(12) United States Patent
Burak et al.

(10) Patent No.: US 12,431,861 B2
(45) Date of Patent: *Sep. 30, 2025

(54) LAYERS, STRUCTURES, ACOUSTIC WAVE RESONATORS, DEVICES AND SYSTEMS

(71) Applicant: QXONIX INC., Irvine, CA (US)

(72) Inventors: Dariusz Burak, Fort Collins, CO (US); Kevin J. Grannen, Selma, TX (US); Jack Lenell, Fort Collins, CO (US)

(73) Assignee: QXONIIX INC., Irvine, CA (US)

( * ) Notice: Subject to any disclaimer, the term of this patent is extended or adjusted under 35 U.S.C. 154(b) by 347 days.

This patent is subject to a terminal disclaimer.

(21) Appl. No.: 18/094,382

(22) Filed: Jan. 8, 2023

(65) Prior Publication Data
US 2023/0170876 A1   Jun. 1, 2023

Related U.S. Application Data

(63) Continuation-in-part of application No. 17/564,813, filed on Dec. 29, 2021, now Pat. No. 12,126,320, and
(Continued)

(51) Int. Cl.
 *H03H 9/17* (2006.01)
 *H03B 5/32* (2006.01)
(Continued)

(52) U.S. Cl.
 CPC .............. *H03H 9/17* (2013.01); *H03B 5/326* (2013.01); *H03H 9/02157* (2013.01); *H03H 9/131* (2013.01); *H03H 9/568* (2013.01)

(58) Field of Classification Search
 CPC .......... H03H 9/17; H03H 9/568; H03H 9/175; H03H 9/605; H03H 9/02015; H03H 9/131; H03H 9/589; H03H 9/02157; H03B 5/326
 See application file for complete search history.

(56) References Cited

U.S. PATENT DOCUMENTS 5,241,236 A * 8/1993 Sasaki ............... H10N 30/40
                                                                    310/366
5,929,555 A   7/1999 Sugimoto et al.
(Continued)

FOREIGN PATENT DOCUMENTS

JP      2007036915 A1   8/2007
WO   WO 2018/022757      2/2018
(Continued)

OTHER PUBLICATIONS

International Search Report and Written Opinion for PCT/US2020/043716 mailed Oct. 20, 2020.
(Continued)

*Primary Examiner* — Quan Tra

(57) ABSTRACT

Techniques for improving acoustic resonators and resonator structures are disclosed, including filters, oscillators and systems that may include such devices. A bulk acoustic wave (BAW) resonator may comprise a substrate. The bulk acoustic wave (BAW) may further comprise a plurality of piezoelectric layers including first, second, third and fourth piezoelectric layers acoustically coupled with one another and arranged over the substrate. The first, second, third and fourth piezoelectric layers may have respective piezoelectric axis orientations. The first, second, third and fourth piezoelectric layers may have respective thicknesses. Electromechanical coupling of the bulk acoustic wave (BAW) resonator may, but need not be limited.

20 Claims, 41 Drawing Sheets

Related U.S. Application Data a continuation-in-part of application No. 17/380,011, filed on Jul. 20, 2021, now Pat. No. 11,863,153, said application No. 17/564,813 is a continuation of application No. PCT/US2020/043755, filed on Jul. 27, 2020, said application No. 17/380,011 is a continuation of application No. 16/940,172, filed on Jul. 27, 2020, now Pat. No. 11,101,783.

(60) Provisional application No. 63/306,299, filed on Feb. 3, 2022, provisional application No. 63/302,070, filed on Jan. 22, 2022, provisional application No. 63/302,067, filed on Jan. 22, 2022, provisional application No. 63/302,068, filed on Jan. 22, 2022, provisional application No. 62/881,074, filed on Jul. 31, 2019, provisional application No. 62/881,085, filed on Jul. 31, 2019, provisional application No. 62/881,091, filed on Jul. 31, 2019, provisional application No. 62/881,061, filed on Jul. 31, 2019, provisional application No. 62/881,087, filed on Jul. 31, 2019, provisional application No. 62/881,077, filed on Jul. 31, 2019, provisional application No. 62/881,094, filed on Jul. 31, 2019.

(51) Int. Cl.
*H03H 9/02* (2006.01)
*H03H 9/13* (2006.01)
*H03H 9/56* (2006.01)

(56) References Cited

U.S. PATENT DOCUMENTS

| | | | |
|---|---|---|---|
| 5,945,770 A | 8/1999 | Hanafy | |
| 6,437,484 B1 * | 8/2002 | Nishimura | H03H 9/175 310/334 |
| 6,927,651 B2 | 8/2005 | Larson, III et al. | |
| 6,975,183 B2 | 12/2005 | Aigner et al. | |
| 7,385,334 B1 | 6/2008 | Olsson et al. | |
| 7,964,144 B1 | 6/2011 | Nordin et al. | |
| 8,346,482 B2 | 1/2013 | Fernandez | |
| 8,673,121 B2 | 3/2014 | Larson, III et al. | |
| 8,796,904 B2 | 8/2014 | Burak et al. | |
| 9,065,421 B2 | 6/2015 | Feng et al. | |
| 9,243,316 B2 | 1/2016 | Larson, III et al. | |
| 9,401,692 B2 | 7/2016 | Burak et al. | |
| 9,679,765 B2 | 6/2017 | Larson, III et al. | |
| 10,153,750 B2 | 12/2018 | Hurwitz | |
| 2002/0093398 A1 | 7/2002 | Ella et al. | |
| 2002/0121945 A1 | 9/2002 | Ruby et al. | |
| 2004/0140869 A1 | 7/2004 | Marksteiner et al. | |
| 2004/0183400 A1 | 9/2004 | Aigner et al. | |
| 2004/0195937 A1 | 10/2004 | Matsubara et al. | |
| 2004/0233019 A1 | 11/2004 | Inoue et al. | |
| 2005/0012568 A1 | 1/2005 | Aigner et al. | |
| 2005/0070232 A1 | 3/2005 | Mages | |
| 2005/0148065 A1 | 7/2005 | Zhang et al. | |
| 2006/0094374 A1 | 5/2006 | Olip | |
| 2006/0119230 A1 | 6/2006 | Umead et al. | |
| 2006/0197411 A1 | 9/2006 | Hoen et al. | |
| 2006/0287195 A1 | 12/2006 | Jerome et al. | |
| 2007/0120625 A1 | 5/2007 | Larson et al. | |
| 2007/0210349 A1 | 9/2007 | Iimura et al. | |
| 2007/0222336 A1 | 9/2007 | Grannen et al. | |
| 2007/0296513 A1 | 12/2007 | Ruile et al. | |
| 2009/0045704 A1 | 2/2009 | Barber et al. | |
| 2009/0096550 A1 | 4/2009 | Handtmann et al. | |
| 2009/0256740 A1 | 10/2009 | Teshirogi et al. | |
| 2010/0073106 A1 | 3/2010 | Stuebing et al. | |
| 2010/0167416 A1 | 7/2010 | Kaliban et al. | |
| 2010/0327701 A1 | 12/2010 | Grannen et al. | |
| 2011/0043081 A1 | 2/2011 | Safari et al. | |
| 2011/0121689 A1 | 5/2011 | Grannen et al. | |
| 2011/0121916 A1 | 5/2011 | Barbet et al. | |
| 2011/0309899 A1 | 12/2011 | Leiba et al. | |
| 2012/0051976 A1 | 3/2012 | Lu et al. | |
| 2012/0096697 A1 | 4/2012 | Grannen et al. | |
| 2012/0154074 A1 | 6/2012 | Ruby et al. | |
| 2012/0201174 A1 | 8/2012 | Jian et al. | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0248941 A1 | 10/2012 | Saito et al. | |
| 2012/0280767 A1 | 11/2012 | Burak et al. | |
| 2012/0293278 A1 | 11/2012 | Burak et al. | |
| 2012/0319530 A1 | 12/2012 | Burak et al. | |
| 2012/0319534 A1 | 12/2012 | Shiwakawa et al. | |
| 2013/0038408 A1 | 2/2013 | Burak et al. | |
| 2013/0063226 A1 | 3/2013 | Burak et al. | |
| 2013/0063227 A1 | 3/2013 | Burak et al. | |
| 2013/0092547 A1 | 4/2013 | Li et al. | |
| 2013/0106248 A1 | 5/2013 | Burak et al. | |
| 2013/0106534 A1 | 5/2013 | Burak et al. | |
| 2013/0193808 A1 | 8/2013 | Feng et al. | |
| 2013/0314177 A1 | 11/2013 | Burak et al. | |
| 2014/0111288 A1 | 4/2014 | Nikkel et al. | |
| 2014/0118087 A1 | 5/2014 | Burak et al. | |
| 2014/0118088 A1 | 5/2014 | Burak et al. | |
| 2014/0118089 A1 | 5/2014 | Bradley et al. | |
| 2014/0118090 A1 | 5/2014 | Grannen et al. | |
| 2014/0118091 A1 | 5/2014 | Burak et al. | |
| 2014/0118092 A1 | 5/2014 | Burak et al. | |
| 2014/0125202 A1 | 5/2014 | Choy et al. | |
| 2014/0125203 A1 | 5/2014 | Choy et al. | |
| 2014/0132117 A1 | 5/2014 | Ella et al. | |
| 2014/0137815 A1 | 5/2014 | Bi et al. | |
| 2014/0152152 A1 | 6/2014 | Burak et al. | |
| 2014/0154697 A1 | 6/2014 | Johal et al. | |
| 2014/0159548 A1 | 6/2014 | Burak et al. | |
| 2014/0174908 A1 | 6/2014 | Feng et al. | |
| 2014/0175950 A1 | 6/2014 | Zou et al. | |
| 2014/0176261 A1 | 6/2014 | Burak et al. | |
| 2014/0193830 A1 | 7/2014 | Schimidt et al. | |
| 2014/0225682 A1 | 8/2014 | Burak et al. | |
| 2014/0225683 A1 | 8/2014 | Burak et al. | |
| 2014/0232486 A1 | 8/2014 | Burak | |
| 2014/0246305 A1 | 9/2014 | Larson, III | |
| 2014/0340172 A1 | 11/2014 | Bradley et al. | |
| 2014/0354109 A1 | 12/2014 | Grannen et al. | |
| 2014/0354115 A1 | 12/2014 | Burak et al. | |
| 2015/0133339 A1 | 5/2015 | Prindle | |
| 2015/0240349 A1 | 8/2015 | Grannen | |
| 2015/0244346 A1 | 8/2015 | Feng et al. | |
| 2015/0244347 A1 | 8/2015 | Lv et al. | |
| 2015/0270826 A1 | 9/2015 | Burak | |
| 2015/0280100 A1 | 10/2015 | Burak et al. | |
| 2015/0280687 A1 | 10/2015 | Burak et al. | |
| 2015/0308996 A1 | 10/2015 | Kim et al. | |
| 2015/0311046 A1 | 10/2015 | Yeh et al. | |
| 2015/0318461 A1 | 11/2015 | Jacobsen et al. | |
| 2015/0318837 A1 | 11/2015 | Zou et al. | |
| 2015/0326200 A1 | 11/2015 | Grannen et al. | |
| 2015/0341015 A1 | 11/2015 | Grannen et al. | |
| 2015/0349743 A1 | 12/2015 | Burak et al. | |
| 2015/0349747 A1 | 12/2015 | Burak et al. | |
| 2015/0377834 A1 | 12/2015 | Salvati et al. | |
| 2016/0007893 A1 | 1/2016 | Roberts | |
| 2016/0079958 A1 | 3/2016 | Burak | |
| 2016/0087186 A1 | 3/2016 | Burak | |
| 2016/0087187 A1 | 3/2016 | Burak | |
| 2016/0118957 A1 | 4/2016 | Burak et al. | |
| 2016/0118958 A1 | 4/2016 | Burak | |
| 2016/0126930 A1 | 5/2016 | Giovannini | |
| 2016/0182011 A1 | 6/2016 | Burak et al. | |
| 2016/0301437 A1 | 10/2016 | Pehlke | |
| 2016/0308509 A1 | 10/2016 | Burak et al. | |
| 2016/0349088 A1 | 12/2016 | Patel | |
| 2017/0047907 A1 | 2/2017 | Burak et al. | |
| 2017/0063339 A1 | 3/2017 | Burak et al. | |
| 2017/0117871 A1 | 4/2017 | Rivas et al. | |
| 2017/0120242 A1 | 5/2017 | Rivas | |

(56) References Cited

U.S. PATENT DOCUMENTS

| | | |
|---|---|---|
| 2017/0122911 A1 | 5/2017 | McCarran et al. |
| 2017/0122936 A1 | 5/2017 | Rivas et al. |
| 2017/0134001 A1 | 5/2017 | Belsick et al. |
| 2017/0134002 A1 | 5/2017 | Rivas et al. |
| 2017/0168017 A1 | 6/2017 | Rivas et al. |
| 2017/0168018 A1 | 6/2017 | Morton et al. |
| 2017/0214387 A1 | 7/2017 | Burak et al. |
| 2017/0227497 A1 | 8/2017 | Rivas et al. |
| 2017/0261503 A1 | 9/2017 | Murdock et al. |
| 2017/0276670 A1 | 9/2017 | Salvati et al. |
| 2017/0288121 A1 | 10/2017 | Burak et al. |
| 2017/0288628 A1 | 10/2017 | Grannen et al. |
| 2017/0292950 A1 | 10/2017 | Grinsven |
| 2017/0310304 A1 | 10/2017 | Burak et al. |
| 2017/0347925 A1 | 12/2017 | Wang et al. |
| 2018/0034438 A1 | 2/2018 | Ryder et al. |
| 2018/0085787 A1 | 3/2018 | Burak et al. |
| 2018/0097499 A1 | 4/2018 | Rinaldi et al. |
| 2018/0138893 A1 | 5/2018 | Caron |
| 2018/0204996 A1 | 7/2018 | Zou et al. |
| 2018/0309425 A1 | 10/2018 | Shealy et al. |
| 2019/0081192 A1 | 3/2019 | Horng et al. |
| 2019/0103853 A1 | 4/2019 | Burak et al. |
| 2019/0152995 A1 | 5/2019 | Gunasekaran et al. |
| 2019/0187105 A1 | 6/2019 | Ram et al. |
| 2019/0234907 A1 | 8/2019 | Edwards et al. |
| 2019/0250198 A1 | 8/2019 | Kenumba et al. |
| 2019/0256806 A1 | 8/2019 | Nietfeld |
| 2020/0124625 A1 | 4/2020 | Dunlop et al. |

FOREIGN PATENT DOCUMENTS

| | | |
|---|---|---|
| WO | 2018111532 A1 | 6/2018 |
| WO | WO 2021/021719 | 2/2021 |
| WO | WO 2021/021723 | 2/2021 |
| WO | WO 2021/021730 | 2/2021 |
| WO | WO 2021/021732 | 2/2021 |
| WO | WO 2021/021736 | 2/2021 |
| WO | WO 2021/021739 | 2/2021 |
| WO | WO 2021/021743 | 2/2021 |
| WO | WO 2021/021745 | 2/2021 |
| WO | WO 2021/021747 | 2/2021 |
| WO | WO 2021/021748 | 2/2021 |

OTHER PUBLICATIONS

International Search Report and Written Opinion for PCT/US2020/043720 mailed Oct. 20, 2020.
International Search Report and Written Opinion for PCT/US2020/043740 mailed Oct. 28, 2020.
International Search Report and Written Opinion for PCT/US2020/043746 mailed Oct. 28, 2020.
International Search Report and Written Opinion for PCT/US2020/043752 mailed Oct. 27, 2020.
International Search Report and Written Opinion for PCT/US2020/043762 mailed Oct. 21, 2020.
International Search Report and Written Opinion for PCT/US2020/043760 mailed Dec. 17, 2020.
International Search Report and Written Opinion for PCT/US2020/043733 mailed Dec. 17, 2020.
International Search Report and Written Opinion for PCT/US2020/043755 mailed Dec. 18, 2020.
International Search Report and Written Opinion for PCT/US2020/043730 mailed Feb. 1, 2021.

* cited by examiner

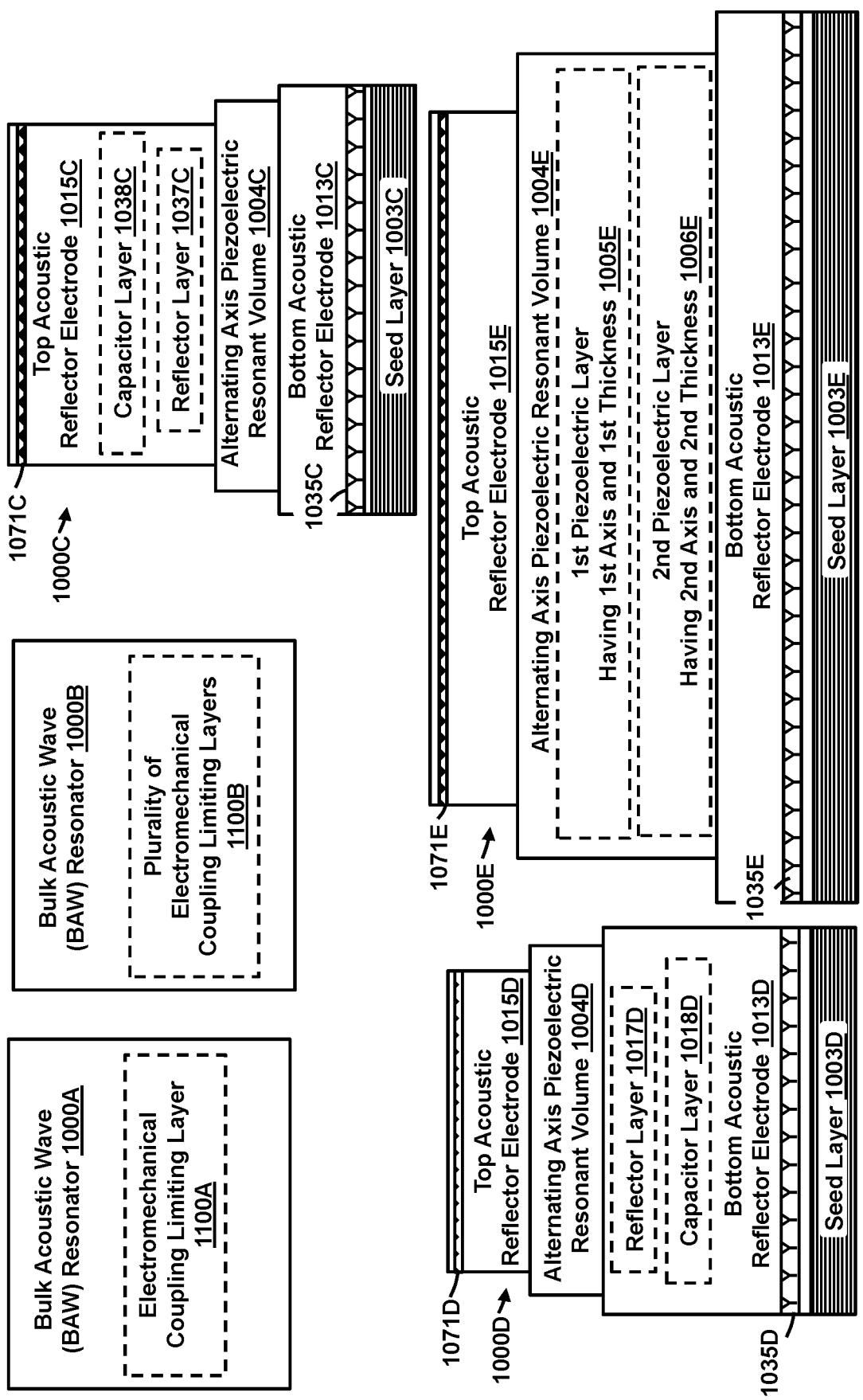

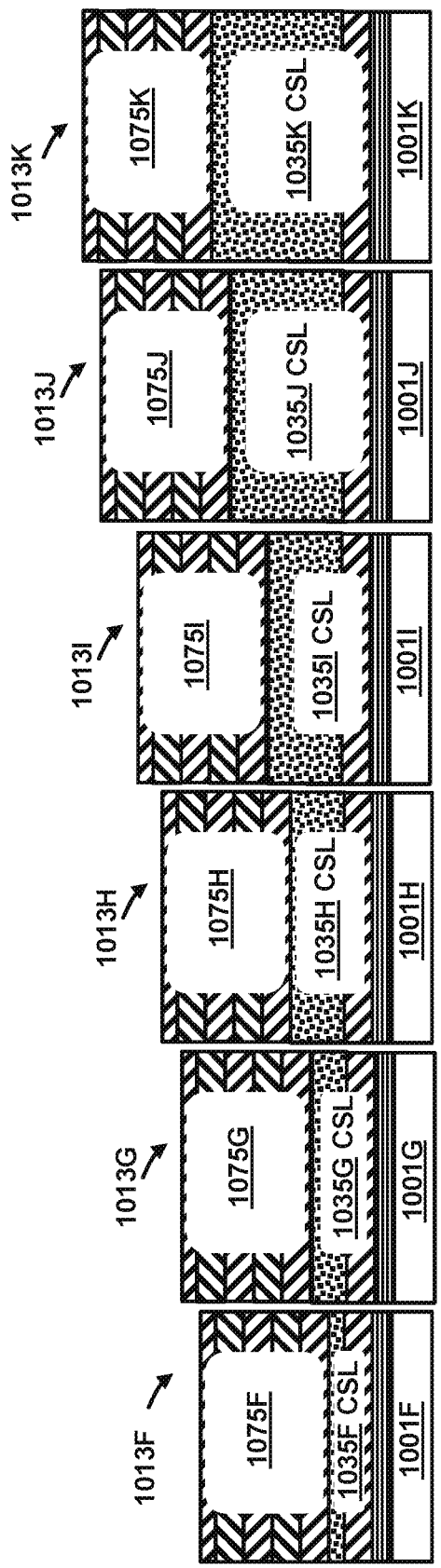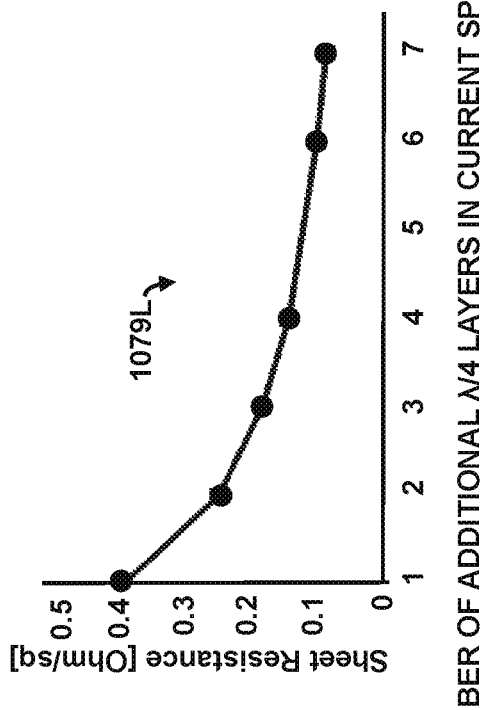
FIG. 1AB

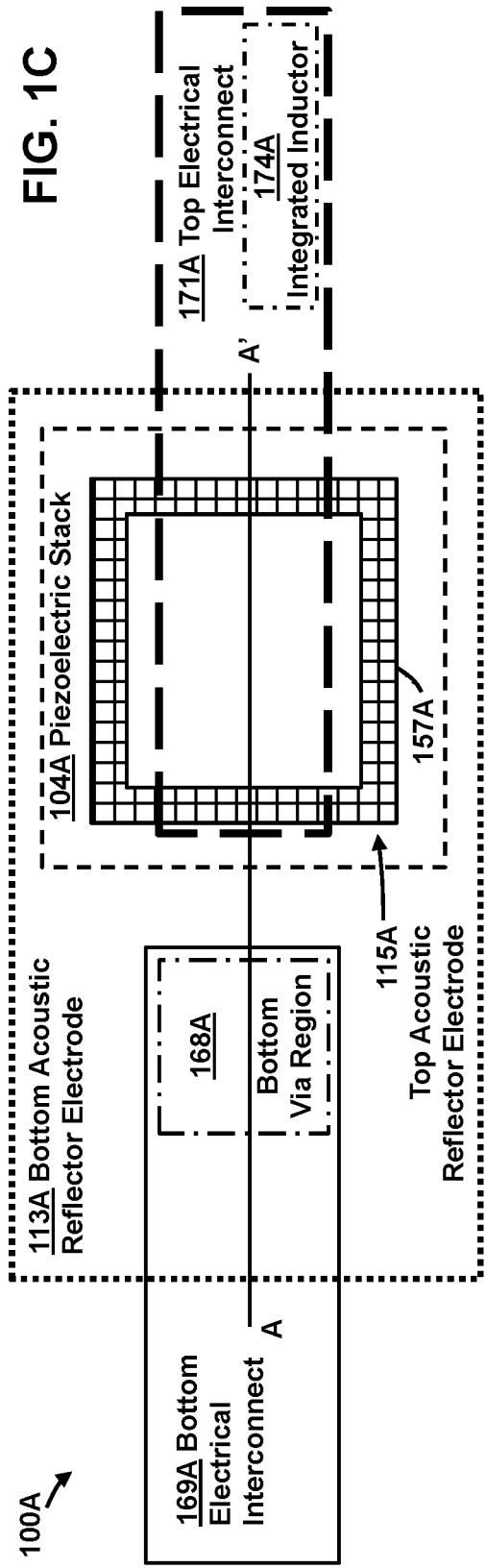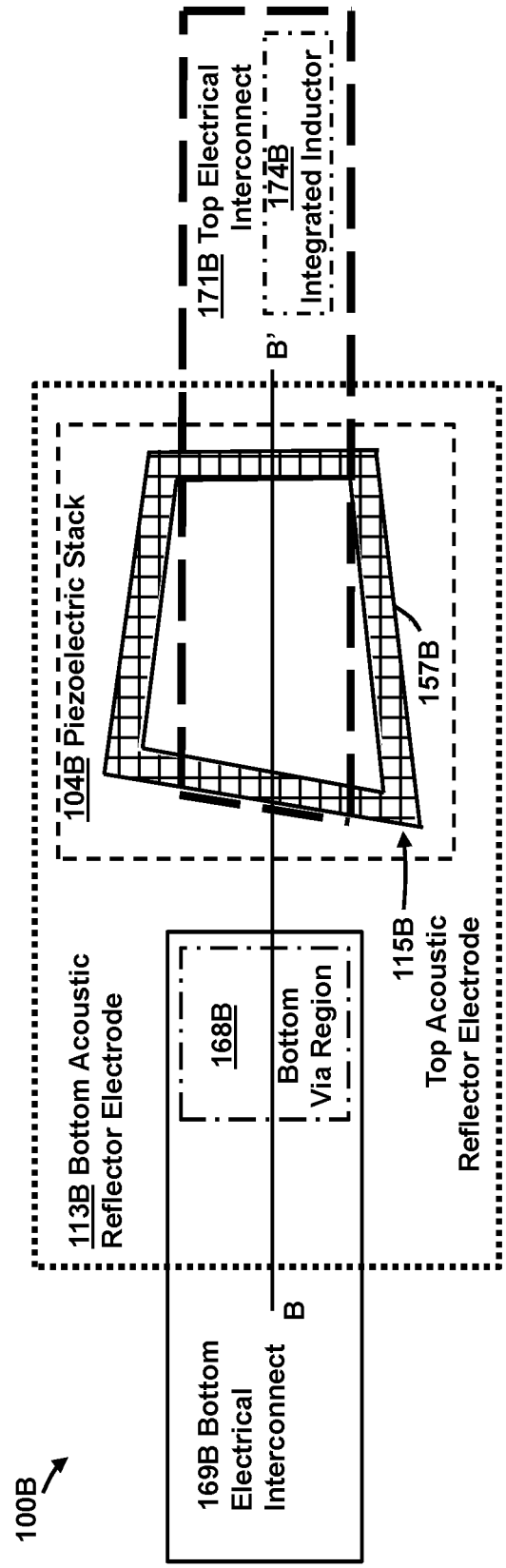
FIG. 1C

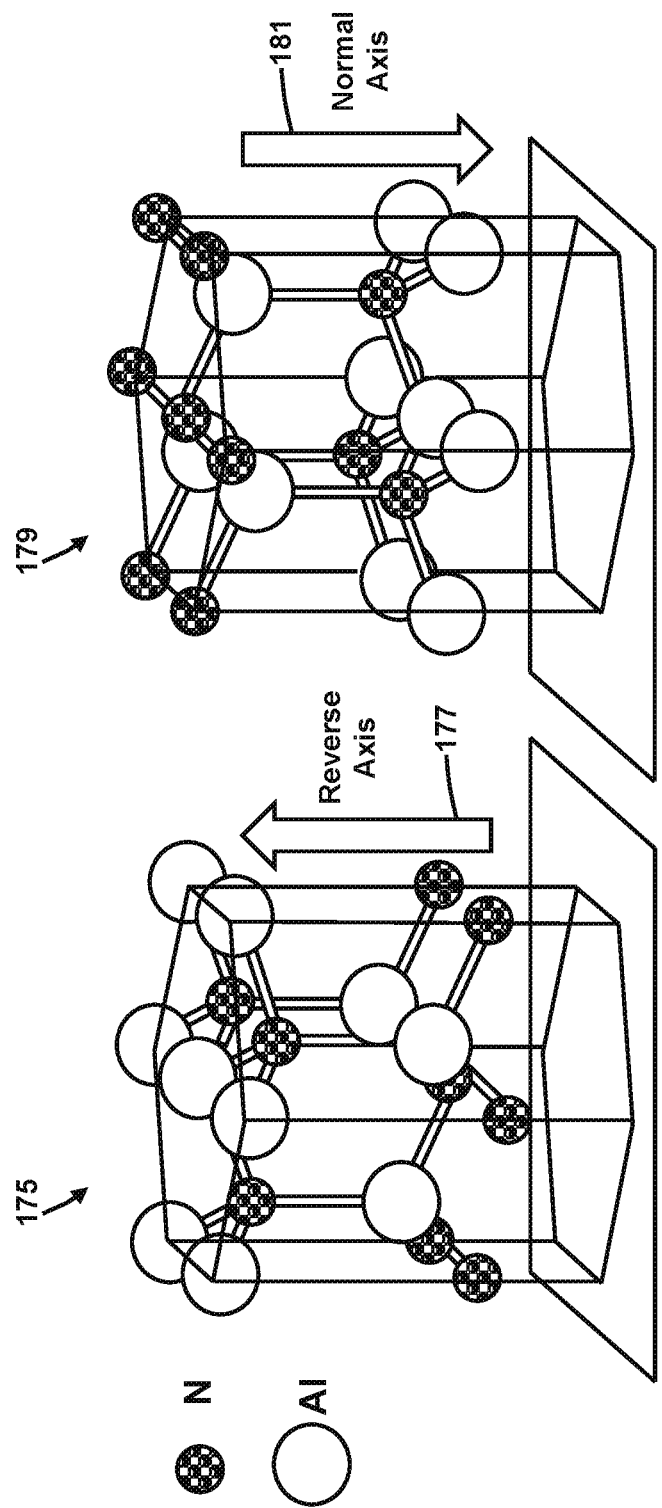

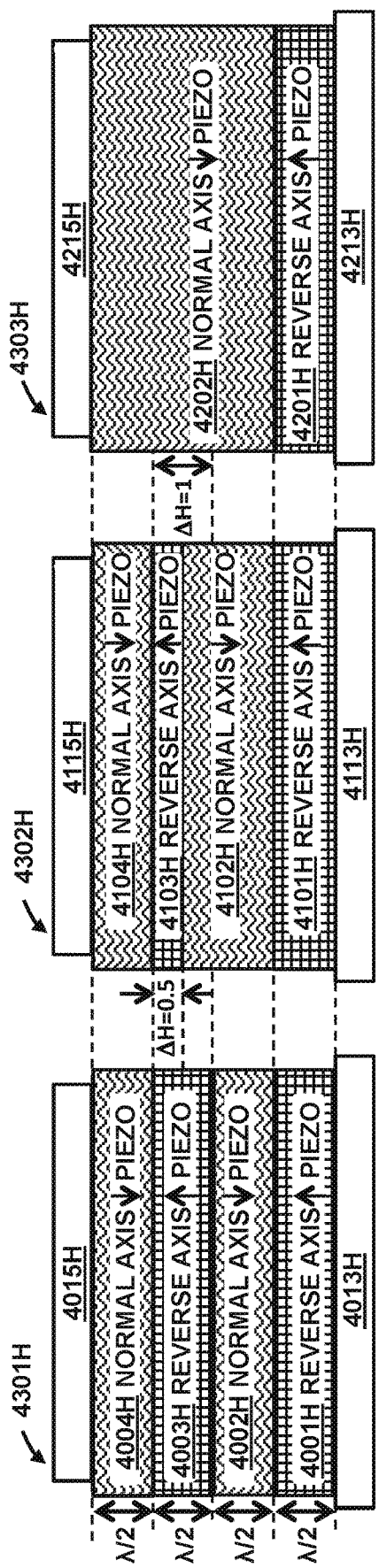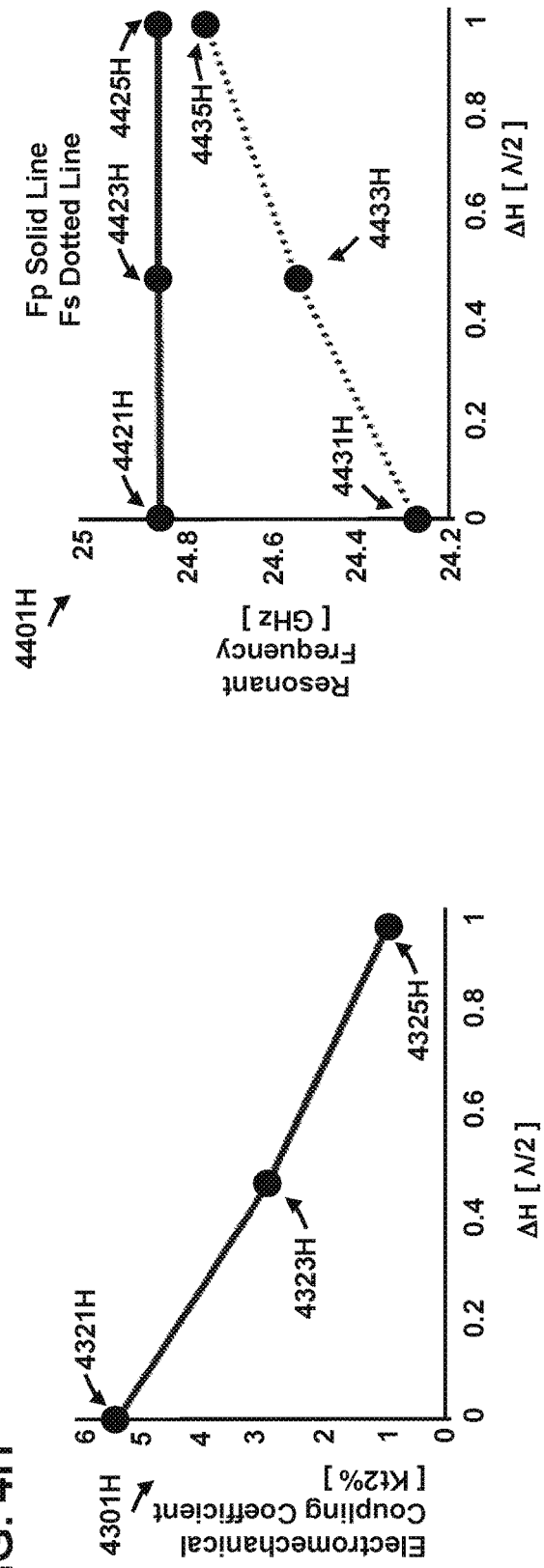
FIG. 4H

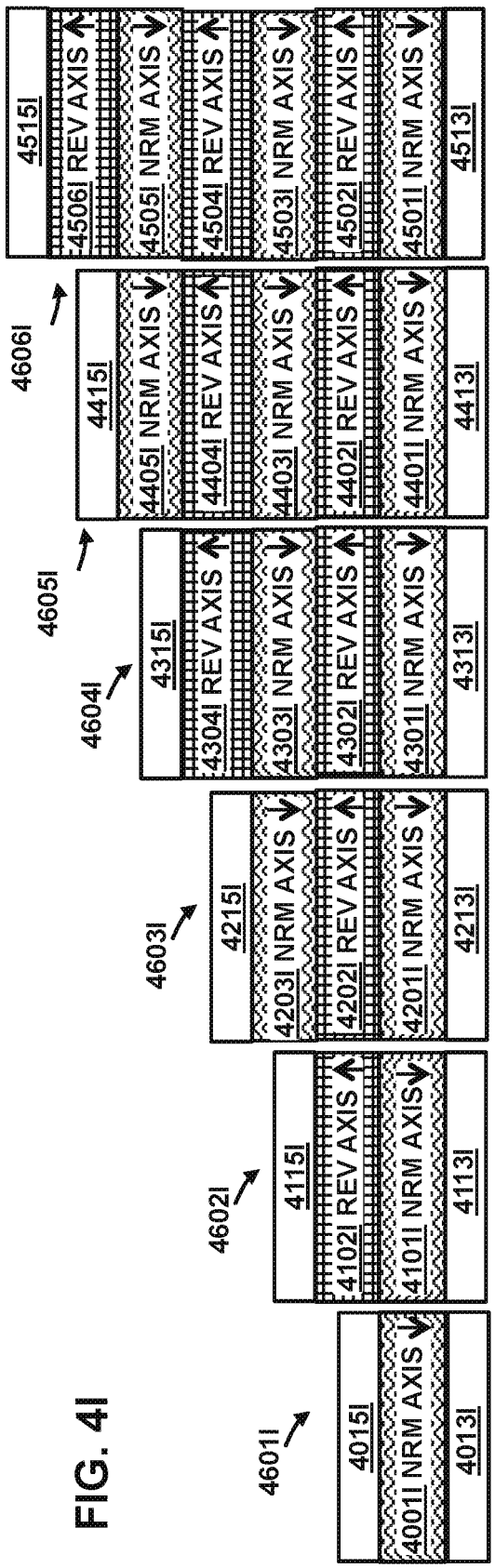
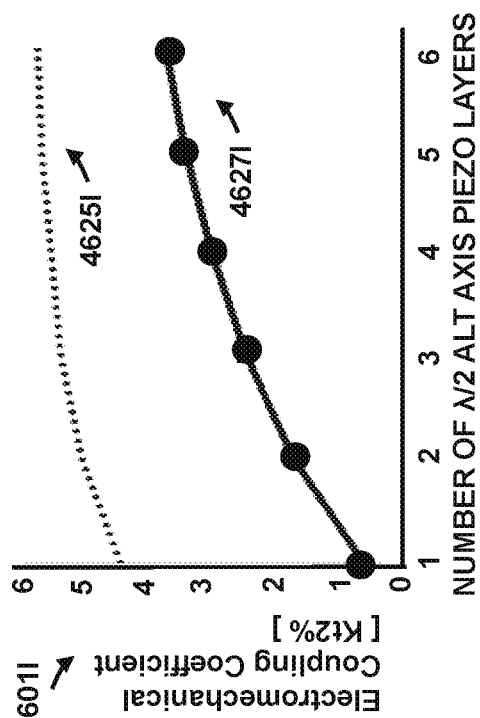
FIG. 4I

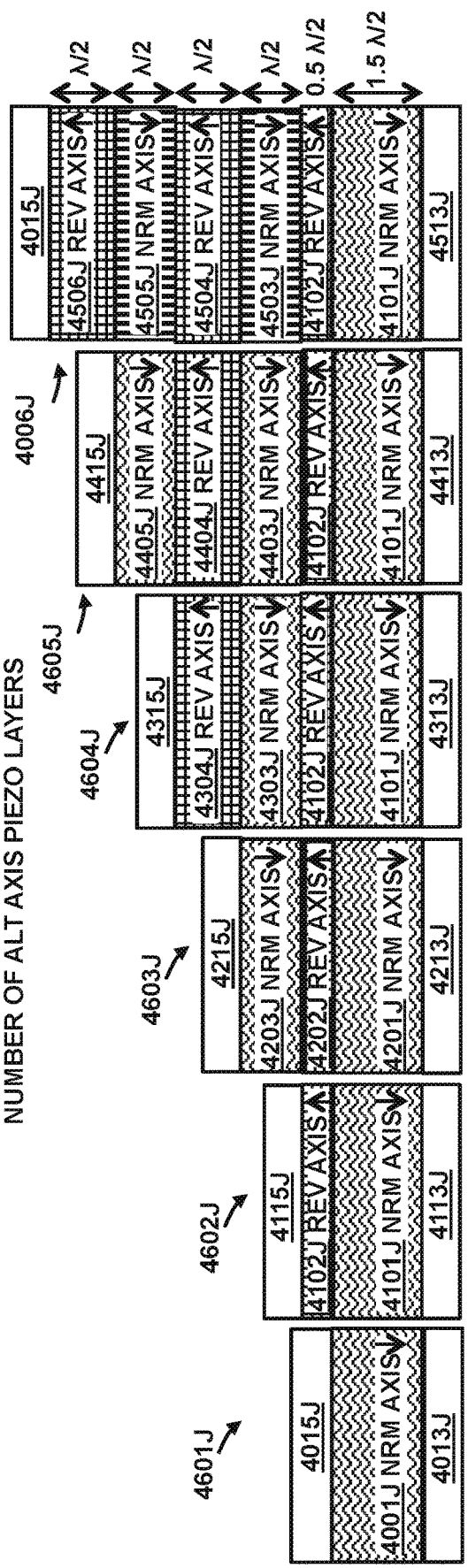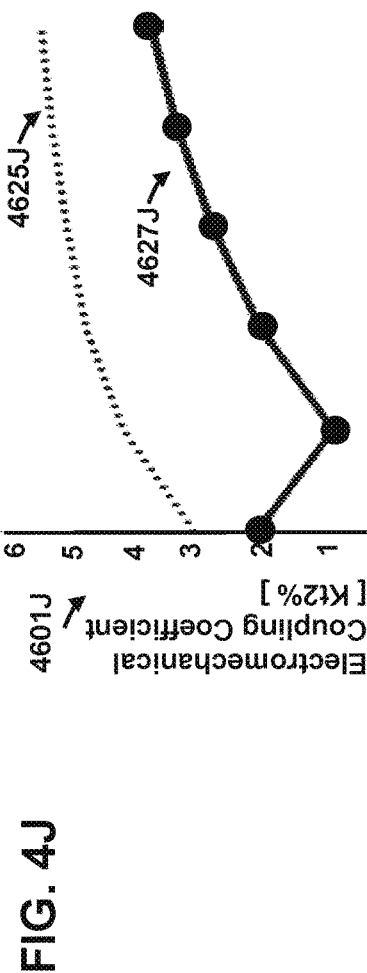
FIG. 4J

FIG. 4K
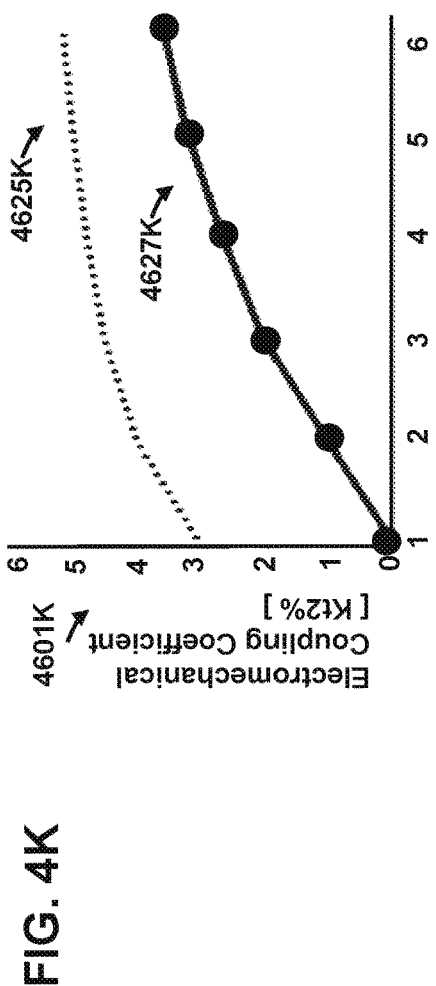
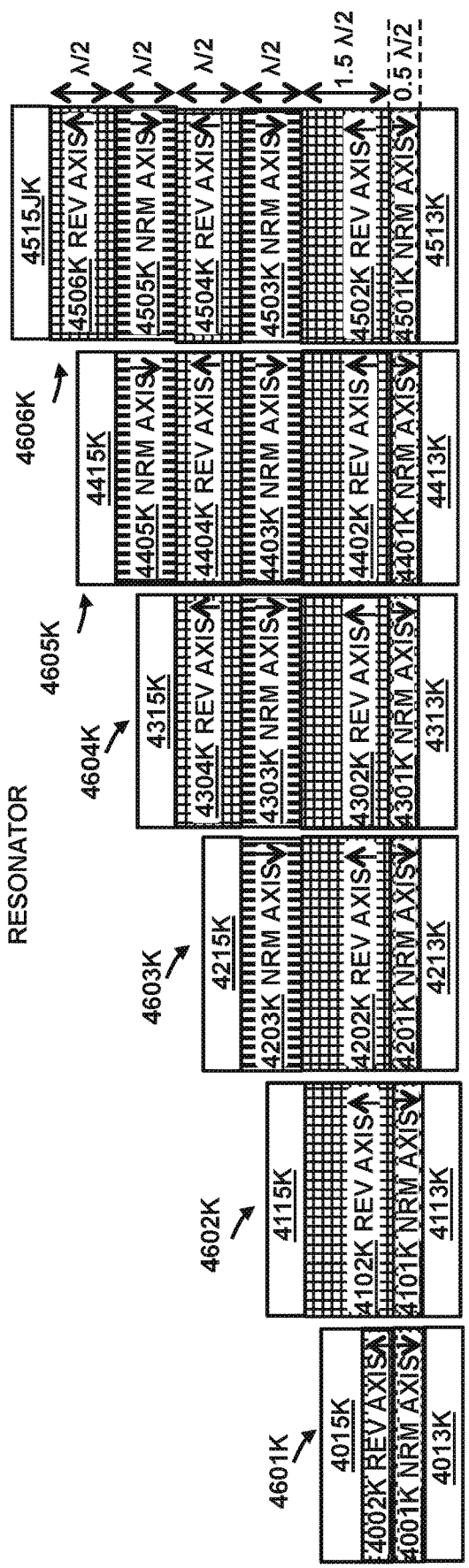

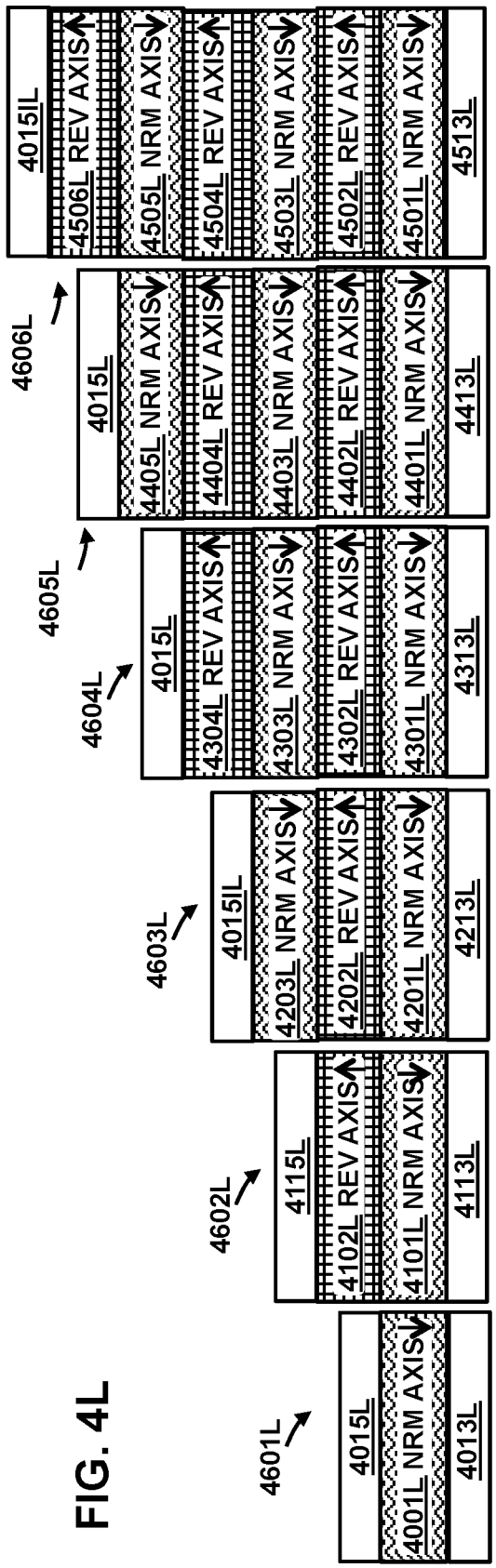
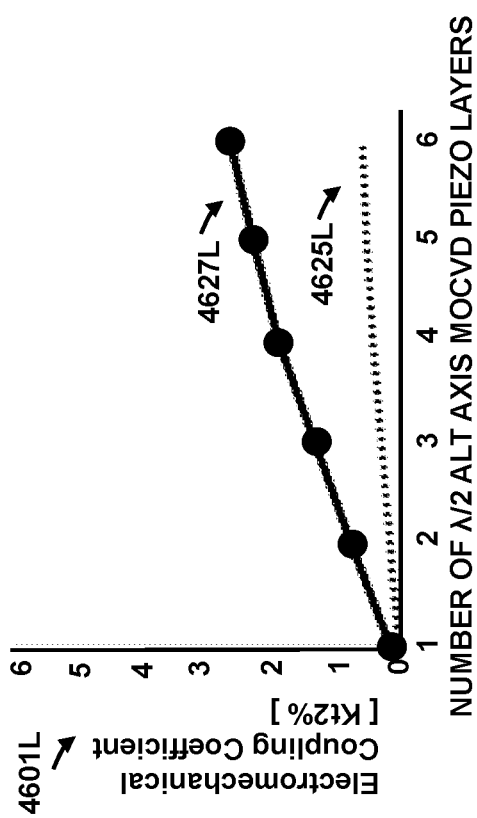
FIG. 4L

FIG. 4M
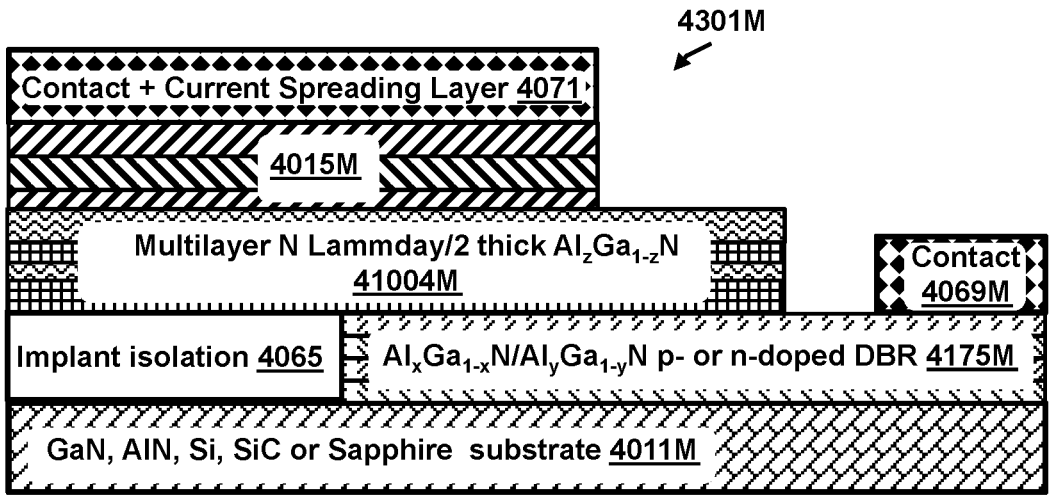
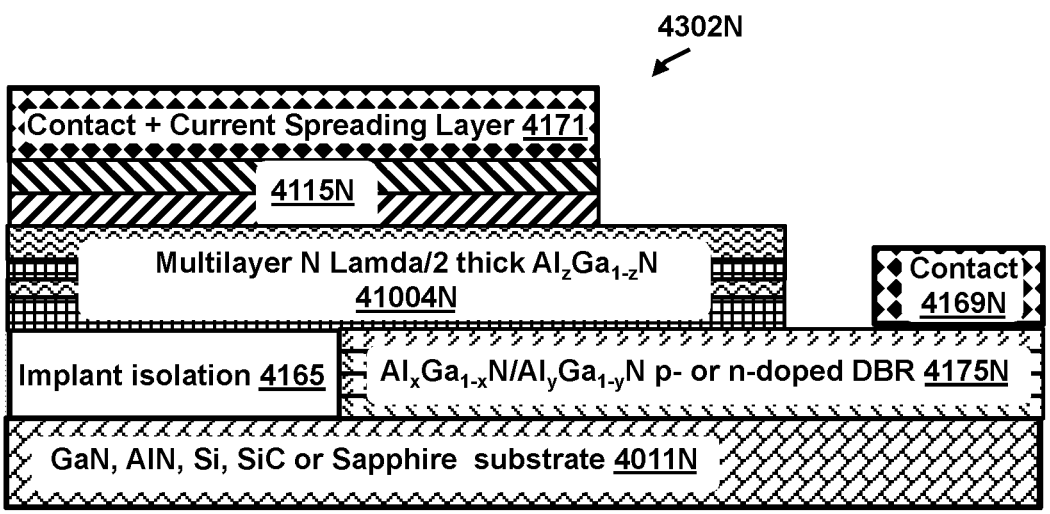
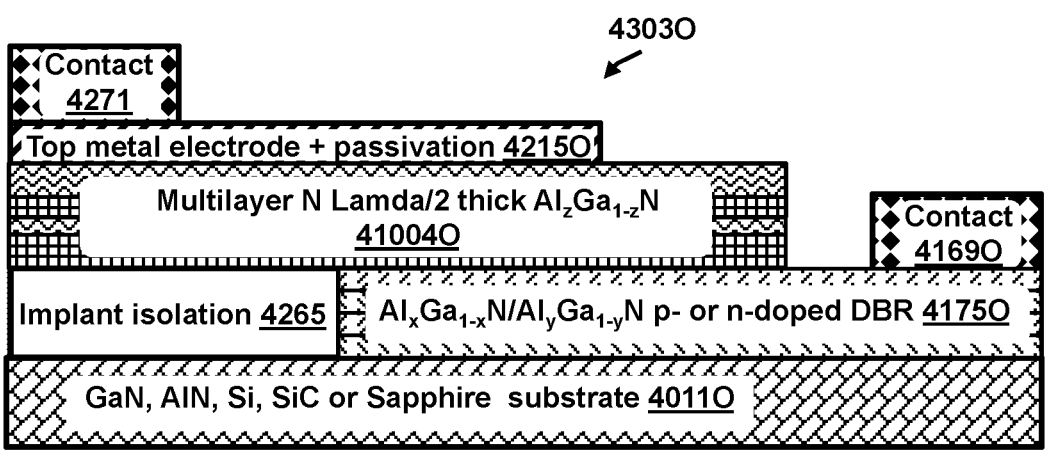

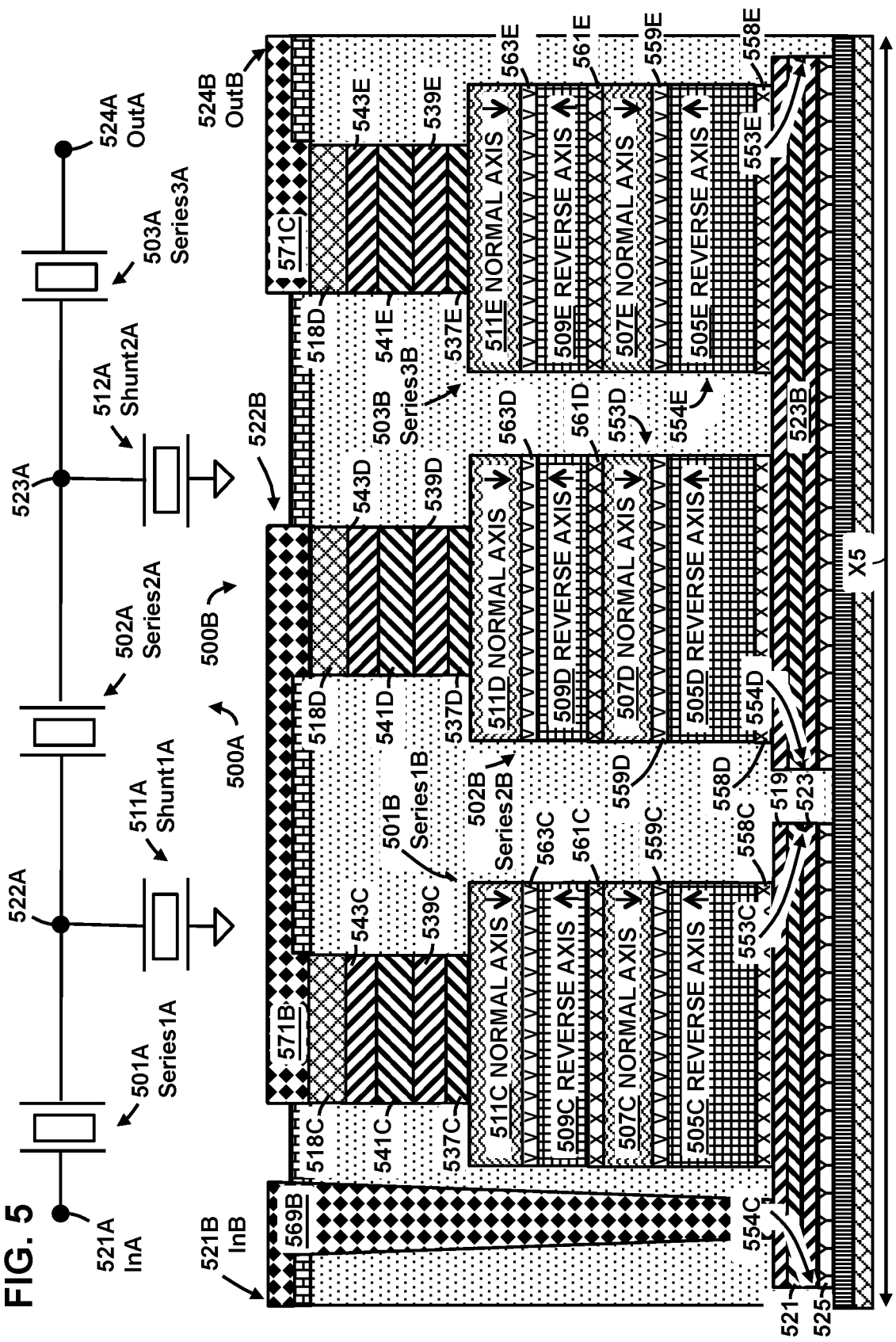

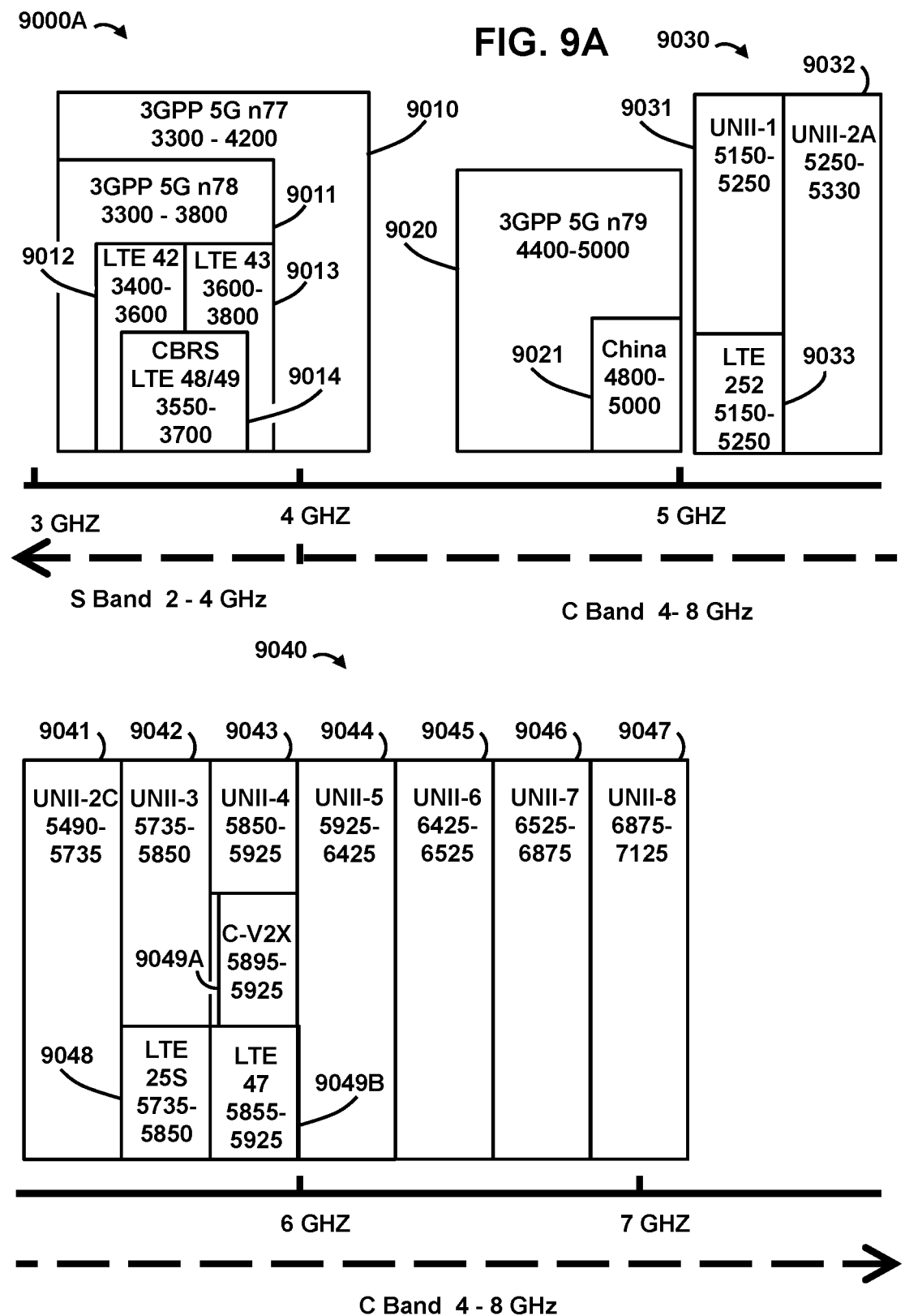

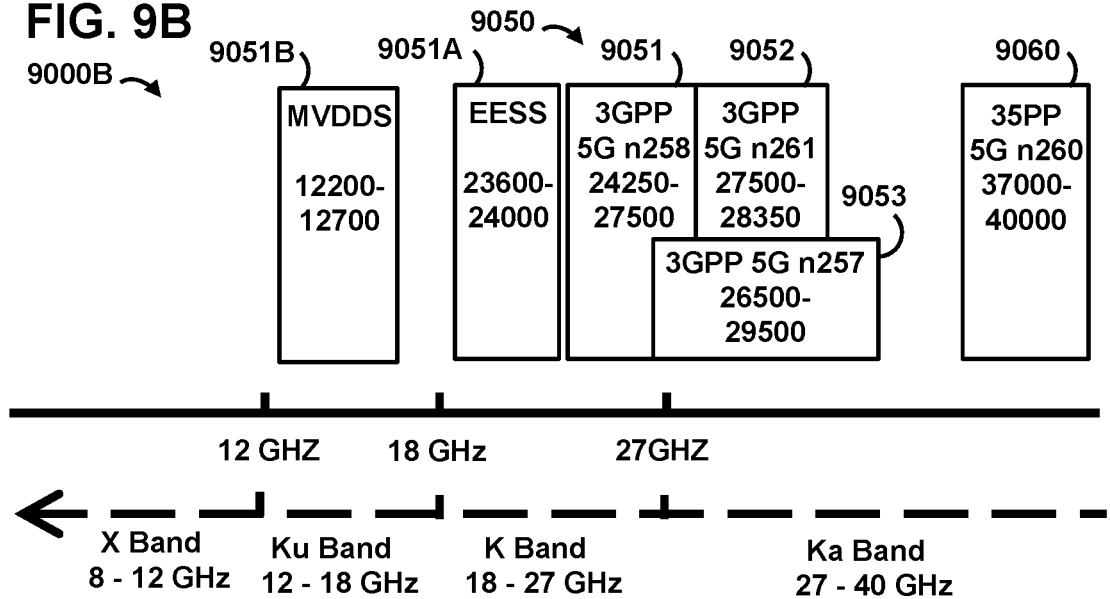
FIG. 9B
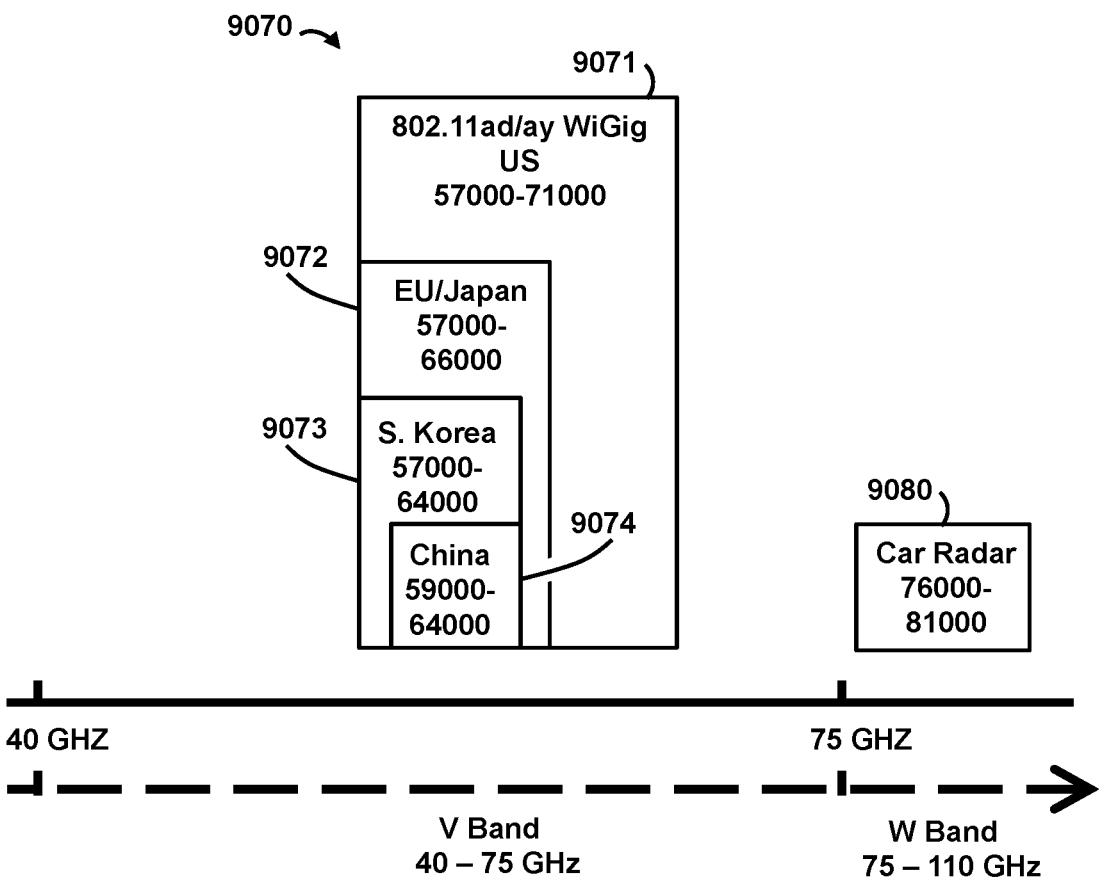

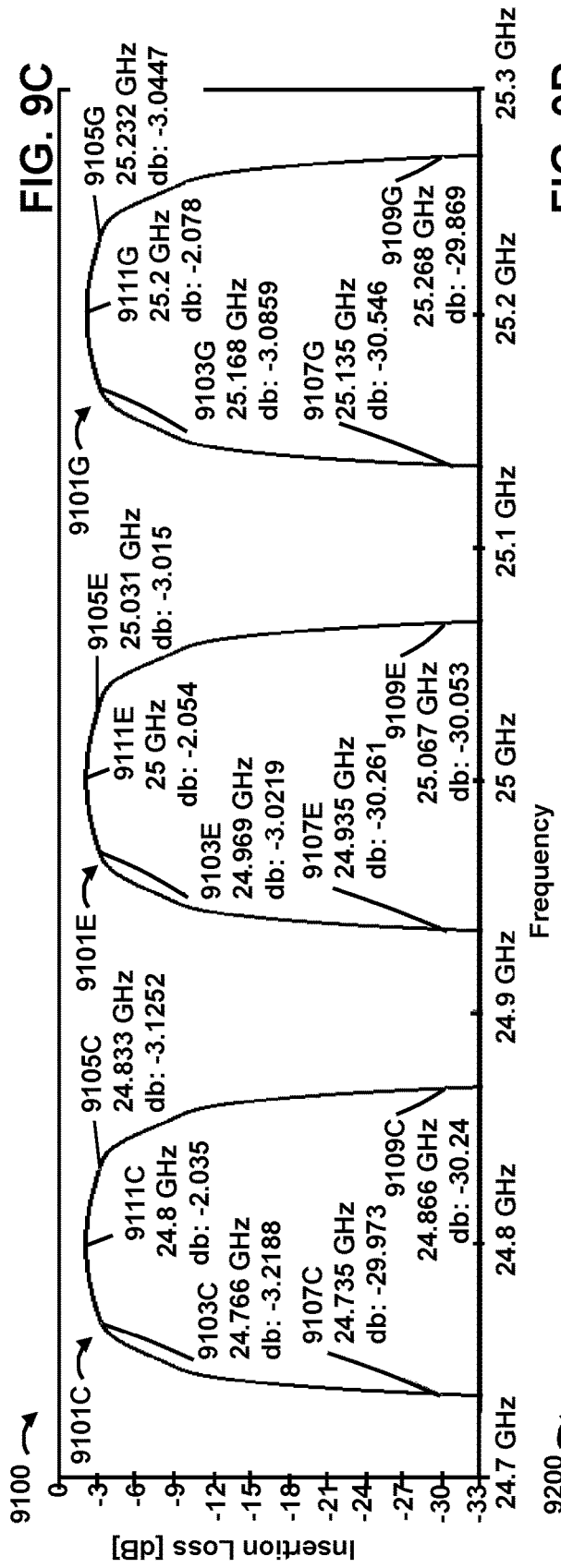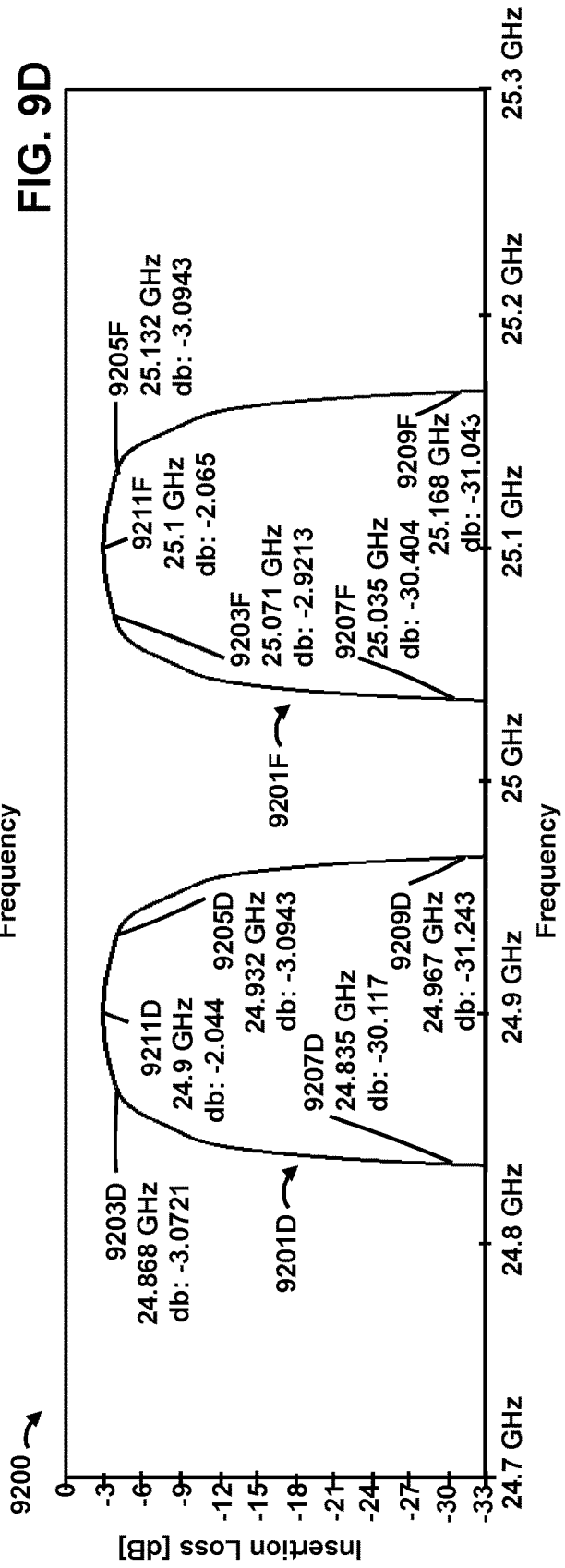

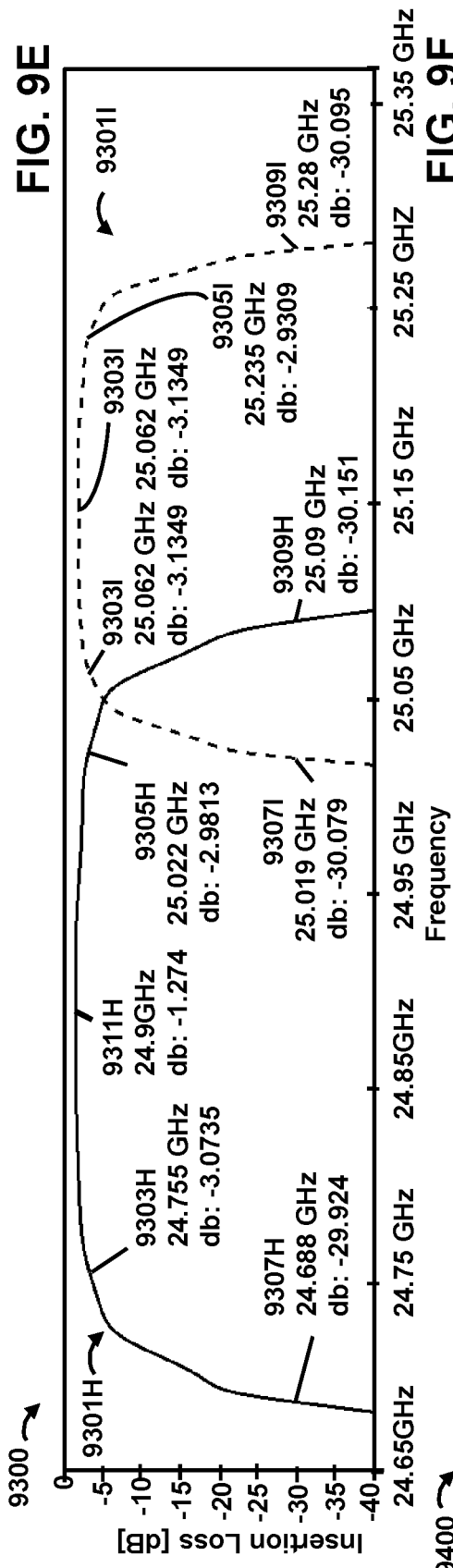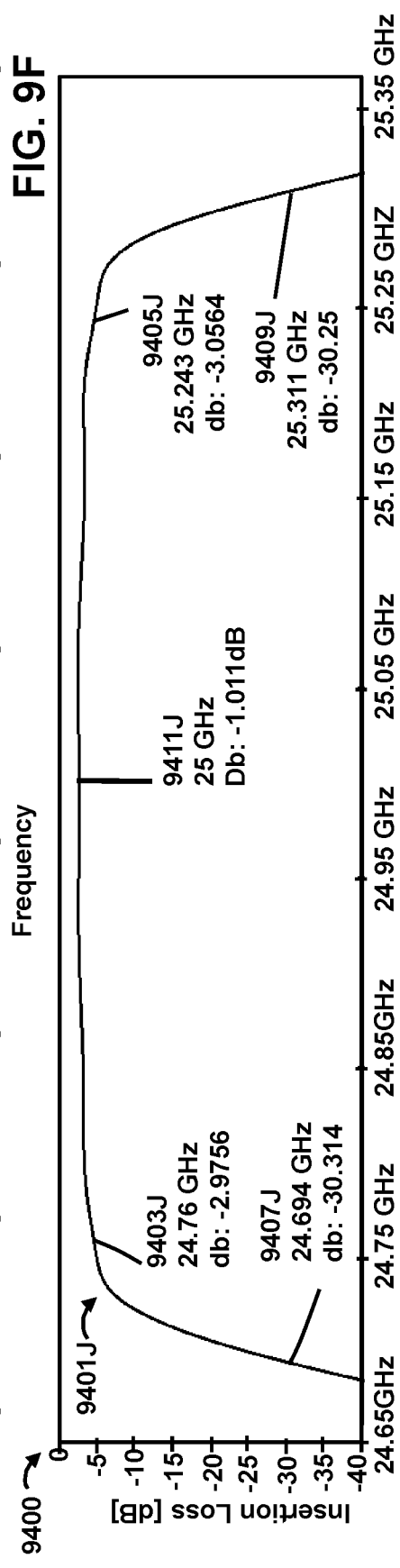

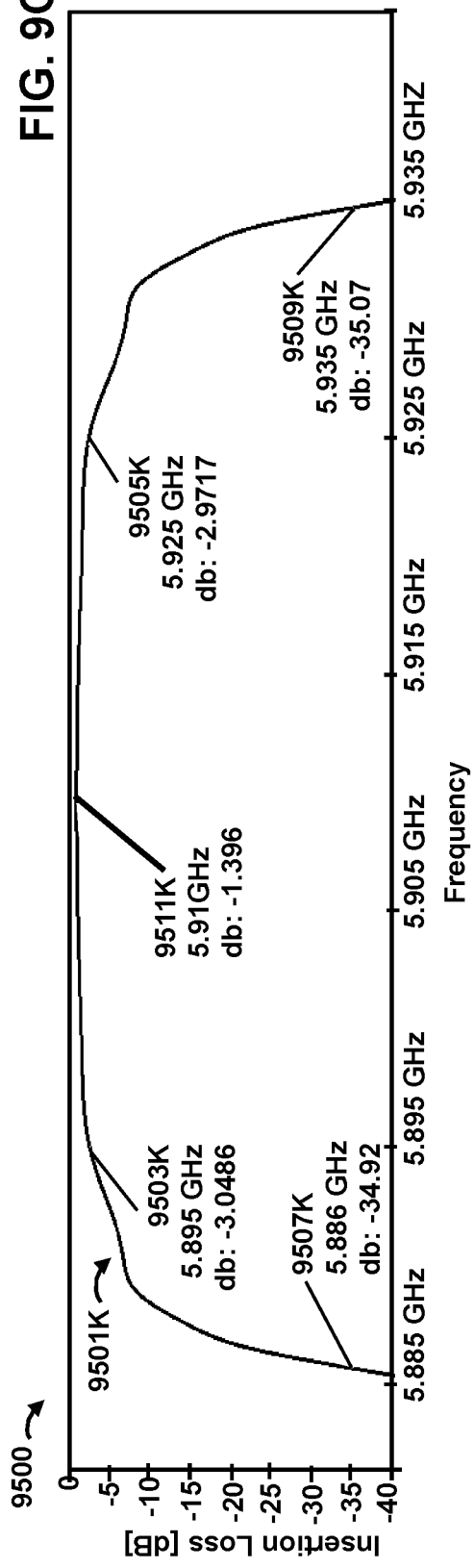
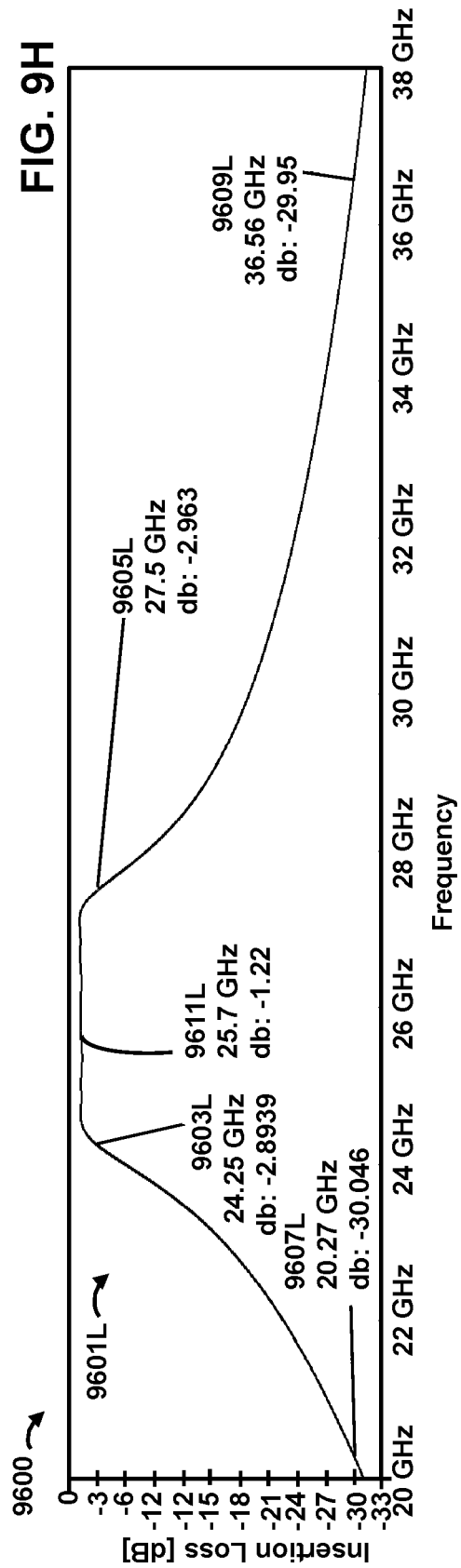

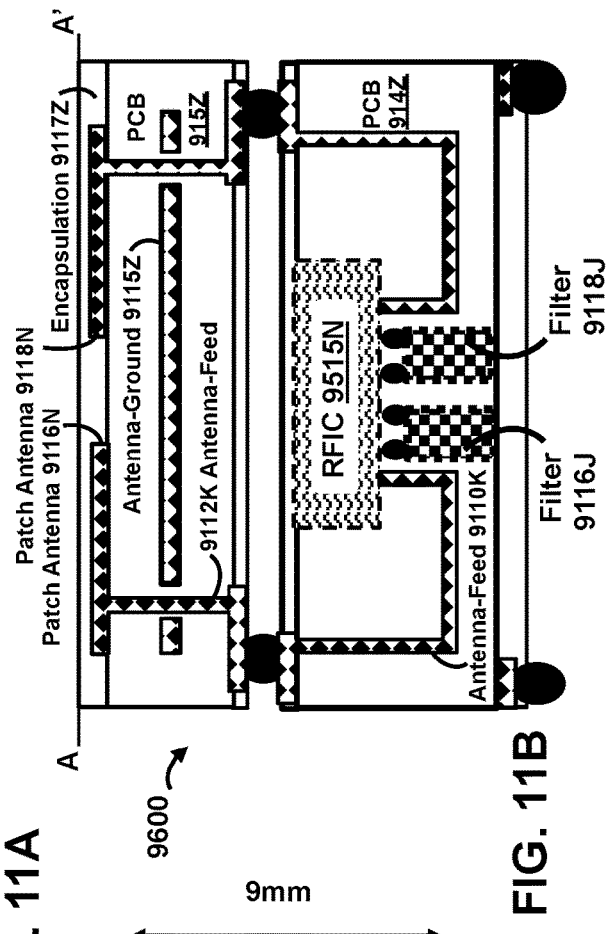
FIG. 11A
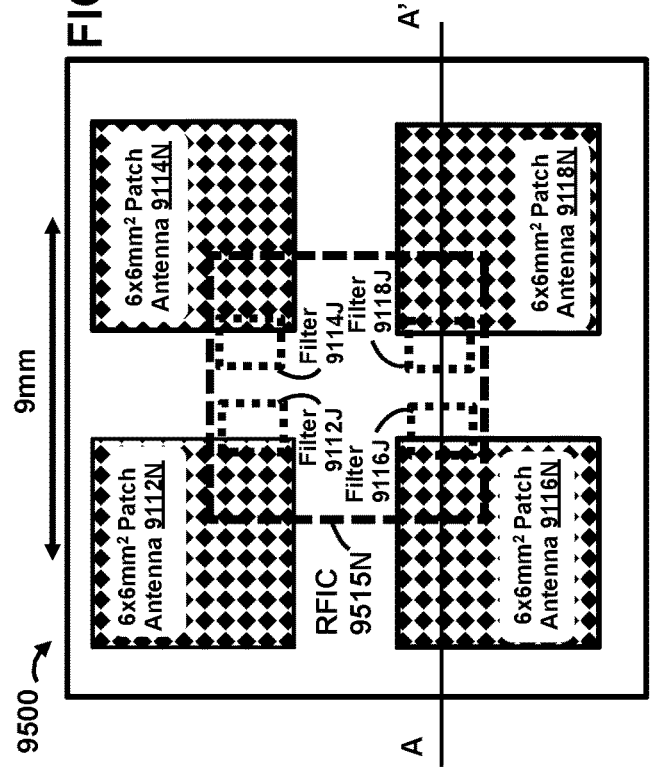
FIG. 11B
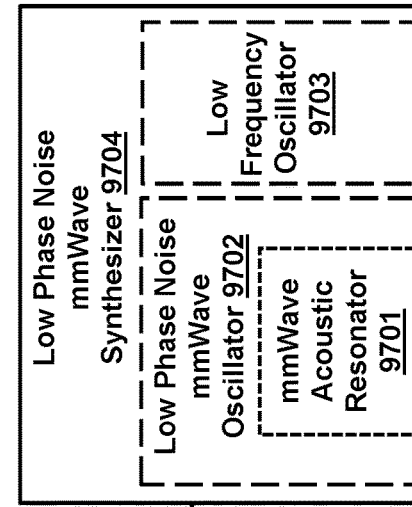
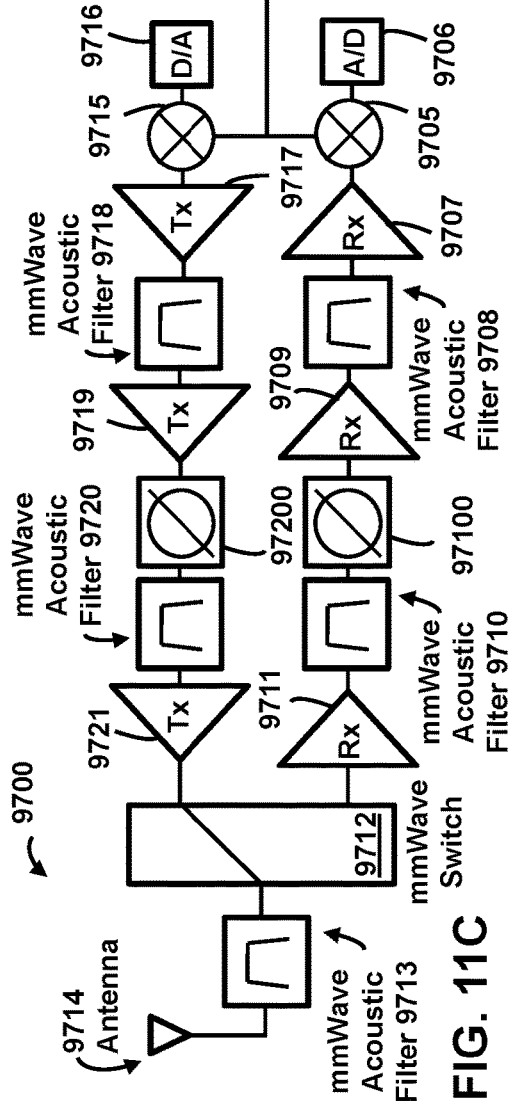
FIG. 11C

LAYERS, STRUCTURES, ACOUSTIC WAVE RESONATORS, DEVICES AND SYSTEMS

PRIORITY CLAIM

This application claims the benefit of priority to the following provisional patent applications:

(1) U.S. Provisional Patent Application Ser. No. 63/302,067 entitled "LAYERS, STRUCTURES, ACOUSTIC WAVE RESONATORS, DEVICES AND SYSTEMS" and filed on Jan. 22, 2022;

(2) U.S. Provisional Patent Application Ser. No. 63/302,068 entitled "BULK ACOUSTIC WAVE (BAW) RESONATOR, PATTERNED LAYER STRUCTURES, DEVICES AND SYSTEMS" and filed on Jan. 22, 2022;

(3) U.S. Provisional Patent Application Ser. No. 63/302,070 entitled "STRUCTURES, ACOUSTIC WAVE RESONATORS, LAYERS, DEVICES AND SYSTEMS" and filed on Jan. 22, 2022; and (4) U.S. Provisional Patent Application Ser. No. 63/306,299 entitled "LAYERS, STRUCTURES, ACOUSTIC WAVE RESONATORS, DEVICES, CIRCUITS AND SYSTEMS" and filed on Feb. 3, 2022.

Each of the provisional patent applications identified above is incorporated herein by reference in its entirety.

This application is also a continuation in part of U.S. patent application Ser. No. 17/380,011 filed Jul. 20, 2021, entitled "STRUCTURES, ACOUSTIC WAVE RESONATORS, DEVICES AND SYSTEMS TO SENSE A TARGET VARIABLE", which in turn is a continuation of U.S. patent application Ser. No. 16/940,172 filed Jul. 27, 2020 (issued as U.S. Pat. No. 11,101,783), entitled "STRUCTURES, ACOUSTIC WAVE RESONATORS, DEVICES AND SYSTEMS TO SENSE A TARGET VARIABLE, INCLUDING AS A NON-LIMITING EXAMPLE CORONA VIRUSES", which in turn claims priority to the U.S. Provisional Patent Applications:

(1) U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

(2) U.S. Provisional Patent Application Ser. No. 62/881,074, entitled "ACOUSTIC DEVICE STRUCTURES, DEVICES AND SYSTEMS" and filed on Jul. 31, 2019;

(3) U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

(4) U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

(5) U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

(6) U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and (7) U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

This application is also a continuation in part of U.S. patent application Ser. No. 17/564,813 filed Dec. 29, 2021, titled "ACOUSTIC DEVICES STRUCTURES, FILTERS AND SYSTEMS", which is a continuation of PCT Application No. PCTUS2020043755 filed Jul. 27, 2020, titled "ACOUSTIC DEVICE STRUCTURES, FILTERS AND SYSTEMS", which claims priority to the following provisional patent applications:

(1) U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

(2) U.S. Provisional Patent Application Ser. No. 62/881,074, entitled "ACOUSTIC DEVICE STRUCTURES, DEVICES AND SYSTEMS" and filed on Jul. 31, 2019;

(3) U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

(4) U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

(5) U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

(6) U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and (7) U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

TECHNICAL FIELD

The present disclosure relates to acoustic resonators and to devices and to systems comprising acoustic resonators.

BACKGROUND

Bulk Acoustic Wave (BAW) resonators have enjoyed commercial success in filter applications. For example, 4G cellular phones that operate on fourth generation broadband cellular networks typically include a large number of BAW filters for various different frequency bands of the 4G network. In addition to BAW resonators and filters, also included in 4G phones are filters using Surface Acoustic Wave (SAW) resonators, typically for lower frequency band filters. SAW based resonators and filters are generally easier to fabricate than BAW based filters and resonators. However, performance of SAW based resonators and filters may decline if attempts are made to use them for higher 4G frequency bands. Accordingly, even though BAW based filters and resonators are relatively more difficult to fabricate than SAW based filters and resonators, they may be included in 4G cellular phones to provide better performance in higher 4G frequency bands what is provided by SAW based filters and resonators.

5G cellular phones may operate on newer, fifth generation broadband cellular networks. 5G frequencies include some frequencies that are much higher frequency than 4G frequencies. Such relatively higher 5G frequencies may transport data at relatively faster speeds than what may be provided over relatively lower 4G frequencies. However, previously known SAW and BAW based resonators and filters have encountered performance problems when attempts were made to use them at relatively higher 5G frequencies. Many learned engineering scholars have studied these problems, but have not found solutions. For example, performance problems cited for previously known SAW and BAW based resonators and filters include scaling issues and significant increases in acoustic losses at high frequencies.

From the above, it is seen that techniques for improving Bulk Acoustic Wave (BAW) resonator structures are highly desirable, for example for operation over frequencies higher than 4G frequencies, in particular for filters, oscillators and systems that may include such devices.

BRIEF DESCRIPTION OF THE DRAWINGS

FIG. 1AB shows six simplified diagrams of multilayer metal acoustic reflector electrodes comprising current spreading layers (CSLs) for use in the bulk acoustic wave resonator structures of this disclosure, and a corresponding chart showing sheet resistance versus number of additional quarter wavelength current spreading layers, with results as expected from simulation.

FIG. 1AC shows three simplified diagrams of multilayer metal acoustic reflector electrodes comprising current spreading layers (CSLs) for use in the bulk acoustic wave resonator structures of this disclosure, and two corresponding charts showing acoustic reflectivity versus acoustic frequency, with results as expected from simulation.

FIG. 1A is a diagram that illustrates an example bulk acoustic wave resonator structure.

FIG. 1C shows a simplified top plan view of a bulk acoustic wave resonator structure corresponding to the cross sectional view of FIG. 1A, and also shows another simplified top plan view of an alternative bulk acoustic wave resonator structure.

FIG. 1D is a perspective view of an illustrative model of a crystal structure of AlN in piezoelectric material of layers in FIG. 1A having reverse axis orientation of negative polarization.

FIG. 1E is a perspective view of an illustrative model of a crystal structure of AlN in piezoelectric material of layers in FIG. 1A having normal axis orientation of positive polarization.

FIG. 4H shows simplified diagrams of a first bulk acoustic wave resonator structure having four half wavelength thick piezoelectric layers for comparison with a second bulk acoustic wave resonator structure and for comparison with a third bulk acoustic wave resonator structure along with two corresponding charts, with results as expected from simulation.

FIG. 4I shows simplified diagrams of six bulk acoustic wave resonator structures having one to six piezoelectric layers, and either top multilayer metal acoustic reflectors, or top integrated capacitive acoustic reflectors, along with a corresponding chart showing electromechanical coupling versus number of piezoelectric layers for the top multilayer metal acoustic reflectors, and for the top integrated capacitive acoustic reflectors, with results as expected from simulation.

FIG. 4J shows simplified diagrams of six alternative bulk acoustic wave resonator structures having one to six piezoelectric layers, in which piezoelectric layer thickness is alternatively varied, along with a corresponding chart showing electromechanical coupling versus number of piezoelectric layers for the alternatively varied piezoelectric layer thickness, and for piezoelectric layer thickness not being varied from half wavelength thickness, with results as expected from simulation.

FIG. 4K shows simplified diagrams of six additional alternative bulk acoustic wave resonator structures having two to six piezoelectric layers, in which piezoelectric layer thickness is additionally alternatively varied, along with a corresponding chart showing electromechanical coupling versus number of piezoelectric layers for the additionally alternatively varied piezoelectric layer thickness, and for piezoelectric layer thickness not being varied from half wavelength thickness, with results as expected from simulation.

FIG. 4L shows simplified diagrams of six yet additional alternative bulk acoustic wave resonator structures having one to six piezoelectric layers, in which either a first material or a second material is used for the piezoelectric layers, and in which multilayer doped semiconductor reflector electrodes are used, and further shows a corresponding chart showing electromechanical coupling versus number of piezoelectric layers for a first alternative of the first material and a second alternative of the second material being used for the piezoelectric layers, with results as expected from simulation.

FIG. 4M shows three more alternative bulk acoustic wave resonator structures of this disclosure.

FIG. 5 shows a schematic of an example ladder filter using three series resonators of the bulk acoustic wave resonator structure of FIG. 1A, and two mass loaded shunt resonators of the bulk acoustic wave resonator structure of FIG. 1A, along with a simplified view of the three series resonators.

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 and 6A and 7, and the example oscillators shown in FIGS. 8A and 8B.

FIGS. 9C and 9D and 9E and 9F and 9G and 9H are diagrams illustrating respective simulated band pass characteristics of insertion loss versus frequency for example filters, with results as expected from simulation.

FIG. 11A shows a top view of an antenna device of the present disclosure.

FIG. 11B shows a cross sectional view of the antenna device shown in FIG. 11A.

FIG. 11C shows a schematic of a millimeter wave transceiver employing millimeter wave filters and a millimeter wave oscillator respectively employing millimeter wave resonators of this disclosure.

DETAILED DESCRIPTION

Figure 1A:
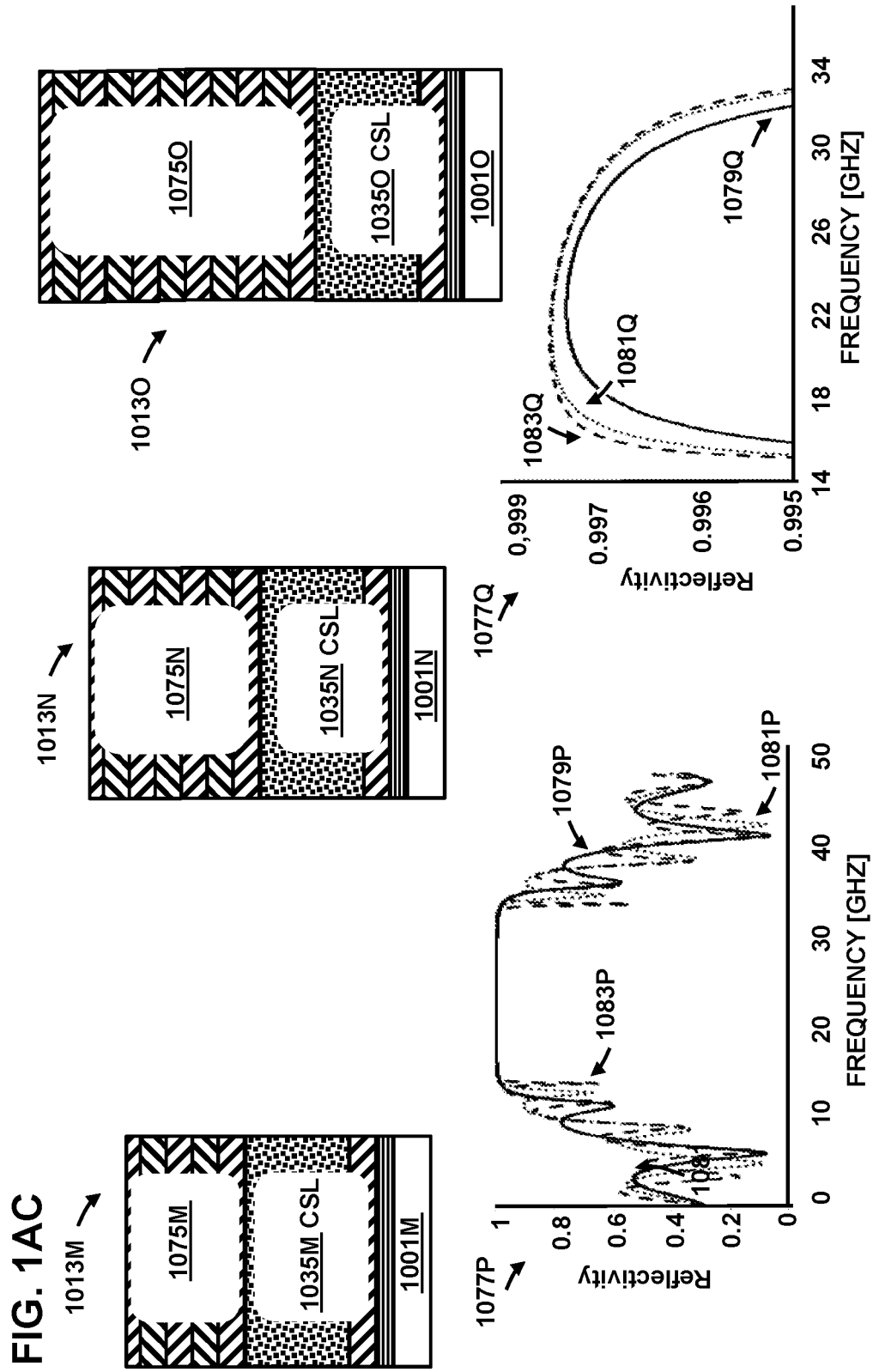
FIG. 1AA shows five simplified diagrams of bulk acoustic wave resonator structures of this disclosure.
Figure 1A:
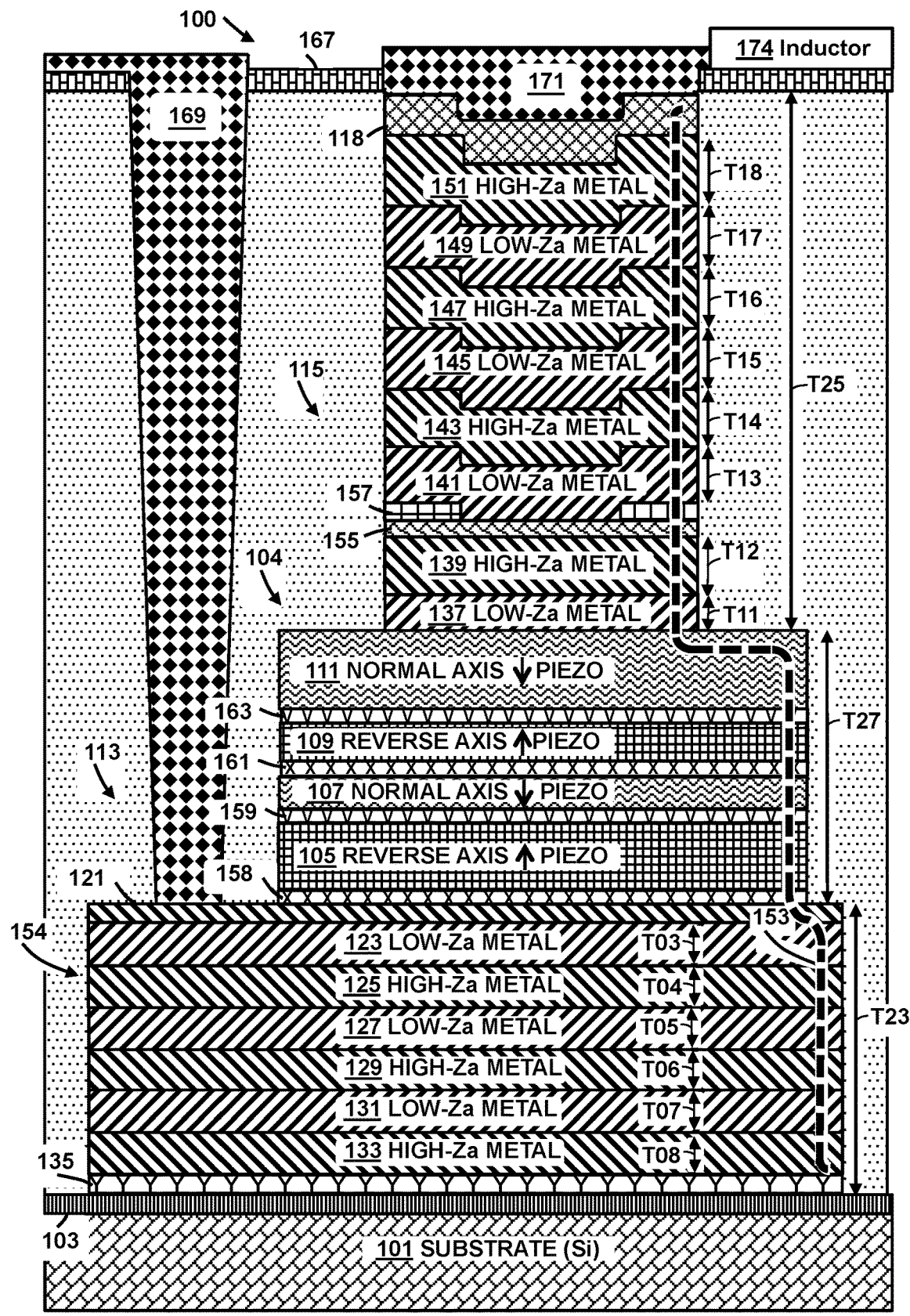

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially canceled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an" and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1AA shows five simplified diagrams of bulk acoustic wave resonator structures 1000A, 1000B, 1000C, 1000D, 1000E. A first bulk acoustic wave resonator structure 1000A may comprise, broadly speaking, an electromechanical coupling limiting layer 1100A. The electromechanical coupling limiting layer 1100A may comprise an integrated capacitive layer, as discussed in greater detail subsequently herein. The integrated capacitive layer may be non-piezoelectric. The electromechanical coupling limiting layer 1100A may comprise a piezoelectric layer having a thickness different (e.g., substantially different) than an integral multiple of a half acoustic wavelength of a main resonant frequency of the bulk acoustic wave resonator structure 1000A, as discussed in greater detail subsequently herein. The electromechanical coupling limiting layer 1100A may comprise a doped piezoelectric layer, as discussed in greater detail subsequently herein. The electromechanical coupling limiting layer 1100A may comprise a piezoelectric layer comprising piezoelectric material having a relatively low electromechanical coupling, as discussed in greater detail subsequently herein.

Further, the foregoing may be used in plurality. Moreover, the foregoing may be used in various different combinations. For example, a second bulk acoustic wave resonator structure 1000B may comprise a plurality of electromechanical coupling limiting layers 1100B (e.g., a plurality of various different electromechanical coupling limiting layers 1100B). For example, the plurality of electromechanical coupling limiting layers 1100B may comprise at least one or more of: an integrated capacitive layer; a piezoelectric layer having a thickness different (e.g., substantially different) than an integral multiple of a half acoustic wavelength of a main resonant frequency of the bulk acoustic wave resonator structure 1000B; a doped piezoelectric layer; and a piezoelectric layer comprising piezoelectric material having a relatively low electromechanical coupling.

FIG. 1AA also shows additional examples of a third bulk acoustic wave resonator structure 1000C, a fourth bulk acoustic wave resonator structure 1000D and a fifth bulk acoustic wave resonator structure 1000E. Bulk acoustic wave resonator structures 1000C through 1000E may comprise respective piezoelectric resonant volumes 1004C through 1004E, e.g., having a plurality of piezoelectric layers, e.g., in which the plurality of piezoelectric layers have respective piezoelectric axes, e.g., in which piezoelectric resonant volumes 1004C through 1004E have respective alternating piezoelectric axes arrangements.

For example, bulk acoustic wave resonator structures 1000C through 1000E may comprise respective piezoelectric resonant volumes, 1004C through 1004E, of an example four layers of piezoelectric material, for example, four layers comprising Aluminum Nitride (AlN) having a wurtzite structure. For example, piezoelectric resonant volumes 1004C through 1004E may comprise a bottom piezoelectric layer, a first middle piezoelectric layer, a second middle piezoelectric layer, and a top piezoelectric layer. The example piezoelectric layers, e.g., example four piezoelectric layers, may be acoustically coupled with one another, for example, in a piezoelectrically excitable resonant mode.

The example four piezoelectric layers of respective piezoelectric resonant volumes 1004C through 1004E may have an alternating axis arrangement in the respective piezoelectric resonant volumes 1004C through 1004E. For example the bottom piezoelectric layer may have a reverse piezoelectric axis orientation, as discussed in greater detail subsequently herein. Next in the alternating axis arrangement of the respective piezoelectric resonant volumes 1004C through 1004E, the first middle piezoelectric layer may have a normal piezoelectric axis orientation. Next in the alternating axis arrangement of the respective piezoelectric resonant volumes 1004C through 1004E, the second middle piezoelectric layer may have the reverse piezoelectric axis. Next in the alternating axis arrangement of the respective piezoelectric resonant volumes 1004C through 1004E, the top piezoelectric layer may have the normal piezoelectric axis orientation.

In the alternating axis arrangement in the respective piezoelectric resonant volumes 1004C through 1004E, respective piezoelectric axes of adjacent piezoelectric layers may substantially oppose one another (e.g., may be antiparallel, e.g, may be substantially antiparallel). For example, the normal piezoelectric axis orientation of the first middle piezoelectric layer may substantially oppose the reverse piezoelectric axis orientation of the bottom piezoelectric layer (e.g, and may substantially oppose the reverse piezoelectric axis orientation of the second middle piezoelectric layer). For example, the reverse piezoelectric axis orientation of the second middle piezoelectric layer may substantially oppose the normal piezoelectric axis orientation of the top piezoelectric layer (e.g, and may substantially oppose the normal piezoelectric axis orientation of the first middle piezoelectric layer).

Respective piezoelectric layers of the example piezoelectric resonant volumes 1004C through 1004E may have respective layer thicknesses, e.g., the bottom piezoelectric layer may have a bottom piezoelectric layer thickness, e.g., the first middle piezoelectric layer may have a first middle piezoelectric layer thickness, e.g., second middle piezoelectric layer may have a second middle piezoelectric layer thickness, e.g., the top piezoelectric layer may have a top piezoelectric layer thickness. For example, more generally, FIG. 1AA shows bulk acoustic wave resonator structure 1000E in simplified view as comprising an alternating axis piezoelectric volume 1004E. This is shown as comprising a first piezoelectric layer having a first axis and a first thickness 1005E, and further comprising a second piezoelectric layer having a second axis and a second thickness 1006E.

Although first and second piezoelectric layers 1005E, 1006E are explicitly shown in simplified view, four or more piezoelectric layers may be included, e.g., bottom piezoelectric layer, e.g., first middle piezoelectric layer, e.g., second middle piezoelectric layer, e.g., top piezoelectric layer.

At least one or more of the piezoelectric layers may have respective thicknesses different (e.g., substantially different) than an integral multiple of a half acoustic wavelength of the main resonant frequency of the bulk acoustic wave resonator structures, e.g, the bottom piezoelectric layer thickness may be greater than the half acoustic wavelength, e.g., the first middle piezoelectric layer thickness may be less than the half acoustic wavelength, e.g., the second middle piezoelectric layer thickness may be less than the half acoustic wavelength, e.g, the top piezoelectric layer thickness may be greater than the half acoustic wavelength. This may (but need not) facilitate limiting electromechanical coupling of the bulk acoustic wave resonator structures.

For example, the bottom piezoelectric layer thickness may be greater (e.g., may be substantially greater) than the integral multiple of the half wavelength of the main resonant frequency. For example, the bottom piezoelectric layer thickness may be greater by about 10% or more of the integral multiple of the half wavelength of the main resonant frequency. For example, the bottom piezoelectric layer thickness may be greater by about 50% or more of the integral multiple of the half wavelength of the main resonant frequency. For example, the bottom piezoelectric layer thickness may be greater by about 90% or more of the integral multiple of the half wavelength of the main resonant frequency.

For example, the first middle piezoelectric layer thickness may be lesser (e.g., may be substantially lesser) than the integral multiple of the half wavelength of the main resonant frequency. For example, the first middle piezoelectric layer thickness may be lesser by about 10% or more of the integral multiple of the half wavelength of the main resonant frequency. For example, the first middle piezoelectric layer thickness may be lesser by about 50% or more of the integral multiple of the half wavelength of the main resonant frequency. For example, the first middle piezoelectric layer thickness may be lesser by about 90% or more of the integral multiple of the half wavelength of the main resonant frequency.

For example, the second middle piezoelectric layer thickness may be lesser (e.g., may be substantially lesser) than the integral multiple of the half wavelength of the main resonant frequency. For example, the second middle piezoelectric layer thickness may be lesser by about 10% or more of the integral multiple of the half wavelength of the main resonant frequency. For example, the second middle piezoelectric layer thickness may be lesser by about 50% or more of the integral multiple of the half wavelength of the main resonant frequency. For example, the second middle piezoelectric layer thickness may be lesser by about 90% or more of the integral multiple of the half wavelength of the main resonant frequency.

For example, the top piezoelectric layer thickness may be greater (e.g., may be substantially greater) than the integral multiple of the half wavelength of the main resonant frequency. For example, the top piezoelectric layer thickness may be greater by about 10% or more of the integral multiple of the half wavelength of the main resonant frequency. For example, the top piezoelectric layer thickness may be greater by about 50% or more of the integral multiple of the half wavelength of the main resonant frequency. For example, the top piezoelectric layer thickness may be greater by about 90% or more of the integral multiple of the half wavelength of the main resonant frequency.

The bottom piezoelectric layer thickness may be different than (e.g., may be greater than, e.g., may be substantially greater than) the first middle piezoelectric layer thickness. The bottom piezoelectric layer thickness may be different than (e.g., may be greater than, e.g., may be substantially greater than) the second middle piezoelectric layer thickness. The top piezoelectric layer thickness may be different than (e.g., may be greater than, e.g., may be substantially greater than) the first middle piezoelectric layer thickness. The top piezoelectric layer thickness may be different than (e.g., may be greater than, e.g., may be substantially greater than) the second middle piezoelectric layer thickness. This may (but need not) facilitate limiting electromechanical coupling of the bulk acoustic wave resonator structures.

Standing wave acoustic energy may be generated in operation of the bulk acoustic wave resonator structures 1000C through 1000E. Piezoelectric layer thickness differences may be sufficiently different to facilitate null placement of standing wave acoustic energy within the piezoelectric layers. For example, the first middle piezoelectric layer thickness may be sufficiently different than the bottom piezoelectric layer thickness to facilitate a first null placement of standing wave acoustic energy within one of the first middle piezoelectric layer and the bottom piezoelectric layer. For example, the second middle piezoelectric layer thickness may be sufficiently different than the bottom piezoelectric layer thickness to facilitate a second null placement of standing wave acoustic energy within one of the second middle piezoelectric layer and the bottom piezoelectric layer. For example, the first middle piezoelectric layer thickness may be sufficiently different than the top piezoelectric layer thickness to facilitate a third null placement of standing wave acoustic energy within one of the first middle piezoelectric layer and the top piezoelectric layer. For example, the second middle piezoelectric layer thickness may be sufficiently different than the top piezoelectric layer thickness to facilitate a fourth null placement of standing wave acoustic energy within one of the second middle piezoelectric layer and the top piezoelectric layer.

A piezoelectric material associated with the piezoelectric layers may have an electromechanical coupling. For example, as mentioned previously, the bottom piezoelectric layer, the first middle piezoelectric layer, the second middle piezoelectric layer, and the top piezoelectric layer may comprise Aluminum Nitride. Aluminum Nitride may have an electromechanical coupling coefficient of about six percent (6%). Piezoelectric layer thickness differences may be sufficiently different to facilitate the electromechanical coupling of the bulk acoustic resonator structures being less (e.g., substantially less, e.g., 10% less, e.g., 50% less, e.g., 90% less) than the electromechanical coupling of the piezoelectric material associated with the piezoelectric layer. For example, piezoelectric layer thickness differences may be sufficiently different to facilitate an electromechanical coupling coefficient of the bulk acoustic resonator structures being less (e.g., substantially less, e.g., 10% less, e.g., 50% less, e.g., 90% less) than the six percent (6%) electromechanical coupling coefficient of the example Aluminum Nitride piezoelectric material, which may be associated with the piezoelectric layer.

Some examples of bulk acoustic wave resonators, and filters employing bulk acoustic wave resonators, of this disclosure may be directed to bulk acoustic millimeter wave resonators, and millimeter wave filters employing bulk acoustic millimeter wave resonators. Given an electromechanical coupling coefficient of Aluminum Nitride (AlN) being approximately six percent (~6%), band pass ladder filters employing Aluminum Nitride based bulk acoustic wave resonators may provide a −3 decibel pass band width of about three percent (3%) of a center millimeter wave frequency of the pass band. For example, for a center millimeter wave frequency of the pass band of about twenty five GigaHertz (25 GHz), the foregoing may provide a −3 decibel pass band width of approximately seven hundred and fifty MegaHertz (750 MHz). However, it is the teaching of this disclosure to provide bulk acoustic millimeter wave resonators that may have electromechanical coupling coefficient of less than six percent (~6%). It is the teaching of this disclosure to provide millimeter wave filters employing bulk acoustic millimeter wave resonators of this disclosure. For example, such millimeter wave filters may comprise band pass millimeter wave filters providing a −3 decibel pass band width of less than three percent (3%) of the center millimeter wave frequency of the pass band. For example, the United States Federal Communications Commission (FCC) millimeter wave spectrum license Auction-102 defined geographically diverse one hundred MegaHertz (100 MHz) channels for millimeter wave bands near twenty-five GigaHertz (25 GHz). One hundred MegaHertz (100 MHz) width of −3 decibel pass bands correspond to approximately four tenths of a percent (~0.4%) of twenty-five GigaHertz (25 GHz), which in turn corresponds to a desired electromechanical coupling coefficient of approximately one percent (~1%) for bulk acoustic millimeter wave resonators. The 3rd Generation Partnership Project standards organization (e.g., 3GPP) has standardized various 5G frequency bands. 3GPP 5G bands configured for fifth generation broadband cellular network (5G) applications may include a 3GPP 5G n258 band (24.25 GHz-27.5 GHz). Thus the approaches of this disclosure to reduce (e.g., limit) electromechanical coupling coefficient of bulk of acoustic millimeter wave resonators (e.g., to reduce/limit electromechanical coupling coefficient of Aluminum Nitride based bulk of acoustic millimeter wave resonators) may be needed.

The additional examples of third bulk acoustic wave resonator structure 1000C, fourth bulk acoustic wave resonator structure 1000D and fifth bulk acoustic wave resonator structure 1000E shown in FIG. 1AA may comprise respective top acoustic reflector electrodes 1015C, 1015D, 1015E, and may further comprise respective bottom acoustic reflector electrodes 1013C, 1013D, 1013E. Bottom acoustic reflector electrodes 1013C, 1013D, 1013E may be arranged over respective seed layers 1003C, 1003D, 1003E. Respective seed layers 1003C, 1003D, 1003E may be interposed between bottom acoustic reflector electrodes 1013C, 1013D, 1013E and respective substrates (e.g., silicon substrates, not shown in FIG. 1AA) of the respective bulk acoustic wave resonator structures 1000C, 1000D, 1000E. Top acoustic reflector electrode 1015C of third bulk acoustic wave resonator structure 1000C may comprise a top reflector layer 1037C (e.g. top metal acoustic reflector electrode layer 1037C, e.g., a plurality of top metal acoustic reflector electrode layers 1037C). The top acoustic reflector electrode 1015C of third bulk acoustic wave resonator structure 1000C may comprise a top integrated capacitor layer 1038C (e.g., top integrated capacitive layer 1038C, e.g., non-piezoelectric top integrated capacitive layer 1038C). The top reflector layer 1037C (e.g. top metal acoustic reflector electrode layer 1037C) may be interposed between the top capacitor layer 1038C and the alternating piezoelectric axis orientation piezoelectric volume 1004C. Similarly, bottom acoustic reflector electrode 1013D of fourth bulk acoustic wave resonator structure 1000D may comprise a bottom reflector layer 1017D (e.g. bottom metal acoustic reflector electrode layer 1017D, e.g., a plurality of bottom metal acoustic reflector electrode layers 1017D). The bottom acoustic reflector electrode 1013D of fourth bulk acoustic wave resonator structure 1000D may comprise a bottom capacitor layer 1018D (e.g., bottom integrated capacitive layer 1018D, e.g., non-piezoelectric bottom integrated capacitive layer 1018D). The bottom reflector layer 1017D (e.g. bottom metal acoustic reflector electrode layer 1017D) may be interposed between the bottom capacitor layer 1018D and the alternating piezoelectric axis orientation piezoelectric volume 1004D. Bottom acoustic reflector electrodes 1013C, 1013D, 1013E may comprise respective bottom current spreading layers 1035C, 1035D, 1035E. Top acoustic reflector electrodes 1015C, 1015D, 1015E may comprise respective top current spreading layers 1071C, 1071D, 1071E. Current spreading layer(s) of this disclosure may comprise aluminum. Current spreading layer(s) of this disclosure may comprise tungsten. Current spreading layers of this disclosure may comprise molybdenum. Current spreading layer(s) of this disclosure may comprise gold. Current spreading layer(s) of this disclosure may comprise silver. Current spreading layer(s) of this disclosure may comprise copper. Current spreading layer(s) of this disclosure may comprise a Back End Of Line (BEOL) metal. Current spreading layer(s) of this disclosure may comprise a Front End Of Line (FEOL) metal.

It is the teaching of this disclosure that acoustic absorption in current spreading layers may be significantly higher than in materials that may be used in metal acoustic reflector electrode layers (e.g., Molybdenum (Mo), e.g., Tungsten (W), e.g., Ruthenium (Ru), e.g., Titanium (Ti)), which may be arranged proximate to the alternating axis piezoelectric volumes 1004C, 1004D, 1004E. Accordingly, metal acoustic reflector electrode layers (e.g., top metal acoustic reflector electrode layer 1037C, e.g., bottom metal acoustic reflector electrode layer 1017D) may be interposed between current spreading layers (e.g., bottom currently spreading layer 1035C, e.g., top current spreading layer 1071D) alternating axis piezoelectric volumes (e.g., alternating axis piezoelectric volume 1004D, e.g., alternating axis piezoelectric volume 1004E). This may facilitate substantial acoustic isolation of the current spreading layers (e.g., bottom currently spreading layer 1035C, e.g., top current spreading layer 1071D) from the alternating axis piezoelectric volumes (e.g., from alternating axis piezoelectric volume 1004D, e.g., from alternating axis piezoelectric volume 1004E).

FIG. 1AB shows six simplified diagrams of multilayer metal acoustic reflector electrodes 1013F through 1013K comprising five metal electrode layers in an alternating acoustic impedance arrangement 1075F through 1075K (e.g, three Tungsten metal electrode layers alternating with two Titanium layers) over current spreading layers (CSLs) 1035F through 1035K. Respective seed layers may be interposed between substrates 1001F through 1001K (e.g., silicon substrates 1001F through 1001K) and current spreading layers (CSLs) 1035F through 1035K. As discussed in detail subsequently herein, current spreading layers (CSLs) 1035F through 1035K may comprise a varying number of additional quarter wavelength current spreading layers for use in bulk acoustic wave resonator structures of this disclosure. FIG. 1AB also includes a chart 1077L showing sheet resistance corresponding to the varying number of additional quarter wavelength current spreading layers for the multilayer metal acoustic reflector electrodes 1013F through 1013K, with results as expected from simulation. The multilayer metal acoustic reflector electrodes 1013F through 1013K shown in FIG. 1AB may be employed in example millimeter acoustic wave resonators (e.g., 24 GigaHertz bulk acoustic wave resonators) of this disclosure, e.g., bulk acoustic wave resonators having main resonant frequencies in a millimeter wave band, e.g., bulk acoustic wave resonators having main resonant frequencies of about 24 GigaHertz. As a general matter, quarter wavelength layer thickness for layers may be understood as corresponding to quarter acoustic wavelength for the main resonant frequency of a given bulk acoustic wave resonator.

For example, a first bottom multilayer metal acoustic reflector electrode 1013F may comprise a first additional quarter wavelength current spreading layer in a first bottom current spreading layer 1035F. First bottom current spreading layer 1035F may be bilayer, for example, comprising a quarter wavelength thick layer of Aluminum (Al) over a quarter wavelength thick layer of Tungsten (W). For example, a second bottom multilayer metal acoustic reflector electrode 1013G may comprise two additional quarter wavelength current spreading layer in a second bottom current spreading layer 1035G. Second bottom current spreading layer 1035G may be bilayer, for example, comprising two quarter wavelength thick layer of Aluminum (Al) over a quarter wavelength thick layer of Tungsten (W). For example, a third bottom multilayer metal acoustic reflector electrode 1013H may comprise three additional quarter wavelength current spreading layer in a third bottom current spreading layer 1035H. Third bottom current spreading layer 1035H may be bilayer, for example, comprising three quarter wavelength thick layer of Aluminum (Al) over a quarter wavelength thick layer of Tungsten (W).

For example, a fourth bottom multilayer metal acoustic reflector electrode 1013I may comprise a fourth additional quarter wavelength current spreading layer in a fourth bottom current spreading layer 1035I. Fourth bottom current spreading layer 1035I may be bilayer, for example, comprising four-quarter wavelength thick layer of Aluminum (Al) over a quarter wavelength thick layer of Tungsten (W). For example, a fifth bottom multilayer metal acoustic reflector electrode 1013J may comprise a sixth additional quarter wavelength current spreading layer in a fifth bottom current spreading layer 1035J. Fifth bottom current spreading layer 1035G may be bilayer, for example, comprising six quarter wavelength thick layer of Aluminum (Al) over a quarter wavelength thick layer of Tungsten (W). For example, a sixth bottom multilayer metal acoustic reflector electrode 1013K may comprise a seventh additional quarter wavelength current spreading layer in a sixth bottom current spreading layer 1035K. Sixth bottom current spreading layer 1035K may be bilayer, for example, comprising seven quarter wavelength thick layer of Aluminum (Al) over a quarter wavelength thick layer of Tungsten (W). Incrementally increasing current spreading layer thickness from the first bottom current spreading layer 1035F to the sixth bottom current spreading layer 1035K may increase thickness, for example may increase current spreading layer thickness of one additional quarter wavelength thickness (e.g., in first bottom current spreading layer 1035F) to seven additional quarter wavelength thickness (e.g., sixth bottom current spreading layer 1035K). This increase in current spreading thickness may increase electrical conductivity, as reflected in decreasing sheet resistance as shown in chart 1077L.

Chart 1077L shows sheet resistance versus varying number of additional quarter wavelength current spreading layers 1079L for the multilayer metal acoustic reflector electrodes 1013F through 1013K, with results as expected from simulation. For example, as shown in chart 1077L, simulation predicts sheet resistance of approximately forty-two hundredths of an Ohm per square corresponding to the multilayer metal acoustic reflector electrode 1013F comprising one additional quarter wavelength (Lambda/4) layer in current spreading layer 1035F. For example, as shown in chart 1077L, simulation predicts sheet resistance of approximately twenty-seven hundredths of an Ohm per square corresponding to the multilayer metal acoustic reflector electrode 1013G comprising two additional quarter wavelength (Lambda/4) layers in current spreading layer 1035G. For example, as shown in chart 1077L, simulation predicts sheet resistance of approximately twenty hundredths of an Ohm per square corresponding to the multilayer metal acoustic reflector electrode 1013H comprising three additional quarter wavelength (Lambda/4) layers in current spreading layer 1035H. For example, as shown in chart 1077L, simulation predicts sheet resistance of approximately fifteen hundredths of an Ohm per square corresponding to the multilayer metal acoustic reflector electrode 1013I comprising four additional quarter wavelength (Lambda/4) layers in current spreading layer 1035I. For example, as shown in chart 1077L, simulation predicts sheet resistance of approximately eleven hundredths of an Ohm per square corresponding to the multilayer metal acoustic reflector electrode 1013J comprising six additional quarter wavelength (Lambda/4) layers in current spreading layer 1035J. For example, as shown in chart 1077L, simulation predicts sheet resistance of approximately nine hundredths of an Ohm per square corresponding to the multilayer metal acoustic reflector electrode 1013K comprising seven additional quarter wavelength (Lambda/4) layers in current spreading layer 1035K.

FIG. 1AC shows three simplified diagrams of multilayer metal acoustic reflector electrodes 1013M through 1013O comprising varying number of metal electrode layers in alternating acoustic impedance arrangements 1075M through 1075O. For example, multilayer metal acoustic reflector electrode 1013M comprises a first arrangement 1075M of a Tungsten metal electrode layer over two alternating pairs of Titanium and Tungsten layers. For example, multilayer metal acoustic reflector electrode 1013N comprises a second arrangement 1075N of a Tungsten metal electrode layer over three alternating pairs of Titanium and Tungsten layers. For example, multilayer metal acoustic reflector electrode 1013O comprises a third arrangement 1075O of a Tungsten metal electrode layer over five alternating pairs of Titanium and Tungsten layers. For example, current spreading layers (CSLs) 1035M through 1035O may be bilayer, for example, comprising six quarter wavelength thick layer of Aluminum (Al) over a quarter wavelength thick layer of Tungsten (W). Respective seed layers may be interposed between substrates 1001M through 1001O (e.g., silicon substrates 1001M through 1001O) and current spreading layers (CSLs) 1035M through 1035O.

Two corresponding charts 1077P, 1077Q show acoustic reflectivity versus acoustic frequency, with results as expected from simulation. Chart 1077P shows wideband acoustic reflectivity in a wideband scale ranging from zero to fifty GigaHertz. Chart 1077Q shows acoustic reflectivity in a scale ranging from fourteen to thirty-four GigaHertz. For example, as depicted in solid line and shown in traces 1079P, 1079Q, simulation predicts a peak reflectivity of about 0.99825 at a frequency of about 22.3 GigaHertz for multilayer metal acoustic reflector electrode 1013M comprising the first arrangement 1075M of the Tungsten metal electrode layer over two alternating pairs of Titanium and Tungsten layers, in which the first arrangement 1075M is over current spreading layer (CSL) 1035M. For example, as depicted in dotted line and shown in traces 1081P, 1081Q, simulation predicts a peak reflectivity of about 0.99846 at a frequency of about 22.1 GigaHertz for multilayer metal acoustic reflector electrode 1013N comprising the second arrangement 1075N of the Tungsten metal electrode layer over three alternating pairs of Titanium and Tungsten layers, in which the second arrangement 1075N is over current spreading layer (CSL) 1035N. For example, as depicted in dashed line and shown in traces 1083P, 1083Q simulation predicts a peak reflectivity of about 0.99848 at a frequency of about 20.7 GigaHertz for multilayer metal acoustic reflector electrode 1013O comprising the third arrangement 1075O of the Tungsten metal electrode layer over five alternating pairs of Titanium and Tungsten layers, in which the third arrangement 1075O is over current spreading layer (CSL) 1035O. As shown in charts 1077P, 1077Q, acoustic reflectivity may increase with increasing number of pairs of alternating acoustic impedance metal layers.

FIG. 1A is a diagram that illustrates an example bulk acoustic wave resonator structure 100. FIGS. 4A through 4G show alternative example bulk acoustic wave resonators, 400A through 400G, to the example bulk acoustic wave resonator structure 100 shown in FIG. 1A. The foregoing are shown in simplified cross sectional views. The resonator structures are formed over a substrate 101, 401A through 401G (e.g., silicon substrate 101, 401A, 401B, 401D through 401F, e.g., silicon carbide substrate 401C). In some examples, the substrate may further comprise a seed layer 103, 403A, 403B, 403D through 403F, formed of, for example, aluminum nitride (AlN), or another suitable material (e.g., silicon dioxide ($SiO_2$), aluminum oxide ($Al_2O_3$), silicon nitride ($Si_3N_4$), amorphous silicon (a-Si), silicon carbide (SiC)), having an example thickness in a range from approximately one hundred Angstroms (100 A) to approximately one micron (1 um) on the silicon substrate. In some other examples, the seed layer 103, 403A, 403B, 403D through 403F may also be at least partially formed of electrical conductivity enhancing material such as Aluminum (Al) or Gold (Au). For example, the seed layer 103, 403A, 403B, 403D through 403F may comprise aluminum nitride (AlN) over a bottom current spreading layer (CSL) of electrical conductivity enhancing material such as Aluminum (Al) or Gold (Au). As mentioned previously current spreading layers (CSLs) may be bilayers, for example Aluminum over Tungsten. For example, FIG. 1A and FIGS. 4A, 4B, and 4D through 4F show bottom current spreading layers 135, 435A, 435B, 435D, 435E, and 435F over seed layers 103, 403A, 403B, 403D, 403E and 403F.

The example resonators 100, 400A through 400G, include a respective stack 104, 404A through 404G, of an example four layers of piezoelectric material, for example, four layers of Aluminum Nitride (AlN) having a wurtzite structure. For example, FIG. 1A and FIGS. 4A through 4G show a bottom piezoelectric layer 105, 405A through 405G, a first middle piezoelectric layer 107, 407A through 407G, a second middle piezoelectric layer 109, 409A through 409G, and a top piezoelectric layer 111, 411A through 411G. A mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may comprise bottom piezoelectric layer 105, 405A through 405G. The mesa structure 104, 404A through 404G (e.g., first mesa structure 104, 404A through 404G) may comprise first middle piezoelectric layer 107, 407A through 407G. The mesa structure 104, 404A through 404G (e.g., first mesa structure 104, 404A through 404G) may comprise second middle piezoelectric layer 109, 409A through 409G. The mesa structure 104, 404A through 404G (e.g., first mesa structure 104, 404A through 404G) may comprise top piezoelectric layer 111, 411A through 411G. Although piezoelectric aluminum nitride may be used, alternative examples may comprise alternative piezoelectric materials, e.g., doped Aluminum Nitride, e.g., Zinc Oxide, e.g., Lithium Niobate, e.g., Lithium Tantalate, e.g., Gallium Nitride, e.g., Aluminum Gallium Nitride.

The example four layers of piezoelectric material in the respective stack 104, 404A through 404G of FIG. 1A and FIGS. 4A through 4G may have an alternating axis arrangement in the respective stack 104, 404A through 404G. For example the bottom piezoelectric layer 105, 405A through 405G may have a reverse axis orientation, which is depicted in the figures using an upward directed arrow. Next in the alternating axis arrangement of the respective stack 104, 404A through 404G, the first middle piezoelectric layer 107, 407A through 407G may have a normal axis orientation, which is depicted in the figures using a downward directed arrow. Next in the alternating axis arrangement of the respective stack 104, 404A through 404G, the second middle piezoelectric layer 109, 409A through 409G may have the reverse axis orientation, which is depicted in the figures using the upward directed arrow. Next in the alternating axis arrangement of the respective stack 104, 404A through 404G, the top piezoelectric layer 111, 411A through 411G may have the normal axis orientation, which is depicted in the figures using the downward directed arrow.

For example, polycrystalline thin film MN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, a first polarizing layer (e.g., an Aluminum Oxynitride layer, e.g., a first polarizing layer comprising oxygen, e.g., a first polarizing layer comprising Aluminum Oxynitride) may reverse the axis orientation of the piezoelectric layer to a crystallographic c-axis positive polarization, or reverse axis, orientation perpendicular relative to the substrate surface.

For example, as shown in FIG. 1A and FIGS. 4A through 4G, a first piezoelectric layer (e.g., a bottom piezoelectric layer 105, 405A through 405G) may interface with (e.g., may be sputter deposited on) the first polarizing layer (e.g., first polarizing layer 158, 458A through 458G) to facilitate (e.g., to determine) the reverse axis orientation of the first piezoelectric layer (e.g., to facilitate/determine the reverse axis orientation of the bottom piezoelectric layer 105, 405A through 405G). For example, the first polarizing layer may be a first polarizing seed layer (e.g., first polarizing seed layer 158, 458A through 458G) to facilitate orienting the reverse axis orientation of the first piezoelectric layer (e.g., to facilitate orienting the reverse axis orientation of the bottom piezoelectric layer 105, 405A through 405G), as the first piezoelectric layer interfaces with (e.g., may be sputter deposited on) the first polarizing layer. The first polarizing layer 158, 458A through 458G may be a first polarizing interposer layer 158, 458A through 458G, e.g., interposed between bottom piezoelectric layer 105, 405A through 405G and substrate 101, 401A through 401G.

The first polarizing layer (e.g., first polarizing layer 158, 458A through 458G, e.g., first polarizing seed layer 158, 458A through 458G) may comprise oxygen (e.g., may comprise an oxygen nitride, e.g., may comprise an aluminum oxynitride). Alternatively or additionally the first polarizing layer (e.g., first polarizing layer 158, 458A through 458G, e.g., first polarizing seed layer 158, 458A through 458G) may comprise Aluminum Silicon Nitride (e.g., AlSiN). For example, percentage of Silicon of the Aluminum Silicon Nitride (e.g., AlSiN) may be less than about fifteen (15) percent. Alternatively or additionally the first polarizing layer (e.g., first polarizing layer 158, 458A through 458G, e.g., first polarizing seed layer 158, 458A through 458G) may comprise a nitride comprising Aluminum and Silicon Magnesium, e.g., Al(SiMg)N, in which a ratio of Magnesium to Silicon may be less than 1 (Mg/Si ratio <1), e.g., Al(SiMg)N, in which a ratio of Magnesium to Silicon may be less than 0.3 (Mg/Si ratio <0.3), e.g., Al(SiMg)N, in which a ratio of Magnesium to Silicon may be greater than 0.2 (Mg/Si ratio >0.2), e.g., Al(SiMg)N, in which a ratio of Magnesium to Silicon may be greater than 0.15 (Mg/Si ratio >0.15). Alternatively or additionally the first polarizing layer (e.g., first polarizing layer 158, 458A through 458G, e.g., first polarizing seed layer 158, 458A through 458G) may comprise a ferroelectric (e.g., a ferroelectric comprising Aluminum, e.g., a ferroelectric comprising Nitrogen, e.g., a ferroelectric comprising Scandium, e.g., a ferroelectric comprising Aluminum Scandium Nitride, e.g., a layer comprising Aluminum and Scandium and Nitride in which percentage of Scandium may be sufficiently high to make the layer comprising Aluminum and Scandium and Nitride ferroelectric, e.g., a layer comprising Aluminum and Scandium and Nitride in which percentage of Aluminum may be sufficiently low to make the layer comprising Aluminum and Scandium and Nitride ferroelectric, e.g., a ferroelectric comprising Sc(x)Al(1−x)N in which x may be about 0.27 or higher, and in which (1−x) may be about 0.73 or lower, e.g., a layer comprising Aluminum and Scandium and Nitogen in which percentage of Scandium may be about twenty-seven percent or higher, e.g., a layer comprising Aluminum and Scandium and Nitrogen in which percentage of Aluminum may be about seventy three percent or lower, e.g., a layer comprising Aluminum and Scandium and Nitrogen in which a ratio of Scandium to Aluminum composition may be about 0.27/0.73 or higher).

The first polarizing layer 158, 458A through 458G may have suitable thickness, for example, taking into account acoustic material properties to facilitate performance of the piezoelectric stack 104, 404A through 404G of the bulk acoustic wave resonators 100, 400A through 400G. For example, resonator fabrication and testing may facilitate determining suitable thickness, for example, taking into account acoustic material properties to facilitate performance of the piezoelectric stack 104, 404A through 404G of the bulk acoustic wave resonators 100, 400A through 400G. Alternatively or additionally Finite Element Modeling (FEM) simulations and varying parameters in fabrication prior to subsequent testing may help to optimize first polarizing layer 158, 458A through 458G thickness and material designs for the piezoelectric stack 104, 404A through 404G. A minimum thickness for first polarizing layer 158, 458A through 458G may be about one mono-layer, or about five Angstroms (5 A). The first polarizing layer 158, 458A through 458G thickness may be less than about five-hundred Angstroms (500 A) for a twenty-four Gigahertz (24 GHz) resonator design, with thickness scaling inversely with frequency for alternative resonator designs.

As shown in FIG. 1A and FIGS. 4A through 4G, a second polarizing layer (e.g., second polarizing layer 159, 459A through 459G) may be arranged over (e.g., may be sputter deposited on) the first piezoelectric layer (e.g., the bottom piezoelectric layer 105, 405A through 405G). A second piezoelectric layer (e.g., a first middle piezoelectric layer 107, 407A through 407G) may interface with (e.g., may be sputter deposited on) the second polarizing layer (e.g., second polarizing layer 159, 459A through 459G) to facilitate (e.g., to determine) the normal axis orientation of the second piezoelectric layer (e.g., to facilitate/determine the normal axis orientation of the first middle piezoelectric layer 107, 407A through 407G). For example, the second polarizing layer may be a second polarizing seed layer (e.g., second polarizing seed layer 159, 459A through 459G) to facilitate orienting the normal axis orientation of the second piezoelectric layer (e.g., to facilitate orienting the normal axis orientation of the first middle piezoelectric layer 107, 407A through 407G), as the second piezoelectric layer interfaces with (e.g., may be sputter deposited on) the second polarizing layer. The second polarizing layer 159, 459A through 459G may be a second polarizing interposer layer, e.g., interposed between e.g., sandwiched between, the first middle piezoelectric layer 107, 407A through 407G and the bottom piezoelectric layer 105, 405A through 405G.

The second polarizing layer 159, 459A through 459G may comprise metal. For example, second polarizing layer 159, 459A through 459G may comprise Titanium (Ti). For example, second polarizing layer 159, 459A through 459G may comprise relatively high acoustic impedance metal (e.g., relatively high acoustic impedance metals e.g., Tungsten (W), e.g., Molybdenum (Mo), e.g., Ruthenium (Ru)).

The second polarizing layer 159, 459A through 459G may comprise a dielectric (e.g. second polarizing dielectric layer 159, 459A through 459G). The second polarizing layer 159, 459A through 459G may comprise Aluminum Oxide, e.g., $Al_2O_3$ (or other stoichiometry). The second polarizing layer 159, 459A through 459G may comprise Aluminum and may comprise Magnesium and may comprise Silicon, e.g, AlMgSi. The second polarizing layer 159, 459A through 459G may comprise nitrogen, e.g, Al(SiMg)N (e.g., with Mg/Si ratio >1). For example, second polarizing layer 159, 459A through 459G may comprise a dielectric that has a positive acoustic velocity temperature coefficient, e.g., to facilitate acoustic velocity increasing with increasing temperature of the dielectric. The second polarizing layer 159, 459A through 459G may comprise, for example, silicon dioxide.

The second polarizing layer 159, 459A through 459G may comprise a nitride. The second polarizing layer 159, 459A through 459G may comprise a doped nitride. The second polarizing layer 159, 459A through 459G may comprise Aluminum Nitride doped with a suitable percentage of a suitable dopant (e.g., Scandium, e.g., Magnesium Zirconium, e.g., Magnesium Hafnium, e.g., Magnesium Niobium). For example, the second polarizing layer 159, 459A through 459G may comprise Aluminum Scandium Nitride (AlScN). For example, Scandium doping of Aluminum Nitride may be within a range from a fraction of a percent of Scandium to thirty percent Scandium. For example, Magnesium Zirconium doping of Aluminum nitride may be within a range from a fraction of a percent of Magnesium and a fraction of a percent of Zirconium to for example twenty percent or less of Magnesium and to twenty percent or less of Zirconium, for example Al(Mg0.5Zr0.5)0.25N). For example, Magnesium Hafnium doping of Aluminum nitride may be within a range from a fraction of a percent of Magnesium and a fraction of a percent of Hafnium to for example twenty percent or less of Magnesium and twenty percent or less of Hafnium, for example e.g., Al(Mg0.5Hf0.5)0.25N. For example, Magnesium Niobium doping of Aluminum nitride may be within a range from a fraction of a percent of Magnesium and a fraction of a percent of Niobium to for example forty percent or less of Magnesium and forty percent or less of Niobium, for example e.g., Al(Mg0.5Nb0.5)0.8N.

The second polarizing layer 159, 459A through 459G may comprise a semiconductor. The second polarizing layer 159, 459A through 459G may comprise doped Aluminum Nitride, as just discussed. The second polarizing layer 159, 459A through 459G may comprise sputtered Silicon, e.g., may comprise amorphous Silicon, e.g., may comprise polycrystalline Silicon, which may be dry etched using Fluorine chemistry.

The second polarizing layer 159, 459A through 459G may have suitable thickness, for example, taking into account acoustic material properties to facilitate performance of the piezoelectric stack 104, 404A through 404G of the bulk acoustic wave resonators 100, 400A through 400G. For example, resonator fabrication and testing may facilitate determining suitable thickness, for example, taking into account acoustic material properties to facilitate performance of the piezoelectric stack 104, 404A through 404G of the bulk acoustic wave resonators 100, 400A through 400G. Alternatively or additionally Finite Element Modeling (FEM) simulations and varying parameters in fabrication prior to subsequent testing may help to optimize second polarizing layer 159, 459A through 459G thickness and material designs for the piezoelectric stack 104, 404A through 404G. A minimum thickness for second polarizing layer 159, 459A through 459G may be about one monolayer, or about five Angstroms (5 A). The second polarizing layer 159, 459A through 459G thickness may be greater or less than about five-hundred Angstroms (500 A) for a twenty-four Gigahertz (24 GHz) resonator design, with thickness scaling inversely with frequency for alternative resonator designs.

As shown in FIG. 1A and FIGS. 4A through 4G, a third polarizing layer (e.g., third polarizing layer 161, 461A through 461G) may be arranged over (e.g., may be sputter deposited on) the second piezoelectric layer (e.g., the first middle piezoelectric layer 107, 407A through 407G). As shown in FIG. 1A and FIGS. 4A through 4G, a third piezoelectric layer (e.g., second middle piezoelectric layer 109, 409A through 409G) may interface with (e.g., may be sputter deposited on) the third polarizing layer (e.g., third polarizing layer 161, 461A through 461G) to facilitate (e.g., to determine) the reverse axis orientation of the third piezoelectric layer (e.g., to facilitate/determine the reverse axis orientation of the second middle piezoelectric layer 109, 409A through 409G). For example, the third polarizing layer may be a third polarizing seed layer (e.g., third polarizing seed layer 161, 461A through 461G) to facilitate orienting the reverse axis orientation of the third piezoelectric layer (e.g., to facilitate orienting the reverse axis orientation of the second middle piezoelectric layer 109, 409A through 409G), as the third piezoelectric layer interfaces with (e.g., may be sputter deposited on) the third polarizing layer. The third polarizing layer 161, 461A through 461G may be a third polarizing interposer layer 161, 461A through 461G, e.g., interposed between second middle piezoelectric layer 109, 409A through 409G and the first middle piezoelectric layer 107, 407A through 407G, e.g., sandwiched between second middle piezoelectric layer 109, 409A through 409G and the first middle piezoelectric layer 107, 407A through 407G.

Both third polarizing layer 161, 461A through 461G and first polarizing layer 158, 458A through 458G are generally directed to facilitating (e.g., to determining) the reverse axis orientation. Accordingly, previous discussions herein about suitable materials and thickness for the first polarizing layer 158, 458A through 458G may likewise be applicable to third polarizing layer 161, 461A through 461G. For brevity and clarity, such discussions are referenced and incorporated rather than repeated in full.

As shown in FIG. 1A and FIGS. 4A through 4G, a fourth polarizing layer (e.g., fourth polarizing layer 163, 463A through 463G) may be arranged over (e.g., may be sputter deposited on) the third piezoelectric layer (e.g., the second middle piezoelectric layer 109, 409A through 409G). A fourth piezoelectric layer (e.g., a top piezoelectric layer 111, 411A through 411G) may interface with (e.g., may be sputter deposited on) the fourth polarizing layer (e.g., fourth polarizing layer 163, 463A through 463G) to facilitate (e.g., to determine) the normal axis orientation of the fourth piezoelectric layer (e.g., to facilitate/determine the normal axis orientation of the top piezoelectric layer 107, 407A through 407G). For example, the fourth polarizing layer may be a fourth polarizing seed layer (e.g., fourth polarizing seed layer 163, 463A through 463G) to facilitate orienting the normal axis orientation of the fourth piezoelectric layer (e.g., to facilitate orienting the normal axis orientation of the top piezoelectric layer 107, 407A through 407G), as the fourth piezoelectric layer interfaces with (e.g., may be sputter deposited on) the fourth polarizing layer. The fourth polarizing layer 163, 463A through 463G may be a fourth polarizing interposer layer, e.g., interposed between e.g., sandwiched between, the second middle piezoelectric layer 109, 409A through 409G and the top piezoelectric layer 111, 411A through 411G.

Both fourth polarizing layer 163, 463A through 463G and second polarizing layer 159, 459A through 459G are generally directed to facilitating (e.g., to determining) the normal axis orientation. Accordingly, previous discussions herein about suitable materials and thickness for the second polarizing layer 159, 459A through 459G may likewise be applicable to fourth polarizing layer 163, 463A through 463G. For brevity and clarity, such discussions are referenced and incorporated rather than repeated in full.

In the example resonators 100, 400A through 400G, of FIG. 1A and FIGS. 4A through 4G, the bottom piezoelectric layer 105, 405A through 405G, may have a piezoelectrically excitable resonance mode (e.g., main resonance mode) at a resonant frequency (e.g., main resonant frequency) of the example resonators. Similarly, the first middle piezoelectric layer 107, 407A through 407G, may have its piezoelectrically excitable resonance mode (e.g., main resonance mode) at the resonant frequency (e.g., main resonant frequency) of the example resonators. Similarly, the second middle piezoelectric layer 109, 409A through 409G, may have its piezoelectrically excitable resonance mode (e.g., main resonance mode) at the resonant frequency (e.g., main resonant frequency) of the example resonators. Similarly, the top piezoelectric layer 111, 411A through 411G, may have its piezoelectrically excitable main resonance mode (e.g., main resonance mode) at the resonant frequency (e.g., main resonant frequency) of the example resonators. Accordingly, the top piezoelectric layer 111, 411A through 411G, may have its piezoelectrically excitable main resonance mode (e.g., main resonance mode) at the resonant frequency (e.g., main resonant frequency) with the bottom piezoelectric layer 105, 405A through 405G, the first middle piezoelectric layer 107, 407A through 407G, and the second middle piezoelectric layer 109, 409A through 409G.

The bottom piezoelectric layer 105, 405A through 405G, may be acoustically coupled with the first middle piezoelectric layer 107, 407A through 407G, in the piezoelectrically excitable resonance mode (e.g., main resonance mode) at the resonant frequency (e.g., main resonant frequency) of the example resonators 100, 400A through 400G. The reverse axis of bottom piezoelectric layer 105, 405A through 405G, in opposing the normal axis of the first middle piezoelectric layer 107, 407A through 407G, may cooperate for the piezoelectrically excitable resonance mode (e.g., main resonance mode) at the resonant frequency (e.g., main resonant frequency) of the example resonators. The first middle piezoelectric layer 107, 407A through 407G, may be sandwiched between the bottom piezoelectric layer 105, 405A through 405G, and the second middle piezoelectric layer 109, 409A through 409G, for example, in the alternating axis arrangement in the respective stack 104, 404A through 404G. For example, the normal axis of the first middle piezoelectric layer 107, 407A through 407G, may oppose the reverse axis of the bottom piezoelectric layer 105, 405A through 405G, and the reverse axis of the second middle piezoelectric layer 109, 409A-409G. In opposing the reverse axis of the bottom piezoelectric layer 105, 405A through 405G, and the reverse axis of the second middle piezoelectric layer 109, 409A through 409G, the normal axis of the first middle piezoelectric layer 107, 407A through 407G, may cooperate for the piezoelectrically excitable resonance mode (e.g., main resonance mode) at the resonant frequency (e.g., main resonant frequency) of the example resonators.

The second middle piezoelectric layer 109, 409A through 409G, may be sandwiched between the first middle piezoelectric layer 107, 407A through 407G, and the top piezoelectric layer 111, 411A through 411G, for example, in the alternating axis arrangement in the respective stack 104, 404A through 404G. For example, the reverse axis of the second middle piezoelectric layer 109, 409A through 409G, may oppose the normal axis of the first middle piezoelectric layer 107, 407A through 407G, and the normal axis of the top piezoelectric layer 111, 411A through 411G. In opposing the normal axis of the first middle piezoelectric layer 107, 407A through 407G, and the normal axis of the top piezoelectric layer 111, 411A through 411G, the reverse axis of the second middle piezoelectric layer 109, 409A through 409G, may cooperate for the piezoelectrically excitable resonance mode (e.g., main resonance mode) at the resonant frequency (e.g., main resonant frequency) of the example resonators. Similarly, the alternating axis arrangement of the bottom piezoelectric layer 105, 405A through 405G, and the first middle piezoelectric layer 107, 407A through 407G, and the second middle piezoelectric layer 109, 409A through 409G, and the top piezoelectric layer 111, 411A-411G, in the respective stack 104, 404A through 404G may cooperate for the piezoelectrically excitable resonance mode (e.g., main resonance mode) at the resonant frequency (e.g., main resonant frequency) of the example resonators. Despite differing in their alternating axis arrangement in the respective stack 104, 404A through 404G, the bottom piezoelectric layer 105, 405A through 405G and the first middle piezoelectric layer 107, 407A through 407G, and the second middle piezoelectric layer 109, 409A through 409G, and the top piezoelectric layer 111, 411A through 411G, may all comprise the same piezoelectric material, e.g., Aluminum Nitride (AlN).

Respective piezoelectric layers of example piezoelectric resonant volumes, e.g., piezoelectric stacks 104, 404A through 404G, may have respective layer thicknesses, e.g., the bottom piezoelectric layer 105, 405A through 405G may have bottom piezoelectric layer thickness, e.g., the first middle piezoelectric layer 107, 407A through 407G may have first middle piezoelectric layer thickness, e.g., second middle piezoelectric layer 109, 409A through 409G may have second middle piezoelectric layer thickness, e.g., top piezoelectric layer 111, 411A through 411G may have top piezoelectric layer thickness. At least one or more of the piezoelectric layers may have respective thicknesses different (e.g., substantially different) than an integral multiple of a half acoustic wavelength of the main resonant frequency of the example bulk acoustic wave resonators 100, 400A through 400G, e.g, the bottom piezoelectric layer thickness may be greater than the half acoustic wavelength, e.g., the first middle piezoelectric layer thickness may be less than the half acoustic wavelength, e.g., the second middle piezoelectric layer thickness may be less than the half acoustic wavelength, e.g, the top piezoelectric layer thickness may be greater than the half acoustic wavelength. This may (but need not) facilitate limiting electromechanical coupling of the example bulk acoustic wave resonators 100, 400A through 400G.

For example, the bottom piezoelectric layer thickness may be greater (e.g., may be substantially greater) than the integral multiple of the half wavelength of the main resonant frequency. For example, the bottom piezoelectric layer thickness may be greater by about 10% or more of the integral multiple of the half wavelength of the main resonant frequency. For example, the bottom piezoelectric layer thickness may be greater by about 50% or more of the integral multiple of the half wavelength of the main resonant frequency. For example, the bottom piezoelectric layer thickness may be greater by about 90% or more of the integral multiple of the half wavelength of the main resonant frequency.

For example, the first middle piezoelectric layer thickness may be lesser (e.g., may be substantially lesser) than the integral multiple of the half wavelength of the main resonant frequency. For example, the first middle piezoelectric layer thickness may be lesser by about 10% or more of the integral multiple of the half wavelength of the main resonant frequency. For example, the first middle piezoelectric layer thickness may be lesser by about 50% or more of the integral multiple of the half wavelength of the main resonant frequency. For example, the first middle piezoelectric layer thickness may be lesser by about 90% or more of the integral multiple of the half wavelength of the main resonant frequency.

For example, the second middle piezoelectric layer thickness may be lesser (e.g., may be substantially lesser) than the integral multiple of the half wavelength of the main resonant frequency. For example, the second middle piezoelectric layer thickness may be lesser by about 10% or more of the integral multiple of the half wavelength of the main resonant frequency. For example, the second middle piezoelectric layer thickness may be lesser by about 50% or more of the integral multiple of the half wavelength of the main resonant frequency. For example, the second middle piezoelectric layer thickness may be lesser by about 90% or more of the integral multiple of the half wavelength of the main resonant frequency.

For example, the top piezoelectric layer thickness may be greater (e.g., may be substantially greater) than the integral multiple of the half wavelength of the main resonant frequency. For example, the top piezoelectric layer thickness may be greater by about 10% or more of the integral multiple of the half wavelength of the main resonant frequency. For example, the top piezoelectric layer thickness may be greater by about 50% or more of the integral multiple of the half wavelength of the main resonant frequency. For example, the top piezoelectric layer thickness may be greater by about 90% or more of the integral multiple of the half wavelength of the main resonant frequency.

The bottom piezoelectric layer thickness may be different than (e.g., may be greater than, e.g., may be substantially greater than) the first middle piezoelectric layer thickness. The bottom piezoelectric layer thickness may be different than (e.g., may be greater than, e.g., may be substantially greater than) the second middle piezoelectric layer thickness. The top piezoelectric layer thickness may be different than (e.g., may be greater than, e.g., may be substantially greater than) the first middle piezoelectric layer thickness. The top piezoelectric layer thickness may be different than (e.g., may be greater than, e.g., may be substantially greater than) the second middle piezoelectric layer thickness. This may (but need not) facilitate limiting electromechanical coupling of the example bulk acoustic wave resonators 100, 400A through 400G.

Standing wave acoustic energy may be generated in operation of the example bulk acoustic wave resonators 100, 400A through 400G. Piezoelectric layer thickness differences may be sufficiently different to facilitate null placement of standing wave acoustic energy within the piezoelectric layers. For example, the first middle piezoelectric layer thickness may be sufficiently different than the bottom piezoelectric layer thickness to facilitate a first null placement of standing wave acoustic energy within one of first middle piezoelectric layer 107, 407A through 407G and the bottom piezoelectric layer 105, 405A through 405G. For example, the second middle piezoelectric layer thickness may be sufficiently different than the bottom piezoelectric layer thickness to facilitate a second null placement of standing wave acoustic energy within one of the second middle piezoelectric layer 109, 409A through 409G and bottom piezoelectric layer 105, 405A through 405G. For example, the first middle piezoelectric layer thickness may be sufficiently different than the top piezoelectric layer thickness to facilitate a third null placement of standing wave acoustic energy within one of the first middle piezoelectric layer 107, 407A through 407G and top piezoelectric layer 111, 411A through 411G. For example, the second middle piezoelectric layer thickness may be sufficiently different than the top piezoelectric layer thickness to facilitate a fourth null placement of standing wave acoustic energy within one of the second middle piezoelectric layer 109, 409A through 409G and the top piezoelectric layer 111, 411A through 411G.

A piezoelectric material associated with the piezoelectric layers may have an electromechanical coupling. For example, as mentioned previously, bottom piezoelectric layer 105, 405A through 405G, first middle piezoelectric layer 107, 407A through 407G, second middle piezoelectric layer 109, 409A through 409G, and top piezoelectric layer 111, 411A through 411G may comprise Aluminum Nitride. Aluminum Nitride may have an electromechanical coupling coefficient of about six percent (6%). Piezoelectric layer thickness differences may be sufficiently different to facilitate the electromechanical coupling of the bulk acoustic resonators 100, 400A through 400G being less (e.g., substantially less, e.g., 10% less, e.g., 50% less, e.g., 90% less)

than the electromechanical coupling of the piezoelectric material associated with the piezoelectric layer. For example, piezoelectric layer thickness differences may be sufficiently different to facilitate an electromechanical coupling coefficient of the bulk acoustic resonators 100, 400A through 400G being less (e.g., substantially less, e.g., 10% less, e.g., 50% less, e.g., 90% less) than the six percent (6%) electromechanical coupling coefficient of the example Aluminum Nitride piezoelectric material, which may be associated with the piezoelectric layer.

A sum of the first thickness of first piezoelectric layer (e.g., bottom layer thickness of bottom piezoelectric layer 105, 405A through 405G) and a third thickness of the second piezoelectric layer (e.g., thickness of first middle layer 107, 407A through 407G) may approximate an integral multiple a wavelength of the main resonant frequency of the example bulk acoustic wave resonators 100, 400A through 400G. For example, for a twenty-four gigahertz (e.g., 24 GHz) main resonant frequency of the example resonators, this sum may correspond to about one wavelength (e.g., about one acoustic wavelength) of the main resonant frequency, and may be about four thousand Angstroms (4000 A).

Similarly, a sum of the first thickness of first piezoelectric layer (e.g., bottom layer thickness of bottom piezoelectric layer 105, 405A through 405G) and thickness of the third piezoelectric layer (e.g., thickness of second middle layer 109, 409A through 409G) may approximate an integral multiple a wavelength of the main resonant frequency of the example bulk acoustic wave resonators 100, 400A through 400G. For example, for a twenty-four gigahertz (e.g., 24 GHz) main resonant frequency of the example resonators, this sum may correspond to about one wavelength (e.g., about one acoustic wavelength) of the main resonant frequency, and may be about four thousand Angstroms (4000 A).

A sum of the fourth thickness of fourth piezoelectric layer (e.g., top layer thickness of top piezoelectric layer 111, 411A through 411G) and thickness of the second piezoelectric layer (e.g., thickness of first middle layer 107, 407A through 407G) may approximate an integral multiple a wavelength of the main resonant frequency of the example bulk acoustic wave resonators 100, 400A through 400G. For example, for a twenty-four gigahertz (e.g., 24 GHz) main resonant frequency of the example resonators, this sum may correspond to about one wavelength (e.g., about one acoustic wavelength) of the main resonant frequency, and may be about four thousand Angstroms (4000 A).

Similarly, a sum of the fourth thickness of fourth piezoelectric layer (e.g., top layer thickness of top piezoelectric layer 111, 411A through 411G) and thickness of the third piezoelectric layer (e.g., thickness of second middle layer 109, 409A through 409G) may approximate an integral multiple a wavelength of the main resonant frequency of the example bulk acoustic wave resonators 100, 400A through 400G. For example, for a twenty-four gigahertz (e.g., 24 GHz) main resonant frequency of the example resonators, this sum may correspond to about one wavelength (e.g., about one acoustic wavelength) of the main resonant frequency, and may be about four thousand Angstroms (4000 A).

In the examples of this disclosure, piezoelectric layer thickness may be scaled up or down to determine main resonant frequency. For example, respective piezoelectric layers (e.g., respective layers of piezoelectric material) in the piezoelectric stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a Super High Frequency (SHF) band or an Extremely High Frequency (EHF) band (e.g., respective resonant frequencies that are in a Super High Frequency (SHF) band, e.g., respective resonant frequencies that are in an Extremely High Frequency (EHF) band). For example, respective layers of piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a millimeter wave band.

The example resonators 100, 400A through 400G, of FIG. 1A and FIGS. 4A through 4G may comprise: a bottom acoustic reflector 113, 413A through 413G, including an acoustically reflective bottom electrode stack of a plurality of bottom metal electrode layers; and a top acoustic reflector 115, 415A through 415G, including an acoustically reflective top electrode stack of a plurality of top metal electrode layers. Accordingly, the bottom acoustic reflector 113, 413A through 413G, may be a bottom multilayer acoustic reflector, and the top acoustic reflector 115, 415A through 415G, may be a top multilayer acoustic reflector. The piezoelectric layer stack 104, 404A through 404G, may be sandwiched between the plurality of bottom metal electrode layers of the bottom acoustic reflector 113, 413A through 413G, and the plurality of top metal electrode layers of the top acoustic reflector 115, 415A through 415G. For example, top acoustic reflector electrode 115, 415A through 415G and bottom acoustic reflector electrode 113, 413A through 413G may abut opposite sides of a resonant volume 104, 404A through 404G (e.g., piezoelectric layer stack 104, 404A through 404G) free of any interposing electrode. The piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency). For example, such excitation may be done by using the plurality of bottom metal electrode layers of the bottom acoustic reflector 113, 413A through 413G and the plurality of top metal electrode layers of the top acoustic reflector 115, 415A through 415G to apply an oscillating electric field having a frequency corresponding to the resonant frequency (e.g., main resonant frequency) of the piezoelectric layer stack 104, 404A through 404G, and of the example resonators 100, 400A through 400G.

For example, the bottom piezoelectric layer 105, 405A through 405G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G, may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G, acoustically coupled with the first middle piezoelectric layer 107, 407A through 407G. Additionally, the first middle piezoelectric layer 107, 407A-407G, may be sandwiched between the bottom piezoelectric layer 105, 405A through 405G and the second middle piezoelectric layer 109, 409A through 409G, and may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

The acoustically reflective bottom electrode stack of the plurality of bottom metal electrode layers of the bottom acoustic reflector 113, 413A through 413G, may have an alternating arrangement of low acoustic impedance metal layer and high acoustic impedance metal layer. For example, an initial bottom metal electrode layer 121, 421A through 421G, may comprise a relatively high acoustic impedance metal, for example, Tungsten having an acoustic impedance of about 100 MegaRayls, or for example, Molybdenum having an acoustic impedance of about 65 MegaRayls. The acoustically reflective bottom electrode stack of the plurality of bottom metal electrode layers of the bottom acoustic reflector 113, 413A through 413G may approximate a metal distributed Bragg acoustic reflector. The plurality of metal bottom electrode layers of the bottom acoustic reflector may be electrically coupled (e.g., electrically interconnected) with one another. The acoustically reflective bottom electrode stack of the plurality of bottom metal electrode layers may operate together as a multilayer (e.g., bilayer, e.g., multiple layer) bottom electrode for the bottom acoustic reflector 113, 413A through 413G.

Next in the alternating arrangement of low acoustic impedance metal layer and high acoustic impedance metal layer of the acoustically reflective bottom electrode stack, may be a first pair of bottom metal electrode layers 123, 423A through 423G and 125, 425A through 425G. A first member 123, 423A through 423G, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 125, 425A through 425G, of the first pair of bottom metal electrode layers may comprise the relatively high acoustic impedance metal, for example, Tungsten or Molybdenum. Accordingly, the first pair of bottom metal electrode layers 123, 423A through 423G, and 125, 425A through 425G, of the bottom acoustic reflector 113, 413A through 413G, may be different metals, and may have respective acoustic impedances that are different from one another so as to provide a reflective acoustic impedance mismatch at the resonant frequency (e.g., main resonant frequency). Similarly, the initial bottom metal electrode layer 119, 419A through 419G, and the first member of the first pair of bottom metal electrode layers 123, 423A through 423G, of the bottom acoustic reflector 113, 413A through 413G, may be different metals, and may have respective acoustic impedances that are different from one another so as to provide a reflective acoustic impedance mismatch at the resonant frequency (e.g., main resonant frequency).

The alternating arrangement of low acoustic impedance metal layer and high acoustic impedance metal layer of the acoustically reflective bottom electrode stack, may comprise a second pair of bottom metal electrode layers 127, 427D, 129, 429D. This may respectively comprise the relatively low acoustic impedance metal and the relatively high acoustic impedance metal. The alternating arrangement of low acoustic impedance metal layer and high acoustic impedance metal layer of the acoustically reflective bottom electrode stack, may comprise a third pair of bottom metal electrode layers 131, 133. This may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400G. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency).

For example, a layer thickness of the initial bottom metal electrode layer 121, 421A through 421G, may be about one eighth of a wavelength (e.g., one eighth of an acoustic wavelength) at the main resonant frequency of the example resonator. For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial bottom metal electrode layer 121, 421A through 421G, as about three hundred and thirty Angstroms (330 A). In the foregoing illustrative but non-limiting example, the one eighth of the wavelength (e.g., the one eighth of the acoustic wavelength) at the main resonant frequency was used for determining the layer thickness of the initial bottom metal electrode layer 121, 421A-421G, but it should be understood that this layer thickness may be varied to be thicker or thinner in various other alternative example embodiments.

Respective layer thicknesses, T03 through T08, shown in FIG. 1A for members of the pairs of bottom metal electrode layers may be about an odd multiple (e.g., 1×, 3×, etc). of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that correspond to from about one eighth to about one half wavelength at the resonant frequency, or an odd multiple (e.g., 1×, 3×, etc). thereof.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the pairs as about six hundred and thirty Angstroms (630 A). Similarly, respective layer thicknesses for members of the pair(s) of bottom metal electrode layers shown in FIGS. 4A through 4G may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

For example, bottom acoustic reflector 113, 413A, 413B, 413D, 413E, 413F and 413G may further comprise bottom current spreading layer 135, 435A, 435B, 435D, 435E, 435F and 435G as shown in FIG. 1A and FIGS. 4A, 4B, and 4D through 4G. Bottom current spreading layer 135, 435A, 435B, 435D, 435E, 435F and 435G may be bilayer, as discussed previously herein. For example bottom current spreading layer 135, 435A, 435B, 435D, 435E, 435F and 435G may comprise an additional pair of bottom metal electrode layers. For example bottom current spreading layer 135 may comprise a fourth pair of bottom metal electrode layers. Bottom current spreading layer 135, 435A, 435B, 435D, 435E, 435F and 435G may respectively comprise a relatively low acoustic impedance metal having a relatively high conductivity, for example Aluminum and the relatively high acoustic impedance metal, for example Tungsten. Previous discussions herein about suitable materials and thickness for the example bilayers of bottom current spreading are likewise applicable to bottom current spreading layer 135, 435A, 435B, 435D, 435E, 435F and 435G shown in FIG. 1A and FIGS. 4A, 4B, and 4D through 4G. For brevity and clarity, such discussions are referenced and incorporated rather than repeated in full.

The bottom piezoelectric layer 105, 405A through 405G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the bottom piezoelectric layer 105, 405A through 405G.

Similarly, the first middle piezoelectric layer 107, 407A through 407G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the first middle piezoelectric layer 107, 407A through 407G. The second middle piezoelectric layer 109, 409A through 409G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the second middle piezoelectric layer 109, 409A through 409G. The top piezoelectric layer 109, 409A through 409G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the top piezoelectric layer 109, 409A through 409G.

Another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G), may comprise initial bottom metal electrode layer 117, 417A through 417G. The another mesa structure 113, 413A through 413G, (e.g., second mesa structure 113, 413A through 413G), may comprise one or more pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G).

Similar to what has been discussed for the bottom electrode stack, likewise the top electrode stack of the plurality of top metal electrode layers of the top acoustic reflector 115, 415A through 415G, may have the alternating arrangement of low acoustic impedance metal layer and high acoustic impedance metal layer. The top electrode stack of the plurality of top metal electrode layers of the top acoustic reflector 115, 415A through 415G, may approximate a distributed Bragg acoustic reflector, e.g., a metal distributed Bragg acoustic reflector. The plurality of top metal electrode layers of the top acoustic reflector may be electrically coupled (e.g., electrically interconnected) with one another. The acoustically reflective top electrode stack of the plurality of top metal electrode layers may operate together as a multi-layer (e.g., bi-layer, e.g., multiple layer) top electrode for the top acoustic reflector 115, 415A through 415G. Next in the alternating arrangement of low acoustic impedance metal layer and high acoustic 5 impedance metal layer of the acoustically reflective top electrode stack, may be a first pair of top metal electrode layers 137, 437A through 437G, and 139, 439A through 439G. A first member 137, 437A through 437G, of the first pair of top metal electrode layers may comprise the relatively low acoustic impedance metal, for example, Titanium or Aluminum. A second member 139, 439A through 439G, of the first pair of top metal electrode layers may comprise the relatively high acoustic impedance metal, for example, Tungsten or Molybdenum. Accordingly, the first pair of top metal electrode layers 137, 437A through 437G, 139, 439A through 439G, of the top acoustic reflector 115, 415A through 415G, may be different metals, and may have respective acoustic impedances that are different from one another so as to provide a reflective acoustic impedance mismatch at the resonant frequency (e.g., main resonant frequency). Similarly, the first member of the first pair of top metal electrode layers 137, 437A through 437G, of the top acoustic reflector 115, 415A through 415G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective top electrode stack, a second pair of top metal electrode layers 141, 441A through 441G, and 143, 443A through 443G, may respectively comprise the relatively low acoustic impedance metal and the relatively high acoustic impedance metal. Accordingly, members of the first and second pairs of top metal electrode layers 137, 437A through 437G, 139, 439A through 439G, 141, 441A through 441G, 143, 443A through 443G, may have respective acoustic impedances in the alternating arrangement to provide a corresponding plurality of reflective acoustic impedance mismatches. Next in the alternating arrangement of low acoustic impedance metal layer and high acoustic impedance metal layer of the acoustically reflective top electrode stack, a third pair of top metal electrode layers 145, 445A through 445C, and 147, 447A through 447C, may respectively comprise the relatively low acoustic impedance metal and the relatively high acoustic impedance metal. Next in the alternating arrangement of low acoustic impedance metal layer and high acoustic impedance metal layer of the acoustically reflective top electrode stack, a fourth pair of top metal electrode layers 149, 449A through 449C, 151, 451A through 451C, may respectively comprise the relatively low acoustic impedance metal and the relatively high acoustic impedance metal.

Additionally, the top electrode stack of the plurality of top metal electrode layers of the top acoustic reflector 115, 415A through 415G, may comprise at least a portion of top current spreading layer 171, 471A through 471G. Top current spreading layer 171 may be integrally coupled with top electrical interconnect 171. This may electrically coupled (e.g., integrally coupled with) integrated inductor 174, 474A, 474B, 474C. Top current spreading layer 171 may comprise a gold layer. Previous discussions herein about suitable materials, layer structures and thickness(es) for the example top current spreading are likewise applicable to top current spreading layer 171, 471A through 471G. For brevity and clarity, such discussions are referenced and incorporated rather than repeated in full.

Additionally, the top electrode stack of the plurality of top metal electrode layers of the top acoustic reflector 115, 415A through 415C, may comprise integrated capacitive layer 118, 418A through 418C, for example, electrically coupled between at least a portion of top current spreading layer 171, 471A through 471G and the fourth pair of top metal electrode layers, 149, 449A through 449C, 151, 451A through 451C. This electrical coupling of integrated capacitive layer 118, 418A through 418C, may (but need not) facilitate limiting of an electromechanical coupling of the example bulk acoustic wave resonators 100, 400A through 400C. The integrated capacitive layer 118, 418A through 418C, may be non-piezoelectric (e.g., may comprise a non-piezoelectric material, e.g., may comprise a non-piezoelectric dielectric material). The integrated capacitive layer 118, 418A through 418C, may comprise a suitable integrated capacitive material. For example, the integrated capacitive layer 118, 418A through 418C, may comprise silicon dioxide. The integrated capacitive layer 118, 418A through 418C, may comprise silicon nitride. The integrated capacitive layer 118, 418A through 418C, may comprise aluminum oxide. The integrated capacitive layer 118, 418A through 418C, may comprise silicon carbide. The integrated capacitive layer 118, 418A through 418C, may comprise amorphous silicon. The integrated capacitive layer 118, 418A through 418C, may comprise hafnium oxide. Thickness of integrated capacitive layer 118, 418A through 418C may be selected based upon desired capacitance associated with integrated capacitive layer 118, 418A through 418C. Thickness of integrated capacitive layer 118, 418A through 418C may, but need not be about a quarter wavelength (e.g., quarter acoustic wavelength) of the resonant frequency (e.g., main resonant frequency) of the bulk acoustic wave resonators 100, 400A through 400C.

In some examples, capacitance of the integrated capacitive layer 118, 418A through 418C may be tunable to facilitate tuning of a main resonant frequency of the BAW resonator. Integrated capacitive layer 118, 418A through 418C may comprise barium strontium titanate. Tuning may be facilitated by coupling a tuning voltage (not shown in FIGS. 1A and 4A though 4C) across integrated capacitive layer 118, 418A through 418C via top current spreading layer 171, 471A through 471G and the fourth pair of top metal electrode layers, 149, 449A through 449C, 151, 451A through 451C.

Top current spreading layer 171 may be integrally coupled with top electrical interconnect 171. This may be electrically coupled (e.g., integrally coupled with) integrated inductor 174, 474A, 474B, 474C. Top current spreading layer 171 may comprise a gold layer. Previous discussions herein about suitable materials, layer structures and thickness(es) for the example top current spreading are likewise applicable to top current spreading layer 171, 471A through 471G. For brevity and clarity, such discussions are referenced and incorporated rather than repeated in full.

For example, the bottom piezoelectric layer 105, 405A through 405G, may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., top current spreading layer 171, 471A through 471G), to excite the piezoelectrically excitable resonance mode (e.g., main resonance mode) at the resonant frequency (e.g., main resonant frequency) of the bottom piezoelectric layer 105, 405A through 405G.

Further, the bottom piezoelectric layer 105, 405A through 405G and the first middle piezoelectric layer 107, 407A through 407G may be electrically and acoustically coupled with and pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., top current spreading layer 171, 471A through 471G), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., top current spreading layer 171, 471A through 471G), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G. Additionally, the second middle piezoelectric layer 109, 409A through 409G, may be sandwiched between the second middle piezoelectric layer 109, 409A through 409G, and the top piezoelectric layer 111, 411A through 411G and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., top current spreading layer 171, 471A through 471G), to excite the piezoelectrically excitable resonance mode (e.g., main resonance mode) at the resonant frequency (e.g., main resonant frequency) of the second middle piezoelectric layer 109, 409A through 409G, sandwiched between the second middle piezoelectric layer 109, 409A through 409G and the top piezoelectric layer 111, 411A through 411G. The top piezoelectric layer 111, 411A through 411G, may be arranged over the second middle piezoelectric layer 109, 409A through 409G, and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, third pair of top metal electrode layers 145, 445A through 445C, 147, 447A through 447C, e.g., top current spreading layer 171, 471A through 471G), to excite the piezoelectrically excitable resonance mode (e.g., main resonance mode) at the resonant frequency (e.g., main resonant frequency) of the top piezoelectric layer 111, 411A through 411G, arranged over the second middle piezoelectric layer 109, 409A.

Yet another mesa structure 115, 415A through 415G, (e.g., third mesa structure 115, 415A through 415G), may comprise the top acoustic reflector 115, 415A through 415G, or a portion of the top acoustic reflector 115, 415A through 415G. The yet another mesa structure 115, 415A through 415C, (e.g., third mesa structure 115, 415A through 415C), may comprise one or more pair(s) of top metal electrode layers (e.g., first pair of top metal electrode layers 137, 437A through 437C, 139, 439A through 439C, e.g., second pair of top metal electrode layers 141, 441A through 441C, 143, 443A through 443C, e.g., third pair of top metal electrode layers 145, 445A through 445C, 147, 447A through 447C, e.g., fourth pair of top metal electrode layers 149, 449A through 449C, 151, 451A through 451C).

For example in the figures, the first member of the first pair of top metal electrode layers 137, 437A through 437G, of the top acoustic reflector 115, 415A through 415G, is depicted as relatively thinner (e.g., thickness T11 of the first member of the first pair of top metal electrode layers 137, 437A through 437G is depicted as relatively thinner) than thickness of remainder top acoustic layers (e.g., than thicknesses T12 through T18 of remainder top metal electrode layers). For example, a thickness T11 may be about 60 Angstroms, 60 A, lesser, e.g., substantially lesser, than an odd multiple (e.g., 1×, 3×, etc). of a quarter of a wavelength (e.g., 70 Angstroms lesser than one quarter of the acoustic wavelength) for the first member of the first pair of top metal electrode layers 137, 437A through 437G. For example, if Titanium is used as the low acoustic impedance metal for a 24 GHz resonator (e.g., resonator having a main resonant frequency of about 24 GHz), a thickness T11 may be about 570 Angstroms, 570 A, for the first member of the first pair of top metal electrode layers 137, 437A through 437G, of the top acoustic reflector 115, 415A through 415G, while respective layer thicknesses, T12 through T18, shown in the figures for corresponding members of the pairs of top metal electrode layers may be substantially thicker than T11. Such arrangement of thicknesses and materials e.g., may facilitate enhanced quality factor, e.g., may facilitate suppression of parasitic resonances, e.g., around the main resonant frequency of the example bulk acoustic wave resonators, 100, 400A through 400G.

Accordingly, like the respective layer thicknesses of the bottom metal electrode layers, respective thicknesses of the top metal electrode layers may likewise be related to wavelength (e.g., acoustic wavelength) for the main resonant frequency of the example bulk acoustic wave resonators, 100, 400A through 400G. Further, various embodiments for resonators having relatively higher main resonant frequency may have relatively thinner top metal electrode thicknesses, e.g., scaled thinner with relatively higher main resonant frequency. Similarly, various alternative embodiments for resonators having relatively lower main resonant frequency may have relatively thicker top metal electrode layer thicknesses, e.g., scaled thicker with relatively lower main resonant frequency. Respective layer thicknesses, T12 through T18, shown in FIG. 1A for corresponding members of the pairs of top metal electrode layers may be about an odd multiple (e.g., 1×, 3×, etc). of a quarter of a wavelength (e.g., one quarter of an acoustic wavelength) of the main resonant frequency of the example resonator. Similarly, respective layer thicknesses for corresponding members of the pairs of top metal electrode layers shown in FIGS. 4A through 4G may likewise be about one quarter of a wavelength (e.g., one quarter of an acoustic wavelength) at the main resonant frequency of the example resonator multiplied by an odd multiplier (e.g., 1×, 3×, etc), and these respective layer thicknesses may likewise be determined for members of the pairs of top metal electrode layers for the high and low acoustic impedance metals employed. However, the foregoing may be varied. For example, members of the pairs of top metal electrode layers of the top acoustic reflector may have respective layer thickness within a range from an odd multiple (e.g., 1×, 3×, etc). of about one eighth to an odd multiple (e.g., 1×, 3×, etc). of about one half wavelength at the resonant frequency.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the second, third and fourth pairs as about six hundred and thirty Angstroms (630 A). Similarly, respective layer thicknesses for members of the remainder pairs of top metal electrode layers shown in FIGS. 4A through 4G (e.g., second, third and fourth pairs) may likewise be about one quarter of the wavelength (e.g., one quarter of the acoustic wavelength) of the main resonant frequency of the example resonator, and these respective layer thicknesses may likewise be determined for members of the pairs of top metal electrode layers for the high and low acoustic impedance metals employed.

As shown in the figures, a second member 139, 439A through 439G of the first pair of top metal electrode layers may have a relatively high acoustic impedance (e.g., high acoustic impedance metal layer 139, 439A through 439G, e.g. tungsten metal layer 139, 439A through 439G). A first member 137, 437A through 437G of the first pair of top metal electrode layers may have a relatively low acoustic impedance (e.g., low acoustic impedance metal layer 137, 437A through 437G, e.g., titanium metal layer 137, 437A through 437G). This relatively low acoustic impedance of the first member 137, 437A through 437G of the first pair may be relatively lower than the acoustic impedance of the second member 139, 439A through 439G of the first pair. The first member 137, 437A through 437G having the relatively lower acoustic impedance may abut a first layer of piezoelectric material (e.g. may abut top piezoelectric layer 111, 411A through 411G, e.g. may abut piezoelectric stack 104, 404A through 404G). This arrangement may facilitate suppressing parasitic lateral resonances in operation of the BAW resonator. The first member 137, 437A through 437G having the relatively lower acoustic impedance may be arranged nearest to a first layer of piezoelectric material (e.g. may be arranged nearest to top piezoelectric layer 111, 411A through 411G, e.g. may be arranged nearest to piezoelectric stack 104, 404A through 404G) relative to other top acoustic layers of the top acoustic reflector 115, 415A through 415G (e.g. relative to the second member 139, 439A through 439G of the first pair of top metal electrode layers, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C). This arrangement may facilitate suppressing parasitic lateral resonances in operation of the BAW resonator.

The bottom acoustic reflector 113, 413A through 413G, may have a thickness dimension T23 extending along the stack of bottom electrode layers. For the example of the 24 GHz resonator, the thickness dimension T23 of the bottom acoustic reflector may be about five thousand Angstroms (5,000 A). The top acoustic reflector 115, 415A through 415G, may have a thickness dimension T25 extending along the stack of top electrode layers. For the example of the 24 GHz resonator, the thickness dimension T25 of the top acoustic reflector may be about five thousand Angstroms (5,000 A). The piezoelectric layer stack 104, 404A through 404G, may have a thickness dimension T27 extending along the piezoelectric layer stack 104, 404A through 404G. For the example of the 24 GHz resonator, the thickness dimension T27 of the piezoelectric layer stack may be about eight thousand Angstroms (8,000 A).

In the example resonators 100, 400A through 400G, of FIG. 1A and FIGS. 4A through 4G, a notional heavy dashed line is used in depicting an etched edge region 153, 453A through 453G, associated with the example resonators 100, 400A through 400G. Similarly, a laterally opposing etched edge region 154, 454A through 454G is arranged laterally opposing or opposite from the notional heavy dashed line depicting the etched edge region 153, 453A through 453G. The etched edge region may, but need not, assist with acoustic isolation of the resonators. The etched edge region may, but need not, help with avoiding acoustic losses for the resonators. The etched edge region 153, 453A through 453G, (and the laterally opposing etched edge region 154, 454A through 454G) may extend along the thickness dimension T27 of the piezoelectric layer stack 104, 404A through 404G. The etched edge region 153, 453A through 453G, may extend through (e.g., entirely through or partially through) the piezoelectric layer stack 104, 404A through 404G. Similarly, the laterally opposing etched edge region 154, 454A through 454G may extend through (e.g., entirely through or partially through) the piezoelectric layer stack 104, 404A through 404G. The etched edge region 153, 453A through 453G, (and the laterally opposing etched edge region 154, 454A through 454G) may extend through (e.g., entirely through or partially through) the bottom piezoelectric layer 105, 405A through 405G. The etched edge region 153, 453A through 453G, (and the laterally opposing etched edge region 154, 454A through 454G) may extend through (e.g., entirely through or partially through) the first middle piezoelectric layer 107, 407A through 407G. The etched edge region 153, 453A through 453G, (and the laterally opposing etched edge region 154, 454A through 454G) may extend through (e.g., entirely through or partially through) the second middle piezoelectric layer 109, 409A through 409G. The etched edge region 153, 453A through 453G, (and the laterally opposing etched edge region 154, 454A through 454G) may extend through (e.g., entirely through or partially through) the top piezoelectric layer 111, 411A through 411G.

The etched edge region 153, 453A through 453G, (and the laterally opposing etched edge region 154, 454A through 454G) may extend along the thickness dimension T23 of the bottom acoustic reflector 113, 413A through 413G. The etched edge region 153, 453A through 453G, (and the laterally opposing etched edge region 154, 454A through 454G) may extend through (e.g., entirely through or partially through) the bottom acoustic reflector 113, 413A through 413G. The etched edge region 153, 453A through 453G, (and the laterally opposing etched edge region 154, 454A through 454G) may extend through (e.g., entirely through or partially through) the initial bottom metal electrode layers, 121, 421A through 421G. The etched edge region 153, 453A through 453G (and the laterally opposing etched edge region 154, 454A through 454G) may extend through (e.g., entirely through or partially through) the first pair of bottom metal electrode layers, 123, 423A through 423G, 125, 425A through 425G. The etched edge region 153, 453D (and the laterally opposing etched edge region 154, 454D) may extend through (e.g., entirely through or partially through) the second pair of bottom metal electrode layers, 127, 427D, 129, 429D. The etched edge region 153 (and the laterally opposing etched edge region 154) may extend through (e.g., entirely through or partially through) the third pair of bottom metal electrode layers, 131, 133. The etched edge region 153, 453A 453B, 453D, 453E, 453F and 453G (and the laterally opposing etched edge region 154, 454A 454B, 454D, 454E, 453F and 454G) may extend through (e.g., entirely through or partially through) another pair of bottom metal electrode layers comprising the bilayer bottom current spreading layer 135, 435A 435B, 435D, 435E, 435F and 435G.

The etched edge region 153, 453A through 453G (and the laterally opposing etched edge region 154, 454A through 454G) may extend along the thickness dimension T25 of the top acoustic reflector 115, 415A through 415G. The etched edge region 153, 453A through 453G (and the laterally opposing etched edge region 154, 454A through 454G) may extend through (e.g., entirely through or partially through) the top acoustic reflector 115, 415A through 415G. The etched edge region 153, 453A through 453G (and the laterally opposing etched edge region 154, 454A through 454G) may extend through (e.g., entirely through or partially through) the first pair of top metal electrode layers, 137, 437A through 437G, 139, 439A through 49G. The etched edge region 153, 453A through 453C (and the laterally opposing etched edge region 154, 454A through 454C) may extend through (e.g., entirely through or partially through) the second pair of top metal electrode layers, 141, 441A through 441C, 143, 443A through 443C. The etched edge region 153, 453A through 453C (and the laterally opposing etched edge region 154, 454A through 454C) may extend through (e.g., entirely through or partially through) the third pair of top metal electrode layers, 145, 445A through 445C, 147, 447A through 447C. The etched edge region 153, 453A through 453C (and the laterally opposing etched edge region 154, 454A through 454C) may extend through (e.g., entirely through or partially through) the fourth pair of top metal electrode layers, 149, 449A through 449C, 151, 451A through 451C.

As mentioned previously, mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may extend laterally between (e.g., may be formed between) etched edge region 153, 453A through 453G and laterally opposing etched edge region 154, 454A through 454G. As mentioned previously, another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G) may extend laterally between (e.g., may be formed between) etched edge region 153, 453A through 453G and laterally opposing etched edge region 154, 454A through 454G. As mentioned previously, yet another mesa structure 115, 415A through 415G, (e.g., third mesa structure 115, 415A through 415G), may comprise the top acoustic reflector 115, 415A through 415G or a portion of the top acoustic reflector 115, 415A through 415G. The yet another mesa structure 115, 415A through 415G, (e.g., third mesa structure 115, 415A through 415G) may extend laterally between (e.g., may be formed between) etched edge region 153, 453A through 453G and laterally opposing etched edge region 154, 454A through 454G. In some example resonators 100, 400A, 400B, 400D through 400F, the second mesa structure corresponding to the bottom acoustic reflector 113, 413A, 413B, 413D through 413F may be laterally wider than the first mesa structure corresponding to the stack 104, 404A, 404B, 404D through 404F, of the example four layers of piezoelectric material. In some example resonators 100, 400A through 400C, the first mesa structure corresponding to the stack 104, 404A through 404C, of the example four layers of piezoelectric material may be laterally wider than the third mesa structure corresponding to the top acoustic reflector 115, 415A through 415C. In some example resonators 400D through 400G, the first mesa structure corresponding to the stack 404D through 404G, of the example four layers of piezoelectric material may be laterally wider than a portion of the third mesa structure corresponding to the top acoustic reflector 415D through 415G.

An optional mass load layer 155, 455A through 455G, may be added to the example resonators 100, 400A through 400G. For example, filters may include series connected resonator designs and shunt connected resonator designs that may include mass load layers. For example, for ladder band pass filter designs, the shunt resonator may include a sufficient mass load layer so that the parallel resonant frequency (Fp) of the shunt resonator approximately matches the series resonant frequency (Fs) of the series resonator design. Thus the series resonator design (without the mass load layer) may be used for the shunt resonator design, but with the addition of the mass load layer 155, 455A through 455G, for the shunt resonator design. By including the mass load layer, the design of the shunt resonator may be approximately downshifted, or reduced, in frequency relative to the series resonator by a relative amount approximately corresponding to the electromechanical coupling coefficient (Kt2) of the shunt resonator. For the example resonators 100, 400A through 400G, the optional mass load layer 155, 455A through 455G, may be arranged in the top acoustic reflector 115, 415A through 415G, above the first pair of top metal electrode layers. A metal may be used for the mass load. A dense metal such as Tungsten may be used for the mass load 155, 455A through 455G. An example thickness dimension of the optional mass load layer 155, 455A through 455G, may be about one hundred Angstroms (100 A).

However, it should be understood that the thickness dimension of the optional mass load layer 155, 455A through 455G, may be varied depending on how much mass loading is desired for a particular design and depending on which metal is used for the mass load layer. Since there may be less acoustic energy in the top acoustic reflector 115, 415A through 415G, at locations further away from the piezoelectric stack 104, 404A through 404G, there may be less acoustic energy interaction with the optional mass load layer, depending on the location of the mass load layer in the arrangement of the top acoustic reflector. Accordingly, in alternative arrangements where the mass load layer is further away from the piezoelectric stack 104, 404A through 404G, such alternative designs may use more mass loading (e.g., thicker mass load layer) to achieve the same effect as what is provided in more proximate mass load placement designs. Also, in other alternative arrangements the mass load layer may be arranged relatively closer to the piezoelectric stack 104, 404A through 404G. Such alternative designs may use less mass loading (e.g., thinner mass load layer). This may achieve the same or similar mass loading effect as what is provided in previously discussed mass load placement designs, in which the mass load is arranged less proximate to the piezoelectric stack 104, 404A through 404G. Similarly, since Titanium (Ti) or Aluminum (Al) is less dense than Tungsten (W) or Molybdenum (Mo), in alternative designs where Titanium or Aluminum is used for the mass load layer, a relatively thicker mass load layer of Titanium (Ti) or Aluminum (Al) is needed to produce the same mass load effect as a mass load layer of Tungsten (W) or Molybdenum (Mo) of a given mass load layer thickness. Moreover, in alternative arrangements both shunt and series resonators may be additionally mass-loaded with considerably thinner mass loading layers (e.g., having thickness of about one tenth of the thickness of a main mass loading layer) in order to achieve specific filter design goals, as may be appreciated by one skilled in the art. The example resonators 100, 400A through 400G, of FIG. 1A and FIGS. 4A through 4G may include a plurality of lateral features 157, 457A through 457G, (e.g., patterned layer 157, 457A through 457G, e.g., step mass features 157, 457A through 457G), sandwiched between two top metal electrode layers (e.g., between the second member 139, 439A through 439G, of the first pair of top metal electrode layers and the first member 141, 441A through 441G, of the second pair of top metal electrode layers) of the top acoustic reflector 115, 415A through 415G. As shown in the figures, the plurality of lateral features 157, 457A through 457G, of patterned layer 157, 457A through 457G may comprise step features 157, 457A through 457G (e.g., step mass features 157, 457A through 457G). As shown in the figures, the plurality of lateral features 157, 457A through 457G, may be arranged proximate to lateral extremities (e.g., proximate to a lateral perimeter) of the top acoustic reflector 115, 415A through 415G. At least one of the lateral features 157, 457A through 457G, may be arranged proximate to where the etched edge region 153, 453A through 453G, extends through the top acoustic reflector 115, 415A through 415G.

After the lateral features 157, 457A through 457G, are formed, they may function as a step feature template, so that subsequent top metal electrode layers formed on top of the lateral features 157, 457A through 457G, may retain step patterns imposed by step features of the lateral features 157, 457A through 457G. For example, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C, may retain step patterns imposed by step features of the lateral features 157, 457A through 457G. The plurality of lateral features 157, 457A through 457G, may add a layer of mass loading. The plurality of lateral features 157, 457A through 457G, may be made of a patterned metal layer (e.g., a patterned layer of Tungsten (W), Molybdenum (Mo), Titanium (Ti) or Aluminum (Al)). In alternative examples, the plurality of lateral features 157, 457A through 457G, may be made of a patterned dielectric layer (e.g., a patterned layer of Silicon Nitride (SiN), Silicon Dioxide ($SiO_2$) or Silicon Carbide (SiC)). The plurality of lateral features 157, 457A through 457G, may, but need not, limit parasitic lateral acoustic modes (e.g., facilitate suppression of spurious modes) of the example resonators 100, 400A through 400G. Thickness of the patterned layer of the lateral features 157, 457A through 457G, (e.g., thickness of the patterned layers 157, 457A through 457G) may be adjusted, e.g., may be determined as desired. For example, for the 24 GHz resonator, thickness may be adjusted within a range from about fifty Angstroms (50 A) to about five hundred Angstroms (500 A). Lateral step width of the lateral features 157, 457A through 457G (e.g., width of the step mass features 157, 457A through 457G) may be adjusted down, for example, from about two microns (2 um). The foregoing may be adjusted to balance a design goal of limiting parasitic lateral acoustic modes (e.g., facilitating suppression of spurious modes) of the example resonators 100, 400A through 400G as well as increasing average quality factor above the series resonance frequency against other design considerations e.g., maintaining desired average quality factor below the series resonance frequency.

In the example bulk acoustic wave resonator 100 shown in FIG. 1A, the patterned layer 157 may comprise Tungsten (W) (e.g., the step mass feature 157 of the patterned layer may comprise Tungsten (W)). A suitable thickness of the patterned layer 157 (e.g., thickness of the step mass feature 157) and lateral width of features of the patterned layer 157 may vary based on various design parameters e.g., material selected for the patterned layer 157, e.g., the desired resonant frequency of the given resonant design, e.g., effectiveness in facilitating spurious mode suppression. For an example of 24 GHz design of the bulk acoustic wave resonator 100 shown in FIG. 1A in which the patterned layer comprises Tungsten (W), a suitable thickness of the patterned layer 157 (e.g., thickness of the step mass feature 157) may be 200 Angstroms and lateral width of features of the patterned layer 157 (e.g., lateral width of the step mass feature 157) may be 0.8 microns, may facilitate suppression of the average strength of the spurious modes in the passband by approximately fifty percent (50%), as estimated by simulation relative to similar designs without the benefit of patterned layer 157.

In the example resonators 100, 400A through 400C, of FIG. 1A and FIGS. 4A through 4C, a planarization layer 165, 465A through 465C may be included. A suitable material may be used for planarization layer 165, 465A through 465C, for example Silicon Dioxide ($SiO_2$), Hafnium Dioxide (HfO2), polyimide, or BenzoCyclobutene (BCB). An isolation layer 167, 467A through 467C, may also be included and arranged over the planarization layer 165, 465A-465C. A suitable low dielectric constant (low-k), low acoustic impedance (low-Za) material may be used for the isolation layer 167, 467A through 467C, for example polyimide, or BenzoCyclobutene (BCB).

In the example resonators 100, 400A through 400G, of FIG. 1A and FIGS. 4A through 4G, a bottom electrical interconnect 169, 469A through 469G, may be included to interconnect electrically with (e.g., electrically contact with) the bottom acoustic reflector 113, 413A through 413G, stack of the plurality of bottom metal electrode layers. A top electrical interconnect 171, 471A through 471G, may be integrally coupled with top current spreading layer 171 to interconnect electrically with the plurality of top metal electrode layers of the top acoustic reflector 115, 415A through 415G. The bottom electrical interconnect 169, 469A through 469G, and the top electrical interconnect 171, 471A through 471G, may comprise a suitable material, for example, gold (Au). Top electrical interconnect 171, 471A through 471G may have some acoustic coupling, but also may be substantially acoustically isolated from the stack 104, 404A through 404G of the example four layers of piezoelectric material by the top multi-layer metal acoustic reflector electrode 115, 415A through 415G. Top electrical interconnect 171, 471A through 471G may have dimensions selected so that the top electrical interconnect 171, 471A through 471G approximates a fifty ohm electrical transmission line at the main resonant frequency of the bulk acoustic wave resonator 100, 400A through 400G. Top electrical interconnect 171, 471A through 471G may have a thickness that is substantially thicker than a thickness of a pair of top metal electrode layers of the top multi-layer metal acoustic reflector electrode 115, 415A through 415G (e.g., thicker than thickness of the first pair of top metal electrode layers 137, 437A through 437G, 139, 439A through 439G). Top electrical interconnect 171, 471A through 471G may have a thickness within a range from about one hundred Angstroms (100 A) to about five micrometers (5 um). For example, top electrical interconnect 171, 471A through 471G may have a thickness of about two thousand Angstroms (2000 A).

Figure 1B:
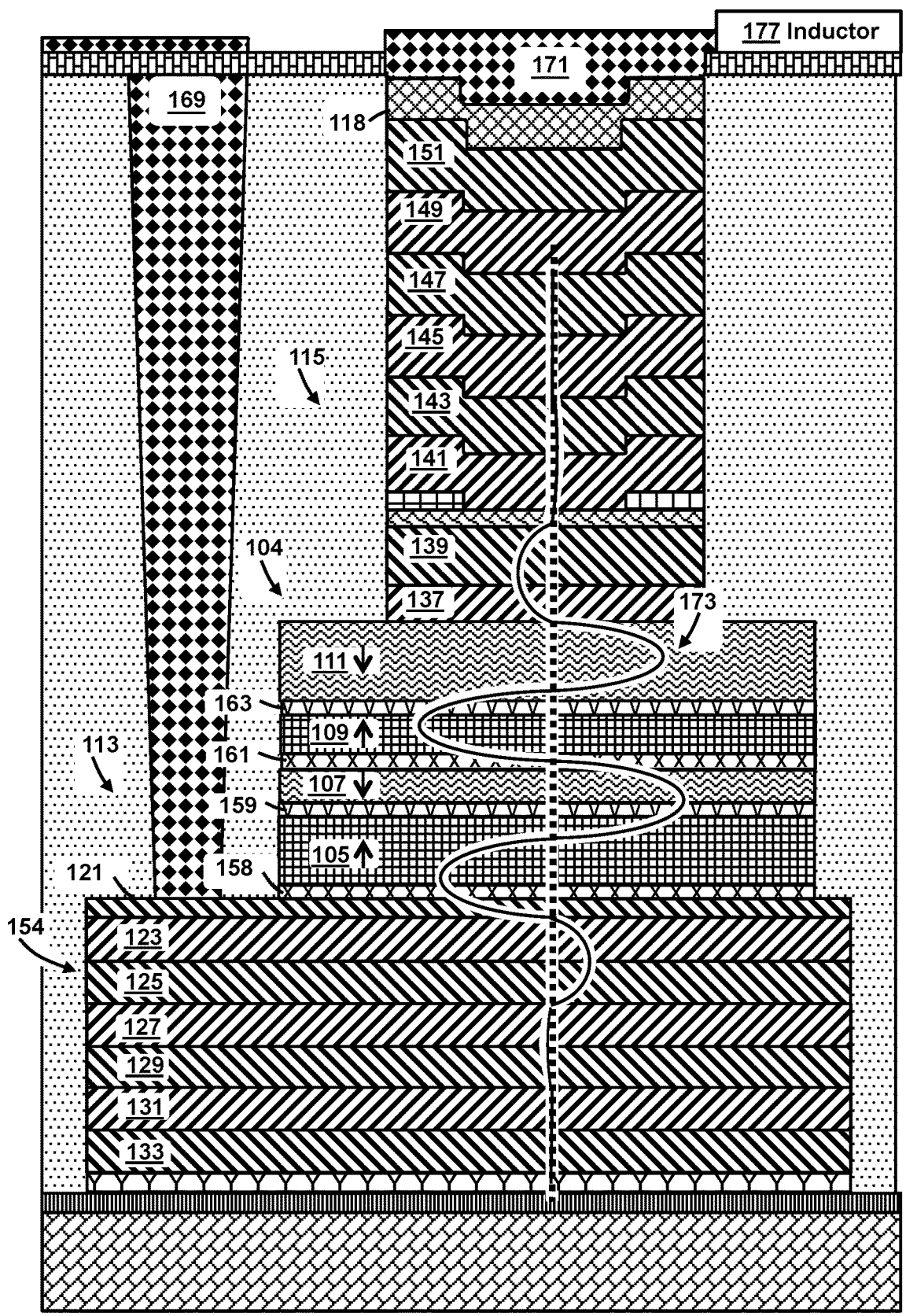
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four piezoelectric layers, 105, 107, 109, 111. The stress 173 is excited by the oscillating electric field applied via the top acoustic reflector 115 stack of the plurality of top metal electrode layers 137, 139, 141, 143, 145, 147, 149, 151, and the bottom acoustic reflector 113 stack of the plurality of bottom metal electrode layers 119, 121, 123, 125, 127, 129, 131, 133. The stress 173 has maximum values inside the stack 104 of piezoelectric layers, while exponentially tapering off within the top acoustic reflector 115 and the bottom acoustic reflector 113. Notably, acoustic energy confined in the resonator structure 100 is proportional to stress magnitude.

As discussed previously herein, the example four piezoelectric layers, 105, 107, 109, 111 in the stack 104 may have an alternating axis arrangement in the stack 104. For example the bottom piezoelectric layer 105 may have the reverse axis orientation, which is depicted in FIG. 1B using the upward directed arrow. Next in the alternating axis arrangement of the stack 104, the first middle piezoelectric layer 107 may have the normal axis orientation, which is depicted in FIG. 1B using the downward directed arrow. Next in the alternating axis arrangement of the stack 104, the second middle piezoelectric layer 109 may have the reverse axis orientation, which is depicted in FIG. 1B using the upward directed arrow. Next in the alternating axis arrangement of the stack 104, the top piezoelectric layer 111 may have the normal axis orientation, which is depicted in FIG. 1B using the downward directed arrow. For the alternating axis arrangement of the stack 104, stress 173 excited by the applied oscillating electric field causes reverse axis piezoelectric layers (e.g., bottom and second middle piezoelectric layers 105, 109) to be in extension, while normal axis piezoelectric layers (e.g., first middle and top piezoelectric layers 107, 111) to be in compression. Accordingly, FIG. 1B shows peaks of stress 173 on the right side of the heavy dashed line to depict compression in normal axis piezoelectric layers (e.g., first middle and top piezoelectric layers 107, 111), while peaks of stress 173 are shown on the left side of the heavy dashed line to depict extension in reverse axis piezoelectric layers (e.g., bottom and second middle piezoelectric layers 105, 109).

In operation of the BAW resonator shown in FIG. 1B, peaks of standing wave acoustic energy may correspond to absolute value of peaks of stress 173 as shown in FIG. 1B (e.g., peaks of standing wave acoustic energy may correspond to squares of absolute value of peaks of stress 173 as shown in FIG. 1B). Standing wave acoustic energy may be coupled into the multi-layer metal top acoustic reflector electrode 115 shown in FIG. 1B in operation of the BAW resonator. A second member 139 of the first pair of top metal electrode layers may have a relatively high acoustic impedance (e.g., high acoustic impedance metal layer 139, e.g., tungsten layer 139). A first member 137 of the first pair of top metal electrode layers may have a relatively low acoustic impedance (e.g., low acoustic impedance metal layer 137, e.g., titanium layer 137). Accordingly, the first member 137 of the first pair of top metal electrode layers may have acoustic impedance that is relatively lower than the acoustic impedance of the second member 139. The first member 137 having the relatively lower acoustic impedance may be arranged, for example as shown in FIG. 1B, sufficiently proximate to a first layer of piezoelectric material (e.g. sufficiently proximate to top layer of piezoelectric material 111, e.g., sufficiently proximate to stack of piezoelectric material 104) so that standing wave acoustic energy to be in the first member 137 is greater than respective standing wave acoustic energy to be in other respective layers of the multi-layer metal top acoustic reflector electrode 115 in operation of the BAW resonator (e.g., greater than standing wave acoustic energy in the second member 139 of the first pair of top metal electrode layers, e.g., greater than standing wave acoustic energy in the first member 141 of the second pair of top metal electrode layers, e.g., greater than standing wave acoustic energy in the second member 143 of the second pair of top metal electrode layers, e.g., greater than standing wave acoustic energy in the first member 145 of the third pair of top metal electrode layers, e.g., greater than standing wave acoustic energy in the second member 147 of the third pair of top metal electrode layers, e.g., greater than standing wave acoustic energy in the first member 149 of the fourth pair of top metal electrodes, e.g., greater than standing wave acoustic energy in the second member 151 of the fourth pair of top metal electrodes). This may facilitate suppressing parasitic lateral resonances in operation of the BAW resonator shown in FIG. 1B.

As shown I FIG. 1B, piezoelectric layer thickness differences may be sufficiently different to facilitate null placement of standing wave acoustic energy within the piezoelectric layers. For example, the first middle piezoelectric layer thickness may be sufficiently different than the bottom piezoelectric layer thickness to facilitate a first null placement of standing wave acoustic energy within one of first middle piezoelectric layer 107 and the bottom piezoelectric layer 105. For example, as shown in FIG. 1B, the first middle piezoelectric layer thickness may be sufficiently thinner than the bottom piezoelectric layer thickness to facilitate a null placement of standing wave acoustic energy within the bottom piezoelectric layer 105. For example null placement of standing wave acoustic energy within the bottom piezoelectric layer 105 is representatively illustrated in FIG. 1B by a zero crossing of the dashed center line by stress 173 within bottom piezoelectric layer 105.

Similarly, the second middle piezoelectric layer thickness may be sufficiently different than the bottom piezoelectric layer thickness to facilitate the null placement of standing wave acoustic energy within one of the second middle piezoelectric layer 109 and bottom piezoelectric layer. For example, as shown in FIG. 1B, the second middle piezoelectric layer thickness may be sufficiently thinner than the bottom piezoelectric layer thickness to facilitate a null placement of standing wave acoustic energy within the bottom piezoelectric layer 105. For example null placement of standing wave acoustic energy within the bottom piezoelectric layer 105 is representatively illustrated in FIG. 1B by a zero crossing of the dashed center line by stress 173 within bottom piezoelectric layer 105.

For example, the first middle piezoelectric layer thickness may be sufficiently different than the top piezoelectric layer thickness to facilitate null placement of standing wave acoustic energy within one of the first middle piezoelectric layer 107 and top piezoelectric layer 111. For example, as shown in FIG. 1B, the first middle piezoelectric layer thickness may be sufficiently thinner than the top piezoelectric layer thickness to facilitate null placement of standing wave acoustic energy within the top piezoelectric layer 111. For example null placement of standing wave acoustic energy within the top piezoelectric layer 11 is representatively illustrated in FIG. 1B by a zero crossing of the dashed center line by stress 173 within top piezoelectric layer 111.

For example, the second middle piezoelectric layer thickness may be sufficiently different than the top piezoelectric layer thickness to facilitate a fourth null placement of standing wave acoustic energy within one of the second middle piezoelectric layer 109, 409A through 409G and the top piezoelectric layer 111, 411A through 411G. For example, as shown in FIG. 1B, the second middle piezoelectric layer thickness may be sufficiently thinner than the top piezoelectric layer thickness to facilitate null placement of standing wave acoustic energy within the top piezoelectric layer 111. For example null placement of standing wave acoustic energy within the top piezoelectric layer 11 is representatively illustrated in FIG. 1B by a zero crossing of the dashed center line by stress 173 within top piezoelectric layer 111.

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A includes the stack 104A of four layers of piezoelectric material e.g., having the alternating piezoelectric axis arrangement of the four layers of piezoelectric material. The stack 104A of piezoelectric layers may be sandwiched between the bottom acoustic reflector electrode 113A and the top acoustic reflector electrode 115A. The bottom acoustic reflector electrode may comprise the stack of the plurality of bottom metal electrode layers of the bottom acoustic reflector electrode 113A, e.g., having the alternating arrangement of low acoustic impedance bottom metal electrode layers and high acoustic impedance bottom metal layers. Similarly, the top acoustic reflector electrode 115A may comprise the stack of the plurality of top metal electrode layers of the top acoustic reflector electrode 115A, e.g., having the alternating arrangement of low acoustic impedance top metal electrode layers and high acoustic impedance top metal electrode layers. The top acoustic reflector electrode 115A may include a patterned layer 157A. The patterned layer 157A may approximate a frame shape (e.g., rectangular frame shape) proximate to a perimeter (e.g., rectangular perimeter) of top acoustic reflector electrode 115A as shown in simplified top plan view in FIG. 1C. This patterned layer 157A, e.g., approximating the rectangular frame shape in the simplified top plan view in FIG. 1C, corresponds to the patterned layer 157 shown in simplified cross sectional view in FIG. 1A. Top electrical interconnect 171A extends over (e.g., electrically contacts) top acoustic reflector electrode 115A. Bottom electrical interconnect 169A extends over (e.g., electrically contacts) bottom acoustic reflector electrode 113A through bottom via region 168A. Integrated inductor 174A may be electrically coupled with top electrical interconnect 171A.

FIG. 1C also shows another simplified top plan view of an alternative bulk acoustic wave resonator structure 100B. Similarly, the bulk acoustic wave resonator structure 100B includes the stack 104B of four layers of piezoelectric material e.g., having the alternating piezoelectric axis arrangement of the four layers of piezoelectric material. The stack 104B of piezoelectric layers may be sandwiched between the bottom acoustic reflector electrode 113B and the top acoustic reflector electrode 115B. The bottom acoustic reflector electrode may comprise the stack of the plurality of bottom metal electrode layers of the bottom acoustic reflector electrode 113B, e.g., having the alternating arrangement of low acoustic impedance bottom metal electrode layers and high acoustic impedance bottom metal layers. Similarly, the top acoustic reflector electrode 115B may comprise the stack of the plurality of top metal electrode layers of the top acoustic reflector electrode 115B, e.g., having the alternating arrangement of low acoustic impedance top metal electrode layers and high acoustic impedance top metal electrode layers. The top acoustic reflector electrode 115B may include a patterned layer 157B. The patterned layer 157B may approximate a frame shape (e.g., apodized frame shape) proximate to a perimeter (e.g., apodized perimeter) of top acoustic reflector electrode 115B as shown in simplified top plan view in FIG. 1C. The apodized frame shape may be a frame shape in which substantially opposing extremities are not parallel to one another. This patterned layer 157B, e.g., approximating the apodized frame shape in the simplified top plan view in FIG. 1C, is an alternative embodiment corresponding to the patterned layer 157 shown in simplified cross sectional view in FIG. 1A. Top electrical interconnect 171B extends over (e.g., electrically contacts) top acoustic reflector electrode 115B. Bottom electrical interconnect 169B extends over (e.g., electrically contacts) bottom acoustic reflector electrode 113B through bottom via region 168B. Integrated inductor 174B may be electrically coupled with top electrical interconnect 171B.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, in piezoelectric material of layers in FIG. 1A, e.g., having reverse axis orientation of negative polarization. For example, first middle and top piezoelectric layers 107, 111 discussed previously herein with respect to FIGS. 1A and 1B are reverse axis piezoelectric layers. By convention, when the first layer of normal axis crystal structure 175 is a Nitrogen, N, layer and second layer in an upward direction (in the depicted orientation) is an Aluminum, Al, layer, the piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis layer is being deposited. The oxygen containing gas may be diatomic oxygen containing gas, such as oxygen (O2). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on massflows, the oxygen composition of the gas atmosphere may be about 2 percent when the oxygen is briefly injected. This results in an aluminum oxynitride (ALON) portion of the final monolithic piezoelectric layer, integrated in the Aluminum Nitride, AlN, material, having a thickness in a range of about 5 nm to about 20 nm, which is relatively oxygen rich and very thin. Alternatively, the entire reverse axis piezoelectric layer may be aluminum oxynitride.

FIG. 1E is a perspective view of an illustrative model of a normal axis crystal structure 179 of Aluminum Nitride, AlN, in piezoelectric material of layers in FIG. 1A, e.g., having normal axis orientation of positive polarization. For example, bottom and second middle piezoelectric layers 105, 109 discussed previously herein with respect to FIGS. 1A and 1B are normal axis piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film AlN may be grown in the crystallographic c-axis positive polarization, or normal axis, orientation perpendicular relative to the substrate surface by using reactive magnetron sputtering of an Aluminum target in a nitrogen atmosphere.

Figure 2A:
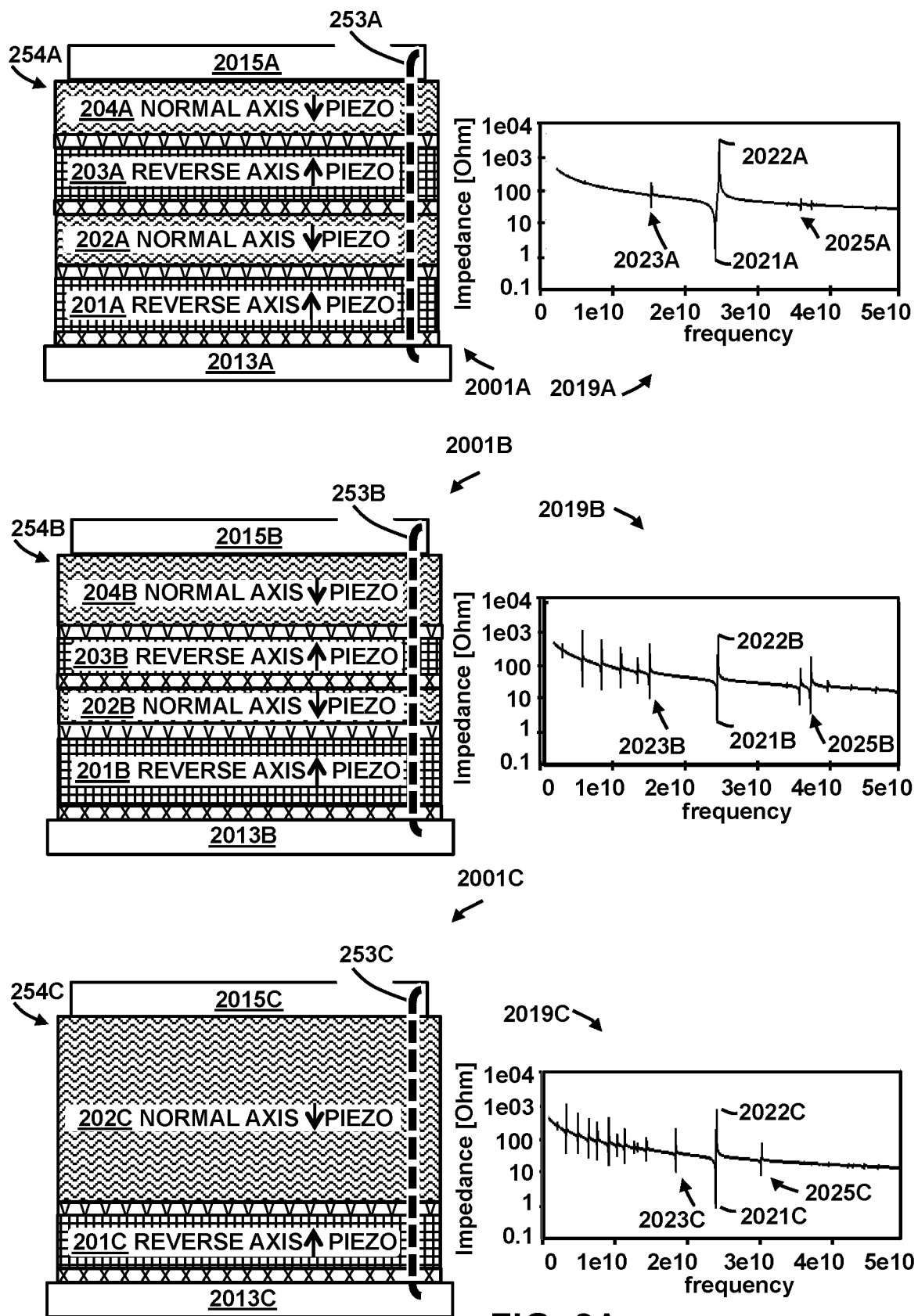
FIG. 2A shows a further simplified view of bulk acoustic wave resonators similar to the bulk acoustic wave resonator structure shown in FIG. 1A, along with adjacent charts showing their corresponding impedance versus frequency response during electrical operation.

FIG. 2A shows a further simplified view of bulk acoustic wave resonators 2001A, 2001B, 2001C similar to the bulk acoustic wave resonator structure shown in FIG. 1A, along with adjacent charts 2019A, 2019B, 2019C showing their corresponding impedance versus frequency response during electrical operation.

Bulk acoustic wave resonators 2001A through 2001C may, but need not be, bulk acoustic millimeter wave resonators 2001A through 2001C, operable with a main resonance mode having a main resonant frequency (e.g., main series resonant frequency) that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Similarly, as defined herein, bulk acoustic millimeter wave resonator (or more generally, an acoustic millimeter wave device) means a bulk acoustic wave resonator (or more generally, an acoustic wave device) having a main resonant frequency (e.g., main series resonant frequency) within a range extending from eight Gigahertz (8 GHz) to three hundred Gigahertz (300 GHz). As defined herein, millimeter acoustic wave filter means a filter comprising a bulk acoustic wave resonator (or more generally, comprising an acoustic wave device) having a main resonant frequency (e.g., main series resonant frequency) within a range extending from eight Gigahertz (8 GHz) to three hundred Gigahertz (300 GHz). As defined herein, millimeter acoustic wave integrated circuit means an integrated circuit comprising a bulk acoustic wave resonator (or more generally, comprising an acoustic wave device) having a main resonant frequency (e.g., main series resonant frequency) within a range extending from eight Gigahertz (8 GHz) to three hundred Gigahertz (300 GHz).

Bulk acoustic wave resonators 2001A through 2001C may, but need not be, bulk acoustic Super High Frequency (SHF) wave resonators 2001A through 2001C or bulk acoustic Extremely High Frequency (EHF) wave resonators 2001A through 2001C, as the terms Super High Frequency (SHF) and Extremely High Frequency (EHF) are defined by the International Telecommunications Union (ITU). For example, bulk acoustic wave resonators 2001A through 2001C may be bulk acoustic Super High Frequency (SHF) wave resonators 2001A through 2001C operable with a main resonance mode having a main resonant frequency that is a Super High Frequency (SHF) (e.g., twenty-four Gigahertz, 24 GHz) in a Super High Frequency (SHF) wave frequency band. Piezoelectric layer thicknesses may be selected to determine the main resonant frequency of bulk acoustic Super High Frequency (SHF) wave resonators 2001A through 2001C in the Super High Frequency (SHF) wave band (e.g., twenty-four Gigahertz, 24 GHz main resonant frequency).

Similarly, layer thicknesses of Super High Frequency (SHF) reflector layers (e.g., layer thickness of multi-layer metal acoustic SHF wave reflector bottom electrodes 2013A through 2013C, e.g., layer thickness of multi-layer metal acoustic SHF wave reflector top electrodes 2015A through 2015C) may be selected to determine quarter wavelength resonant frequency of such SHF reflectors at a frequency, e.g., quarter wavelength resonant frequency, within the Super High Frequency (SHF) wave band.

Alternatively, bulk acoustic wave resonators 2001A through 2001C may be bulk acoustic Extremely High Frequency (EHF) wave resonators 2001A through 2001C operable with a main resonance mode having a main resonant frequency that is an Extremely High Frequency (EHF) wave band (e.g., thirty-nine Gigahertz, 39 GHz main resonant frequency, e.g., seventy-seven Gigahertz, 77 GHz main resonant frequency) in an Extremely High Frequency (EHF) wave frequency band. As discussed previously herein, piezoelectric layer thicknesses may be selected to determine the main resonant frequency of bulk acoustic Extremely High Frequency (EHF) wave resonators 2001A through 2001C in the Extremely High Frequency (EHF) wave band (e.g., thirty-nine Gigahertz, 39 GHz main resonant frequency, e.g., seventy-seven Gigahertz, 77 GHz main resonant frequency). Similarly, layer thicknesses of Extremely High Frequency (EHF) reflector layers (e.g., layer thickness of multi-layer metal acoustic EHF wave reflector bottom electrodes 2013A through 2013C, e.g., layer thickness of multi-layer metal acoustic EHF wave reflector top electrodes 2015A through 2015C) may be selected to determine quarter wavelength resonant frequency of such EHF reflectors at a frequency, e.g., quarter wavelength resonant frequency, within the Extremely High Frequency (EHF) wave band.

The general structures of the multi-layer metal acoustic reflector top electrode and the multi-layer metal acoustic reflector bottom electrode have already been discussed previously herein with respect of FIGS. 1A and 1B. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair).

For example, in top reflector electrodes 2015A through 2015C, the first member having the relatively lower acoustic impedance of the first pair may be arranged nearest, e.g. may abut, a first piezoelectric layer (e.g. top piezoelectric layer of the BAW resonator, e.g., piezoelectric stack of the BAW resonator). This may facilitate suppressing parasitic lateral modes. In top reflector electrodes 2015A through 2015C, the first member having the relatively lower acoustic impedance may be arranged sufficiently proximate to the first layer of piezoelectric material (e.g. may be arranged sufficiently proximate to the top piezoelectric layer, e.g. may be arranged sufficiently proximate to the piezoelectric stack), so that the first member having the relatively lower acoustic impedance may contribute more, e.g., may contribute more to facilitate suppressing parasitic lateral resonances in operation of the BAW resonator than is contributed by any other top metal electrode layer of the multi-layer metal top acoustic reflector electrode.

Included in FIG. 2A is bulk acoustic SHF or EHF wave resonator 2001A in simplified view similar to the bulk acoustic wave resonator structure shown in FIGS. 1A and 1B and including a reverse axis piezoelectric layer 201A, a normal axis piezoelectric layer 202A, and another reverse axis piezoelectric layer 203A, and another normal axis piezoelectric layer 204A arranged in a four piezoelectric layer alternating stack arrangement sandwiched between multi-layer metal acoustic SHF or EHF wave reflector top electrode 2015A and multi-layer metal acoustic SHF or EHF wave reflector bottom electrode 2013A. In bulk acoustic SHF or EHF wave resonator 2001A, respective layer thicknesses of the four piezoelectric layer stack may be substantially equal. For example, respective layer thicknesses of the four piezoelectric layer stack may correspond to approximately an integral multiple of a half wavelength (e.g., half acoustic wavelength) for a resonant frequency (e.g., main resonant frequency) of bulk acoustic SHF or EHF wave resonator 2001A. For example, respective layer thicknesses of the four piezoelectric layer stack may correspond to approximately a half wavelength (e.g., half acoustic wavelength) for a resonant frequency (e.g., main resonant frequency) of bulk acoustic SHF or EHF wave resonator 2001A.

In FIG. 2A, shown directly to the right of the bulk acoustic SHF or EHF wave resonator 2001A is a corresponding diagram 2019A depicting its impedance versus frequency response during its electrical operation, as predicted by simulation. The diagram 2019A depicts the main resonant peak 2021A of the main resonant mode (e.g., main series resonant peak 2021A, e.g., main resonant admittance peak 2021A) of the bulk acoustic SHF or EHF wave resonator 2001A at its main resonant frequency (e.g., its 24 GHz series resonant frequency, e.g., its main series resonant frequency, e.g., Fs) and main parallel resonant peak 2022A of the bulk acoustic SHF or EHF wave resonator 2001A at its main parallel resonant frequency, Fp. Electromechanical coupling (e.g., electromechanical coupling coefficient) of bulk acoustic SHF or EHF wave resonator 2001A may be related to frequency difference between series resonant frequency Fs of main series resonant peak 2021A and parallel resonant frequency Fp of main parallel resonant peak 2022A.

The diagram 2019A also depicts the satellite resonance peaks 2023A, 2025A of the satellite resonant modes of the bulk acoustic SHF or EHF wave resonator 2001A at satellite frequencies above and below the main resonant frequency 2021A (e.g., above and below the 24 GHz series resonant frequency). Relatively speaking, the main resonant mode corresponding to the main resonance peak 2021A is the strongest resonant mode because it is stronger than other resonant modes of the resonator 2001A, (e.g., stronger than the satellite modes corresponding to relatively lesser satellite resonance peaks 2023A, 2025A).

Also included in FIG. 2A is bulk acoustic SHF or EHF wave resonator 2001B in simplified view similar to the bulk acoustic wave resonator structure shown in FIGS. 1A and 1B and including a bottom reverse axis piezoelectric layer 201B, first middle normal axis piezoelectric layer 202B, and second middle reverse axis piezoelectric layer 203B, and top normal axis piezoelectric layer 204B arranged in another four piezoelectric layer alternating stack arrangement sandwiched between multi-layer metal acoustic SHF or EHF wave reflector top electrode 2015B and multi-layer metal acoustic SHF or EHF wave reflector bottom electrode 2013B. In bulk acoustic SHF or EHF wave resonator 2001B, respective layer thicknesses of the four piezoelectric layer stack may be varied, as already discussed in detail previously herein, for example, with respect to bulk acoustic waver resonator 100 shown in FIG. 1A. For example, respective layer thicknesses of bottom reverse axis piezoelectric layer 201B and top normal axis piezoelectric layer 204B may be substantially greater (e.g., may be substantially thicker) then respective layer thicknesses of first middle normal axis piezoelectric layer 202B, and second middle reverse axis piezoelectric layer 203B. This may limit electromechanical coupling of bulk acoustic SHF or EHF wave resonator 2001B. Bulk acoustic SHF or EHF wave resonator 2001B having varied layer thickness of its four piezoelectric layers 201B, 202B, 203B, 204B, may have electromechanical coupling (e.g., electromechanical coupling coefficient) that is relatively lower than electromechanical coupling (e.g., electromechanical coupling coefficient) of bulk acoustic SHF or EHF wave resonator 2001A having substantially equal layer thickness of its four piezoelectric layers 201A, 202A, 203A, 204A.

In FIG. 2A, shown directly to the right of the bulk acoustic SHF or EHF wave resonator 2001B is a corresponding diagram 2019B depicting its impedance versus frequency response during its electrical operation, as predicted by simulation. The diagram 2019B depicts the main resonant peak 2021B of the main resonant mode (e.g., main series resonant peak 2021B, e.g., main resonant admittance peak 2021B) of the bulk acoustic SHF or EHF wave resonator 2001B at its main resonant frequency (e.g., its 24 GHz series resonant frequency, e.g., its main series resonant frequency, e.g., Fs) and main parallel resonant peak 2022B of the bulk acoustic SHF or EHF wave resonator 2001B at its main parallel resonant frequency, Fp. Electromechanical coupling (e.g., electromechanical coupling coefficient) of bulk acoustic SHF or EHF wave resonator 2001B may be related to frequency difference between series resonant frequency Fs of main series resonant peak 2021B and parallel resonant frequency Fp of main parallel resonant peak 2022B. Comparing diagram 2019B to diagram 2019A, 2019B shows relatively lower electromechanical coupling than what is shown in diagram 2019A (e.g., frequency difference between series resonant frequency Fs of main series resonant peak 2021B and parallel resonant frequency Fp of main parallel resonant peak 2022B in diagram 2019B is relatively less than frequency difference between series resonant frequency Fs of main series resonant peak 2021A and parallel resonant frequency Fp of main parallel resonant peak 2022A in diagram 2019A).

The diagram 2019B also depicts the satellite resonance peaks 2023B, 2025B of the satellite resonant modes of the bulk acoustic SHF or EHF wave resonator 2001B at satellite frequencies above and below the main resonant frequency 2021B (e.g., above and below the 24 GHz series resonant frequency). Relatively speaking, the main resonant mode corresponding to the main resonance peak 2021B is the strongest resonant mode because it is stronger than other resonant modes of the resonator 2001B, (e.g., stronger than the satellite modes corresponding to relatively lesser satellite resonance peaks 2023B, 2025B). Comparing diagram 2019B to 2019A, diagram 2019B shows relatively stronger satellite resonances 2023B, 2025B. Thickness of the second middle piezoelectric layer 203B may be sufficiently different than thickness of bottom piezoelectric layer to facilitate placement of the satellite resonant frequency away from the main resonant frequency (e.g., by 50% or more, e.g., by 75% or more, e.g., by 80% or more) of the main resonant frequency of bulk acoustic wave resonator 2001B.

Also included in FIG. 2A is bulk acoustic SHF or EHF wave resonator 2001C in simplified view similar to the bulk acoustic wave resonator structure shown in FIGS. 1A and 1B and including a bottom reverse axis piezoelectric layer 201C, and top normal axis piezoelectric layer 202C arranged in a two piezoelectric layer alternating stack arrangement sandwiched between multi-layer metal acoustic SHF or EHF wave reflector top electrode 2015C and multi-layer metal acoustic SHF or EHF wave reflector bottom electrode 2013C. In bulk acoustic SHF or EHF wave resonator 2001C, respective layer thicknesses of the two piezoelectric layer stack may be varied, as already discussed in detail previously herein. For example, layer thicknesses of top normal axis piezoelectric layer 204C may be substantially greater (e.g., may be substantially thicker, e.g., may be three times thicker) than bottom reverse axis piezoelectric layer 201C. This may further limit electromechanical coupling of bulk acoustic SHF or EHF wave resonator 2001C. Bulk acoustic SHF or EHF wave resonator 2001C having varied layer thickness of its piezoelectric layers 201C, 202C, may have electromechanical coupling (e.g., electromechanical coupling coefficient) that is relatively lower than electromechanical coupling (e.g., electromechanical coupling coefficient) of bulk acoustic SHF or EHF wave resonator 2001A and of bulk acoustic SHF or EHF wave resonator 2001B.

In FIG. 2A, shown directly to the right of the bulk acoustic SHF or EHF wave resonator 2001C is a corresponding diagram 2019C depicting its impedance versus frequency response during its electrical operation, as predicted by simulation. The diagram 2019C depicts the main resonant peak 2021C of the main resonant mode (e.g., main series resonant peak 2021C, e.g., main resonant admittance peak 2021C) of the bulk acoustic SHF or EHF wave resonator 2001C at its main resonant frequency (e.g., its 24 GHz series resonant frequency, e.g., its main series resonant frequency, e.g., Fs) and main parallel resonant peak 2022C of the bulk acoustic SHF or EHF wave resonator 2001C at its main parallel resonant frequency, Fp. Electromechanical coupling (e.g., electromechanical coupling coefficient) of bulk acoustic SHF or EHF wave resonator 2001C may be related to frequency difference between series resonant frequency Fs of main series resonant peak 2021C and parallel resonant frequency Fp of main parallel resonant peak 2022C. Comparing diagram 2019C to diagram 2019A and to diagram 2019B, diagram 2019C shows relatively lower electromechanical coupling than what is shown in diagram 2019A (e.g., frequency difference between series resonant frequency Fs of main series resonant peak 2021C and parallel resonant frequency Fp of main parallel resonant peak 2022C in diagram 2019C shows relatively lower electromechanical coupling).

In the example resonators, 2001A through 2001C of FIG. 2A, a notional heavy dashed line is used in depicting respective etched edge region, 253A through 253C, associated with the example resonators, 2001A through 2001C. Similarly, in the example resonators, 2001A through 2001C of FIG. 2A a laterally opposed etched edge region 254A through 254C may be arranged laterally opposite from etched edge region, 253A through 253C. The respective etched edge region may, but need not, assist with acoustic isolation of the resonators, 2001A through 2001C. The respective etched edge region may, but need not, help with avoiding acoustic losses for the resonators, 2001A through 2001C. The respective etched edge region, 253A through 253C, (and the laterally opposed etched edge region 254A through 254C) may extend along the thickness dimension of the respective piezoelectric layer stack. The respective etched edge region, 253A through 253C, (and the laterally opposed etched edge region 254A through 254C) may extend along the thickness dimension of the respective multi-layer metal acoustic SHF or EHF wave reflector bottom electrode, 2013A through 2013C, of the resonators, 2001A through 2001C. The respective etched edge region, 253A through 253C, (and the laterally opposed etched edge region 254A through 254C) may extend through (e.g., entirely through or partially through) the respective multi-layer metal bottom acoustic SHF or EHF wave reflector electrode, 2013A through 2013C. The respective etched edge region, 253A through 253I, (and the laterally opposed etched edge region 254A through 254I) may extend along the thickness dimension of the respective multi-layer metal top acoustic SHF or EHF wave reflector electrode, 2015A through 2015C of the resonators, 2001A through 2001C. The etched edge region, 253A through 253C, (and the laterally opposed etched edge region 254A through 254C) may extend through (e.g., entirely through or partially through) the respective multi-layer metal bottom acoustic SHF or EHF wave reflector electrode, 2013A through 2013C.

As shown in FIGS. 2A, first mesa structures corresponding to the respective stacks of piezoelectric material layers may extend laterally between (e.g., may be formed between) etched edge regions 253A through 253C and laterally opposing etched edge region 254A through 254C. Second mesa structures corresponding to multi-layer metal bottom acoustic SHF or EHF wave reflector electrode 2013A through 2013C may extend laterally between (e.g., may be formed between) etched edge regions 253A through 253C and laterally opposing etched edge region 254A through 254C. Third mesa structures corresponding to multi-layer metal top acoustic SHF or EHF wave reflector electrode 2015A through 2015C may extend laterally between (e.g., may be formed between) etched edge regions 253A through 253C and laterally opposing etched edge region 254A through 254C.

Figure 2B:
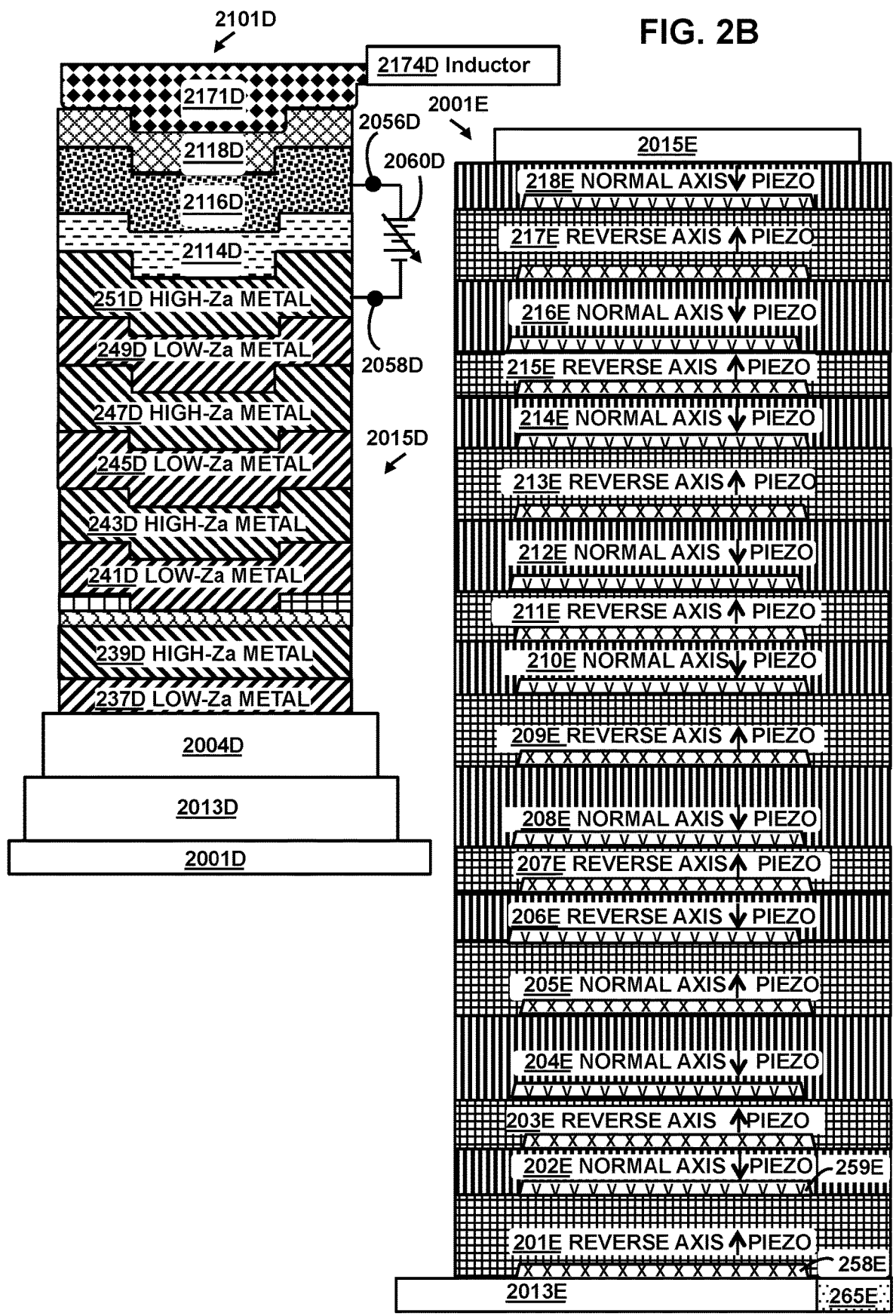
FIG. 2B shows simplified views of additional alternative bulk acoustic wave resonator structures.

FIG. 2B shows simplified views of additional alternative bulk acoustic wave resonator structures 2101D, 2001E. Bulk acoustic wave resonator structure 2101D may comprise an alternating piezoelectric axis arrangement of a piezoelectric resonant volume 2004D. Piezoelectric resonant volume 2004D may comprise piezoelectric layers having varying thicknesses. This may (but need not) limit (e.g., reduce) electromechanical coupling, as already discussed in detail previously herein. Piezoelectric resonant volume 2004D may be sandwiched between bottom acoustic reflector electrode 2013D and top acoustic reflector electrode 2015D and arranged over substrate 2001D (e.g., silicon substrate 2001D. Top acoustic reflector electrode 2015D may comprise first pair of top metal electrode layers 237D, 239D, second pair of top metal electrode layers 241D, 243D, third pair of top metal electrode layers 245D, 247D, and fourth pair of top metal electrode layers 249D, 251D, in with members of the pairs in an alternating acoustic impedance arrangement (e.g., alternating between low acoustic impedance metal and high acoustic impedance metal). A first integrated capacitive layer 2114D may be sandwiched between an additional metal layer 2116D (e.g., Aluminum layer 2116D) and the fourth pair of top metal electrode layers 249D, 251D. Capacitance of first integrated capacitive layer 2114D may be tunable (e.g., tunable via applied bias voltage) to facilitate tuning of a main resonant frequency of the bulk acoustic wave resonator 2101D. First integrated capacitive layer 2114D may comprise barium strontium titanate. Tuning may be facilitated by coupling a variable tuning bias voltage across 2060D across integrated capacitive layer 2114D via the additional metal layer 2116D (e.g., Aluminum layer 2116D) and the fourth pair of top metal electrode layers 249D, 251D. Variable tuning bias voltage across 2060D may be coupled with the additional metal layer 2116D (e.g., Aluminum layer 2116D) and the fourth pair of top metal electrode layers 249D, 251D via coupling nodes 2056D, 2058D. An additional integrated capacitive layer 2118D (e.g., second integrated capacitive layer 2118D, e.g., silicon dioxide layer 211D) may be sandwiched between additional metal layer 2116D (e.g., Aluminum layer 2116D) and top current spreading layer 2171D. First integrated capacitive layer 2114D may comprise a first integrated capacitive material (e.g., barium strontium titanate). Second integrated capacitive layer 2118D may comprise a second integrated capacitive material (e.g., silicon dioxide) that is different than the first integrated capacitive material (e.g., different that barium strontium titanate). Second integrated capacitive layer 2118D may be non-piezoelectric. Although barium strontium titanate has been discussed for the example first integrated capacitive layer 2114D, in alternative examples first integrated capacitive layer 2114D may be non-piezoelectric. In another alternative example of the bulk acoustic wave resonator structure 2101D, the first integrated capacitive layer 2114D and the second integrated capacitive layer 2118D may comprise the same material (e.g., silicon dioxide) and may be connected in parallel by connecting top acoustic reflector electrode 251D and the top current spreading layer 2171D to a common node, and connecting metal layer 2116D to the input (or output terminal) of the bulk acoustic wave resonator structure 2101D. In such arrangement, the series total capacitance of the bulk acoustic wave resonator structure 2101D may be increased without decreasing the thickness of the first and second integrated capacitive layers 2114D and 2118D. This may increase, for example, power handling of the bulk acoustic wave resonator structure 2101D, as would be appreciated by one skilled in the art, upon reading this disclosure.

In other examples, first integrated capacitive layer 2114D, may be piezoelectric but with a fundamental thickness resonance far in frequency from (e.g., at significantly lower frequency than) the main resonant frequency of bulk acoustic wave resonator structure 2101D. Top current spreading layer 2171D may be electrically coupled with integrated inductor 2174D.

FIG. 2B also shows bulk acoustic wave resonator structure 2001E. Bulk acoustic wave resonator 2001E may include nine reverse axis piezoelectric layers 201E, 203E, 205E, 207E, 209E, 211E, 213E, 215E, 217E and nine normal axis piezoelectric layers 202E, 204E, 206E, 208E, 210E, 212E, 214E, 216E, 218E arranged in an eighteen piezoelectric layer alternating stack arrangement sandwiched between multi-layer metal top acoustic wave reflector electrode 2015E and multi-layer metal bottom acoustic wave reflector electrode 2013E. A planarization layer 265E at a limited extent of multi-layer metal bottom acoustic wave reflector electrode 2013E may facilitate fabrication of the eighteen piezoelectric layer alternating axis stack arrangement (e.g., stack of eighteen piezoelectric layers 201E through 218E).

For the bulk acoustic wave resonator 2001E having the alternating axis stack of eighteen piezoelectric layers with varying thicknesses of piezoelectric layers to lower Kt2 from, for example, about 5.5% to, for example, 1.9%, simulation of the 24 GHz design estimates an average pass band quality factor of approximately 3050. Scaling this 24 GHz, eighteen piezoelectric layer design to a 37 GHz, eighteen piezoelectric layer design, may have an average pass band quality factor of approximately 2260 as estimated from the simulation. Scaling this 24 GHz, eighteen piezoelectric layer design to a 77 GHz, eighteen piezoelectric layer design, may have an average pass band quality factor of approximately 1280 as estimated from the simulation.

First piezoelectric layer 201E may interface with (e.g., may be sputter deposited on) first polarizing layer 258E to facilitate (e.g., to determine) the reverse axis orientation of the first piezoelectric layer 201E. For example, the first polarizing layer 258E may be a first polarizing seed layer 258E to facilitate orienting the reverse axis orientation of the first piezoelectric layer 201E as the first piezoelectric layer 201E interfaces with (e.g., may be sputter deposited on) the first polarizing layer 258E. The first polarizing layer 258E may be a first polarizing interposer layer 258E, e.g., interposed between first piezoelectric layer 201E and multi-layer metal bottom acoustic wave reflector electrode 2013E The first polarizing layer 258E may comprise oxygen (e.g., may comprise an oxygen nitride, e.g., may comprise an aluminum oxynitride). Alternatively or additionally the first polarizing layer 258E may comprise Aluminum Silicon Nitride (e.g., AlSiN). Alternatively or additionally the first polarizing layer 258E may comprise a nitride comprising Aluminum and Silicon Magnesium, e.g., Al(SiMg)N, in which a ratio of magnesium to Silicon may be less than 1 (Mg/Si ratio <1).

The first polarizing layer 258E may have suitable thickness, for example, taking into account acoustic material properties to facilitate performance of the piezoelectric stack of the bulk acoustic wave resonator 2001E. For example, resonator fabrication and testing may facilitate determining suitable thickness, for example, taking into account acoustic material properties to facilitate performance of the piezoelectric of the bulk acoustic wave resonator 2001E. Alternatively or additionally Finite Element Modeling (FEM) simulations and varying parameters in fabrication prior to subsequent testing may help to optimize first polarizing layer 258E thickness and material designs for the piezoelectric stack. A minimum thickness for first polarizing layer 258E may be about one mono-layer, or about five Angstroms (5 A). The first polarizing layer 258E thickness may be greater or less than about five-hundred Angstroms (500 A) for a twenty-four Gigahertz (24 GHz) resonator design, with thickness scaling inversely with frequency for alternative resonator designs.

As shown in FIG. 2B, nine reverse axis piezoelectric layers 201E, 203E, 205E, 207E, 209E, 211E, 213E, 215E, 217E may interface with (e.g., may be sputter deposited on) respective polarizing layers to respectively facilitate (e.g., to respectively determine) the respective reverse axis orientations of nine reverse axis piezoelectric layers 201E, 203E, 205E, 207E, 209E, 211E, 213E, 215E, 217E. Accordingly, previous discussions herein about suitable materials and thickness for the first polarizing layer 258E to facilitate the reverse axis of first reverse axis piezoelectric layer 201E may likewise be applicable to respective additional polarizing layers (e.g., eight additional polarizing layers) to respectively facilitate the respective reverse axis of additional (e.g., eight additional) reverse axis piezoelectric layers 203E, 205E, 207E, 209E, 211E, 213E, 215E, 217E. For brevity and clarity, such discussions are referenced and incorporated rather than repeated in full.

Second piezoelectric layer 202E may interface with (e.g., may be sputter deposited on) second polarizing layer 259E to facilitate (e.g., to determine) the normal axis orientation of the second piezoelectric layer 202E. For example, the second polarizing layer 259E may be a second polarizing seed layer 259E to facilitate orienting the normal axis orientation of the second piezoelectric layer 202E, as the second piezoelectric layer 202E interfaces with (e.g., may be sputter deposited on) the second polarizing layer 259E. The second polarizing layer 259E may be a second polarizing interposer layer 259E, e.g., interposed between e.g., sandwiched between, the second piezoelectric layer 202E and the first piezoelectric layer 201E.

The second polarizing layer 259E may comprise metal. For example, second polarizing layer 259E may comprise relatively high acoustic impedance metal (e.g., relatively high acoustic impedance metals such as Tungsten (W) or Molybdenum (Mo)). The second polarizing layer 259E may comprise a dielectric (e.g. second polarizing dielectric layer 259E).

The second polarizing layer 259E may comprise Aluminum Oxide, e.g., $Al_2O_3$ (or other stoichiometry). The second polarizing layer 259E may comprise Aluminum and may comprise Magnesium and may comprise Silicon, e.g, AlMgSi. The second polarizing layer may comprise nitrogen, e.g, Al(SiMg)N (e.g., with Mg/Si ratio >1). For example, second polarizing layer 259E may comprise a dielectric that has a positive acoustic velocity temperature coefficient, e.g., to facilitate acoustic velocity increasing with increasing temperature of the dielectric. The second polarizing layer 259E may comprise, for example, silicon dioxide.

The second polarizing layer 259E may comprise a nitride. The second polarizing layer 259E may comprise a doped nitride. The second polarizing layer 259E may comprise Aluminum Nitride doped with a suitable percentage of a suitable dopant (e.g., Scandium, e.g., Magnesium Zirconium, e.g., Magnesium Hafnium, e.g., Magnesium Niobium). For example, the second polarizing layer 259E may comprise Aluminum Scandium Nitride (AlScN). For example, Scandium doping of Aluminum Nitride may be within a range from a fraction of a percent of Scandium to thirty percent Scandium. For example, Magnesium Zirconium doping of Aluminum nitride may be within a range from a fraction of a percent of Magnesium and a fraction of a percent of Zirconium to for example twenty percent or less of Magnesium and to twenty percent or less of Zirconium, for example Al(Mg0.5Zr0.5)0.25N). For example, Magnesium Hafnium doping of Aluminum nitride may be within a range from a fraction of a percent of Magnesium and a fraction of a percent of Hafnium to for example twenty percent or less of Magnesium and twenty percent or less of Hafnium, for example e.g., Al(Mg0.5Hf0.5)0.25N.

The second polarizing layer 259E may comprise a semiconductor. The second polarizing layer 259E may comprise doped Aluminum Nitride, as just discussed. The second polarizing layer 259E may comprise sputtered silicon.

The second polarizing layer 259E may have suitable thickness, for example, taking into account acoustic material properties to facilitate performance of the piezoelectric stack of the bulk acoustic wave resonator 2001E. For example, resonator fabrication and testing may facilitate determining suitable thickness, for example, taking into account acoustic material properties to facilitate performance of the piezoelectric stack of the bulk acoustic wave resonator 2001E. Alternatively or additionally Finite Element Modeling (FEM) simulations and varying parameters in fabrication prior to subsequent testing may help to optimize second polarizing layer 259E thickness and material designs for the piezoelectric stack. A minimum thickness for second polarizing layer 259E may be about one mono-layer, or about five Angstroms (5 A). The second polarizing layer 259E thickness may be greater or less than about five-hundred Angstroms (500 A) for a twenty-four Gigahertz (24 GHz) resonator design, with thickness scaling inversely with frequency for alternative resonator designs.

As shown in FIG. 2B, nine normal axis piezoelectric layers 202E, 204E, 206E, 208E, 210E, 212E, 214E, 216E, 218E may interface with (e.g., may be sputter deposited on) respective polarizing layers to respectively facilitate (e.g., to respectively determine) the respective normal axis orientations of nine normal axis piezoelectric layers 202E, 204E, 206E, 208E, 210E, 212E, 214E, 216E, 218E. Accordingly, previous discussions herein about suitable materials and thickness for the second polarizing layer 259E to facilitate the normal axis of second normal axis piezoelectric layer 202E may likewise be applicable to respective additional polarizing layers (e.g., eight additional polarizing layers) to respectively facilitate the respective noral axis of additional (e.g., eight additional) normal axis piezoelectric layers 204E, 206E, 208E, 210E, 212E, 214E, 216E, 218E. For brevity and clarity, such discussions are referenced and incorporated rather than repeated in full.

Piezoelectric layers 201E through 218E may have respective active regions where multi-layer metal top acoustic wave reflector electrode 2015E overlaps multi-layer metal bottom acoustic wave reflector electrode 2013E. Polarizing layers (e.g., first polarizing layer 258E, e.g., second polarizing layer 259, e.g., additional polarizing layers) may be patterned, e.g., using photolithography and etching techniques. Polarizing layers (e.g., first polarizing layer 258E, e.g., second polarizing layer 259, e.g., additional polarizing layers) may be patterned, for example, to have extent limited to the respective active region of piezoelectric layers 201E through 218E, as shown in FIG. 2B.

As shown in FIG. 2B, thicknesses of the eighteen piezoelectric layers 201E through 218E may be varied. This may (but need not) limit (e.g., reduce) electromechanical coupling, as already discussed in detail previously herein. First piezoelectric layer 201E may have a first thickness. Second piezoelectric layer 202E may have a second thickness. Third piezoelectric layer 203E may have a third thickness. Fourth piezoelectric layer 204E may have a fourth thickness. Fifth piezoelectric layer 205E may have a fifth thickness. Sixth piezoelectric layer 206E may have a sixth thickness. Seventh piezoelectric layer 207E may have a seventh thickness. Eight piezoelectric layer 208E may have an eighth thickness. Ninth piezoelectric layer 209E may have a ninth thickness. Tenth piezoelectric layer 210E may have a tenth thickness. Eleventh piezoelectric layer 211E may have an eleventh thickness. Twelfth piezoelectric layer 212E may have a twelfth thickness. Thirteenth piezoelectric layer 213E may have a thirteenth thickness. Fourteenth piezoelectric layer 214E may have a fourteenth thickness. Fifteenth piezoelectric layer 215E may have a fifteenth thickness. Sixteenth piezoelectric layer 216E may have a sixteenth thickness. Seventeenth piezoelectric layer 217E may have a seventeenth thickness. Eighteenth piezoelectric layer 218E may have an eighteenth thickness.

At least one or more of the foregoing piezoelectric layers may have respective thicknesses different (e.g., substantially different) than an integral multiple of a half acoustic wavelength of the main resonant frequency of the example bulk acoustic wave resonators 2001E (e.g., the first thickness of the first piezoelectric layer 201E may be greater than a half acoustic wavelength, e.g., the second thickness of the second piezoelectric layer 202E may be less than a half acoustic wavelength, e.g., the third thickness of the third piezoelectric layer 203E may be less than a half acoustic wavelength, e.g., the fourth thickness of the fourth piezoelectric layer 204E may be greater than a half acoustic wavelength, e.g., the fifth thickness of the fifth piezoelectric layer 205E may be greater than a half acoustic wavelength, e.g., the sixth thickness of the second piezoelectric layer 206E may be less than a half acoustic wavelength, e.g., the seventh thickness of the seventh piezoelectric layer 207E may be less than a half acoustic wavelength, e.g., the eighth thickness of the eighth piezoelectric layer 208E may be greater than a half acoustic wavelength, e.g., the ninth thickness of the ninth piezoelectric layer 209E may be greater than a half acoustic wavelength, e.g., the tenth thickness of the tenth piezoelectric layer 210E may be less than a half acoustic wavelength, e.g., the eleventh thickness of the eleventh piezoelectric layer 211E may be less than a half acoustic wavelength, e.g., the twelfth thickness of the twelfth piezoelectric layer 212E may be greater than a half acoustic wavelength, e.g., the thirteenth thickness of the thirteenth piezoelectric layer 213E may be greater than a half acoustic wavelength, e.g., the fourteenth thickness of the fourteenth piezoelectric layer 214E may be less than a half acoustic wavelength, e.g., the fifteenth thickness of the fifteenth piezoelectric layer 215E may be less than a half acoustic wavelength, e.g., the sixteenth thickness of the sixteenth piezoelectric layer 216E may be greater than a half acoustic wavelength, e.g., the seventeenth thickness of the seventeenth piezoelectric layer 217E may be greater than a half acoustic wavelength, e.g., the eighteenth thickness of the eighteenth piezoelectric layer 218E may be less than a half acoustic wavelength).

The first thickness of the first piezoelectric layer 201E may be different than the second thickness of the second piezoelectric layer 202E. The first thickness of the first piezoelectric layer 201E may be different than the third thickness of the third piezoelectric layer 203E. The first thickness of the first piezoelectric layer 201E may be different than the sixth thickness of the sixth piezoelectric layer 206E. The first thickness of the first piezoelectric layer 201E may be different than the seventh thickness of the seventh piezoelectric layer 207E. The first thickness of the first piezoelectric layer 201E may be different than the tenth thickness of the tenth piezoelectric layer 210E. The first thickness of the first piezoelectric layer 201E may be different than the eleventh thickness of the eleventh piezoelectric layer 211E. The first thickness of the first piezoelectric layer 201E may be different than the fourteenth thickness of the fourteenth piezoelectric layer 214E. The first thickness of the first piezoelectric layer 201E may be different than the fifteenth thickness of the fifteenth piezoelectric layer 215E. The first thickness of the first piezoelectric layer 201E may be different than the eighteenth thickness of the eighteenth piezoelectric layer 218E.

Figure 3A:
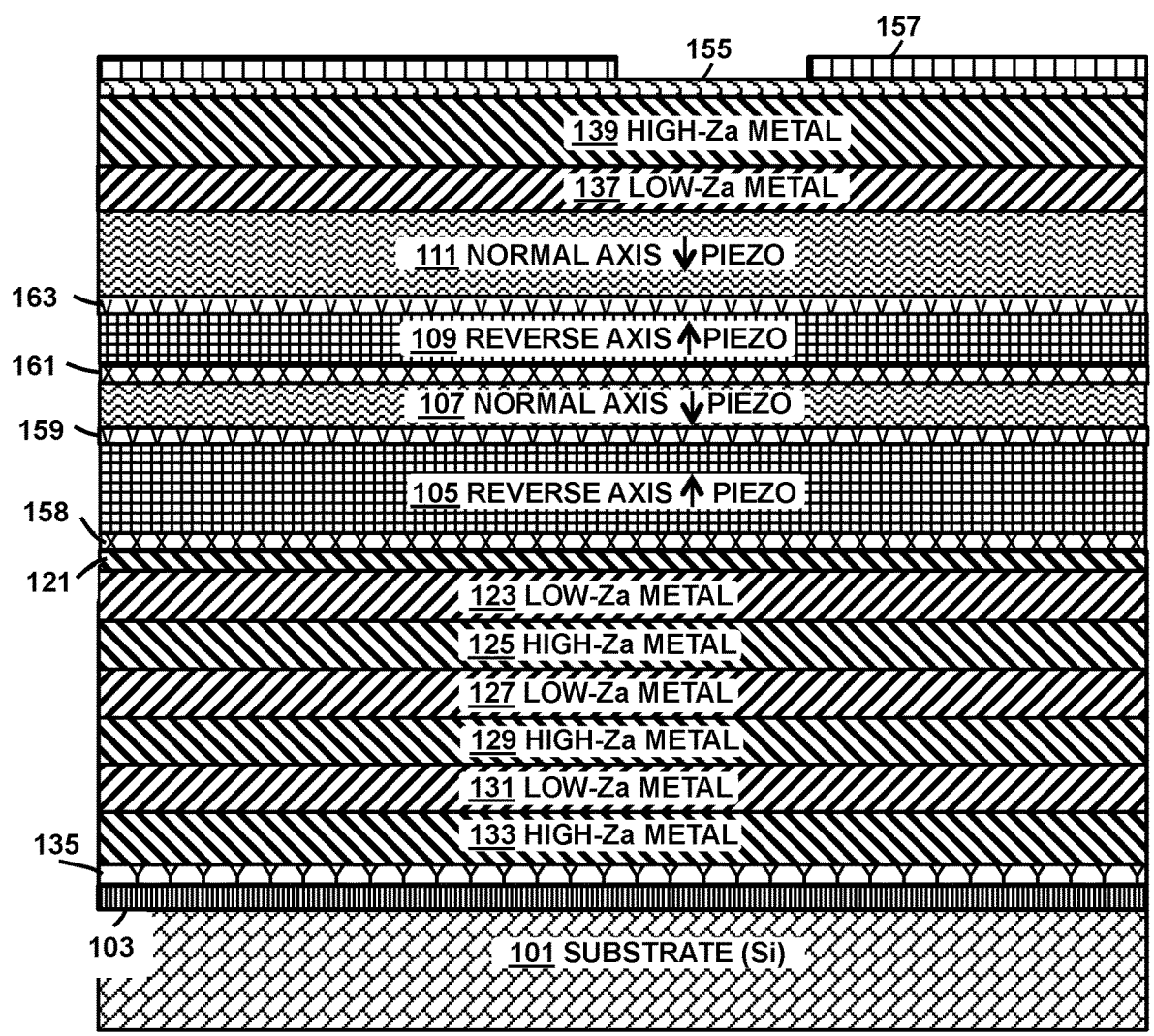
FIGS. 3A through 3E illustrate example integrated circuit structures used to form the example bulk acoustic wave resonator structure of FIG. 1A. Note that although AlN is used as an example piezoelectric layer material, the present disclosure is not intended to be so limited. For example, in some embodiments, the piezoelectric layer material may include other group III material-nitride (III-N) compounds (e.g., any combination of one or more of gallium, indium, and aluminum with nitrogen), and further, any of the foregoing may include dopants, e.g., Scandium, e.g., Magnesium, e.g., Oxygen, e.g., Silicon.

FIGS. 3A through 3E illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$), e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). In some examples, the seed layer 103 may also be at least partially formed of electrical conductivity enhancing material such as Aluminum (Al) or Gold (Au). Next a bottom current spreading layer 135 may be sputter deposited on the seed layer 103. Bottom current spreading layer 135 may be bilayer. Bottom current spreading layer 135 may comprise a relatively low acoustic impedance metal (e.g., Aluminum) sputtered over a sputter deposited relatively high acoustic impedance metal (e.g., Tungsten). Previous discussions herein, for example, about materials, structures and layer thicknesses for current spreading layers (e.g., top current spreading layer, e.g. bottom current spreading layer) may likewise be applicable to bottom current spreading layer 135. For brevity and clarity, such discussions are referenced and incorporated rather than repeated in full.

Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the third pair of bottom metal electrode layers, 133, 131, may be deposited by sputtering the high acoustic impedance metal for a first bottom metal electrode layer 133 of the pair on the current spreading layer 135, and then sputtering the low acoustic impedance metal for a second bottom metal electrode layer 131 of the pair on the first layer 133 of the pair. Similarly, the second pair of bottom metal electrode layers, 129, 127, may then be deposited by sequentially sputtering from the high acoustic impedance metal target and the low acoustic impedance metal target. Similarly, the first pair of bottom metal electrodes 125, 123, may then be deposited by sequentially sputtering from the high acoustic impedance metal target and the low acoustic impedance metal target. Respective layer thicknesses of bottom metal electrode layers of the first, second and third pairs 123, 125, 127, 129, 131, 133 may correspond to approximately a quarter wavelength (e.g., a quarter of an acoustic wavelength) of the resonant frequency at the resonator (e.g., respective layer thickness of about six hundred Angstroms (660 A) for the example 24 GHz resonator). An initial bottom metal electrode layer 121 of high acoustic impedance metal (e.g., Tungsten) may be sputtered over low acoustic impedance metal electrode layer 124 of the first pair of bottom metal electrode layers for the bottom acoustic reflector. Initial bottom metal electrode layer 121 of the high acoustic impedance metal (e.g., Tungsten) is depicted as relatively thinner than thickness of remainder bottom acoustic layers. For example, a thickness of initial bottom metal electrode layer 121 may be, for example, about an eighth wavelength (e.g., an eighth of an acoustic wavelength) of the resonant frequency of the resonator (e.g., layer thickness of about one hundred (100 A) to about three hundred Angstroms (300 A) for the example 24 GHz resonator). A stack of four layers of piezoelectric material, for example, four layers of Aluminum Nitride (AlN) having the wurtzite structure may be deposited by sputtering. For example, bottom piezoelectric layer 105, first middle piezoelectric layer 107, second middle piezoelectric layer 109, and top piezoelectric layer 111 may be deposited by sputtering. The four layers of piezoelectric material in the stack 104, may have the alternating axis arrangement in the respective stack 104.

For example the bottom piezoelectric layer 105 may be sputter deposited over a sputter deposition of first polarizing layer 158 to have the reverse axis orientation, which is depicted in FIG. 3A using the upward directed arrow. The first middle piezoelectric layer 107 may be sputter deposited over a sputter deposition of second polarizing layer 159 to have the to have the normal axis orientation, which is depicted in the FIG. 3A using the downward directed arrow. The second middle piezoelectric layer 109 may be sputter deposited over a sputter deposition of third polarizing layer 161 to have the reverse axis orientation, which is depicted in the FIG. 3A using the upward directed arrow. The top piezoelectric layer 111 may be sputter deposited over a sputter deposition of fourth polarizing layer 163 to have the normal axis orientation, which is depicted in the FIG. 3A using the downward directed arrow. As mentioned previously herein, polycrystalline thin film MN may be selectively grown in the reverse axis orientation or the normal axis orientation perpendicular relative to the substrate surface using reactive magnetron sputtering of the Aluminum target in the nitrogen atmosphere over selected polarizing layers (e.g., first polarizing layer 158, e.g., second polarizing layer 159, e.g., third polarizing layer 161, e.g., fourth polarizing layer 163) to facilitate (e.g., determine) selection of the reverse axis orientation or normal axis orientation.

The first pair of top metal electrode layers, 137, 139, may be deposited by sputtering the low acoustic impedance metal for a first top metal electrode layer 137 of the pair, and then sputtering the high acoustic impedance metal for a second top metal electrode layer 139 of the pair on the first layer 137 of the pair. As shown in the figures, layer thickness may be thinner for the first member 137 of the first pair 137, 139 of top metal electrode layers. For example, the first member 137 of the first pair of top metal electrode layers for the top acoustic reflector is depicted as relatively thinner (e.g., thickness of the first member 137 of the first pair of top metal electrode layers is depicted as relatively thinner) than thickness of remainder top acoustic layers. For example, a thickness of the first member 137 of the first pair of top metal electrode layers may be about 60 Angstroms lesser, e.g., substantially lesser than an odd multiple (e.g., 1×, 3×, etc). of a quarter of a wavelength (e.g., 60 Angstroms lesser than one quarter of the acoustic wavelength) for the first member 137 of the first pair of top metal electrode layers. For example, if Titanium is used as the low acoustic impedance metal for a 24 GHz resonator (e.g., resonator having a main resonant frequency of about 24 GHz), a thickness for the first member 137 of the first pair of top metal electrode layers of the top acoustic reflector may be about 570 Angstroms, while respective layer thicknesses shown in the figures for corresponding members of the other pairs of top metal electrode layers may be substantially thicker. For example, layer thickness for the second member 139 of the first pair 137, 139 of top metal electrode layers of may correspond to approximately a quarter wavelength (e.g., a quarter acoustic wavelength) of the resonant frequency of the resonator (e.g., respective layer thickness of about six hundred Angstroms (600 A) for the example 24 GHz resonator). The optional mass load layer 155 may be sputtered from a high acoustic impedance metal target onto the second top metal electrode layer 139 of the pair. Thickness of the optional mass load layer may be as discussed previously herein. The mass load layer 155 may be an additional mass layer to increase electrode layer mass, so as to facilitate the preselected frequency compensation down in frequency (e.g., compensate to decrease resonant frequency). Alternatively, the mass load layer 155 may be a mass load reduction layer, e.g., ion milled mass load reduction layer 155, to decrease electrode layer mass, so as to facilitate the preselected frequency compensation up in frequency (e.g., compensate to increase resonant frequency). Accordingly, in such case, in FIG. 3A mass load reduction layer 155 may representatively illustrate, for example, an ion milled region of the second member 139 of the first pair of electrodes 137, 139 (e.g., ion milled region of high acoustic impedance metal electrode 139).

The plurality of lateral features 157 (e.g., patterned layer 157) may be formed by sputtering a layer of additional mass loading having a layer thickness as discussed previously herein. The plurality of lateral features 157 (e.g., patterned layer 157) may be made by patterning the layer of additional mass loading after it is deposited by sputtering. The patterning may done by photolithographic masking, layer etching, and mask removal. Initial sputtering may be sputtering of a metal layer of additional mass loading from a metal target (e.g., a target of Tungsten (W), Molybdenum (Mo), Titanium (Ti) or Aluminum (Al)). In alternative examples, the plurality of lateral features 157 may be made of a patterned dielectric layer (e.g., a patterned layer of Silicon Nitride (SiN), Silicon Dioxide ($SiO_2$) or Silicon Carbide (SiC)). For example Silicon Nitride, and Silicon Dioxide may be deposited by reactive magnetron sputtering from a silicon target in an appropriate atmosphere, for example Nitrogen, Oxygen or Carbon Dioxide. Silicon Carbide may be sputtered from a Silicon Carbide target.

Figure 3B:
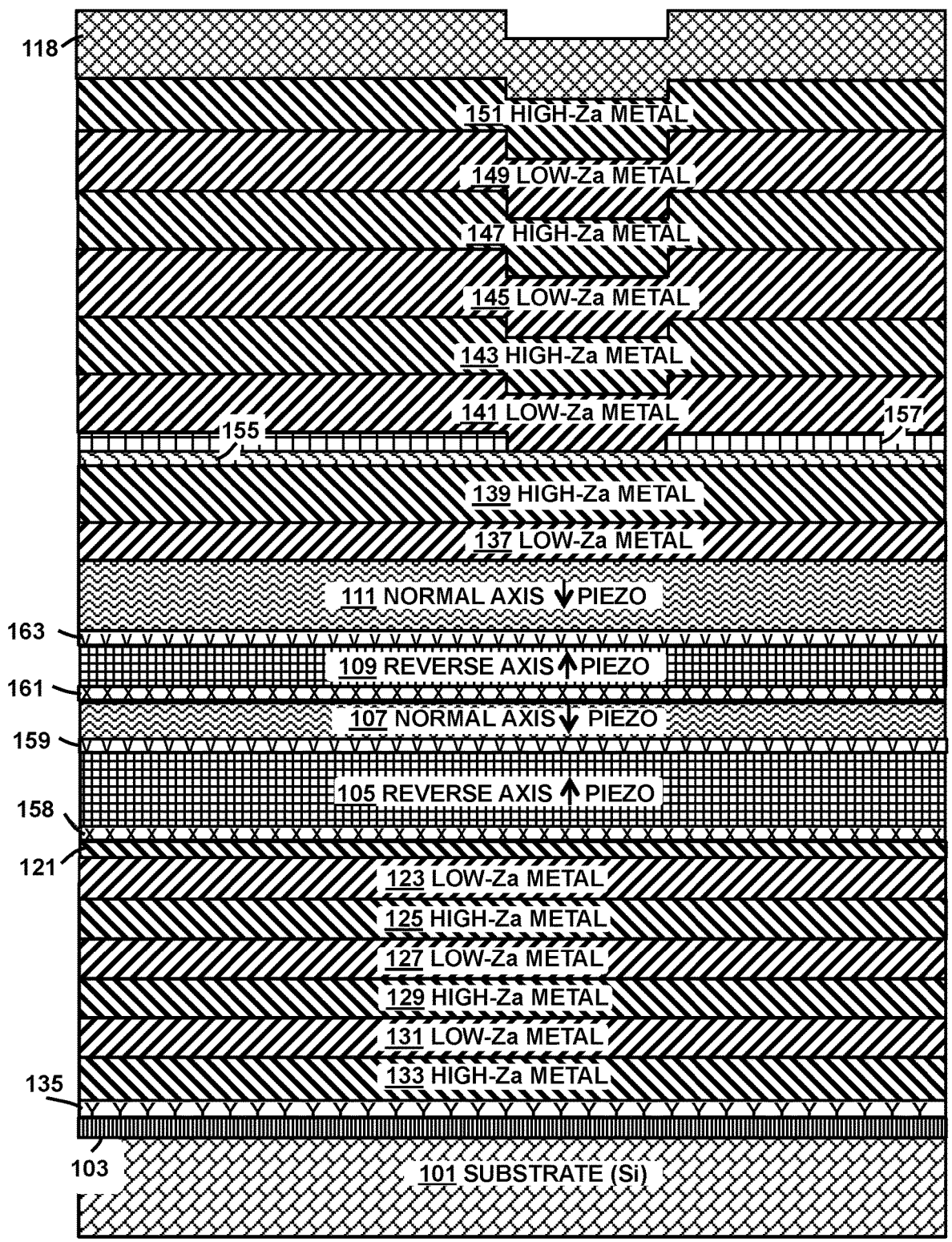

Once the plurality of lateral features 157 have been patterned (e.g., patterned layer 157) as shown in FIG. 3A, sputter deposition of successive additional pairs of alternating layers of high acoustic impedance metal and low acoustic impedance metal may continue as shown in FIG. 3B by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the second pair of top metal electrode layers, 141, 143, may be deposited by sputtering the low acoustic impedance metal for a first bottom metal electrode layer 141 of the pair on the plurality of lateral features 157, and then sputtering the high acoustic impedance metal for a second top metal electrode layer 143 of the pair on the first layer 141 of the pair. Similarly, the third pair of top metal electrode layers, 145, 147, may then be deposited by sequentially sputtering from the low acoustic impedance metal target and the high acoustic impedance metal target. Similarly, the fourth pair of top metal electrodes 149, 151, may then be deposited by sequentially sputtering from the low acoustic impedance metal target and the high acoustic impedance metal target. Respective layer thicknesses of top metal electrode layers of the first, second, third and fourth pairs 137, 139, 141, 143, 145, 147, 149, 151 may correspond to approximately a quarter wavelength (e.g., a quarter acoustic wavelength) at the resonant frequency of the resonator (e.g., respective layer thickness of about six hundred Angstroms (600 A) for the example 24 GHz resonator). Integrated capacitive layer 118 may be sputter deposited over the fourth pair of top metal electrodes 149, 151 using suitable sputtering target(s) under suitable sputtering conditions. Thickness of integrated capacitive layer 118 may correspond to approximately a quarter wavelength (e.g., a quarter acoustic wavelength) at the resonant frequency of the resonator.

As mentioned previously, and as shown in FIG. 3B, after the lateral features 157 are formed, (e.g., patterned layer 157), they may function as a step feature template, so that subsequent top metal electrode layers formed on top of the lateral features 157 may retain step patterns imposed by step features of the lateral features 157. For example, the second pair of top metal electrode layers 141, 143, the third pair of top metal electrode layers 145, 147, and the fourth pair of top metal electrodes 149, 151, and integrated capacitive layer 118 may retain step patterns imposed by step features of the lateral features 157.

Figure 3C:
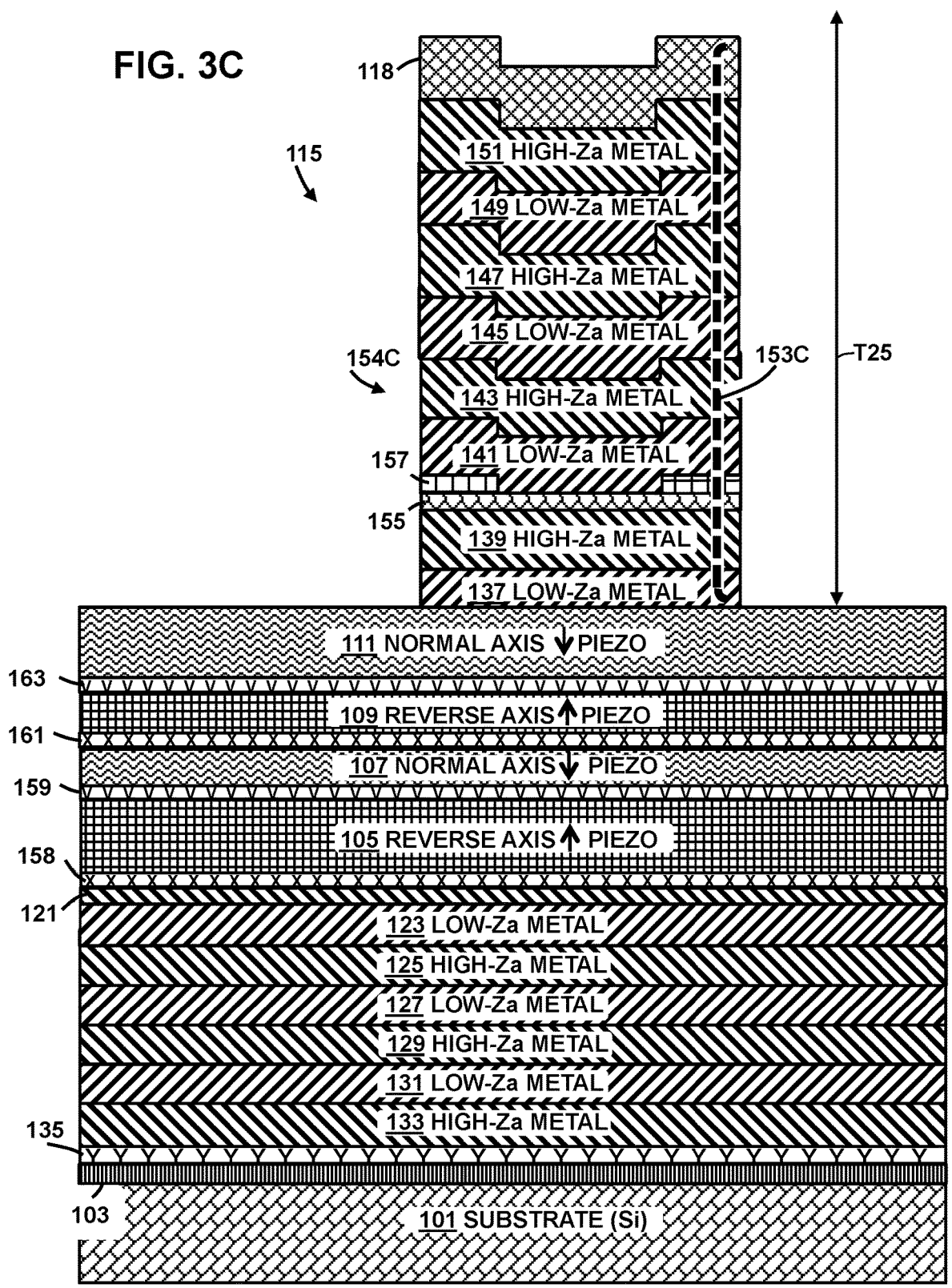

After depositing integrated capacitive layer 118 over layers of the fourth pair of top metal electrodes 149, 151 as shown in FIG. 3B, suitable photolithographic masking and etching may be used to form a first portion of etched edge region 153C for the top acoustic reflector 115 as shown in FIG. 3C. A notional heavy dashed line is used in FIG. 3C depicting the first portion of etched edge region 153C associated with the top acoustic reflector 115. The first portion of etched edge region 153C may extend along the thickness dimension T25 of the top acoustic reflector 115. The first portion etched edge region 153C may extend through (e.g., entirely through or partially through) the top acoustic reflector 115. The first portion of the etched edge region 153C may extend through (e.g., entirely through or partially through) the first pair of top metal electrode layers 137, 139. The first portion of the etched edge region 153C may extend through (e.g., entirely through or partially through) the optional mass load layer 155. The first portion of the etched edge region 153C may extend through (e.g., entirely through or partially through) at least one of the lateral features 157 (e.g., through patterned layer 157). The first portion of etched edge region 153C may extend through (e.g., entirely through or partially through) the second pair of top metal electrode layers, 141,143. The first portion etched edge region 153C may extend through (e.g., entirely through or partially through) the third pair of top metal electrode layers, 145, 147. The first portion of etched edge region 153C may extend through (e.g., entirely through or partially through) the fourth pair of top metal electrode layers, 149, 151. The first portion of etched edge region 153C may extend through (e.g., entirely through or partially through) integrated capacitive layer 118.

Just as suitable photolithographic masking and etching may be used to form the first portion of etched edge region 153C at a lateral extremity the top acoustic reflector 115 as shown in FIG. 3C, such suitable photolithographic masking and etching may likewise be used to form another first portion of a laterally opposing etched edge region 154C at an opposing lateral extremity the top acoustic reflector 115, e.g., arranged laterally opposing or opposite from the first portion of etched edge region 153C, as shown in FIG. 3C. The another first portion of the laterally opposing etched edge region 154C may extend through (e.g., entirely through or partially through) the opposing lateral extremity of the top acoustic reflector 115, e.g., arranged laterally opposing or opposite from the first portion of etched edge region 153C, as shown in FIG. 3C. The mesa structure (e.g., third mesa structure) corresponding to the top acoustic reflector 115 may extend laterally between (e.g., may be formed between) etched edge region 153C and laterally opposing etched edge region 154C. Dry etching may be used, e.g., reactive ion etching may be used to etch the materials of the top acoustic reflector. Chlorine based reactive ion etch may be used to etch Aluminum, in cases where Aluminum is used in the top acoustic reflector. Fluorine based reactive ion etch may be used to etch Tungsten (W), Molybdenum (Mo), Titanium (Ti), Silicon Nitride (SiN), Silicon Dioxide (SiO$_2$) and/or Silicon Carbide (SiC) in cases where these materials are used in the top acoustic reflector.

Figure 3D:
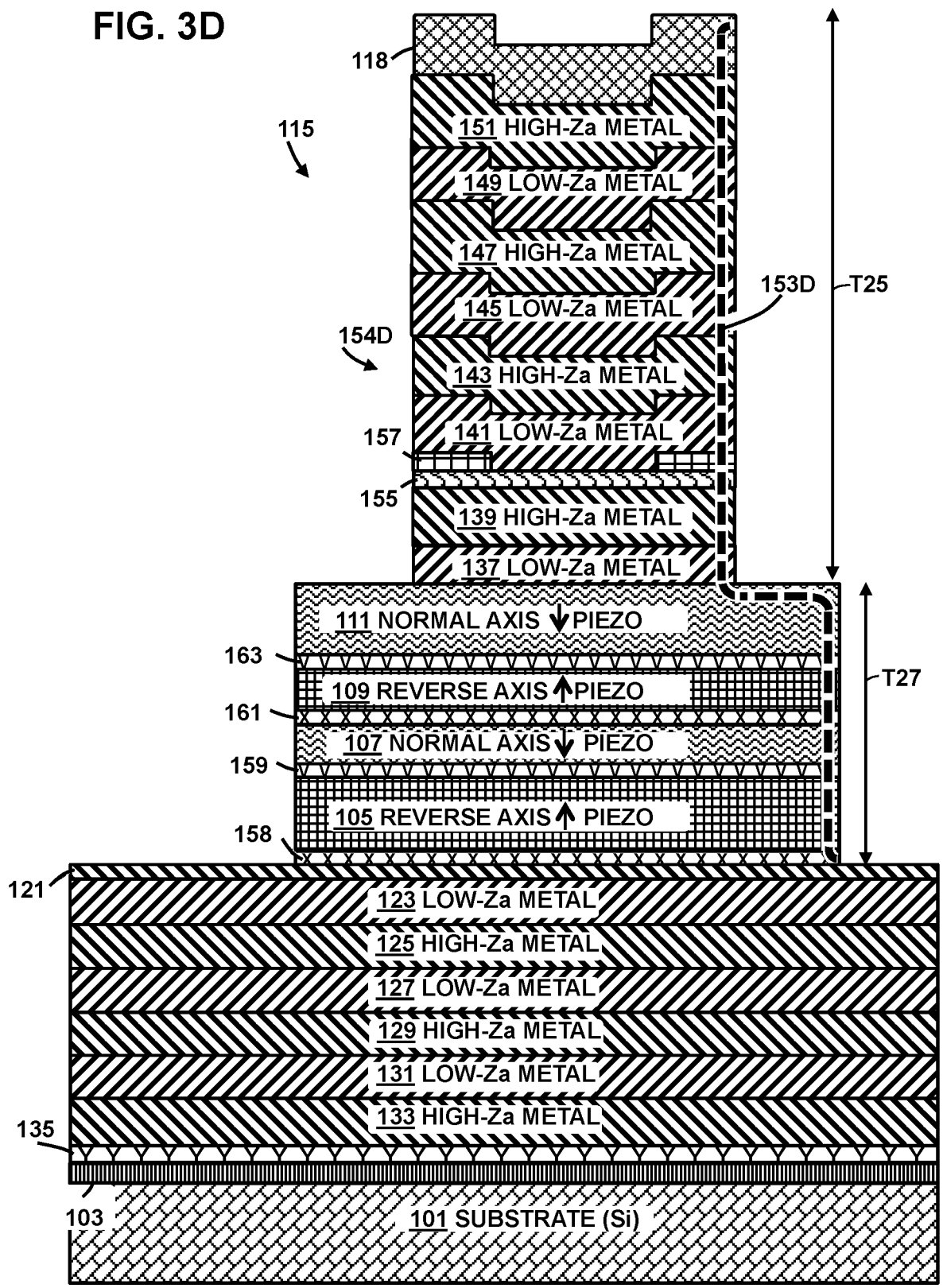

After etching to form the first portion of etched edge region 153C for top acoustic reflector 115 as shown in FIG. 3C, additional suitable photolithographic masking and etching may be used to form elongated portion of etched edge region 153D for the integrated capacitive layer 118, for top acoustic reflector 115 and for the stack 104 of four piezoelectric layers 105, 107, 109, 111 as shown in FIG. 3D. A notional heavy dashed line is used in FIG. 3D depicting the elongated portion of etched edge region 153D associated with the stack 104 of four piezoelectric layers 105, 107, 109, 111 and with the top acoustic reflector 115. Accordingly, the elongated portion of etched edge region 153D shown in FIG. 3D may extend through (e.g., entirely through or partially through) the integrated capacitive layer 118, the fourth pair of top metal electrode layers, 149, 151, the third pair of top metal electrode layers, 145, 147, the second pair of top metal electrode layers, 141,143, at least one of the lateral features 157 (e.g., through patterned layer 157), the optional mass load layer 155, the first pair of top metal electrode layers 137, 139 of the top acoustic reflector 115. The elongated portion of etched edge region 153D may extend through (e.g., entirely through or partially through) the stack 104 of four piezoelectric layers 105, 107, 109, 111. The elongated portion of etched edge region 153D may extend through (e.g., entirely through or partially through) the first polarizing layer 158, the first piezoelectric layer, 105, e.g., having the reverse axis orientation, second polarizing layer 159, first middle piezoelectric layer, 107, e.g., having the normal axis orientation, third polarizing layer 161, second middle interposer layer, 109, e.g., having the reverse axis orientation, fourth polarizing layer 163, and top piezoelectric layer 111, e.g., having the normal axis orientation. The elongated portion of etched edge region 153D may extend along the thickness dimension T25 of the top acoustic reflector 115. The elongated portion of etched edge region 153D may extend along the thickness dimension T27 of the stack 104 of four piezoelectric layers 105, 107, 109, 111. Just as suitable photolithographic masking and etching may be used to form the elongated portion of etched edge region 153D at the lateral extremity the top acoustic reflector 115 and at a lateral extremity of the stack 104 of four piezoelectric layers 105, 107, 109, 111 as shown in FIG. 3D, such suitable photolithographic masking and etching may likewise be used to form another elongated portion of the laterally opposing etched edge region 154D at the opposing lateral extremity the top acoustic reflector 115 and the stack 104 of four piezoelectric layers 105, 107, 109, 111, e.g., arranged laterally opposing or opposite from the elongated portion of etched edge region 153D, as shown in FIG. 3D. The another elongated portion of the laterally opposing etched edge region 154D may extend through (e.g., entirely through or partially through) the opposing lateral extremity of the top acoustic reflector 115 and the stack of four piezoelectric layers 105, 107, 109, 111, e.g., arranged laterally opposing or opposite from the elongated portion of etched edge region 153D, as shown in FIG. 3D. The mesa structure (e.g., third mesa structure) corresponding to the top acoustic reflector 115 may extend laterally between (e.g., may be formed between) etched edge region 153D and laterally opposing etched edge region 154D. The mesa structure (e.g., first mesa structure) corresponding to stack 104 of the example four piezoelectric layers may extend laterally between (e.g., may be formed between) etched edge region 153D and laterally opposing etched edge region 154D. Dry etching may be used, e.g., reactive ion etching may be used to etch the materials of the stack 104 of four piezoelectric layers 105, 107, 109, 111 and polarizing layers. For example, Chlorine based reactive ion etch may be used to etch Aluminum Nitride piezoelectric layers and/or doped Aluminum Nitride piezoelectric layers. For example, Chlorine based reactive ion etch may be used to etch selected polarizing layers (e.g., Aluminum Scandium Nitride polarizing layers, e.g., Aluminum Oxynitride polarizing layers, sputtered Silicon polarizing layers e.g., in cases where Aluminum Scandium Nitride and/or Aluminum Oxynitride and/or sputtered Silicon may be used in polarizing layers). For example, Fluorine based reactive ion etch may be used to etch Tungsten (W), Molybdenum (Mo), Ruthenium (Ru), Titanium (Ti), sputtered Silicon, amorphous Silicon, Silicon Nitride (SiN), Silicon Dioxide (SiO2) and/or Silicon Carbide (SiC) in cases where these materials may be used in polarizing layers.

Figure 3E:
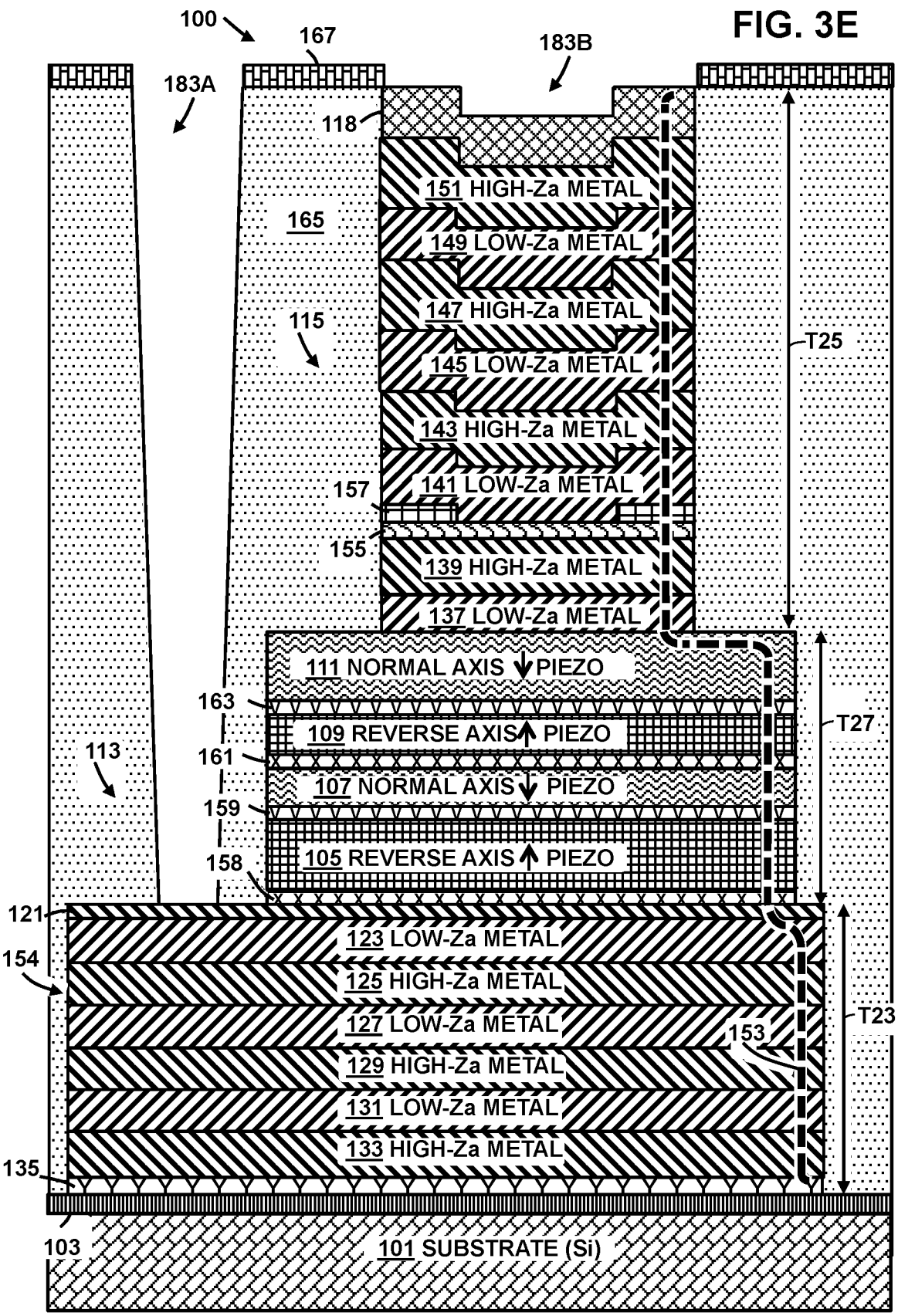

After etching to form the elongated portion of etched edge region 153D for top acoustic reflector 115 and the stack 104 of four piezoelectric layers 105, 107, 109, 111 as shown in FIG. 3D, further additional suitable photolithographic masking and etching may be used to form etched edge region 153D for top acoustic reflector 115 and for the stack 104 of four piezoelectric layers 105, 107, 109, 111 and for bottom acoustic reflector 113 as shown in FIG. 3E. The notional heavy dashed line is used in FIG. 3E depicting the etched edge region 153 associated with the stack 104 of four piezoelectric layers 105, 107, 109, 111 and with the top acoustic reflector 115 and with the bottom acoustic reflector 113. The etched edge region 153 may extend along the thickness dimension T25 of the top acoustic reflector 115. The etched edge region 153 may extend along the thickness dimension T27 of the stack 104 of four piezoelectric layers 105, 107, 109, 111. The etched edge region 153 may extend along the thickness dimension T23 of the bottom acoustic reflector 113. Just as suitable photolithographic masking and etching may be used to form the etched edge region 153 at the lateral extremity the top acoustic reflector 115 and at the lateral extremity of the stack 104 of four piezoelectric layers 105, 107, 109, 111 and at a lateral extremity of the bottom acoustic reflector 113 as shown in FIG. 3E, such suitable photolithographic masking and etching may likewise be used to form another laterally opposing etched edge region 154 at the opposing lateral extremity of the top acoustic reflector 115 and the stack 104 of four piezoelectric layers 105, 107, 109, 111, and the bottom acoustic reflector 113, e.g., arranged laterally opposing or opposite from the etched edge region 153, as shown in FIG. 3E. The laterally opposing etched edge region 154 may extend through (e.g., entirely through or partially through) the opposing lateral extremity of the top acoustic reflector 115 and the stack of four piezoelectric layers 105, 107, 109, 111, and the bottom acoustic reflector 113 e.g., arranged laterally opposing or opposite from the etched edge region 153, as shown in FIG. 3E.

After the foregoing etching to form the etched edge region 153 and the laterally opposing etched edge region 154 of the resonator 100 shown in FIG. 3E, a planarization layer 165 may be deposited. A suitable planarization material (e.g., Silicon Dioxide (SiO2), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of SiO2 or HfO2) or spin coating (e.g., in cases of Polyimide or BenzoCyclobutene (BCB)). An isolation layer 167 may also be deposited over the planarization layer 165. A suitable low dielectric constant (low-k), low acoustic impedance (low-Za) material may be used for the isolation layer 167, for example polyimide, or BenzoCyclobutene (BCB). These materials may be deposited by suitable methods, for example, chemical vapor deposition, standard or reactive magnetron sputtering or spin coating. After planarization layer 165 and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3E, so as to provide for the bottom electrical interconnect 169 and top electrical interconnect 171 that are shown explicitly in FIG. 1A. A suitable material, for example Gold (Au) may be used for the bottom electrical interconnect 169 and top electrical interconnect 171. Top electrical interconnect 171 may be integrally formed with top current spreading layer 171. Integrated inductor 173 may be electrically coupled with top electrical interconnect 171/top current spreading layer 171.

FIGS. 4A through 4G show alternative example bulk acoustic wave resonators 400A through 400G to the example bulk acoustic wave resonator 100 shown in FIG. 1A. For example, the bulk acoustic wave resonator 400A, 400E shown in FIG. 4A, 4E may have a cavity 483A, 483E, e.g., an air cavity 483A, 483E, e.g., extending into substrate 401A, e.g., extending into silicon substrate 401A, e.g., extending over substrate 401E, e.g., arranged below bottom acoustic reflector 413A, 413E. The cavity 483A, 483E may be formed using techniques known to those with ordinary skill in the art. For example, the cavity 483A, 483E may be formed by initial photolithographic masking and etching of the substrate 401A, 401E (e.g., silicon substrate 401A, 401E), and deposition of a sacrificial material (e.g., phosphosilicate glass (PSG)). The phosphosilicate glass (PSG) may comprise 8% phosphorous and 92% silicon dioxide. The resonator 400A, 400E may be formed over the sacrificial material (e.g., phosphosilicate glass (PSG)). The sacrificial material may then be selectively etched away beneath the resonator 400A, 400E, leaving cavity 483A, 483E beneath the resonator 400A, 400E. For example phosphosilicate glass (PSG) sacrificial material may be selectively etched away by hydrofluoric acid beneath the resonator 400A, 400E, leaving cavity 483A, 483E beneath the resonator 400A, 400E. The cavity 483A, 483E may, but need not, be arranged to provide acoustic isolation of the structures, e.g., bottom acoustic reflector 413A, 413E, e.g., stack 404A, 404E of piezoelectric layers, e.g., resonator 400A, 400E from the substrate 401A, 401E.

Figure 4A:
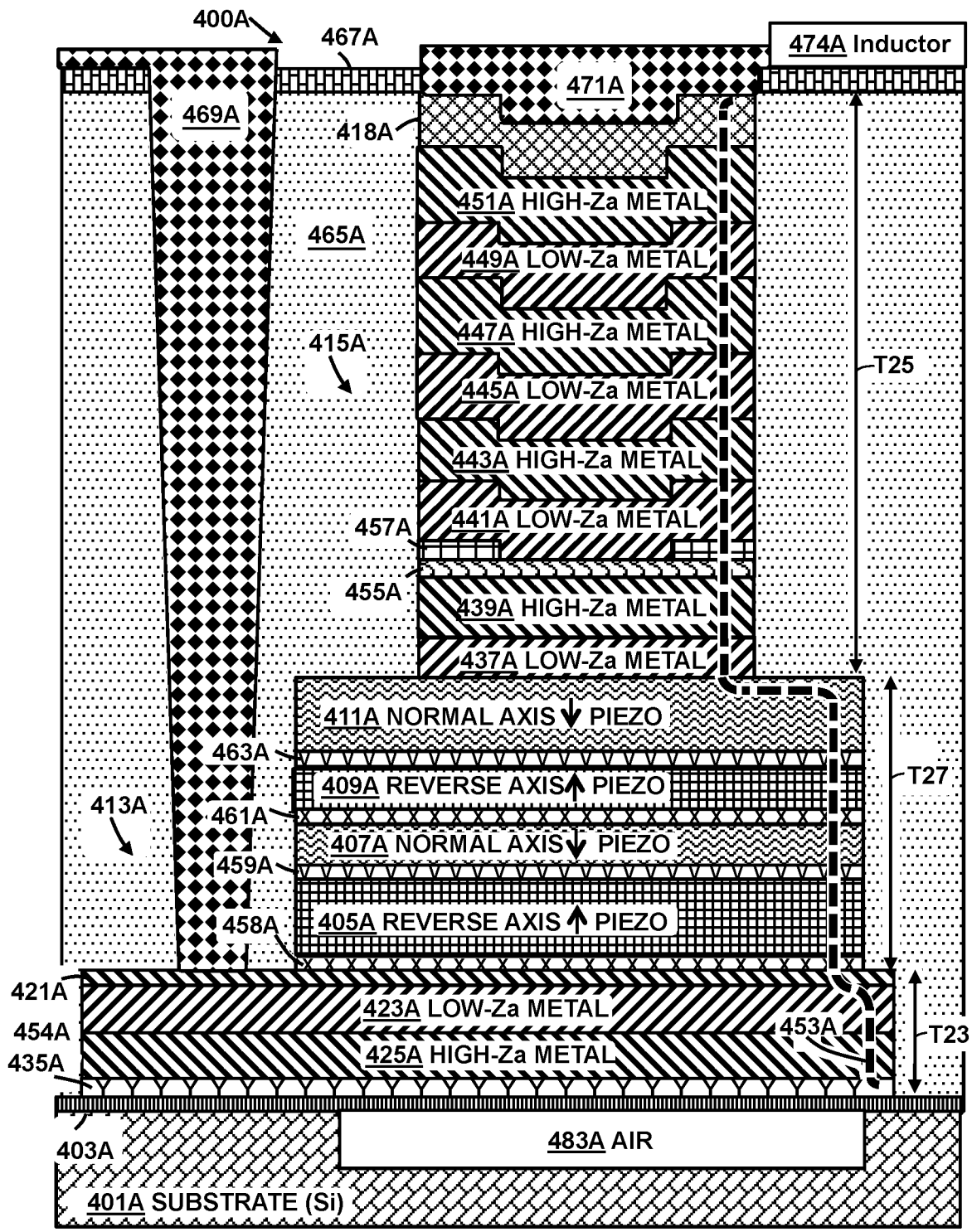
FIGS. 4A through 4G show alternative example bulk acoustic wave resonators to the example bulk acoustic wave resonator structures shown in FIG. 1A.
Figure 4B:
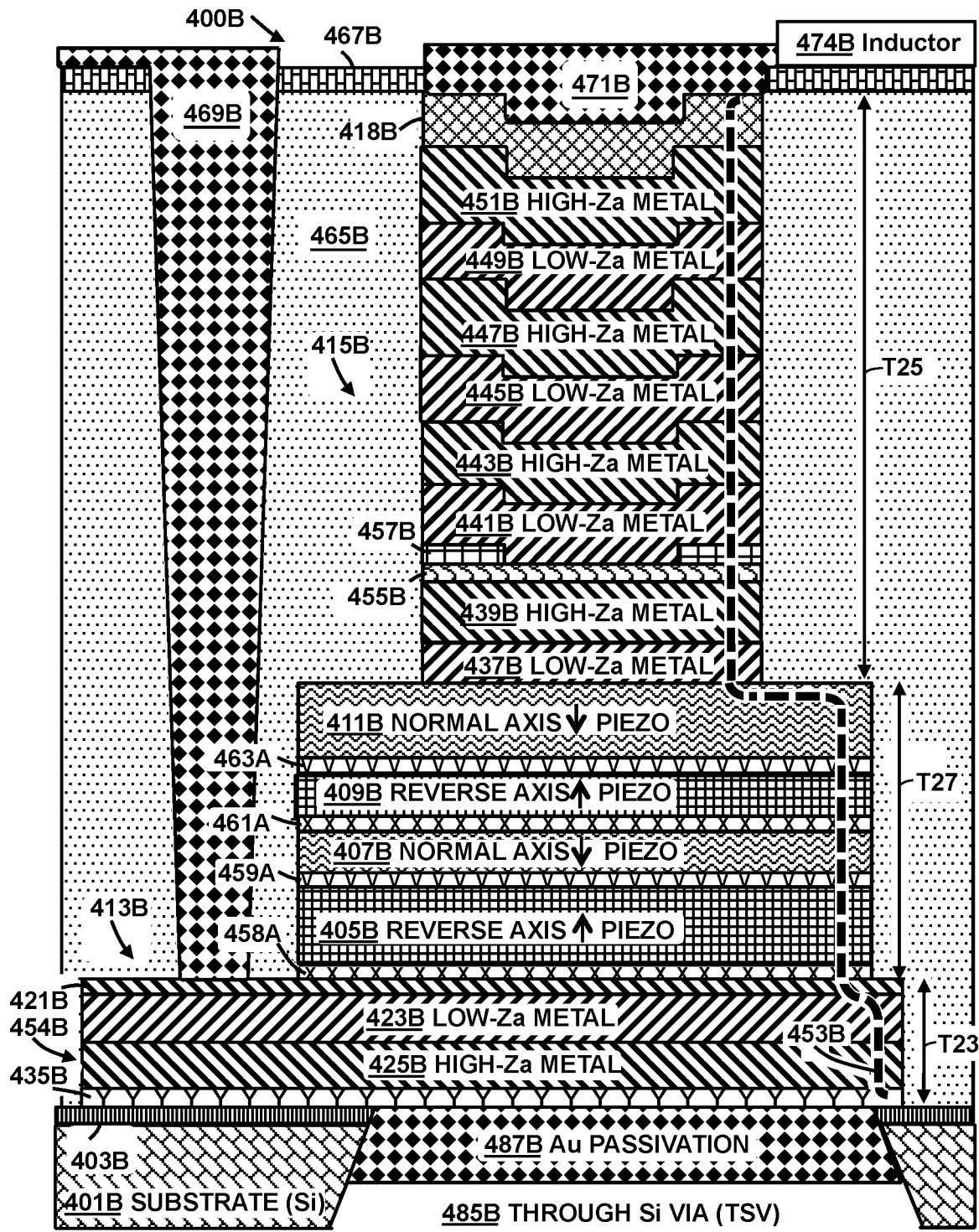
Figure 4C:
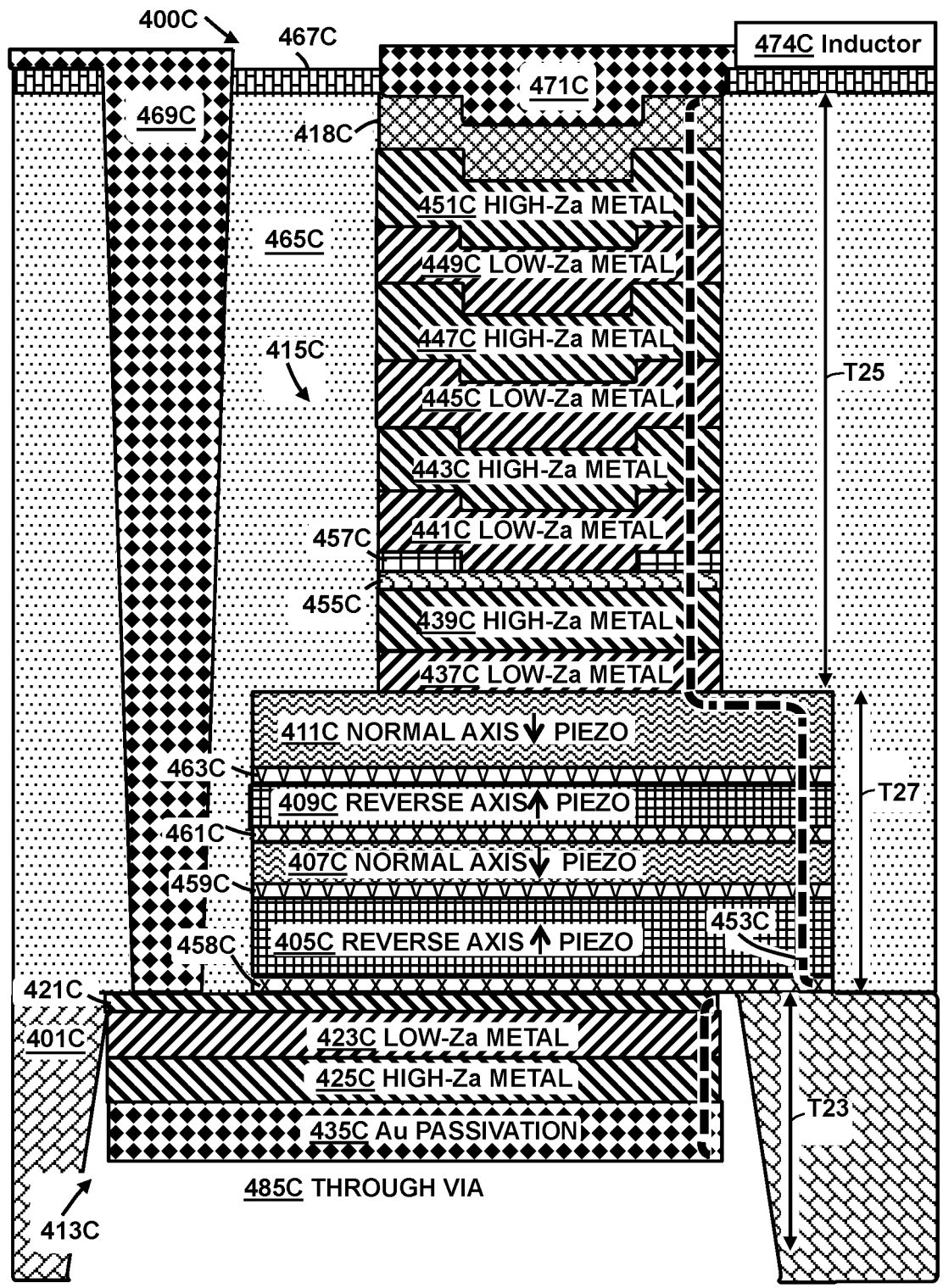
Figure 4D:
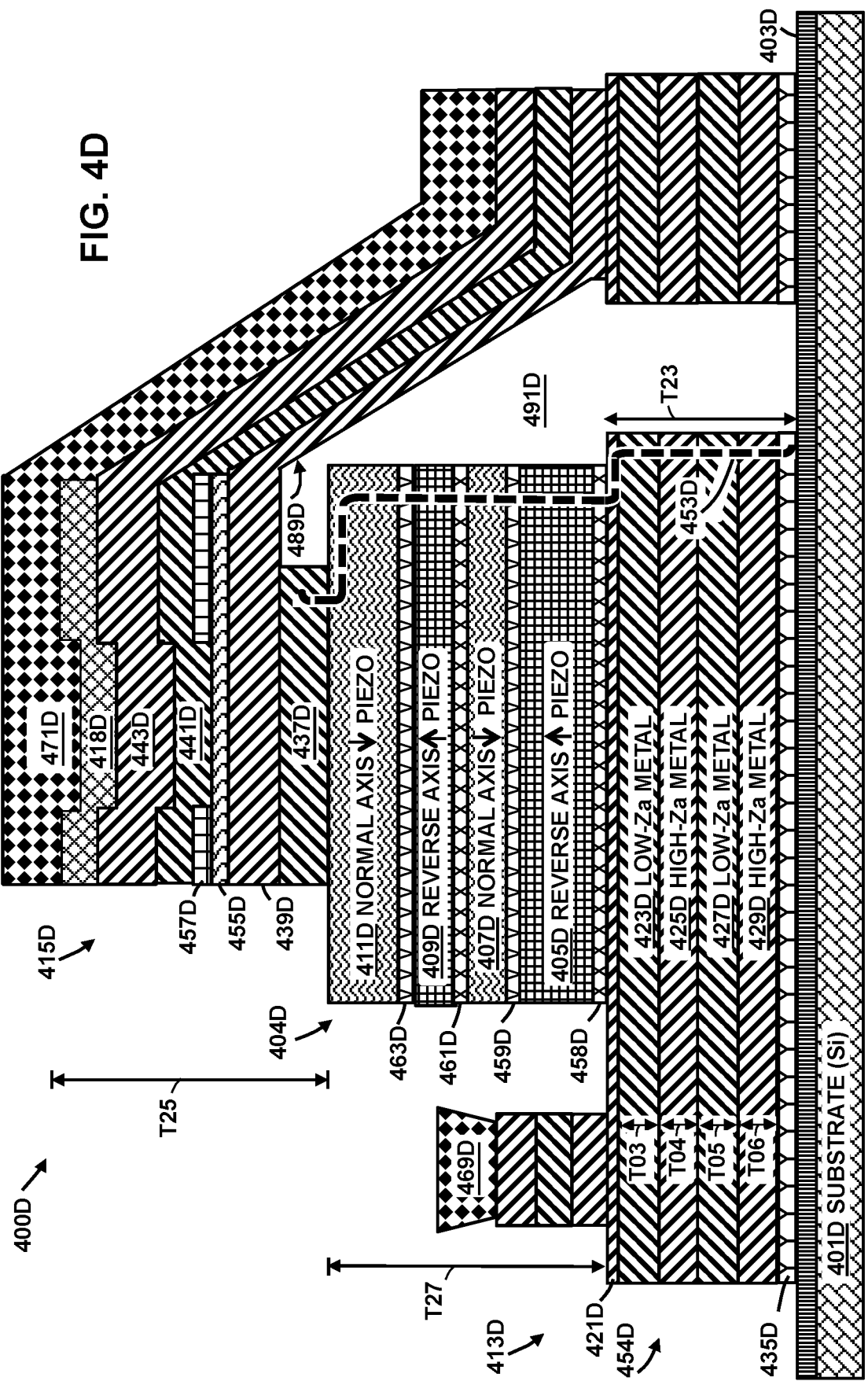
Figure 4E:
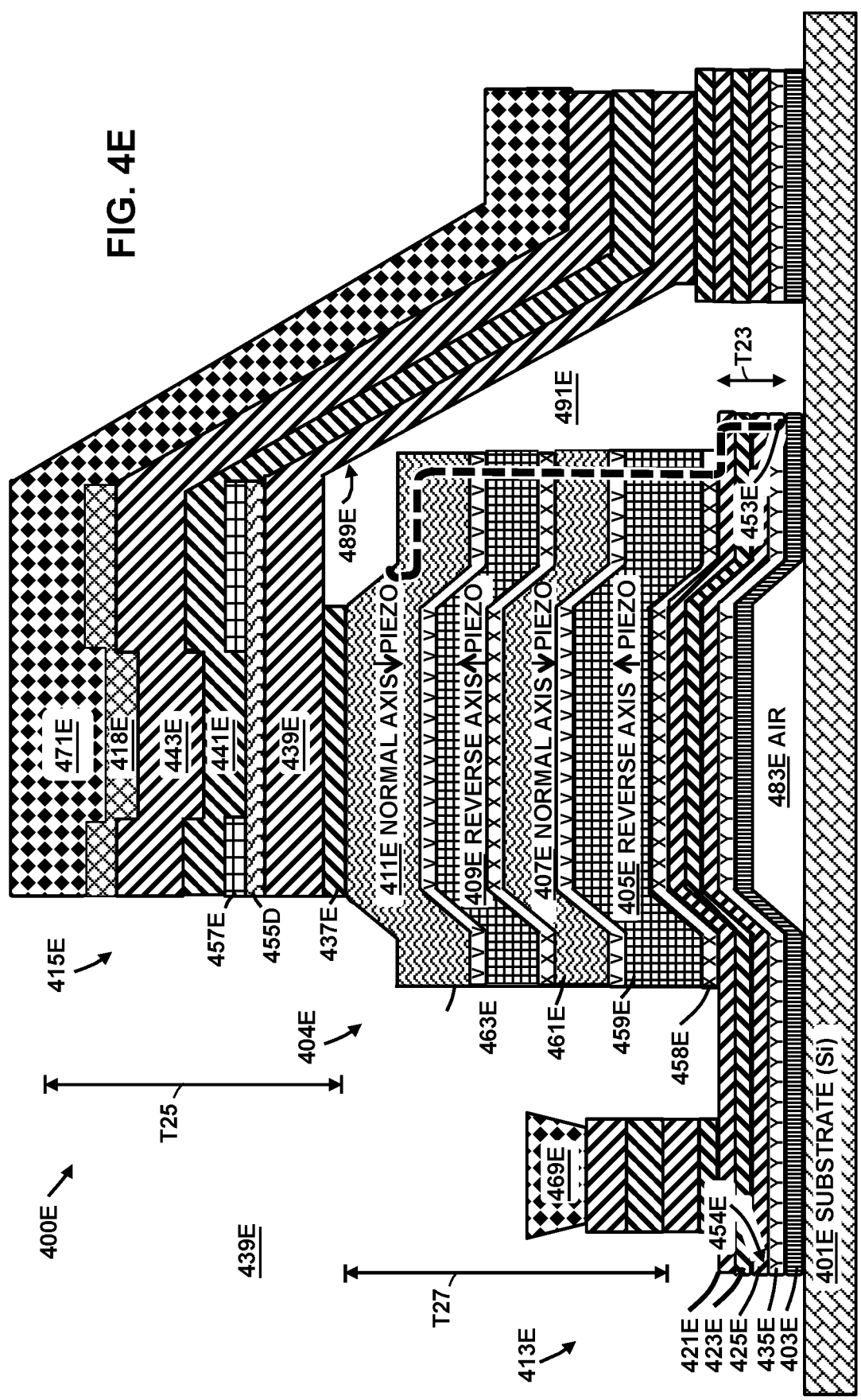
Figure 4F:
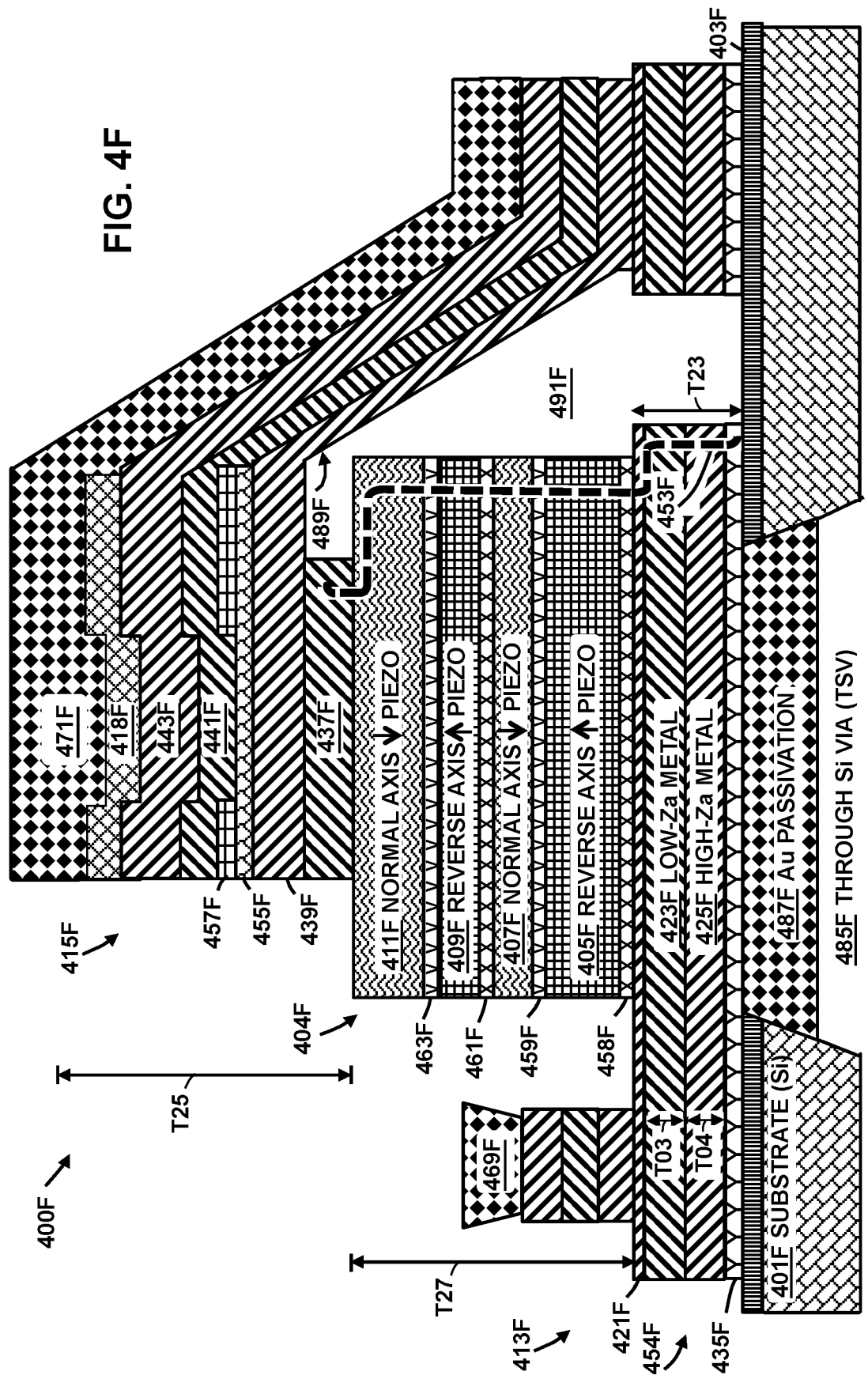
Figure 4G:
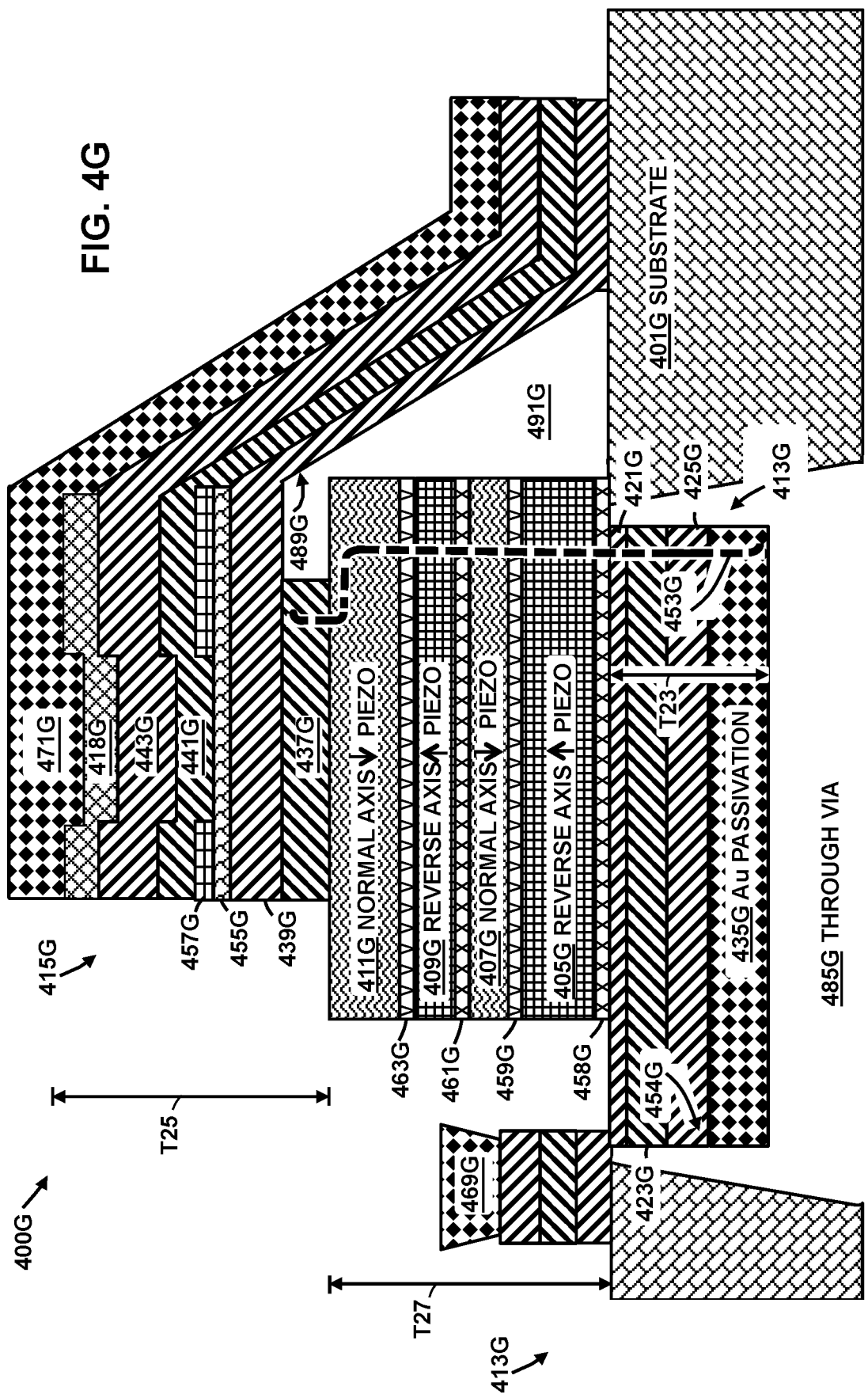

Similarly, in FIGS. 4B, 4C, 4F and 4G, a via 485B, 485C, 485F, 485G (e.g., through silicon via 485B, 485F, e.g., through silicon carbide via 485C, 485G) may, but need not, be arranged to provide acoustic isolation of the structures, e.g., bottom acoustic reflector 413B, 413C, 413F, 413G, e.g., stack 404B, 404C, 404F, 404G, of piezoelectric layers, e.g., resonator 400B, 400C, 400F, 400G from the substrate 401B, 401C, 401F, 401G. The via 485B, 485C, 485F, 485G (e.g., through silicon via 485B, 485F, e.g., through silicon carbide via 485C, 485G) may be formed using techniques (e.g., using photolithographic masking and etching techniques) known to those with ordinary skill in the art. For example, in FIGS. 4B and 4F, backside photolithographic masking and etching techniques may be used to form the through silicon via 485B, 485F, and an additional passivation layer 487B, 487F may be deposited, after the resonator 400B, 400F is formed. For example, in FIGS. 4C and 4G, backside photolithographic masking and etching techniques may be used to form the through silicon carbide via 485C, 485G, after the top acoustic reflector 415C, 415G and stack 404C, 404G of piezoelectric layers are formed. In FIGS. 4C and 4G, after the through silicon carbide via 485C, 485G, is formed, backside photolithographic masking and deposition techniques may be used to form bottom acoustic reflector 413C, 413G, and additional passivation layer 487C, 487G.

In FIGS. 4A, 4B, 4C, 4E, 4F, 4G, bottom acoustic reflector 413A, 413B, 413C, 413E, 413F, 413G, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C, 400E, 400F, 400G. Respective layer thicknesses, (e.g., T02 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C, 400E, 400F, 400G. Relatively speaking, in various alternative designs of the example resonators 400A, 400B, 400C, 400E, 400F, 400G, for relatively lower main resonant frequencies (e.g., five Gigahertz (5 GHz)) and having corresponding relatively longer wavelengths (e.g., longer acoustic wavelengths), may have relatively thicker bottom metal electrode layers in comparison to other alternative designs of the example resonators 400A, 400B, 400C, 400E, 400F, 400G, for relatively higher main resonant frequencies (e.g., twenty-four Gigahertz (24 GHz)). There may be corresponding longer etching times to form, e.g., etch through, the relatively thicker bottom metal electrode layers in designs of the example resonator 400A, 400B, 400C, 400E, 400F, 400G, for relatively lower main resonant frequencies (e.g., five Gigahertz (5 GHz)). Accordingly, in designs of the example resonators 400A, 400B, 400C, 400E, 400F, 400G, for relatively lower main resonant frequencies (e.g., five Gigahertz (5 GHz)) having the relatively thicker bottom metal electrode layers, there may (but need not) be an advantage in etching time in having a relatively fewer number (e.g., four (4)) of bottom metal electrode layers, shown in 4A, 4B, 4C, 4E, 4F, 4G, in comparison to a relatively larger number (e.g., eight (8)) of bottom metal electrode layers, shown in FIG. 1A and in FIG. 4D. The relatively larger number (e.g., eight (8)) of bottom metal electrode layers, shown in FIG. 1A and in FIG. 4D may (but need not) provide for relatively greater acoustic isolation than the relatively fewer number (e.g., four (4)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A, 483E. Similarly, in FIGS. 4B, 4C, 4F, 4G, the via 483B, 483C, 483F, 483G, (e.g., through silicon via 485B, 485F, e.g., through silicon carbide via 485C, 485G) may (but need not) be arranged to provide acoustic isolation enhancement relative to some designs without the via 483B, 483C, 483F, 483G.

In FIGS. 4A and 4E, the cavity 483A, 483E may (but need not) be arranged to compensate for relatively lesser acoustic isolation of the relatively fewer number (e.g., four (4)) of bottom metal electrode layers. In FIGS. 4A and 4E, the cavity 483A, 483E may (but need not) be arranged to provide acoustic isolation benefits, while retaining possible electrical conductivity improvements and etching time benefits of the relatively fewer number (e.g., four (4)) of bottom metal electrode layers, e.g., particularly in designs of the example resonator 400A, 400E, for relatively lower main resonant frequencies (e.g., five Gigahertz (5 GHz)). Similarly, in FIGS. 4B, 4C, 4F, 4G, the via 483B, 483C, 483F, 483G, may (but need not) be arranged to compensate for relatively lesser acoustic isolation of the relatively fewer number (e.g., four (4)) of bottom metal electrode layers. In FIGS. 4B, 4C, 4F, 4G, the via 483B, 483C, 483F, 483G, may (but need not) be arranged to provide acoustic isolation benefits, while retaining possible electrical conductivity improvement benefits and etching time benefits of the relatively fewer number (e.g., four (4)) of bottom metal electrode layers, e.g., particularly in designs of the example resonator 400B, 400C, 400F, 400G, for relatively lower main resonant frequencies (e.g., five Gigahertz (5 GHz), e.g., below six Gigahertz (6 GHz), e.g., below five Gigahertz (5 GHz)).

FIGS. 4D through 4G show alternative example bulk acoustic wave resonators 400D through 400G to the example bulk acoustic wave resonator 100A shown in FIG. 1A, in which the top acoustic reflector, 415D through 415G, may comprise a lateral connection portion, 489D through 489G, (e.g., bridge portion, 489D through 489G), of the top acoustic reflector, 415D through 415G. A gap, 491D through 491G, may be formed beneath the lateral connection portion, 489D through 489G, (e.g., bridge portion, 489D through 489G), of the top acoustic reflector 415D through 415G. The gap, 491D through 491G, may be arranged adjacent to the etched edge region, 453D through 453G, of the example resonators 400D through 400G.

For example, the gap, 491D through 491G, may be arranged adjacent to where the etched edge region, 453D through 453G, extends through (e.g., extends entirely through or extends partially through) the stack 404D through 404G, of piezoelectric layers, for example along the thickness dimension T27 of the stack 404D through 404G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the first middle piezoelectric layer 407D through 407G. For example, the gap, 491D through 491G, may be arranged adjacent to where the etched edge region, 453D through 453G, extends through (e.g., extends entirely through or extends partially through) the second middle piezoelectric layer 409D through 409G. For example, the gap, 491D through 491G, may be arranged adjacent to where the etched edge region, 453D through 453G, extends through (e.g., extends entirely through or extends partially through) the top piezoelectric layer 411D through 411G. For example, the gap, 491D through 491G, may be arranged adjacent to where the etched edge region, 453D through 453G, extends through (e.g., extends entirely through or extends partially through) one or more polarizing layers (e.g., first interposer polarizing layer, 458D through 458G, second polarizing layer, 459D through 459G, third polarizing layer 461D through 461G, fourth polarizing layer 463D through 463G).

For example, as shown in FIGS. 4D through 4G, the gap, 491D through 491G, may be arranged adjacent to where the etched edge region, 453D through 453G, extends through (e.g., extends partially through) the top acoustic reflector 415D through 415G, for example partially along the thickness dimension T25 of the top acoustic reflector 415D through 415G. For example, the gap, 491D through 491G, may be arranged adjacent to where the etched edge region, 453D through 453G, extends through (e.g., extends entirely through or extends partially through) the first member, 437D through 437G, of the first pair of top electrode layers, 437D through 437G, 439D through 439G.

For example, as shown in FIGS. 4D through 4F, the gap, 491D through 491F, may be arranged adjacent to where the etched edge region, 453D through 453F, extends through (e.g., extends entirely through or extends partially through) the bottom acoustic reflector 413D through 413F, for example along the thickness dimension T23 of the bottom acoustic reflector 413D through 413F. For example, the gap, 491D through 491F, may be arranged adjacent to where the etched edge region, 453D through 453F, extends through (e.g., extends entirely through or extends partially through) the initial bottom electrode layer, 421D through 421F. For example, the gap, 491D through 491F, may be arranged adjacent to where the etched edge region, 453D through 453F, extends through (e.g., extends entirely through or extends partially through) the first pair of bottom electrode layers, 423D through 423F, 425D through 425F.

For example, as shown in FIGS. 4D through 4F, the etched edge region, 453D through 453F, may extend through (e.g., entirely through or partially through) the bottom acoustic reflector, 413D through 413F, and through (e.g., entirely through or partially through) one or more of the piezoelectric layers, 405D through 405F, 407D through 407F, 409D through 409F, 411D through 411F, to the lateral connection portion, 489D through 489G, (e.g., to the bridge portion, 489D through 489G), of the top acoustic reflector, 415D through 415F.

As shown in FIGS. 4D-4G, lateral connection portion, 489D through 489G, (e.g., bridge portion, 489D through 489G), of top acoustic reflector, 415D through 415G, may be a multi-layer lateral connection portion, 415D through 415G, (e.g., a multi-layer metal bridge portion, 415D through 415G, comprising differing metals, e.g., metals having differing acoustic impedances). For example, lateral connection portion, 489D through 489G, (e.g., bridge portion, 489D through 489G), of top acoustic reflector, 415D through 415G, may comprise the second member, 439D through 439G, (e.g., comprising the relatively high acoustic impedance metal) of the first pair of top electrode layers, 437D through 437G, 439D through 439G. For example, lateral connection portion, 489D through 489G, (e.g., bridge portion, 489D through 489G), of top acoustic reflector, 415D through 415G, may comprise the second pair of top electrode layers, 441D through 441G, 443D through 443G.

Gap 491D-491G may be an air gap 491D-491G, or may be filled with a relatively low acoustic impedance material (e.g., BenzoCyclobutene (BCB)), which may be deposited using various techniques known to those with skill in the art. Gap 491D-491G may be formed by depositing a sacrificial material (e.g., phosphosilicate glass (PSG)) after the etched edge region, 453D through 453G, is formed. The lateral connection portion, 489D through 489G, (e.g., bridge portion, 489D through 489G), of top acoustic reflector, 415D through 415G, may then be deposited (e.g., sputtered) over the sacrificial material. The sacrificial material may then be selectively etched away beneath the lateral connection portion, 489D through 489G, (e.g., e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). For example the phosphosilicate glass (PSG) sacrificial material may be selectively etched away by hydrofluoric acid beneath the lateral connection portion, 489D through 489G, (e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G).

Although in various example resonators, 100A, 400A, 400B, 400D, 400E, 400F, polycrystalline piezoelectric layers (e.g., polycrystalline Aluminum Nitride (AlN)) may be deposited (e.g., by sputtering), in other example resonators 400C, 400G, alternative single crystal or near single crystal piezoelectric layers (e.g., single/near single crystal Aluminum Nitride (AlN)) may be deposited (e.g., by metal organic chemical vapor deposition (MOCVD)). Normal axis piezoelectric layers (e.g., normal axis Aluminum Nitride (AlN) piezoelectric layers) may be deposited by MOCVD using techniques known to those with skill in the art. As discussed previously herein, the polarizing layers may be deposited by sputtering, but alternatively may be deposited by MOCVD. Reverse axis piezoelectric layers (e.g., reverse axis Aluminum Nitride (AlN) piezoelectric layers) may likewise be deposited via MOCVD. For the respective example resonators 400C, 400G shown in FIGS. 4C and 4G, the alternating axis piezoelectric stack 404C, 404G comprised of piezoelectric layers 405C, 407C, 409C, 411C, 405G, 407G, 409G, 411G as well as polarizing layers 458C, 459C, 461C, 463C, 458G, 459G, 461G, 463G extending along stack thickness dimension T27 fabricated using MOCVD on a silicon carbide substrate 401C, 401G. For example, aluminum nitride of piezoelectric layers 405C, 407C, 409C, 411C, 405G, 407G, 409G, 411G the may grow nearly epitaxially on silicon carbide (e.g., 4H SiC) by virtue of the small lattice mismatch between the polar axis aluminum nitride wurtzite structure and specific crystal orientations of silicon carbide. Alternative small lattice mismatch substrates may be used (e.g., sapphire, e.g., aluminum oxide).

By varying the ratio of the aluminum and nitrogen in the deposition precursors, an aluminum nitride film may be produced with the desired polarity (e.g., normal axis, e.g., reverse axis). For example, normal axis aluminum nitride may be synthesized using MOCVD when a nitrogen to aluminum ratio in precursor gases approximately 1000. For example, reverse axis aluminum nitride may synthesized when the nitrogen to aluminum ratio is approximately 27000.

In accordance with the foregoing, FIGS. 4C and 4G show MOCVD synthesized reverse axis piezoelectric layer 405C, 405G, MOCVD synthesized normal axis piezoelectric layer 407C, 407G, MOCVD synthesized reverse axis piezoelectric layer 409C, 409G, and MOCVD synthesized normal axis piezoelectric layer 411C, 411G. For example, a first oxyaluminum nitride polarizing layer, 458C at lower temperature, may be deposited by MOCVD that may reverse axis (e.g., reverse axis polarity) of the growing aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis piezoelectric layer 405C, 405G to be synthesized. For example, normal axis piezoelectric layer 407C, 407G may be synthesized by MOCVD in a deposition environment where the nitrogen to aluminum gas ratio is relatively low, e.g., 1000 or less.

For example, second polarizing layer 459C, 459G, for example fourth polarizing layer 463C, 463G, may be oxide layers such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 407C, 407G may be grown by MOCVD on top of second polarizing layer 459C, 459G using MOCVD growth conditions in a deposition environment where the nitrogen to aluminum gas ratio is relatively low, e.g., 1000 or less.

Next an aluminum oxynitride, third polarizing layer 461C, 461G may be deposited in a low temperature MOCVD process followed by a reverse axis piezoelectric layer 409C, 409G, synthesized in a high temperature MOCVD process and an atmosphere of nitrogen to aluminum ratio in the several thousand range.

For example fourth polarizing layer 463C, 463G, may be oxide layers such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 411C, 411G may be grown by MOCVD on top of fourth polarizing layer 463C, 463G using MOCVD growth conditions in a deposition environment where the nitrogen to aluminum gas ratio is relatively low, e.g., 1000 or less. Upon conclusion of these depositions, the piezoelectric stack 404C, 404G shown in FIGS. 4C and 4G may be realized.

FIG. 4H shows simplified diagrams of a first alternating axis bulk acoustic wave resonator structure 4301H having four half wavelength thick alternating axis piezoelectric layers 4001H through 4004H for comparison with a second alternating axis bulk acoustic wave resonator structure 4302H having a second normal axis piezoelectric layer 4102H with thickness increased from the half wavelength by an additional quarter wavelength to a resulting three quarter wavelength (with its third piezoelectric layer 4013H with thickness decreased from the half wavelength by a quarter wavelength to a resulting quarter wavelength, e.g., with its third piezoelectric layer 4013H with thickness decreased by half, e.g., a decrease thickness factor delta H being half). For comparison with the foregoing, a third bulk acoustic wave resonator structure 4303H having a second normal axis piezoelectric layer 4202H with thickness increased from the half wavelength by an additional half wavelength to a resulting full wavelength (e.g., with its third piezoelectric layer omitted, e.g., with thickness decreased from the half wavelength to zero, e.g., with another decrease thickness factor delta H being 100% or 1). For the sake of comparison, first alternating axis bulk acoustic wave resonator structure 4301H, the second alternating axis bulk acoustic wave resonator structure 4302H, and the third bulk acoustic wave resonator structure 4303H may comprise respective half wavelength thick first reverse axis piezoelectric layers 4001H, 4101H, 4201H. For the sake of comparison, first alternating axis bulk acoustic wave resonator structure 4301H and second alternating axis bulk acoustic wave resonator structure 4302H, may comprise respective half wavelength thick fourth normal axis piezoelectric layers 4004H, 4104H. For the sake of comparison, first alternating axis bulk acoustic wave resonator structure 4301H, the second alternating axis bulk acoustic wave resonator structure 4302H, and the third bulk acoustic wave resonator structure 4303H may comprise respective stacks of piezoelectric layers sandwiched between respective multi-layer metal bottom acoustic reflector electrodes 4013H, 4113H, 4213H, respective multi-layer metal top acoustic reflector electrodes 4015H, 4115H, 4215H. First alternating axis bulk acoustic wave resonator structure 4301H and the second alternating axis bulk acoustic wave resonator structure 4302H and the third bulk acoustic wave resonator structure 4303H may be millimeter wave resonators, for example, with main acoustic resonant frequencies at about twenty-four Gigahertz (24 GHz).

In FIG. 4H a first corresponding chart 4301H shows electromechanical coupling coefficient versus half wavelength layer thickness change. For example, in chart 4301H, a first data point 4321H corresponds to first alternating axis bulk acoustic wave resonator structure 4301H with zero deviation, e.g., zero change (e.g., no deviation, e.g., no change) from half wavelength layer thickness. For example, for corresponding first alternating axis bulk acoustic wave resonator structure 4001H having four half wavelength thick alternating axis piezoelectric layers 4001H through 4004H, first data point 4321H of chart 4301H shows electromechanical coupling coefficient of about five and a half percent (5.5%) for no change from half wavelength layer thickness in BAW resonator 4001H, as expected from simulation.

For example, in chart 4301H, a second data point 4323H corresponds to second alternating axis bulk acoustic wave resonator structure 4302H having the second normal axis piezoelectric layer 4102H with thickness increased from the half wavelength by the additional quarter wavelength to the resulting three quarter wavelength (with its third piezoelectric layer 4013H with thickness decreased from the half wavelength by a quarter wavelength to a resulting quarter wavelength, e.g., with its third piezoelectric layer 4013H with thickness decreased by half, e.g., the decrease thickness factor delta H being half). For example, for corresponding second alternating axis bulk acoustic wave resonator structure 4302H having the decreased thickness factor delta H being half, second data point 4331H of chart 4301H shows electromechanical coupling coefficient of about two and a half percent (2.5%) for thickness decreased from the half wavelength by a quarter wavelength to a resulting quarter wavelength in BAW resonator 4302H, as expected from simulation. Accordingly, as representatively illustrated in in chart 4301H, and by comparing the first data point 4321H to the second data point 4331H of chart 4301H, it is shown that electromechanical coupling (e.g., electromechanical coupling coefficient) may be limited, e.g., may be reduced, by varying thickness of alternating axis piezoelectric layers from half acoustic wavelength thickness (e.g., by varying thickness of alternating axis piezoelectric layers from integer multiples of half acoustic wavelength thickness).

For example, in chart 4301H, a third data point 4325H corresponds to third bulk acoustic wave resonator structure 4303H having the second normal axis piezoelectric layer 4202H with thickness increased from the half wavelength by an additional half wavelength to a resulting full wavelength (e.g., with its third piezoelectric layer omitted, e.g., with thickness decreased from the half wavelength to zero, e.g., with another decrease thickness factor delta H being 100% or 1). For example for third bulk acoustic wave resonator structure 4303H having the decreased thickness factor delta H being 100% or 1, the third data point 4325H point of chart 4301H shows electromechanical coupling coefficient of about one percent (1%). Accordingly, as representatively illustrated in in chart 4301H, and by comparing third data point 4325H to the first data point 4321H and to the second data point 4331H of chart 4301H, it is shown that electromechanical coupling (e.g., electromechanical coupling coefficient) may be further limited, e.g., may be further reduced, by further varying thickness of alternating axis piezoelectric layers from half acoustic wavelength thickness (e.g., by further varying thickness of alternating axis piezoelectric layers from integer multiples of half acoustic wavelength thickness).

In FIG. 4H a second chart 4401H shows series resonant frequency Fs in dotted line and parallel resonant frequency Fp in solid line versus half wavelength layer thickness change, as expected from simulation. For example, in chart 4401H, a first pair of data points 4421H, 4431H correspond to first alternating axis bulk acoustic wave resonator structure 4301H with zero deviation, e.g., zero change (e.g., no deviation, e.g., no change) from half wavelength layer thickness. For example, for corresponding first alternating axis bulk acoustic wave resonator structure 4301H having four half wavelength thick alternating axis piezoelectric layers 4001H through 4004H, first pair of data points 4421H, 4431H of chart 4301H shows parallel resonant frequency Fp of twenty-four and eighty-five hundredths GigaHertz (24.85 Ghz) and series resonant frequency Fs of twenty-four and twenty-five hundredths GigaHertz (24.25 Ghz) for no change from half wavelength layer thickness in BAW resonator 4301H, as expected from simulation.

For example, in chart 4401H, a second pair of data points 4423H, 4433H correspond to second alternating axis bulk acoustic wave resonator structure 4302H having the second normal axis piezoelectric layer 4102H with thickness increased from the half wavelength by the additional quarter wavelength to the resulting three quarter wavelength (with its third piezoelectric layer 4013H with thickness decreased from the half wavelength by a quarter wavelength to a resulting quarter wavelength, e.g., with its third piezoelectric layer 4013H with thickness decreased by half, e.g., the decreased thickness factor delta H being half). For example, for corresponding second alternating axis bulk acoustic wave resonator structure 4302H having the decreased thickness factor delta H being half, the second pair of data points 4423H, 4433H of chart 4301H shows parallel resonant frequency Fp of twenty-four and eighty-five hundredths GigaHertz (24.85 Ghz) and series resonant frequency Fs of twenty-four and fifty-five hundredths GigaHertz (24.55 Ghz) for thickness decreased from the half wavelength by the quarter wavelength to the resulting quarter wavelength in BAW resonator 4302H, as expected from simulation. Accordingly, as representatively illustrated in chart 4401H, and by comparing the first pair of data points 4421H, 4431H to the second pair of data points 4423H, 4433H, it is shown that frequency separation between parallel resonant frequency Fp and series resonant frequency Fs may be limited, e.g., may be reduced, by varying thickness of alternating axis piezoelectric layers from half wavelength thickness (e.g., by varying thickness of alternating axis piezoelectric layers from integer multiples of half acoustic wavelength thickness).

For example, in chart 4401H, a third pair of data points 4425H, 4435H correspond to third bulk acoustic wave resonator structure 4303H having the second normal axis piezoelectric layer 4202H with thickness increased from the half wavelength by an additional half wavelength to a resulting full wavelength (e.g., with its third piezoelectric layer omitted, e.g., with thickness decreased from the half wavelength to zero, e.g., with another decrease thickness factor delta H being 100% or 1). For example for third bulk acoustic wave resonator structure 4303H having the decreased thickness factor delta H being 100% or 1, the third pair of data points 4425H, 4435H of chart 4301H shows parallel resonant frequency Fp of twenty-four and eighty-five hundredths GigaHertz (24.85 Ghz) and series resonant frequency Fs of twenty-four and fifty-five hundredths GigaHertz (24.75 Ghz), as expected from simulation. Accordingly, as representatively illustrated in chart 4401H, and by comparing the first pair of data points 4421H, 4431H and the second pair of data points 4423H, 4433H to the third pair of data points 4425H, 4435H, it is shown that frequency separation between parallel resonant frequency Fp and series resonant frequency Fs may be further reduced, by further varying thickness of alternating axis piezoelectric layers from half acoustic wavelength thickness (e.g., by further varying thickness of alternating axis piezoelectric layers from integer multiples of half acoustic wavelength thickness).

FIG. 4I shows simplified diagrams of six bulk acoustic millimeter wave resonator structures 4601I through 4606I having one to six piezoelectric layers, and either top multilayer metal acoustic reflector electrodes 4015I through 4515I, or top multilayer metal integrated capacitive acoustic reflector electrodes 4015I through 4515I. For example, the six bulk acoustic millimeter wave resonator structures 4601I through 4606I may have main resonant frequencies of about twenty-four GigaHertz (24 GHz). For example, without integrated capacitive layers, embodiments of top multilayer metal acoustic reflector electrodes 4015I through 4515I may comprise four pairs of quarter wavelength thick high acoustic impedance metal (e.g., Tungsten)/low acoustic impedance metal (e.g., Titanium) top electrode layers approximating a distributed Bragg acoustic reflector and including a two quarter wavelength thick Aluminum top current spreading layer. For example, for alternative embodiments with integrated capacitive layers, layers of capacitive material (e.g., Silicon Dioxide layers) may replace low acoustic impedance metal (e.g., Titanium) in the distributed Bragg acoustic reflector for top multilayer metal acoustic reflector electrodes 4015I through 4515I. For example, the alternative top multilayer metal acoustic reflector electrodes 4015I through 4515I may comprise four pairs of quarter wavelength thick high acoustic impedance metal (e.g., Tungsten)/capacitive layer (e.g., Silicon Dioxide) top electrode layers, approximating the distributed Bragg acoustic reflector, and the foregoing may further comprise the two quarter wavelength thick Aluminum top current spreading layer.

For example, first bulk acoustic millimeter wave resonator structure 4601I may comprise a normal axis piezoelectric layer 4001I having a thickness of about a half acoustic wavelength sandwiched between bottom multi-layer metal acoustic reflector electrode 4013I and either top multilayer metal acoustic reflector electrodes 4015I, or top multilayer metal integrated capacitive acoustic reflector electrodes 4015I. Second bulk acoustic millimeter wave resonator structures 4602I may comprise a two layer alternating axis piezoelectric stack (e.g., normal axis piezoelectric layer 4101I, e.g., reverse axis piezoelectric layer 4102I) having respective thicknesses of about a half wavelength and sandwiched between bottom multi-layer metal acoustic reflector electrode 4113I and either top multilayer metal acoustic reflector electrodes 4115I, or top multilayer metal integrated capacitive acoustic reflector electrodes 4115I.

Third bulk acoustic millimeter wave resonator structure 4603I may comprise a three layer alternating axis piezoelectric stack (e.g., normal axis piezoelectric layer 4201I, e.g., reverse axis piezoelectric layer 4202I e.g., normal axis piezoelectric layer 4203I) having respective thicknesses of about a half wavelength and sandwiched between bottom multi-layer metal acoustic reflector electrode 4213I and either top multilayer metal acoustic reflector electrodes 4215I, or top multilayer metal integrated capacitive acoustic reflector electrodes 4215I.

Fourth bulk acoustic millimeter wave resonator structure 4604I may comprise a four layer alternating axis piezoelectric stack (e.g., normal axis piezoelectric layer 4301I, e.g., reverse axis piezoelectric layer 4302I e.g., normal axis piezoelectric layer 4303I, e.g., reverse axis piezoelectric layer 4304I) having respective thicknesses of about a half wavelength and sandwiched between bottom multi-layer metal acoustic reflector electrode 4313I and either top multilayer metal acoustic reflector electrodes 4315I, or top multilayer metal integrated capacitive acoustic reflector electrodes 4315I.

Fifth bulk acoustic millimeter wave resonator structure 4605I may comprise a five layer alternating axis piezoelectric stack (e.g., normal axis piezoelectric layer 4401I, e.g., reverse axis piezoelectric layer 4402I, e.g., normal axis piezoelectric layer 4403I, e.g., reverse axis piezoelectric layer 4404I, e.g., normal axis piezoelectric layer 4405I) having respective thicknesses of about a half wavelength and sandwiched between bottom multi-layer metal acoustic reflector electrode 4413I and either top multilayer metal acoustic reflector electrodes 4415I, or top multilayer metal integrated capacitive acoustic reflector electrodes 4415I.

Sixth bulk acoustic millimeter wave resonator structure 4606I may comprise a six layer alternating axis piezoelectric stack (e.g., normal axis piezoelectric layer 4501I, e.g., reverse axis piezoelectric layer 4502I, e.g., normal axis piezoelectric layer 4503I, e.g., reverse axis piezoelectric layer 4504I, e.g., normal axis piezoelectric layer 4505I, e.g., reverse axis piezoelectric layer 4506I) having respective thicknesses of about a half wavelength and sandwiched between bottom multi-layer metal acoustic reflector electrode 4513I and either top multilayer metal acoustic reflector electrodes 4515I, or top multilayer metal integrated capacitive acoustic reflector electrodes 4515I.

It is theorized that the following may (but need not) explain a capacitive mechanism for electromechanical coupling limitation/reduction. For example, four integrated Silicon Dioxide (e.g., SiO2) capacitors in series in top multilayer metal acoustic reflector electrodes 4015I through 4515I may lower voltage available to drive piezoelectric layers. This may limit/reduce electromechanical coupling relative to top multilayer metal acoustic reflector electrodes 4015I through 4515I without integrated capacitors.

A corresponding chart 460I shows electromechanical coupling versus number of piezoelectric layers for the top multilayer metal acoustic reflectors, and for the top integrated capacitive acoustic reflectors, with results as expected from simulation. For example, dotted line trace 4625I corresponds to top multilayer metal acoustic reflector electrodes 4015I through 4515I without integrated capacitors and shows electromechanical coupling coefficient increasing and ranging from about four and a half percent (4.5%) to about five and a half percent (5.5%) for resonators 4601I through 4606I as number of piezoelectric layers increases and EE from one to six piezoelectric layers. For example, solid line trace 4627I corresponds to top multilayer metal acoustic reflector electrodes 4015I through 4515I comprising integrated capacitors and shows electromechanical coupling coefficient increasing and ranging from about one percent (1%) to about three and a half percent (3%) for resonators 4601I through 4606I as number of piezoelectric layers increases and ranges from one to six piezoelectric layers. Accordingly, chart 460I illustrates that top multilayer metal acoustic reflector electrodes 4015I through 4515I comprising integrated capacitors may limit, e.g., may reduce, electromechanical coupling, e.g., electromechanical coupling coefficient, relative to top multilayer metal acoustic reflector electrodes 4015I through 4515I without integrated capacitors.

In addition, top multilayer metal acoustic reflector electrodes 4015I through 4515I comprising integrated capacitors may increase resonator area, e.g., by a factor, which may be selected, e.g., to achieve characteristic impedance of fifty (50) Ohms. This may be compared to top multilayer metal acoustic reflector electrodes 4015I through 4515I without integrated capacitors. For example, top multilayer metal acoustic reflector electrodes 4015I through 4515I comprising integrated capacitors may increase resonator area, which may be selected, e.g., to achieve characteristic impedance of fifty (50) Ohms, e.g., at twenty-four GigaHerta (24 GHz), may increase by a factor of about 9 times to about 1.6 times for bulk acoustic millimeter wave resonator structures 4601I through 4606I. This may beneficial e.g., for power handling, e.g., for quality factors, of bulk acoustic millimeter wave resonator structures 4601I through 4606I.

FIG. 4J shows simplified diagrams of six alternative bulk acoustic millimeter wave resonator structures 4601J through 4606J having one to six piezoelectric layers, in which piezoelectric layer thickness is alternatively varied. For example, the six bulk acoustic millimeter wave resonator structures 4601J through 4606J may have main resonant frequencies of about twenty-four GigaHertz (24 GHz).

For example, first bulk acoustic millimeter wave resonator structure 4601J may comprise a normal axis piezoelectric layer 4001J having a thickness of about one-and-a half times a half acoustic wavelength (or about a half acoustic wavelength, not shown). This may be sandwiched between bottom multi-layer metal acoustic reflector electrode 4013J and top multilayer metal acoustic reflector electrodes 4015J. Second bulk acoustic millimeter wave resonator structure 4602J may comprise a two layer alternating axis piezoelectric stack (e.g., normal axis piezoelectric layer 4101J, e.g., reverse axis piezoelectric layer 4102J), with normal axis piezoelectric layer 4101J having a thickness of about one-and-a half times a half acoustic wavelength (or about a half acoustic wavelength, not shown). Reverse axis piezoelectric layer 4102J may have a thickness of about one half of a half acoustic wavelength (or about a half acoustic wavelength, not shown). The two piezoelectric layers 4101J, 4102J may be sandwiched between bottom multi-layer metal acoustic reflector electrode 4113J and top multilayer metal acoustic reflector electrodes 4115J.

Third bulk acoustic millimeter wave resonator structure 4603J may comprise a three layer alternating axis piezoelectric stack (e.g., normal axis piezoelectric layer 4201J, e.g., reverse axis piezoelectric layer 4202J e.g., normal axis piezoelectric layer 4203J). Normal axis piezoelectric layer 4201J may have a thickness of about one-and-a half times a half acoustic wavelength (or about a half acoustic wavelength, not shown). Reverse axis piezoelectric layer 4202J may have a thickness of about one half of a half acoustic wavelength (or about a half acoustic wavelength, not shown). Normal axis piezoelectric layer 4203J may have a thickness of about a half acoustic wavelength.

Fourth bulk acoustic millimeter wave resonator structure 4604J may comprise a four layer alternating axis piezoelectric stack (e.g., normal axis piezoelectric layer 4301J, e.g., reverse axis piezoelectric layer 4302J, e.g., normal axis piezoelectric layer 4303J, e.g., reverse axis piezoelectric layer 4304J). Normal axis piezoelectric layer 4301J may have a thickness of about one-and-a half times a half acoustic wavelength (or about a half acoustic wavelength, not shown). Reverse axis piezoelectric layer 4302J may have a thickness of about one half of a half acoustic wavelength (or about a half acoustic wavelength, not shown). Normal axis piezoelectric layer 4303J may have a thickness of about a half acoustic wavelength. Reverse axis piezoelectric layer 4304J may have a thickness of about a half acoustic wavelength.

Fifth bulk acoustic millimeter wave resonator structure 4605J may comprise a five layer alternating axis piezoelectric stack (e.g., normal axis piezoelectric layer 4401J, e.g., reverse axis piezoelectric layer 4402J, e.g., normal axis piezoelectric layer 4403J, e.g., reverse axis piezoelectric layer 4404J, e.g., normal axis piezoelectric layer 4405J). Normal axis piezoelectric layer 4401J may have a thickness of about one-and-a half times a half acoustic wavelength (or about a half acoustic wavelength, not shown). Reverse axis piezoelectric layer 4402J may have a thickness of about one half of a half acoustic wavelength (or about a half acoustic wavelength, not shown). Normal axis piezoelectric layer 4403J may have a thickness of about a half acoustic wavelength. Reverse axis piezoelectric layer 4404J may have a thickness of about a half acoustic wavelength. Normal axis piezoelectric layer 4405J may have a thickness of about a half acoustic wavelength.

Sixth bulk acoustic millimeter wave resonator structure 4606J may comprise a six layer alternating axis piezoelectric stack (e.g., normal axis piezoelectric layer 4501J, e.g., reverse axis piezoelectric layer 4502J, e.g., normal axis piezoelectric layer 4503J, e.g., reverse axis piezoelectric layer 4504J, e.g., normal axis piezoelectric layer 4505J, e.g., reverse axis piezoelectric layer 4506J). Normal axis piezoelectric layer 4501J may have a thickness of about one-and-a half times a half acoustic wavelength (or about a half acoustic wavelength, not shown). Reverse axis piezoelectric layer 4502J may have a thickness of about one half of a half acoustic wavelength (or about a half acoustic wavelength, not shown). Normal axis piezoelectric layer 4503J may have a thickness of about a half acoustic wavelength. Reverse axis piezoelectric layer 4504J may have a thickness of about a half acoustic wavelength. Normal axis piezoelectric layer 4505J may have a thickness of about a half acoustic wavelength. Reverse axis piezoelectric layer 4506J may have a thickness of about a half acoustic wavelength.

Chart 4601J corresponds to the six bulk acoustic millimeter wave resonator structures 4601J through 4606J. Chart 4601J shows electromechanical coupling (e.g., electromechanical coupling coefficient) versus number of alternating axis piezoelectric layers for the alternatively varied piezoelectric layer thickness, and for piezoelectric layer thickness not being varied from half wavelength thickness, with results as expected from simulation. For the sake of comparison to varied piezoelectric layer thickness, dotted line trace 4625J corresponds to bulk acoustic millimeter wave resonators having about equal thickness (e.g., about half wave length thickness. Dotted line trace 4625J shows electromechanical coupling coefficient increasing and ranging from about three percent (3%) to about five-and-a-half percent (5.5%), as number of alternating axis piezoelectric layers increases and ranges from one piezoelectric layer to six alternating axis piezoelectric layers. Solid line trace 4627J corresponds to bulk acoustic millimeter wave resonators having varied piezoelectric layer thickness.

Solid line trace 4627J shows electromechanical coupling coefficient of about two percent (% 2) for first bulk acoustic millimeter wave resonator structure 4601J comprising the normal axis piezoelectric layer 4001J having a thickness of about one-and-a half times a half acoustic wavelength. Notably, the resonance frequency of the first bulk acoustic millimeter wave resonator structure 4601J may be about twenty GigaHertz (20 GHz), rather than about twenty-four GigaHertz (24 GHz) for bulk acoustic millimeter wave resonator structures 4602J through 4606J. This may be due to thicker than half wavelength normal axis piezoelectric layer 4001J Solid line trace 4627J shows electromechanical coupling coefficient relatively decreasing to about eight tenths of a percent (% 0.8) for second bulk acoustic millimeter wave resonator structure 4602J comprising the two layer alternating axis piezoelectric stack (e.g., normal axis piezoelectric layer 4101J, e.g., reverse axis piezoelectric layer 4102J), with normal axis piezoelectric layer 4101J having the thickness of about one-and-a half times a half acoustic wavelength, and with reverse axis piezoelectric layer 4102J having a thickness of about one half of a half acoustic wavelength.

Solid line trace 4627J shows electromechanical coupling coefficient relatively increasing and ranging from about eight tenths of a percent (% 0.8) for two layer varied layer thickness piezoelectric stack (just discussed) to about three and half percent (3.5%) for the six layer piezoelectric stack of 4606J, as addition of half acoustic wavelength layers increases and ranges up to the four additional half acoustic wavelength layers for the six layer piezoelectric stack of 4606J.

Chart 4601J may show by comparison of dotted line trace 4625J and solid line trace 4627J that electromechanical coupling (e.g., electromechanical coupling coefficient) may be limited, e.g., reduced, by varying thickness of piezoelectric layers (e.g., by varying thickness of piezoelectric layers for a half acoustic wavelength, e.g., by varying thickness of piezoelectric layers for an integer multiple of a half acoustic wavelength). Chart 4601J may show via solid line trace 4627J that electromechanical coupling (e.g., electromechanical coupling coefficient) may be limited, e.g., reduced, by varying thickness of piezoelectric layers, for example, so layers have differing thicknesses, e.g., first and second piezoelectric layers have different thicknesses. In chart 4601J, dotted line trace 4625J and solid line trace 4627J show that electromechanical coupling (e.g., electromechanical coupling coefficient) may increase as half acoustic wavelength thick alternating axis piezoelectric layers may be added.

FIG. 4K shows simplified diagrams of six additional alternative bulk acoustic millimeter wave resonator structures 4601K through 4606K having from two to six piezoelectric layers, in which piezoelectric layer thickness is additionally alternatively varied. For example, the six bulk acoustic millimeter wave resonator structures 4601K through 4606K may have main resonant frequencies of about twenty-four GigaHertz (24 GHz).

For example, first bulk acoustic millimeter wave resonator structure 4601K may comprise a normal axis piezoelectric layer 4001K having a thickness of about one half a half acoustic wavelength and a reverse axis piezoelectric layer 4002K having a thickness of about one half a half acoustic wavelength (or, instead of two piezoelectric layers, one piezoelectric layer having thickness of about a half acoustic wavelength, not shown). This may be sandwiched between bottom multi-layer metal acoustic reflector electrode 4013K and top multilayer metal acoustic reflector electrode 4015K. Second bulk acoustic millimeter wave resonator structure 4602K may comprise a two layer alternating axis piezoelectric stack (e.g., normal axis piezoelectric layer 4101K, e.g., reverse axis piezoelectric layer 4102K), with normal axis piezoelectric layer 4101K having a thickness of about one half of a half acoustic wavelength (or about a half acoustic wavelength, not shown). Reverse axis piezoelectric layer 4102K may have a thickness of about one-and-a half times a half acoustic wavelength (or about a half acoustic wavelength, not shown). The two piezoelectric layers 4101K, 4102K may be sandwiched between bottom multi-layer metal acoustic reflector electrode 4113K and top multilayer metal acoustic reflector electrodes 4115K.

Third bulk acoustic millimeter wave resonator structure 4603K may comprise a three layer alternating axis piezoelectric stack (e.g., normal axis piezoelectric layer 4201K, e.g., reverse axis piezoelectric layer 4202K e.g., normal axis piezoelectric layer 4203K). Normal axis piezoelectric layer 4201K may have a thickness of about one half of a half acoustic wavelength (or about a half acoustic wavelength, not shown). Reverse axis piezoelectric layer 4202K may have a thickness of about one-and-a half times a half acoustic wavelength (or about a half acoustic wavelength, not shown). Normal axis piezoelectric layer 4203K may have a thickness of about a half acoustic wavelength.

Fourth bulk acoustic millimeter wave resonator structure 4604K may comprise a four layer alternating axis piezoelectric stack (e.g., normal axis piezoelectric layer 4301K, e.g., reverse axis piezoelectric layer 4302K, e.g., normal axis piezoelectric layer 4303K, e.g., reverse axis piezoelectric layer 4304K). Normal axis piezoelectric layer 4301K may have a thickness of about one half of a half acoustic wavelength (or about a half acoustic wavelength, not shown). Reverse axis piezoelectric layer 4302K may have a thickness of about one-and-a half times a half acoustic wavelength (or about a half acoustic wavelength, not shown). Normal axis piezoelectric layer 4303K may have a thickness of about a half acoustic wavelength. Reverse axis piezoelectric layer 4304K may have a thickness of about a half acoustic wavelength.

Fifth bulk acoustic millimeter wave resonator structure 4605K may comprise a five layer alternating axis piezoelectric stack (e.g., normal axis piezoelectric layer 4401K, e.g., reverse axis piezoelectric layer 4402K, e.g., normal axis piezoelectric layer 4403K, e.g., reverse axis piezoelectric layer 4404K, e.g., normal axis piezoelectric layer 4405K). Normal axis piezoelectric layer 4401K may have a thickness of about one half of a half acoustic wavelength (or about a half acoustic wavelength, not shown). Reverse axis piezoelectric layer 4402K may have a thickness of about one-and-a half times a half acoustic wavelength (or about a half acoustic wavelength, not shown). Normal axis piezoelectric layer 4403K may have a thickness of about a half acoustic wavelength. Reverse axis piezoelectric layer 4404K may have a thickness of about a half acoustic wavelength. Normal axis piezoelectric layer 4405K may have a thickness of about a half acoustic wavelength.

Sixth bulk acoustic millimeter wave resonator structure 4606K may comprise a six layer alternating axis piezoelectric stack (e.g., normal axis piezoelectric layer 4501K, e.g., reverse axis piezoelectric layer 4502K, e.g., normal axis piezoelectric layer 4503K, e.g., reverse axis piezoelectric layer 4504K, e.g., normal axis piezoelectric layer 4505K, e.g., reverse axis piezoelectric layer 4506K). Normal axis piezoelectric layer 4501K may have a thickness of about one half of a half acoustic wavelength (or about a half acoustic wavelength, not shown). Reverse axis piezoelectric layer 4502K may have a thickness of about one-and-a half times a half acoustic wavelength (or about a half acoustic wavelength, not shown). Normal axis piezoelectric layer 4503K may have a thickness of about a half acoustic wavelength. Reverse axis piezoelectric layer 4504K may have a thickness of about a half acoustic wavelength. Normal axis piezoelectric layer 4505K may have a thickness of about a half acoustic wavelength. Reverse axis piezoelectric layer 4506K may have a thickness of about a half acoustic wavelength.

Chart 4601K corresponds to the six bulk acoustic millimeter wave resonator structures 4601K through 4606K. Chart 4601K shows electromechanical coupling (e.g., electromechanical coupling coefficient) versus number of alternating axis piezoelectric layers for the alternatively varied piezoelectric layer thickness, and for piezoelectric layer thickness not being varied from half wavelength thickness, with results as expected from simulation.

For the sake of comparison to varied piezoelectric layer thickness, dotted line trace 4625K corresponds to bulk acoustic millimeter wave resonators having about equal thickness (e.g., about half wavelength thickness). Dotted line trace 4625K shows electromechanical coupling coefficient increasing and ranging from about three percent (3%) to about five-and-a-half percent (5.5%), as number of alternating axis piezoelectric layers increases and ranges from one piezoelectric layer to six alternating axis piezoelectric layers. Solid line trace 4627K corresponds to bulk acoustic millimeter wave resonators having varied piezoelectric layer thickness.

Solid line trace 4627K shows electromechanical coupling coefficient of about a zero percent (% 0) for first bulk acoustic millimeter wave resonator structure 4601K comprising the normal axis piezoelectric layer 4001K having the thickness of about one half of a half acoustic wavelength and the reverse axis piezoelectric layer 4002K having the thickness of about one half of a half acoustic wavelength. Notably, the first bulk acoustic millimeter wave resonator structure 4601K may exhibit no electrically excited resonance at twenty-four GigaHertz (24 GHz). This may be due to approximately complete charge cancelation between quarter wavelength thick normal and reverse axis piezoelectric layers 4001K and 4002K.

Solid line trace 4627K shows electromechanical coupling coefficient relatively increasing to about eight tenths of a percent (% 0.8) for second bulk acoustic millimeter wave resonator structure 4602K comprising the two layer alternating axis piezoelectric stack (e.g., normal axis piezoelectric layer 4101K, e.g., reverse axis piezoelectric layer 4102K), with normal axis piezoelectric layer 4101K having the thickness of about one half of a half acoustic wavelength thickness of about one-and-a half times a half acoustic wavelength, and with reverse axis piezoelectric layer 4102K having the thickness of about one-and-a half times a half acoustic wavelength.

Solid line trace 4627K shows electromechanical coupling coefficient relatively increasing and ranging from about the eight tenths of a percent (% 0.8) for two layer varied layer thickness piezoelectric stack (just discussed) to about three and half percent (3.5%) for the six layer piezoelectric stack of 4606K, as addition of half acoustic wavelength layers increases and ranges up to the four additional half acoustic wavelength layers for the six layer piezoelectric stack of 4606K.

Chart 4601K may show by comparison of dotted line trace 4625K and solid line trace 4627K that electromechanical coupling (e.g., electromechanical coupling coefficient) may be limited, e.g., reduced, by varying thickness of piezoelectric layers (e.g., by varying thickness of piezoelectric layers for a half acoustic wavelength, e.g., by varying thickness of piezoelectric layers for an integer multiple of a half acoustic wavelength). Chart 4601K may show via solid line trace 4627K that electromechanical coupling (e.g., electromechanical coupling coefficient) may be limited, e.g., reduced, by varying thickness of piezoelectric layers, for example, so layers have differing thicknesses, e.g., first and second piezoelectric layers have different thicknesses. In chart 4601K, dotted line trace 4625K and solid line trace 4627K show that electromechanical coupling (e.g., electromechanical coupling coefficient) may increase as half acoustic wavelength thick alternating axis piezoelectric layers may be added.

Based on the teachings of this disclosure with respect to FIGS. 2A, 2B, 4J and 4K, one skilled in the art upon reading this disclosure will appreciate that various combinations within the scope of this disclosure and directed to reducing of electromechanical coupling (e.g., reducing electromechanical coupling coefficient) may be embodied, e.g., based on adapting thickness of normal and reverse axis piezoelectric layers. The foregoing description of example embodiments has been presented for the purposes of illustration and description. It is not intended to be exhaustive or to limit the present disclosure to the precise forms disclosed.

FIG. 4L shows simplified diagrams of six yet additional alternative bulk acoustic millimeter wave resonator structures 4601L through 4606L having one to six piezoelectric layers, in which either a first material (e.g., Aluminum Nitride) or a second material (e.g., Gallium Nitride), or a combination of these two materials (e.g., Aluminum Gallium Nitride), may be used for the half wavelength thick piezoelectric layers. For example, the six bulk acoustic millimeter wave resonator structures 4601L through 4606L may have main resonant frequencies of about twenty-four GigaHertz (24 GHz).

For example, first bulk acoustic millimeter wave resonator structure 4601L may comprise a normal axis piezoelectric layer 4001L having a thickness of about a half acoustic wavelength sandwiched between bottom multi-layer acoustic reflector electrode 4013L and top multilayer acoustic reflector electrodes 4015L. Second bulk acoustic millimeter wave resonator structures 4602L may comprise a two layer alternating axis piezoelectric stack (e.g., normal axis piezoelectric layer 4101L, e.g., reverse axis piezoelectric layer 4102L) having respective thicknesses of about a half wavelength and sandwiched between bottom multi-layer acoustic reflector electrode 4113L and top multilayer acoustic reflector electrodes 4115L.

Third bulk acoustic millimeter wave resonator structure 4603L may comprise a three layer alternating axis piezoelectric stack (e.g., normal axis piezoelectric layer 4201L, e.g., reverse axis piezoelectric layer 4202L e.g., normal axis piezoelectric layer 4203L) having respective thicknesses of about a half wavelength and sandwiched between bottom multi-layer acoustic reflector electrode 4213L and top multilayer acoustic reflector electrodes 4215L.

Fourth bulk acoustic millimeter wave resonator structure 4604L may comprise a four layer alternating axis piezoelectric stack (e.g., normal axis piezoelectric layer 4301L, e.g., reverse axis piezoelectric layer 4302L e.g., normal axis piezoelectric layer 4303L, e.g., normal axis piezoelectric layer 4304L) having respective thicknesses of about a half wavelength and sandwiched between bottom multi-layer acoustic reflector electrode 4313L and top multilayer acoustic reflector electrodes 4315L.

Fifth bulk acoustic millimeter wave resonator structure 4605L may comprise a five layer alternating axis piezoelectric stack (e.g., normal axis piezoelectric layer 4401L, e.g., reverse axis piezoelectric layer 4402L, e.g., normal axis piezoelectric layer 4403L, e.g., normal axis piezoelectric layer 4404L, e.g., reverse axis piezoelectric layer 4405L) having respective thicknesses of about a half wavelength and sandwiched between bottom multi-layer acoustic reflector electrode 4413L and top multilayer acoustic reflector electrodes 4415L.

Sixth bulk acoustic millimeter wave resonator structure 4606L may comprise a six layer alternating axis piezoelectric stack (e.g., normal axis piezoelectric layer 4501L, e.g., reverse axis piezoelectric layer 4502L, e.g., normal axis piezoelectric layer 4503L, e.g., normal axis piezoelectric layer 4504L, e.g., reverse axis piezoelectric layer 4505L, e.g., normal axis piezoelectric layer 4506L) having respective thicknesses of about a half wavelength and sandwiched between bottom multi-layer acoustic reflector electrode 4513L and top multilayer acoustic reflector electrodes 4515L.

Bottom multi-layer acoustic reflector electrodes 4013L, 4113L, 4213L, 4313L, 4413L, 4513L and top multilayer acoustic reflector electrodes 4015L, 4115L, 4215L, 4315L, 4415L, 4515L may approximate distributed Bragg acoustic reflectors (e.g. may comprise alternating layers of differing materials, e.g. may comprise alternating layers of highly N type doped Aluminum Nitride and highly N type doped Gallium Nitride, e.g. may comprise alternating layers of differing materials having differing acoustic impedance, e.g., may comprise alternating layers of differing materials have respective thicknesses of about one quarter acoustic wavelength). Bottom multi-layer acoustic reflector electrodes 4013L, 4113L, 4213L, 4313L, 4413L, 4513L may comprise ten (10) pairs of highly N type doped Aluminum Nitride and highly N type doped Gallium Nitride in an alternating arrangement e.g., over a Gallium Nitride substrate, e.g., over an Aluminum Nitride substrate. Top multilayer acoustic reflector electrodes 4015L, 4115L, 4215L, 4315L, 4415L, 4515L may two (2) pairs of highly N type doped Aluminum Nitride and highly N type doped Gallium Nitride in an alternating arrangement.

It is theorized that the following may (but need not) explain a electromechanical coupling limitation/reduction via use of various alternative piezoelectric materials. For example, Gallium Nitride (GaN) may have a relatively low intrinsic electromechanical coupling coefficient (Kt2) of approximately one and seven tenths percent (~1.7%). In contrast, Aluminum Nitride (AlN) may have a relatively higher intrinsic electromechanical coupling coefficient (Kt2) of approximately one and six percent (~6%). Employing materials having relatively lower intrinsic electromechanical coupling coefficient (Kt2) may (but need not) provide the limitation/reduction of electromechanical coupling for resonators employing the relatively lower intrinsic electromechanical coupling coefficient (Kt2). In addition, it is theorized that a relatively low acoustic impedance ratio of 1.6 between Gallium Nitride (GaN_ and Aluminum Nitride (AlN) (as compared to a relatively high acoustic impedance ratio of about three to one for Tungsten (W) and Titanium (Ti)) may allow for a significant portion of acoustic energy to be confined in non-piezoelectric top and bottom Distributed Bragg acoustic Reflectors (DBRs). This may further reduce electromechanical coupling coefficient (Kt2).

A corresponding chart 460L shows electromechanical coupling versus number of piezoelectric layers for differing piezoelectric materials (e.g., for Gallium Nitride (GaN), e.g., for Aluminum Nitride (AlN)), with results as expected from simulation. For example, dotted line trace 4625L corresponds to Gallium Nitride (GaN) piezoelectric layers, and shows electromechanical coupling coefficient increasing and ranging from less than about a tenth of percent (0.1%) to about a half percent (0.5%) for resonators 4601L through 4606L as number of piezoelectric layers increases and ranges from one to six piezoelectric layers. For example, solid line trace 4627L corresponds to Aluminum Nitride (AlN) piezoelectric layers, and shows electromechanical coupling coefficient increasing and ranging from about a tenth percent (0.1%) to about two and a half percent (2.5%) for resonators 4601L through 4606L as number of piezoelectric layers increases and ranges from one to six piezoelectric layers. Accordingly, chart 4601L may illustrate that employing materials having relatively lower intrinsic electromechanical coupling coefficient (Kt2) may provide the limitation/reduction of electromechanical coupling for resonators employing the relatively lower intrinsic electromechanical coupling coefficient (Kt2). Further, chart 4601L may illustrate that increasing number of alternating piezoelectric layers may increase electromechanical coupling, even for various different piezoelectric material systems.

FIG. 4M shows three more alternative bulk acoustic millimeter wave resonator structures 4301M, 4302N, 4303O of this disclosure. For example, the three bulk acoustic millimeter wave resonator structures 4301M, 4302N, 4303O may have main resonant frequencies of about twenty-four GigaHertz (24 GHz). The three bulk acoustic millimeter wave resonator structures 4301M, 4302N, 4303O may comprise piezoelectric stacks 4104M, 4104N, 4104O comprising a respective number N (e.g., number N may be four or more) of alternating axis piezoelectric layers, having respective thicknesses of about a half acoustic wavelength. Piezoelectric stacks 4104M, 4104N, 4104O may be arranged over respective substrates 4011M, 4011N, 4011O (e.g. substrates comprising Gallium Nitride (GaN), e.g. substrates comprising Aluminum Nitride (AlN), e.g. substrates comprising Silicon (Si), e.g. substrates comprising Silicon Carbide (SiC), e.g. substrates comprising Sapphire). Bottom multi-layer acoustic reflector electrodes 4175M, 4175N, 4175O may approximate distributed Bragg acoustic reflectors (e.g. may comprise alternating layers of differing materials, e.g. may comprise alternating layers of highly N type doped Aluminum Nitride and highly N type doped Gallium Nitride, e.g. may comprise alternating layers of highly P type doped Aluminum Nitride and highly P type doped Gallium Nitride, e.g. may comprise alternating layers of differing materials having differing acoustic impedance, e.g., may comprise alternating layers of differing materials have respective thicknesses of about one quarter acoustic wavelength). Contacts 4169M, 4169N, 4169O (e.g., electrical contacts 4169M, 4169N, 4169O, e.g., metal contacts 4169M, 4169N, 4169O) may be electrically coupled with respective extremities of bottom multi-layer acoustic reflector electrodes 4175M, 4175N, 4175O. Isolation layer 4065, 4165, 4265 (e.g., implant isolation layer) may be fabricated adjacent to opposing extremity of multi-layer acoustic reflector electrodes 4175M, 4175N, 4175O. For example, electrical isolation of opposing extremity of multi-layer acoustic reflector electrodes 4175M, 4175N, 4175O may be facilitated via selective ion implantation. Selective ion implantation may facilitate neutralization of doping (e.g., of highly N type doping, e.g., of highly P type doping) at the opposing extremity of multi-layer acoustic reflector electrodes 4175M, 4175N, 4175O.

First bulk acoustic millimeter wave resonator structure 4301M may comprise a top multi-layer metal acoustic reflector electrode 4071. Top multi-layer metal acoustic reflector electrode 4071 may comprise a current spreading layer. Top multi-layer metal acoustic reflector electrode 4071 may comprise a pair of metal layers (or a plurality of pairs of metal layers) of high acoustic impedance metal (e.g., Tungsten) and low acoustic impedance metal (e.g., Titanium) having respective layer thicknesses of about a quarter acoustic wavelength. Top multi-layer metal acoustic reflector electrode 4071 may comprise an initial high acoustic impedance metal electrode layer, which may abut the piezoelectric stack 4104M.

Second bulk acoustic millimeter wave resonator structure 4301N may comprise a top multi-layer metal acoustic reflector electrode 4071. Top multi-layer metal acoustic reflector electrode 4171 may comprise a current spreading layer. Top multi-layer metal acoustic reflector electrode 4171 may comprise a pair of metal layers (or a plurality of pairs of metal layers) of high acoustic impedance metal (e.g., Tungsten) and low acoustic impedance metal (e.g., Titanium) having respective layer thicknesses of about a quarter acoustic wavelength. A low acoustic impedance metal electrode layer of top multi-layer metal acoustic reflector electrode 4071 may abut the piezoelectric stack 4104N.

Third bulk acoustic millimeter wave resonator structure 4301O may comprise a top high acoustic impedance metal electrode (e.g., Tungsten) with passivation 4215O. A contact 4271 (e.g., metal contact 4271) may be electrically coupled with top high acoustic impedance metal electrode 4215O.

FIG. 5 shows a schematic of an example ladder filter 500A (e.g., SHF or EHF wave ladder filter 500A) using three series resonators of the bulk acoustic wave resonator structure of FIG. 1A (e.g., three bulk acoustic SHF or EHF wave resonators), and two mass loaded shunt resonators of the bulk acoustic wave resonator structure of FIG. 1A (e.g., two mass loaded bulk acoustic SHF or EHF wave resonators), along with a simplified view of the three series resonators. Accordingly, the example ladder filter 500A (e.g., SHF or EHF wave ladder filter 500A) is an electrical filter, comprising a plurality of bulk acoustic wave (BAW) resonators, e.g., on a substrate, in which the plurality of BAW resonators may comprise a respective first layer (e.g., bottom layer) of piezoelectric material having a respective piezoelectrically excitable resonance mode. The plurality of BAW resonators of the filter 500A may comprise a respective top acoustic reflector (e.g., top acoustic reflector electrode) including a respective first pair of top metal electrode layers electrically and acoustically coupled with the respective first layer (e.g., bottom layer) of piezoelectric material to excite the respective piezoelectrically excitable resonance mode at a respective resonant frequency. For example, the respective top acoustic reflector (e.g., top acoustic reflector electrode) may include the respective first pair of top metal electrode layers, and the foregoing may have a respective quarter wavelength resonant frequency in the Super High Frequency (SHF) band or the Extremely High Frequency (EHF) band that includes the respective resonant frequency of the respective BAW resonator. The plurality of BAW resonators of the filter 500A may comprise a respective bottom acoustic reflector (e.g., bottom acoustic reflector electrode) including a respective first pair of bottom metal electrode layers electrically and acoustically coupled with the respective first layer (e.g., bottom layer) of piezoelectric material to excite the respective piezoelectrically excitable resonance mode at the respective resonant frequency. For example, the respective bottom acoustic reflector (e.g., bottom acoustic reflector electrode) may include the respective first pair of bottom metal electrode layers, and the foregoing may have a respective quarter wavelength resonant frequency in the super high frequency band or the extremely high frequency band that includes the respective resonant frequency of the respective BAW resonator. The respective first layer (e.g., bottom layer) of piezoelectric material may be sandwiched between the respective top acoustic reflector and the respective bottom acoustic reflector. Further, the plurality of BAW resonators may comprise at least one respective additional layer of piezoelectric material, e.g., first middle piezoelectric layer. The at least one additional layer of piezoelectric material may have the piezoelectrically excitable main resonance mode with the respective first layer (e.g., bottom layer) of piezoelectric material. The respective first layer (e.g., bottom layer) of piezoelectric material may have a respective first piezoelectric axis orientation (e.g., reverse axis orientation) and the at least one respective additional layer of piezoelectric material may have a respective piezoelectric axis orientation (e.g., normal axis orientation) that opposes the first piezoelectric axis orientation of the respective first layer of piezoelectric material. Further discussion of features that may be included in the plurality of BAW resonators of the filter 500A is present previously herein with respect to previous discussion of FIG. 1A

As shown in the schematic appearing at an upper section of FIG. 5, the example ladder filter 500A may include an input port comprising a first node 521A (InA), and may include a first series resonator 501A (Series1A) (e.g., first bulk acoustic SHF or EHF wave resonator 501A) coupled between the first node 521A (InA) associated with the input port and a second node 522A. The example ladder filter 500A may also include a second series resonator 502A (Series2A) (e.g., second bulk acoustic SHF or EHF wave resonator 502A) coupled between the second node 522A and a third node 523A. The example ladder filter 500A may also include a third series resonator 503A (Series3A) (e.g., third bulk acoustic SHF or EHF wave resonator 503A) coupled between the third node 523A and a fourth node 524A (OutA), which may be associated with an output port of the ladder filter 500A. The example ladder filter 500A may also include a first mass loaded shunt resonator 511A (Shunt1A) (e.g., first mass loaded bulk acoustic SHF or EHF wave resonator 511A) coupled between the second node 522A and ground. The example ladder filter 500A may also include a second mass loaded shunt resonator 512A (Shunt2A) (e.g., second mass loaded bulk acoustic SHF or EHF wave resonator 512A) coupled between the third node 523 and ground.

Appearing at a lower section of FIG. 5 is the simplified view of the three series resonators 501B (Series1B), 502B (Series2B), 503B (Series3B) in a serial electrically interconnected arrangement 500B, for example, corresponding to series resonators 501A, 502A, 503A, of the example ladder filter 500A. The three series resonators 501B (Series1B), 502B (Series2B), 503B (Series3B), may be constructed as shown in the arrangement 500B and electrically interconnected in a way compatible with integrated circuit fabrication of the ladder filter. Although the first mass loaded shunt resonator 511A (Shunt1A) and the second mass loaded shunt resonator 512A are not explicitly shown in the arrangement 500B appearing at a lower section of FIG. 5, it should be understood that the first mass loaded shunt resonator 511A (Shunt1A) and the second mass loaded shunt resonator 512A are constructed similarly to what is shown for the series resonators in the lower section of FIG. 5, but that the first and second mass loaded shunt resonators 511A, 512A may include mass layers, in addition to layers corresponding to those shown for the series resonators in the lower section of FIG. 5 (e.g., the first and second mass loaded shunt resonators 511A, 512A may include respective mass layers, in addition to respective top acoustic reflectors of respective top metal electrode layers, may include respective alternating axis stacks of piezoelectric material layers, and may include respective bottom acoustic reflectors of bottom metal electrode layers). For example, all of the resonators of the ladder filter may be co-fabricated using integrated circuit processes (e.g., Complementary Metal Oxide Semiconductor (CMOS) compatible fabrication processes) on the same substrate (e.g., same silicon substrate). The example ladder filter 500A and serial electrically interconnected arrangement 500B of series resonators 501A, 502A, 503A, may respectively be relatively small in size, and may respectively have a lateral dimension (X5) of less than approximately one millimeter.

For example, the serial electrically interconnected arrangement 500B of three series resonators 501B (Series1B), 502B (Series2B), 503B (Series3B), may include an input port comprising a first node 521B (InB) and may include a first series resonator 501B (Series1B) (e.g., first bulk acoustic SHF or EHF wave resonator 501B) coupled between the first node 521B (InB) associated with the input port and a second node 522B. The first node 521B (InB) may include bottom electrical interconnect 569B electrically contacting a first bottom acoustic reflector of first series resonator 501B (Series1B) (e.g., first bottom acoustic reflector electrode of first series resonator 501B (Series1B)). Accordingly, in addition to including bottom electrical interconnect 569, the first node 521B (InB) may also include the first bottom acoustic reflector of first series resonator 501B (Series1B) (e.g., first bottom acoustic reflector electrode of first series resonator 501B (Series1B)). The first bottom acoustic reflector of first series resonator 501B (Series1B) (e.g., first bottom acoustic reflector electrode of first series resonator 501B (Series1B)) may include a stack of the plurality of bottom metal electrode layers 519 through 523 and bottom current spreading layer 525. The serial electrically interconnected arrangement 500B of three series resonators 501B (Series1B), 502B (Series2B), 503B (Series3B), may include the second series resonator 502B (Series2B) (e.g., second bulk acoustic SHF or EHF wave resonator 502B) coupled between the second node 522B and a third node 523B. The third node 523B may include a second bottom acoustic reflector of second series resonator 502B (Series2B) (e.g., second bottom acoustic reflector electrode of second series resonator 502B (Series2B)). The second bottom acoustic reflector of second series resonator 502B (Series2B) (e.g., second bottom acoustic reflector electrode of second series resonator 502B (Series2B)) may include an additional stack of an additional plurality of bottom metal electrode layers. The serial electrically interconnected arrangement 500B of three series resonators 501B (Series1B), 502B (Series2B), 503B (Series3B), may also include the third series resonator 503B (Series3B) (e.g., third bulk acoustic SHF or EHF wave resonator 503B) coupled between the third node 523B and a fourth node 524B (OutB). The third node 523B, e.g., including the additional plurality of bottom metal electrode layers, may electrically interconnect the second series resonator 502B (Series2B) and the third series resonator 503B (Series3B). The second bottom acoustic reflector (e.g., second bottom acoustic reflector electrode) of second series resonator 502B (Series2B) of the third node 523B, e.g., including the additional plurality of bottom metal electrode layers, may be a mutual bottom acoustic reflector (e.g., mutual bottom acoustic reflector electrode), and may likewise serve as bottom acoustic reflector (e.g., bottom acoustic reflector) of third series resonator 503B (Series3B). The fourth node 524B (OutB) may be associated with an output port of the serial electrically interconnected arrangement 500B of three series resonators 501B (Series1B), 502B (Series2B), 503B (Series3B). The fourth node 524B (OutB) may include top current spreading layer 571C, e.g., made integral with top electrical interconnect 571C.

The stack of the plurality of bottom metal electrode layers 519 through 523 and bottom current spreading layer 525 are associated with the first bottom acoustic reflector (e.g., first bottom acoustic reflector electrode) of first series resonator 501B (Series1B). The additional stack of the additional plurality of bottom metal electrode layers (e.g., of the third node 523B) may be associated with the mutual bottom acoustic reflector (e.g., mutual bottom acoustic reflector electrode) of both the second series resonant 502B (Series2B) and the third series resonator 503B (Series3B). Although stacks of respective five bottom metal electrode layers are shown in simplified view in FIG. 5, in should be understood that the stacks may include respective larger numbers of bottom metal electrode layers, e.g., respective nine top metal electrode layers. Further, the first series resonator (Series1B), and the second series resonant 502B (Series2B) and the third series resonator 503B (Series3B) may all have the same, or approximately the same, or different (e.g., achieved by means of additional mass loading layers) resonant frequency (e.g., the same, or approximately the same, or different main resonant frequency). For example, small additional massloads (e.g, a tenth of the main shunt mass-load) of series and shunt resonators may help to reduce pass-band ripples insertion loss, as may be appreciated by one with skill in the art. The bottom metal electrode layers 519 through 523 and bottom current spreading layer 525 and the additional plurality of bottom metal electrode layers (e.g., of the mutual bottom acoustic reflector, e.g., of the third node 523B) may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner bottom metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker bottom metal electrode layer thicknesses, e.g., scaled thicker with relatively lower resonant frequency (e.g., lower main resonant frequency).

Initial bottom acoustic reflector electrode layers 519 may comprise the relatively high acoustic impedance metal (e.g., Tungsten). For example, respective thicknesses of the initial bottom acoustic reflector electrode layers 519 may be about a quarter of an acoustic wavelength. A first pair of bottom acoustic reflector electrode layers 521, 523 may comprise an alternating layer pair of the relatively low acoustic impedance metal (e.g., Titanium) and the relatively high acoustic impedance metal (e.g., Tungsten). For example, respective thicknesses of the first pair of bottom acoustic reflector electrode layers 521, 523 may about a quarter acoustic wavelength.

The bottom metal electrode layers 519, 521, 523 and current spreading layer 525 and the additional plurality of bottom metal electrode layers (e.g., of the mutual bottom acoustic reflector, e.g., of the third node 523B) may include members of pairs of bottom metal electrodes having respective thicknesses of one quarter wavelength (e.g., one quarter acoustic wavelength) at the resonant frequency (e.g., main resonant frequency) of the series resonators (e.g., first series resonator 501B (Series1B), e.g., second series resonator 502B, e.g., third series resonator (503B)). The stack of bottom metal electrode layers 519 through 523 and bottom current spreading layer 525 and the stack of additional plurality of bottom metal electrode layers (e.g., of the mutual bottom acoustic reflector, e.g., of the third node 523B) may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the first bottom acoustic reflector (e.g., first bottom acoustic reflector electrode) of the first series resonator 501B (Series1B) and the mutual bottom acoustic reflector (e.g., of the third node 523B) of the second series resonator 502B (Series2B) and the third series resonator 503B (Series3B).

A first top acoustic reflector (e.g., first top acoustic reflector electrode) may comprise first capacitive layer 518C over a first stack of a first plurality of top metal electrode layers 537C through 543C of the first series resonator 501B (Series1B) along with current spreading layer 571B, e.g., made integral with top electrical interconnect 571B. A second top acoustic reflector (e.g., second top acoustic reflector electrode) may comprise second capacitive layer 518D over a second stack of a second plurality of top metal electrode layers 537D through 543D of the second series resonator 502B (Series2B), along with current spreading layer 571B, e.g., made integral with top electrical interconnect 571B. A third top acoustic reflector (e.g., third top acoustic reflector electrode) may comprise third capacitive layer 518E over a third stack of a third plurality of top metal electrode layers 537E through 543E of the third series resonator 503B (Series3B), along with current spreading layer 571C, e.g., made integral with top electrical interconnect 571C. Although stacks of respective five top metal electrode layers are shown in simplified view in FIG. 5, it should be understood that the stacks may include respective larger numbers of top metal electrode layers, e.g., respective nine bottom metal electrode layers. Further, the first plurality of top metal electrode layers 537C through 543C, the second plurality of top metal electrode layers 537D through 543D, and the third plurality of top metal electrode layers 537E through 543E may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner top metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker top metal electrode layer thicknesses, e.g., scaled thicker with relatively lower resonant frequency (e.g., lower main resonant frequency).

The first pair of top metal electrode layers 537C, 539C of the first top acoustic reflector, the first pair of top metal electrode layers 537D, 539D of the second top acoustic reflector, and the first pair of top metal electrode layers 537E, 539E of the third top acoustic reflector may include members of pairs of top metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). The second pair of top metal electrode layers 541C, 543C of the first top acoustic reflector, the second pair of top metal electrode layers 541D, 543D of the second top acoustic reflector, and the second pair of top metal electrode layers 541E, 543E of the third top acoustic reflector may include members of pairs of top metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). Second top acoustic reflector may further comprise capacitive layer 518D. Third top acoustic reflector may further comprise capacitive layer 518E. The first stack of the first plurality of top metal electrode layers 537C through 543C, the second stack of the second plurality of top metal electrode layers 537D through 543D, and the third stack of the third plurality of top metal electrode layers 537E through 543E may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the top acoustic reflectors (e.g., the first top acoustic reflector of the first series resonator 501B (Series1B), e.g., the second top acoustic reflector of the second series resonator 502B (Series2B), e.g., the third top acoustic reflector of the third series resonator 503B (Series3B)). Although not explicitly shown in the FIG. 5 simplified views of metal electrode layers of the series resonators, respective pluralities of lateral features (e.g., respective pluralities of step features) may be sandwiched between metal electrode layers (e.g., between respective pairs of top metal electrode layers, e.g., between respective first pairs of top metal electrode layers 537C, 539C, 537D, 539D, 537E, 539E, and respective second pairs of top metal electrode layers 541C, 543C, 541D, 543D, 541E, 543E. The respective pluralities of lateral features may, but need not, limit parasitic lateral acoustic modes (e.g., facilitate suppression of spurious modes) of the bulk acoustic wave resonators of FIG. 5 (e.g., of the series resonators, the mass loaded series resonators, and the mass loaded shunt resonators).

The first series resonator 501B (Series1B) may comprise a first alternating axis stack, e.g., an example first stack of four layers of alternating axis piezoelectric material, 505C through 511C. The second series resonator 502B (Series2B) may comprise a second alternating axis stack, e.g., an example second stack of four layers of alternating axis piezoelectric material, 505D through 511D. The third series resonator 503B (Series3B) may comprise a third alternating axis stack, e.g., an example third stack of four layers of alternating axis piezoelectric material, 505E through 511E. The first, second and third alternating axis piezoelectric stacks may comprise layers of Aluminum Nitride (AlN) having alternating C-axis wurtzite structures. For example, piezoelectric layers 505C, 505D, 505E, 509C, 509D, 509E have reverse axis orientation. For example, piezoelectric layers 507C, 507D, 507E, 511C, 511D, 511E have normal axis orientation. Members of the first stack of four layers of alternating axis piezoelectric material, 505C through 511C, and members of the second stack of four layers of alternating axis piezoelectric material, 505D through 511D, and members of the third stack of four layers of alternating axis piezoelectric material, 505E through 511E, may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner piezoelectric layer thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker piezoelectric layer thicknesses, e.g., scaled thicker with relatively lower resonant frequency (e.g., lower main resonant frequency).

Respective thicknesses of respective bottom piezoelectric layers 505C, 505D, 505E of the first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may be substantially greater than approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)). Respective thicknesses of respective first middle piezoelectric layers 507C, 507D, 507E of the first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may be substantially less than approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)). More generally respective thicknesses of respective bottom piezoelectric layers 505C, 505D, 505E may be substantially different than respective thicknesses of respective first middle piezoelectric layers 507C, 507D, 507E Respective thicknesses of respective second middle piezoelectric layers 509C, 509D, 509E of the first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may be substantially less than approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)). More generally respective thicknesses of respective bottom piezoelectric layers 505C, 505D, 505E may be substantially different than respective thicknesses of respective second middle piezoelectric layers 509C, 509D, 509E Respective thicknesses of respective top piezoelectric layers 511C, 511D, 511E of the first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may be substantially greater than approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)).

The foregoing may reduce electromechanical coupling, as already discussed in detail previously herein. Accordingly, with regard to serial electrically interconnected arrangement 500B, for example, corresponding to series resonators 501A, 502A, 503A, of the example ladder filter 500A, respective thicknesses of piezoelectric layers though may be varied in accordance with teachings as already discussed in detail previously herein. This may facilitate limiting (e.g. may facilitate reducing) electromechanical coupling. Alternatively or additionally, piezoelectric layers may be doped e.g., to facilitate limiting (e.g. to facilitate reducing) electromechanical coupling, as already discussed in detail previously herein. Alternatively or additionally, piezoelectric materials of piezoelectric layers may be selected to facilitate limiting (e.g. to facilitate reducing) electromechanical coupling, as already discussed in detail previously herein. Alternatively or additionally, capacitive layer(s) (e.g., non-piezoelectric capacitive layers) may be employed to facilitate limiting (e.g. to facilitate reducing) electromechanical coupling, as already discussed in detail previously herein. For clarity and brevity, these discussions are referenced and incorporated rather than explicitly repeated.

The example first stack of four layers of alternating axis piezoelectric material, 505C through 511C, may include a first, second, third and fourth polarizing layers 558C, 559C, 561C, 563C respectively arranged below the corresponding four layers of alternating axis piezoelectric material, 505C through 511C. The example second stack of four layers of alternating axis piezoelectric material, 505D through 511D, may include a second set of first, second, third and fourth polarizing layers 558D, 559D, 561D, 563D respectively arranged below the corresponding four layers of alternating axis piezoelectric material, 505D through 511D. The example third stack of four layers of alternating axis piezoelectric material, 505E through 511E, may third set of first, second, third and fourth polarizing layers 558E, 559E, 561D, 563E respectively arranged below the corresponding four layers of alternating axis piezoelectric material, 505E through 511E. The first series resonator 501B (Series1B), the second series resonator 502B (Series2B) and the third series resonator 503B (Series3B) may have respective etched edge regions 553C, 553D, 553E, and respective laterally opposing etched edge regions 554C, 554D, 554E. Reference is made to resonator mesa structures as have already been discussed in detail previously herein. Accordingly, they are not discussed again in detail at this point. Briefly, respective first, second and third mesa structures of the respective first series resonator 501B (Series1B), the respective second series resonator 502B (Series2B) and the respective third series resonator 503B (Series3B) may extend between respective etched edge regions 553C, 553D, 553E, and respective laterally opposing etched edge regions 554C, 554D, 554E of the respective first series resonator 501B (Series1B), the respective second series resonator 502B (Series2B) and the respective third series resonator 503B (Series3B). The second bottom acoustic reflector of second series resonator 502B (Series2B) of the third node 523B, e.g., including the additional plurality of bottom metal electrode layers may be a second mesa structure. For example, this may be a mutual second mesa structure bottom acoustic reflector 523B, and may likewise serve as bottom acoustic reflector of third series resonator 503B (Series3B). Accordingly, this mutual second mesa structure bottom acoustic reflector 523B may extend between etched edge region 553E of the third series resonator 503B (Series3B) and the laterally opposing etched edge region 554D of the third series resonator 503B (Series3B).

For example, in the plurality of top reflector electrodes, respective first members 537C, 537D, 537E having the relatively lower acoustic impedance of the first pairs may be arranged nearest, e.g. may abut, respective first piezoelectric layers (e.g. respective top piezoelectric layers 511C, 511D, 511E of the BAW resonators, e.g., respective piezoelectric stacks of the BAW resonators). For example, in respective top reflector electrodes, the respective first members 537C, 537D, 537E having the relatively lower acoustic impedance of the respective first pairs may be arranged substantially nearest, e.g. may substantially abut, respective first piezoelectric layers (respective top piezoelectric layers 511C, 511D, 511E of the BAW resonators, e.g., respective piezoelectric stacks of the BAW resonators). This may facilitate suppressing parasitic lateral modes. In the plurality of multi-layer metal top reflector electrodes, the respective first members 537C, 537D, 537E having the relatively lower acoustic impedance may be arranged sufficiently proximate to the respective first layers of piezoelectric material (e.g. may be arranged sufficiently proximate to respective top piezoelectric layers 511C, 511D, 511E of the BAW resonators, e.g., may be arranged sufficiently proximate to respective piezoelectric stacks of the BAW resonators), so that the respective first members 537C, 537D, 537E having the relatively lower acoustic impedance may contribute more, e.g., may contribute more to facilitate suppressing parasitic lateral resonances in operation of the respective BAW resonators than is contributed by any other top metal electrode layer of the plurality of multi-layer metal top acoustic reflector electrodes.

In the plurality of multi-layer top reflector electrodes, the respective first members 537C, 537D, 537E having the relatively lower acoustic impedance may be arranged sufficiently proximate to the respective first layer of piezoelectric material (e.g. may be arranged sufficiently proximate to the respective top piezoelectric layers 511C, 511D, 511E of the BAW resonators, e.g., may be arranged sufficiently proximate to respective piezoelectric stacks of the BAW resonators), so that the respective first members having the relatively lower acoustic impedance may contribute more, e.g., may contribute more to facilitate suppressing parasitic lateral resonances in operation of the respective BAW resonators than is contributed by any other top metal electrode layer of the plurality of multi-layer metal top acoustic reflector electrodes.

Figure 6A:
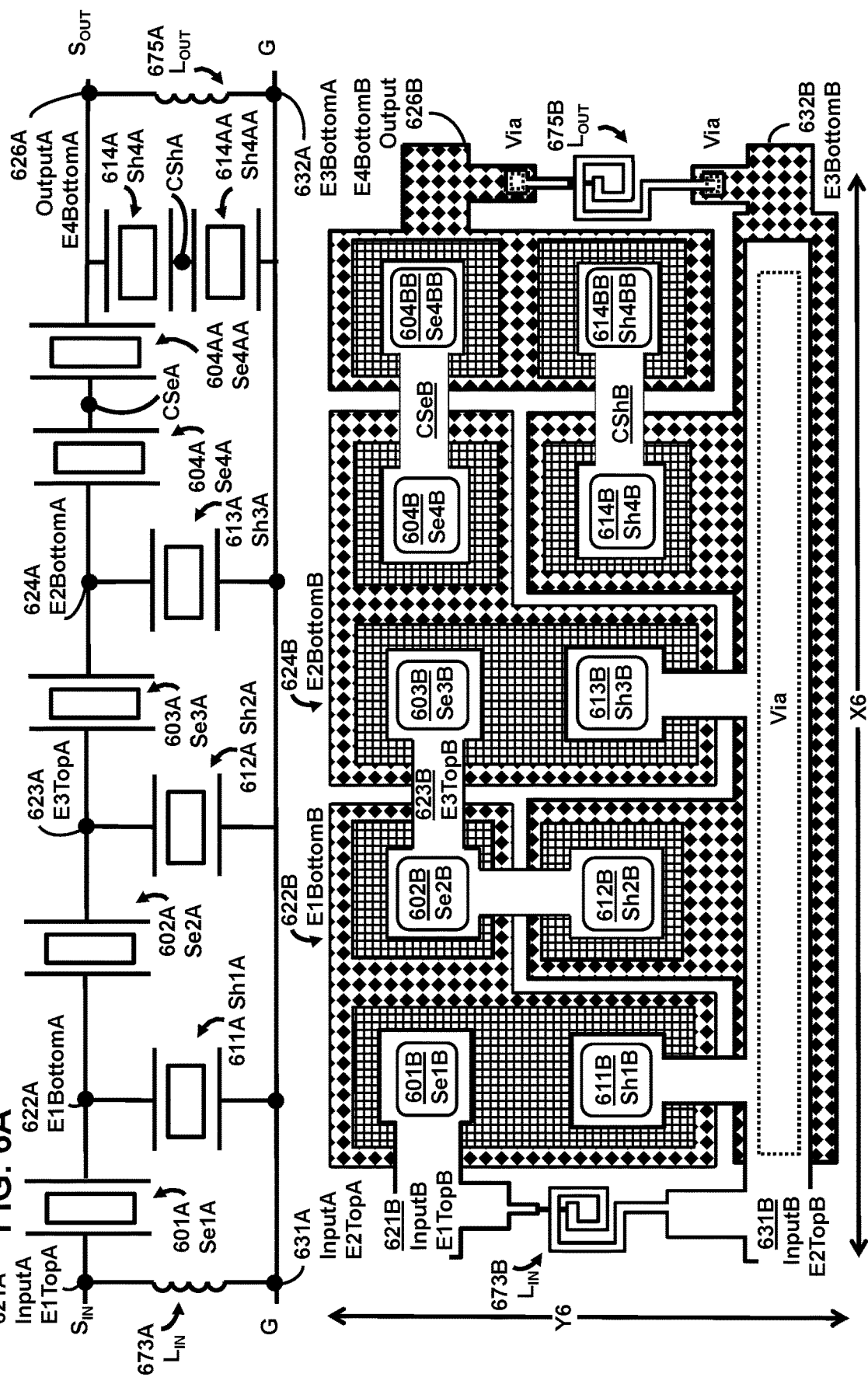
FIG. 6A shows a schematic of an example ladder filter using five series resonators of the bulk acoustic wave resonator structure of FIG. 1A, and five mass loaded shunt resonators of the bulk acoustic wave resonator structure of FIG. 1A, along with a simplified top view of the ten resonators interconnected in the example ladder filter, along with input and output coupled integrated inductors, and lateral dimensions of the example ladder filter.

FIG. 6A shows a schematic of an example ladder filter 600A (e.g., SHF or EHF wave ladder filter 600A) using five series resonators of the bulk acoustic wave resonator structure of FIG. 1A (e.g., five bulk acoustic SHF or EHF wave resonators), and five mass loaded shunt resonators of the bulk acoustic wave resonator structure of FIG. 1A (e.g., five mass loaded bulk acoustic SHF or EHF wave resonators), including schematic representations of input coupled integrated inductor 673A and output coupled integrated inductor 675A. Corresponding to the example ladder filter 600A shown in schematic view, FIG. 6B also shows a simplified top view of the ten resonators interconnected in the example ladder filter 600B, along with input and output coupled integrated inductors 673B, 673B, and lateral dimensions of the example ladder filter 600B.

As shown in the schematic appearing at an upper section of FIG. 6A, the example ladder filter 600A may include an input port comprising a first node 621A (InputA E1TopA), and may include a first series resonator 601A (Se1A) (e.g., first bulk acoustic SHF or EHF wave resonator 601A) coupled between the first node 621A (InputA E1TopA) associated with the input port and a second node 622A (E1BottomA). Input coupled integrated inductor 673A may be coupled between first node 621A (InputA E1TopA) and a first input grounding node 631A (E2TopA).

The example ladder filter 600A may also include a second series resonator 602A (Se2A) (e.g., second bulk acoustic SHF or EHF wave resonator 602A) coupled between the second node 622A (E1BottomA) and a third node 623A (E3TopA). The example ladder filter 600A may also include a third series resonator 603A (Se3A) (e.g., third bulk acoustic SHF or EHF wave resonator 603A) coupled between the third node 623A (E3TopA) and a fourth node 624A (E2BottomA). The example ladder filter 600A may also include a fourth and fifth cascade node coupled series resonators 604A (Se4A), 604AA (Se4AA) (e.g., fourth and fifth cascade node coupled bulk acoustic SHF or EHF wave resonators 604A, 604AA) coupled between the fourth node 624A (E2BottomA) and a sixth node 626A (OutputA E4BottomA). Fourth and fifth cascade node coupled series resonators 604A (Se4A), 604AA (Se4AA) (e.g., fourth and fifth cascade node coupled bulk acoustic SHF or EHF wave resonators 604A, 604AA) may be coupled to one another at cascade series branch node CSeA.

The example ladder filter 600A may also comprise the sixth node 626A (OutputA E4BottomA) and may further comprise a second grounding node 632A (E3BottomA), which may be associated with an output port of the ladder filter 600A. Output coupled integrated inductor 675A may be coupled between the sixth node 626A (OutputA E4BottomA) and the second grounding node 632A (E3BottomA).

The example ladder filter 600A may also include a first mass loaded shunt resonator 611A (Sh1A) (e.g., first mass loaded bulk acoustic SHF or EHF wave resonator 611A) coupled between the second node 622A (E1BottomA) and first grounding node 631A (E2TopA). The example ladder filter 600A may also include a second mass loaded shunt resonator 612A (Sh2A) (e.g., second mass loaded bulk acoustic SHF or EHF wave resonator 612A) coupled between the third node 623A (E3TopA) and second grounding node (E3BottomA). The example ladder filter 600A may also include a third mass loaded shunt resonator 613A (Sh3A) (e.g., third mass loaded bulk acoustic SHF or EHF wave resonator 613A) coupled between the fourth node 624A (E2BottomA) and the first grounding node 631A (E2TopA). The example ladder filter 600A may also include fourth and fifth cascade node coupled mass loaded shunt resonators 614A (Sh4A), 614A (Sh4A) (e.g., fourth and fifth mass loaded bulk acoustic SHF or EHF wave resonators 614A, 614AA) coupled between the sixth node 626A (OutputA E4BottomA) and the second grounding node 632A (E3BottomA). Fourth and fifth cascade node coupled mass loaded shunt resonators 614A (Sh4A), 614A (Sh4A) (e.g., fourth and fifth mass loaded bulk acoustic SHF or EHF wave resonators 614A, 614AA) may be coupled to one another at cascade shunt branch node CShA. The first grounding node 631A (E2TopA) and the second grounding node 632A (E3BottomA) may be interconnected to each other.

Appearing at a lower section of FIG. 6A is the simplified top view of the ten resonators interconnected in the example ladder filter 600B, and lateral dimensions of the example ladder filter 600B. The example ladder filter 600B may include an input port comprising a first node 621B (InputA E1TopB), and may include a first series resonator 601B (Se1B) (e.g., first bulk acoustic SHF or EHF wave resonator 601B) coupled between (e.g., sandwiched between) the first node 621B (InputA E1TopB) associated with the input port and a second node 622B (E1BottomB). Input integrated inductor 673G may be coupled between the first node 621B (InputA E1TopB) associated with the input port and first input grounding node 631B (E2TopB) associated with the input port.

The example ladder filter 600B may also include a second series resonator 602B (Se2B) (e.g., second bulk acoustic SHF or EHF wave resonator 602B) coupled between (e.g., sandwiched between) the second node 622B (E1BottomB) and a third node 623B (E3TopB). The example ladder filter 600B may also include a third series resonator 603B (Se3B) (e.g., third bulk acoustic SHF or EHF wave resonator 603B) coupled between (e.g., sandwiched between) the third node 623B (E3TopB) and a fourth node 624B (E2BottomB). The example ladder filter 600B may also include fourth and fifth cascade node coupled series resonators 604B (Se4B), 604BB (Se4BB) (e.g., fourth and fifth bulk acoustic SHF or EHF wave resonators 604B, 604BB) coupled between (e.g., sandwiched between) the fourth node 624B (E2BottomB) and a sixth node 626A (OutputB E4BottomB). Fourth and fifth cascade node coupled series resonators 604B (Se4B), 604BB (Se4BB) (e.g., fourth and fifth bulk acoustic SHF or EHF wave resonators 604B, 604BB) may be coupled to one another by cascade series branch node CSeB. The example ladder filter 600B may comprise the sixth node 626B (OutputB E4BottomB) and may further comprise a second grounding node 632B (E3BottomB), which may be associated with an output port of the ladder filter 600B. Output coupled integrated inductor 675B may be coupled between the sixth node 626B (OutputB E4BottomB) and the second grounding node 632B (E3BottomB).

The example ladder filter 600B may also include a first mass loaded shunt resonator 611B (Sh1B) (e.g., first mass loaded bulk acoustic SHF or EHF wave resonator 611B) coupled between (e.g., sandwiched between) the second node 622B (E1BottomB) and a first grounding node 631B (E2TopB). The example ladder filter 600B may also include a second mass loaded shunt resonator 612B (Sh2B) (e.g., second mass loaded bulk acoustic SHF or EHF wave resonator 612B) coupled between (e.g., sandwiched between) the third node 623B (E3TopB) and first grounding node 631B (E2TopB). First grounding node 631B (E2TopB) and the second grounding node 632B (E3BottomB) may be electrically coupled to one another through a via. The example ladder filter 600B may also include a third mass loaded shunt resonator 613B (Sh3B) (e.g., third mass loaded bulk acoustic SHF or EHF wave resonator 613B) coupled between (e.g., sandwiched between) the fourth node 624B (E2BottomB) and the second grounding node 632B (E3BottomB). The example ladder filter 600B may also include fourth and fifth cascade node coupled mass loaded shunt resonators 614B (Sh4B), 614BB (Sh4BB) (e.g., fourth and fifth mass loaded bulk acoustic SHF or EHF wave resonators 614B, 614BB) coupled between (e.g., sandwiched between) the sixth node 626B (OutputB E4BottomB) and the second grounding node 623B (E3BottomB). Fourth and fifth cascade node coupled mass loaded shunt resonators 614B (Sh4B), 614BB (Sh4BB) (e.g., fourth and fifth mass loaded bulk acoustic SHF or EHF wave resonators 614B, 614BB) may be coupled to one another by cascade shunt branch node CShB. Output coupled integrated inductor 675B may be coupled between the sixth node 626B (OutputB E4BottomB) and the second grounding node 632B (E3BottomB). The example ladder filter 600B may respectively be relatively small in size, and may respectively have lateral dimensions (X6 by Y6) of less than approximately one millimeter by one millimeter.

For simplicity and clarity, ten resonators are shown as similarly sized in the example ladder filter 600B. However, it should be understood that despite appearances in FIG. 6A, there may be different (e.g., larger) sizing of four cascaded resonators relative to remaining six non-cascaded resonators shown in FIG. 6A. For example, the four cascaded resonators (e.g., fourth and fifth cascade node coupled series resonators 604B (Se4B), 604BB (Se4BB) (e.g., fourth and fifth bulk acoustic SHF or EHF wave resonators 604B, 604BB), e.g., fourth and fifth cascade node coupled mass loaded shunt resonators 614B (Sh4B), 614BB (Sh4BB)) may be differently sized (e.g., larger sized) than the remaining six non-cascaded resonators shown in FIG. 6A. Along with different (e.g., larger) size, the four cascaded resonators (e.g., fourth and fifth cascade node coupled series resonators 604B (Se4B), 604BB (Se4BB) (e.g., fourth and fifth bulk acoustic SHF or EHF wave resonators 604B, 604BB), e.g., fourth and fifth cascade node coupled mass loaded shunt resonators 614B (Sh4B), 614BB (Sh4BB)) may have greater power handling capability than the remaining six non-cascaded resonators shown in FIG. 6A. These and other attributes for cascaded resonators versus non-cascaded resonators, as well as additional alternative arrangements of cascaded resonators versus non-cascaded resonators are discussed in greater detail next with reference to FIG. 6B.

Figure 6B:
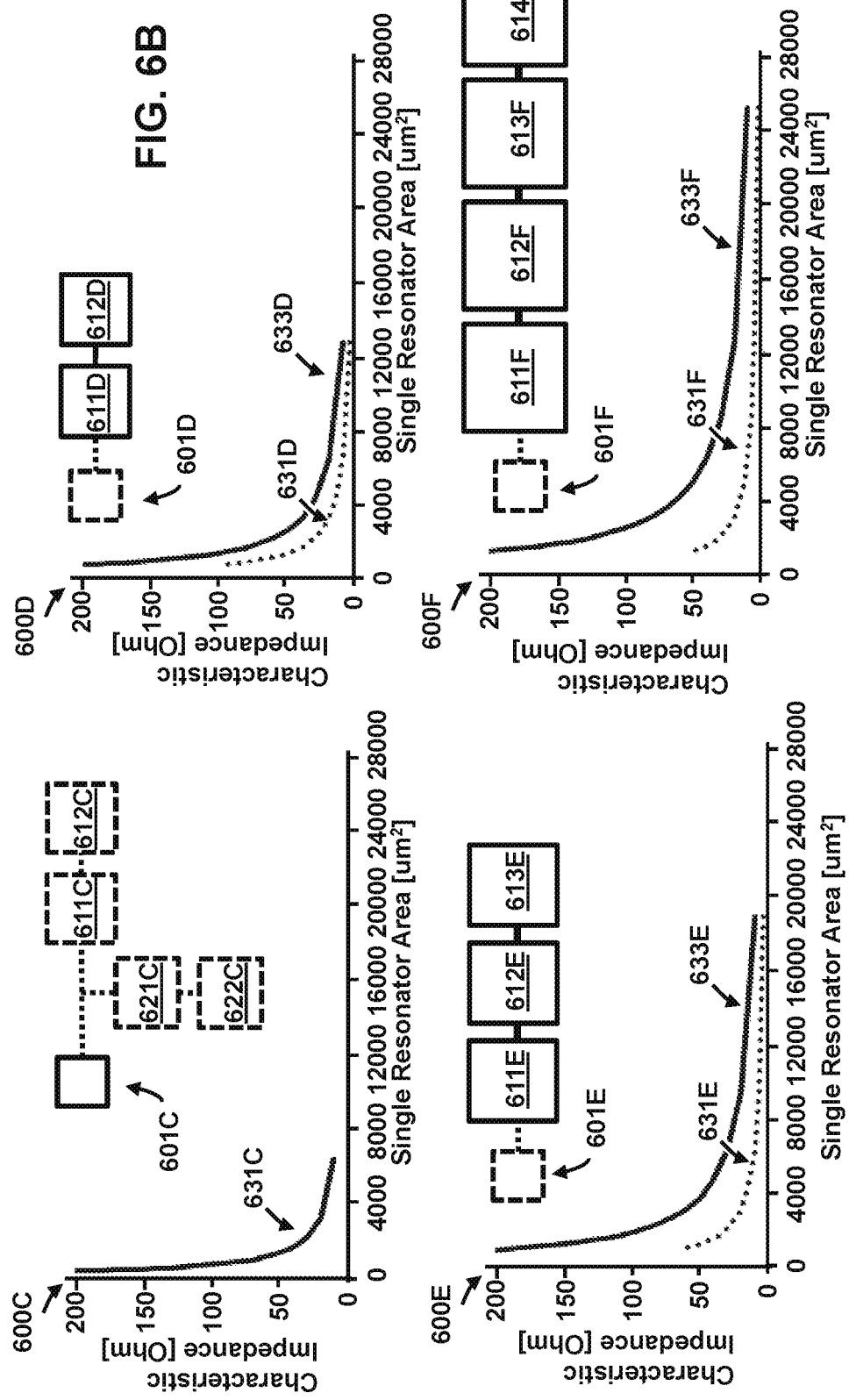
FIG. 6B shows four charts with results as expected from simulation along with corresponding simplified example cascade arrangements of resonators similar to the bulk acoustic wave resonator structure of FIG. 1A.

FIG. 6B shows four charts 600C, 600D, 600E, 600F with results as expected from simulation along with corresponding simplified example cascade arrangements of resonators similar to the bulk acoustic wave resonator structure of FIG. 1A. An upper left hand corner of FIG. 6B shows a simplified view of a non-cascaded resonator 601C in solid line depiction coupled in dotted line to dotted line depictions of a pair of series branch cascade node coupled series resonators 611C, 612C. Non-cascaded resonator 601C in solid line depiction is also coupled in dotted line to dotted line depictions of a pair of shunt branch cascade node coupled shunt resonators 621C, 622C. Lateral size (e.g., lateral area) of respective members of the pair of series branch cascade node coupled series resonators 611C, 612C is depicted as different (e.g., relatively larger, e.g., about twice as large) as non-cascaded resonator 601C. Power handing of respective members of the pair of series branch cascade node coupled series resonators 611C, 612C may be different (e.g., relatively larger, e.g., about twice as large) as power handling of non-cascaded resonator 601C. Lateral size (e.g., lateral area) of respective members of the pair of shunt branch cascade node coupled shunt resonators 621C, 622C is depicted as different (e.g., relatively larger, e.g., about twice as large) as non-cascaded resonator 601C. Power handling of respective members of the pair of shunt branch cascade node coupled shunt resonators 621C, 622C may be different (e.g., relatively larger, e.g., about twice as large) as power handling of non-cascaded resonator 601C.

Electrical characteristic impedance of respective members of the pair of series branch cascade node coupled series resonators 611C, 612C may be different (e.g., relatively smaller, e.g., about half as large) than electrical character impedance of non-cascaded resonator 601C. For example, electrical characteristic impedance of first member 611C of the pair of series branch cascade node coupled series resonators 611C, 612C may be different (e.g., relatively smaller, e.g., about half as large) than electrical character impedance of non-cascaded resonator 601C. For example, electrical characteristic impedance of second member 612C of the pair of series branch cascade node coupled series resonators 611C, 612C may be different (e.g., relatively smaller, e.g., about half as large) than electrical character impedance of non-cascaded resonator 601C. For example, in a case where electrical character impedance of non-cascaded resonator 601C may be about fifty (50) Ohms: electrical characteristic impedance of first member 611C may be about twenty-five (25) Ohms; electrical characteristic impedance of second member 612C may be about twenty-five (25) Ohms. Combined respective electrical characteristic impedance of members of the pair of series branch cascade node coupled series resonators 611C, 612C may approximate (e.g., may substantially match) electrical characteristic impedance of non-cascaded resonator 601C (e.g., 25 Ohms for 611C plus 25 Ohms for 612C may approximate 50 Ohms for 601C). Ladder filters as discussed may have a series branch characteristic impedance e.g., fifty (50) Ohms. Combined respective electrical characteristic impedance of members of the pair of series branch cascade node coupled series resonators 611C, 612C may approximate (e.g., may substantially match) the series branch characteristic impedance (e.g., 25 Ohms for 611C plus 25 Ohms for 612C may approximate 50 Ohms for series branch). More broadly, ladder filters as discussed may have a characteristic impedance e.g., fifty (50) Ohms. Combined respective electrical characteristic impedance of members of the pair of series branch cascade node coupled series resonators 611C, 612C may approximate (e.g., may substantially match) the filter characteristic impedance (e.g., 25 Ohms for 611C plus 25 Ohms for 612C may approximate 50 Ohms for filter).

Similarly, electrical characteristic impedance of respective members of the pair of shunt branch cascade node coupled shunt resonators 621C, 622C may be different (e.g., relatively smaller, e.g., about half as large) than electrical character impedance of non-cascaded resonator 601C. For example, electrical characteristic impedance of first member 621C of the pair of shunt branch cascade node coupled shunt resonators 621C, 622C may be different (e.g., relatively smaller, e.g., about half as large) than electrical character impedance of non-cascaded resonator 601C. For example, electrical characteristic impedance of second member 622C of the pair of shunt branch cascade node coupled shunt resonators 621C, 622C may be different (e.g., relatively smaller, e.g., about half as large) than electrical character impedance of non-cascaded resonator 601C. For example, in a case where electrical character impedance of non-cascaded resonator 601C may be about fifty (50) Ohms: electrical characteristic impedance of first member 621C may be about twenty-five (25) Ohms; electrical characteristic impedance of second member 622C may be about twenty-five (25) Ohms. Combined respective electrical characteristic impedance of members of the pair of shunt branch cascade node coupled shunt resonators 621C, 622C may approximate (e.g., may substantially match) electrical characteristic impedance of non-cascaded resonator 601C (e.g., 25 Ohms for 621C plus 25 Ohms for 622C may approximate 50 Ohms for 601C). Ladder filters as discussed may have a shunt branch characteristic impedance e.g., fifty (50) Ohms. Combined respective electrical characteristic impedance of members of the pair of shunt branch cascade node coupled shunt resonators 621C, 622C may approximate (e.g., may substantially match) the shunt branch characteristic impedance (e.g., 25 Ohms for 621C plus 25 Ohms for 622C may approximate 50 Ohms for shunt branch). More broadly, ladder filters as discussed may have a characteristic impedance e.g., fifty (50) Ohms. Combined respective electrical characteristic impedance of members of the pair of shunt branch cascade node coupled shunt resonators 621C, 622C may approximate (e.g., may substantially match) the filter characteristic impedance (e.g., 25 Ohms for 621C plus 25 Ohms for 622C may approximate 50 Ohms for filter).

In the upper left hand corner of FIG. 6B, corresponding chart 600C shows electrical characteristic impedance of non-cascaded resonator 601C versus single resonator area of non-cascaded resonator 601C. Trace 631C shows electrical characteristic impedance of non-cascaded resonator 601C decreasing and ranging from less than about 200 Ohms to greater than about ten Ohms as single resonator area of non-cascaded resonator 601C increases and ranges from greater than three hundred square microns to less than about six thousand square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

An upper right hand corner of FIG. 6B shows a simplified view of a non-cascaded resonator 601D in dotted line depiction coupled in dotted line to solid line depictions of a pair of series branch cascade node coupled series resonators 611D, 612D. Lateral size (e.g., lateral area) of respective members of the pair of series branch cascade node coupled series resonators 611D, 612D is depicted as different (e.g., relatively larger, e.g., about one and four tenths times as large) as non-cascaded resonator 601D. Power handling of respective members of the pair of series branch cascade node coupled series resonators 611C, 612C may be different (e.g., relatively larger, e.g., about twice as large) as power handling of non-cascaded resonator 601C.

In the upper right hand corner of FIG. 6B, corresponding chart 600D shows in dotted line trace 631D the electrical characteristic impedance of single cascaded resonator in cascaded pair 611D and 612D versus single resonator area of in cascaded resonator pair 611D and 612D. Trace 631D shows electrical characteristic impedance of a single resonator in cascaded resonator pair 611D and 612D decreasing and ranging from less than about 100 Ohms to greater than about 5 Ohms as single resonator area in cascaded resonator pair 611D and 612D increases and ranges from greater than 600 of square microns to less than about 12000 thousand square microns. In the upper right hand corner of FIG. 6B, corresponding chart 600D also shows in solid line trace 633D the electrical characteristic impedance of cascaded resonator pair 611D and 612D versus single resonator area in cascaded resonator pair 611D and 612D. Trace 633D shows electrical characteristic impedance of cascaded resonator 611D decreasing and ranging from less than about 200 Ohms to greater than about a 10 Ohms as single resonator area in cascaded resonator pair 611D and 612D increases and ranges from greater than 600 of square microns to less than about 12000 thousand square microns. For example, non-cascaded resonator 601D may have an electrical characteristic impedance of about fifty (50) Ohms and a lateral area of about 1260 square microns. For example, cascaded resonator 611D may have an electrical characteristic impedance of about twenty-five (25) Ohms and a lateral area of about 2520 square microns. Similarly cascaded resonator 612D may have an electrical characteristic impedance of about twenty-five (25) Ohms and a lateral area of about 2520 square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

The lower left hand corner of FIG. 6B shows a simplified view of a non-cascaded resonator 601E in dotted line depiction coupled in dotted line to solid line depictions of a trio of series branch cascade nodes coupled series resonators 611E, 612E, 613E. Lateral size (e.g., lateral area) of respective members of the trio of series branch cascade nodes coupled series resonators 611E, 612E, 613E is depicted as different (e.g., relatively larger, e.g., about one and seven tenths times as large) as non-cascaded resonator 601E. Power handling of respective members of the trio of series branch cascade nodes coupled series resonators 611E, 612E, 613E may be different (e.g., relatively larger, e.g., about three times as large) as power handling of non-cascaded resonator 601E. Electrical characteristic impedance of respective members of the trio of series branch cascade nodes coupled series resonators 611E, 612E, 613E may be different (e.g., relatively smaller, e.g., three times small) than electrical character impedance of non-cascaded resonator 601E. For example, electrical characteristic impedance of first member 611E of the trio of series branch cascade nodes coupled series resonators 611E, 612E, 613E may be different (e.g., relatively smaller, e.g., about three times smaller) than electrical character impedance of non-cascaded resonator 601E. For example, electrical characteristic impedance of second member 612E of the trio of series branch cascade nodes coupled series resonators 611E, 612E, 613E may be different (e.g., relatively smaller, e.g., about three times smaller) than electrical character impedance of non-cascaded resonator 601E. For example, electrical characteristic impedance of third member 613E of the trio of series branch cascade nodes coupled series resonators 611E, 612E, 613E may be different (e.g., relatively smaller, e.g., about a three time smaller) than electrical character impedance of non-cascaded resonator 601E. For example, in a case where electrical character impedance of non-cascaded resonator 601E may be about fifty (50) Ohms: electrical characteristic impedance of first member 611E may be about sixteen and two thirds (16.6) Ohms; electrical characteristic impedance of second member 612E may be about sixteen and two thirds (16.6) Ohms; electrical characteristic impedance of third member 613E may be about sixteen and two thirds (16.6) Ohms. Combined respective electrical characteristic impedance of members of the trio of series branch cascade nodes coupled series resonators 611E, 612E, 613E may approximate (e.g., may substantially match) electrical characteristic impedance of non-cascaded resonator 601E (e.g., 16.6 Ohms for 611E plus 16.6 Ohms for 612E plus 16.6 Ohms for 613E may approximate 50 Ohms for 601E). Ladder filters as discussed may have a series branch characteristic impedance e.g., fifty (50) Ohms. Combined respective electrical characteristic impedance of members of the trio of series branch cascade nodes coupled series resonators 611E, 612E, 613E may approximate (e.g., may substantially match) the series branch characteristic impedance (e.g., 16.6 Ohms for 611E plus 16.6 Ohms for 612E plus 16.6 Ohms for 613E may approximate 50 Ohms for series branch). More broadly, ladder filters as discussed may have a characteristic impedance e.g., fifty (50) Ohms. Combined respective electrical characteristic impedance of members of the trio of series branch cascade nodes coupled series resonators 611E, 612E, 613E may approximate (e.g., may substantially match) the filter characteristic impedance (e.g., 16.6 Ohms for 611E plus 16.6 Ohms for 612E plus 16.6 Ohms for 613E may approximate 50 Ohms for filter). Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

In the lower left hand corner of FIG. 6B, corresponding chart 600E shows in dotted line trace 631E the electrical characteristic impedance of a single cascaded resonator in a resonator trio 611E, 612E and 613E versus single resonator area in a cascaded resonator trio 611E, 612E and 613E. Trace 631E shows electrical characteristic impedance of a single cascaded resonator in a resonator trio 611E, 612E and 613E decreasing and ranging from less than about 67 Ohms to greater than about 3 Ohms as single resonator area of a single cascaded resonator in a resonator trio 611E, 612E and 613E increases and ranges from greater than 940 of square microns to less than about 19000 square microns. In the lower left hand corner of FIG. 6B, corresponding chart 600E also shows in solid line trace 633E the electrical characteristic impedance of cascaded resonator trio 611E, 612E and 613 versus a single cascaded resonator area in a resonator trio 611E, 612E and 613E. Trace 633E shows electrical characteristic impedance of cascaded resonator trio 611E, 612E and 613 decreasing and ranging from less than about 200 Ohms to greater than about a 10 Ohms as single resonator area of cascaded resonator 611E increases and ranges from greater than 940 square microns to less than about 19000 thousand square microns. For example, non-cascaded resonator 601E may have an electrical characteristic impedance of about fifty (50) Ohms and a lateral area of about 1260 square microns. For example, cascaded resonator 611E may have an electrical characteristic impedance of about sixteen and two thirds (16.6) Ohms and a lateral area of about 3780 square microns. Similarly cascaded resonator 612E may have an electrical characteristic impedance of about sixteen and two thirds (16.6) Ohms and a lateral area of about 3780 square microns. Similarly cascaded resonator 613E may have an electrical characteristic impedance of about sixteen and two thirds (16.6) Ohms and a lateral area of about 3780 square microns The lower right hand corner of FIG. 6B shows a simplified view of a non-cascaded resonator 601F in dotted line depiction coupled in dotted line to solid line depictions of a quad of series branch cascade nodes coupled series resonators 611F, 612F, 613F, 614F. Lateral size (e.g., lateral area) of respective members of the quad of series branch cascade nodes coupled series resonators 611F, 612F, 613F, 614F is depicted as different (e.g., relatively larger, e.g., about twice as large) as non-cascaded resonator 601E. Power handing of respective members of the quad of series branch cascade nodes coupled series resonators 611F, 612F, 613F, 614F may be different (e.g., relatively larger, e.g., about four times as large) as power handling of non-cascaded resonator 601F. Electrical characteristic impedance of respective members of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of first member 611E of the quad of series branch cascade nodes coupled series resonators 611F, 612F, 613F, 614F may be different (e.g., relatively smaller, e.g., about a four times smaller) than electrical character impedance of non-cascaded resonator 601F. For example, electrical characteristic impedance of second member 612F of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of third member 613F of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of fourth member 614F of the quad of series branch cascade nodes coupled series resonators 611F, 612F, 613F, 614F may be different (e.g., relatively smaller, e.g., about four times smaller) than electrical character impedance of non-cascaded resonator 601F. For example, in a case where electrical character impedance of non-cascaded resonator 601F may be about fifty (50) Ohms: electrical characteristic impedance of first member 611F may be about twelve and a half (12.5) Ohms; electrical characteristic impedance of second member 612F may be about twelve and a half (12.5) Ohms; electrical characteristic impedance of third member 613F may be about twelve and a half (12.5) Ohms. Combined respective electrical characteristic impedance of members of the quad of series branch cascade nodes coupled series resonators 611F, 612F, 613F, 614F may approximate (e.g., may substantially match) electrical characteristic impedance of non-cascaded resonator 601F (e.g., 12.5 Ohms for 611F plus 12.5 Ohms for 612F plus 12.5 Ohms for 613F plus 12.5 Ohms for 614F may approximate 50 Ohms for 601F). Ladder filters as discussed may have a series branch characteristic impedance e.g., fifty (50) Ohms. Combined respective electrical characteristic impedance of members of the quad of series branch cascade nodes coupled series resonators 611F, 612F, 613F, 614F may approximate (e.g., may substantially match) the series branch characteristic impedance (e.g., 12.5 Ohms for 611F plus 12.5 Ohms for 612E plus 12.5 Ohms for 613F plus 12.5 Ohms for 614F may approximate 50 Ohms for series branch). More broadly, ladder filters as discussed may have a characteristic impedance e.g., fifty (50) Ohms. Combined respective electrical characteristic impedance of members of the quad of series branch cascade nodes coupled series resonators 611F, 612F, 613F, 614F may approximate (e.g., may substantially match) the filter characteristic impedance (e.g., 12.5 Ohms for 611F plus 12.5 Ohms for 612E plus 12.5 Ohms for 613F plus 12.5 Ohms for 614F may approximate 50 Ohms for filter).

In the lower right hand corner of FIG. 6B, corresponding chart 600F shows in dotted line trace 631E the electrical characteristic impedance of a single resonator in cascaded resonator 611F, 612F, 613F and 614F quad versus single resonator area in cascaded resonator 611F, 612F, 613F and 614F quad. Trace 631F shows electrical characteristic impedance of a single resonator in cascaded resonator 611F, 612F, 613F and 614F quad decreasing and ranging from less than about 50 Ohms to greater than about a 2.5 Ohms as single resonator area in a cascaded resonator 611F, 612F, 613F and 614F quad increases and ranges from greater than 1260 square microns to less than about 25000 square microns. In the lower right hand corner of FIG. 6B, corresponding chart 600F also shows in solid line trace 633F the electrical characteristic impedance of cascaded resonator 611F, 612F, 613F and 614F quad versus single resonator area in a cascaded resonator 611F, 612F, 613F and 614F quad. Trace 633E shows electrical characteristic impedance of cascaded resonator 611F, 612F, 613F and 614F quad decreasing and ranging from less than about 200 Ohms to greater than about a 12.5 Ohms as single resonator area in a cascaded resonator 611F, 612F, 613F and 614F quad increases and ranges from greater than 1260 square microns to less than about 25000 square microns. For example, non-cascaded resonator 601F may have an electrical characteristic impedance of about fifty (50) Ohms and a lateral area of about 1260 square microns. For example, cascaded resonator 611F may have an electrical characteristic impedance of about twelve and a half (12.5) Ohms and a lateral area of about 5040 square microns. Similarly cascaded resonator 612F may have an electrical characteristic impedance of about twelve and a half (12.5) Ohms and a lateral area of about 5040 square microns. Similarly cascaded resonator 613F may have an electrical characteristic impedance of about twelve and a half (12.5) Ohms and a lateral area of about 5040 square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

Figure 6C:
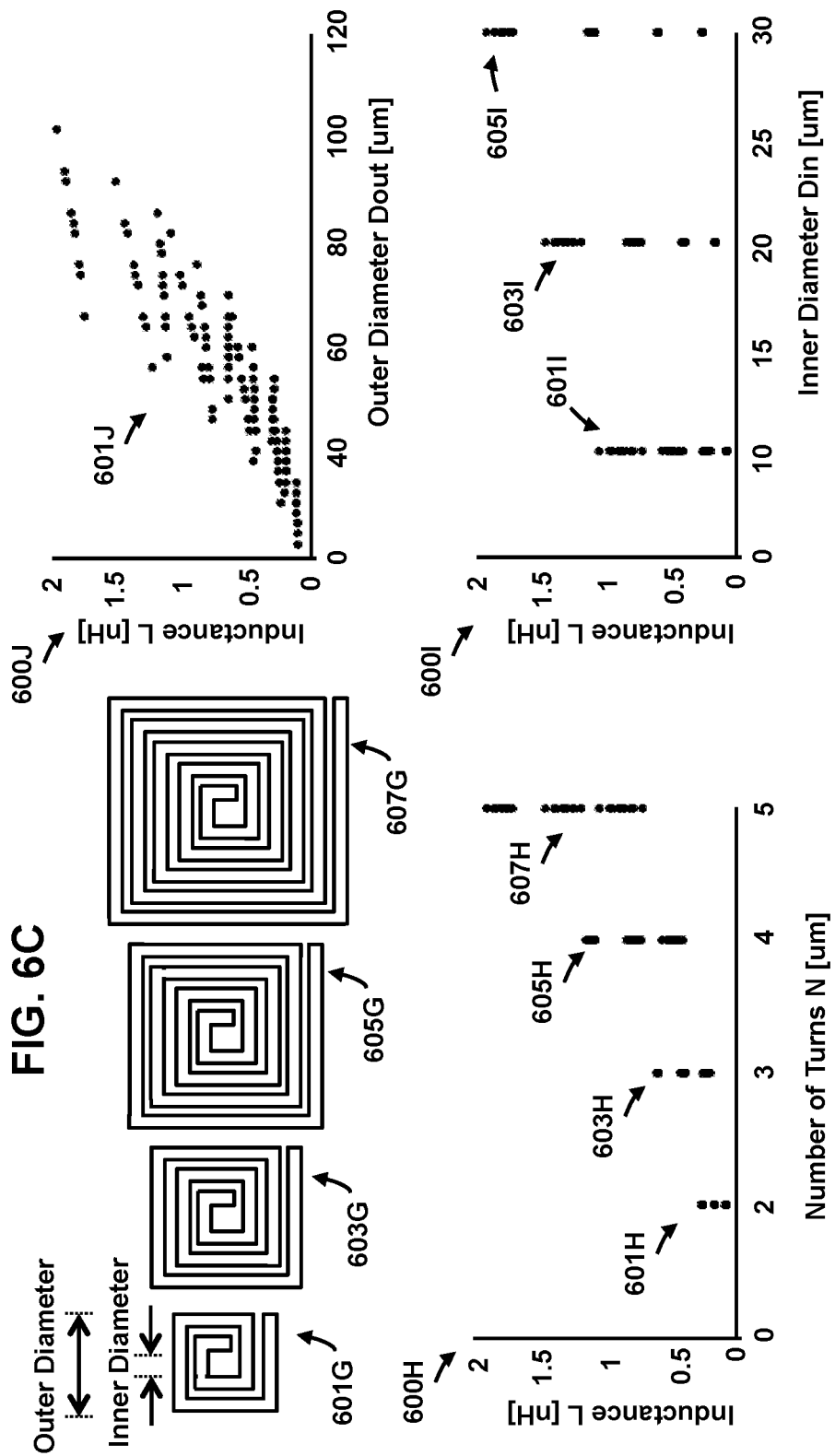
FIG. 6C shows four alternative example integrated inductors along with three corresponding inductance charts showing versus number of turns, showing versus inner diameter and showing versus outer diameter, with results as expected from simulation.

FIG. 6C shows four alternative example integrated inductors 601G, 603G, 605G, 607G along with three corresponding inductance charts showing versus number of turns (Chart 600H), showing versus inner diameter (Chart 600I) and showing versus outer diameter (Chart 600J), with results as expected from approximate simulations. Example integrated inductor 601G may comprise two turns. Example integrated inductor 603G may comprise three turns. Example integrated inductor 605G may comprise four turns. Example integrated inductor 607G may comprise five turns. Example integrated inductors 601G, 603G, 605G, 607G may be spiral. Example integrated inductors 601G, 603G, 605G, 607G may be substantially planar. Example integrated inductors 601G, 603G, 605G, 607G may have respective inner diameters. Example integrated inductors 601G, 603G, 605G, 607G may have respective outer diameters.

Chart 600H shows inductance versus number of turns. For two turns, trace 601H shows inductance increasing and ranging from greater than about 0.09 nanoHenries to less than about 0.28 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For three turns, trace 603H shows inductance increasing and ranging from greater than about 0.23 nanoHenries to less than about 0.62 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For four turns, trace 605H shows inductance increasing and ranging from greater than about 0.43 nanoHenries to less than about 1.17 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For five turns, trace 605H shows inductance increasing and ranging from greater than about 0.74 nanoHenries to less than about 2 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns.

Chart 600I shows inductance versus inner diameter. Inner diameter may range from about ten (10) microns or greater to about thirty (30) microns or less. For inner diameter of approximately ten (10) microns, trace 601I shows inductance increasing and ranging from greater than about 0.09 nanoHenries to less than about 1.07 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6. For inner diameter of approximately twenty (20) microns, trace 603I shows inductance increasing and ranging from greater than about 0.19 nanoHenries to less than about 1.5 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6. For inner diameter of approximately thirty (30) microns, trace 605I shows inductance increasing and ranging from greater than about 0.28 nanoHenries to less than about 2 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6.

Chart 600J shows inductance versus outer diameter. Outer diameter may range from about 22 microns or greater to about a hundred (100) microns or less, for various integrated inductor embodiments. Plot 601J shows various inductances for various integrated inductor embodiments ranging form greater than about 0.09 nanoHenries to less than about two (2) nanoHenries.

Figure 7:
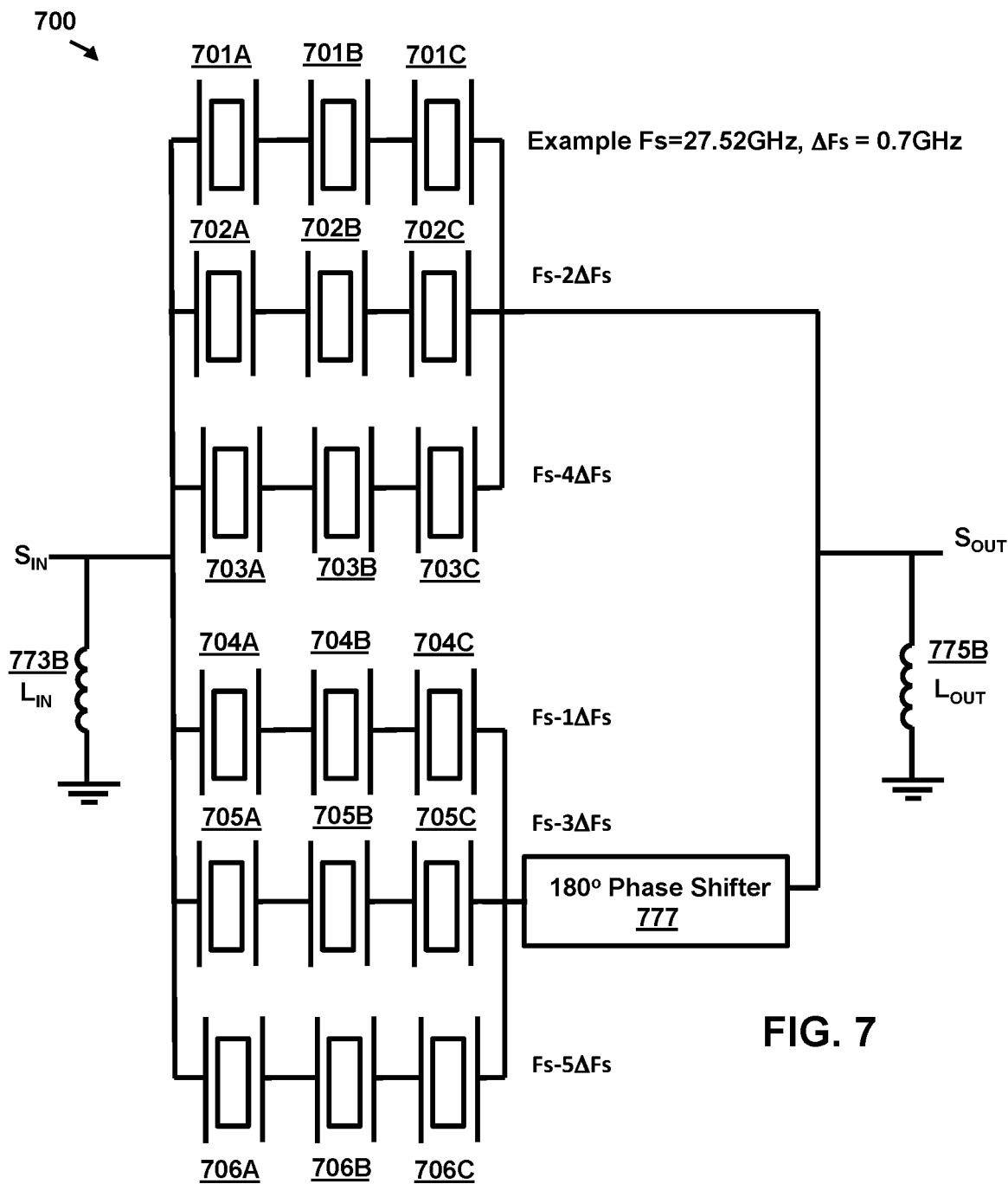
FIG. 7 shows an example millimeter acoustic wave transversal filter using bulk acoustic millimeter wave resonator structures similar to those shown in FIG. 1A.

FIG. 7 shows an example millimeter acoustic wave transversal filter 700 using bulk acoustic millimeter wave resonator structures similar to those shown in FIG. 1A. Transversal filter 700 may comprise: a first series branch of three series coupled bulk acoustic millimeter wave resonator 701A, 701B, 701C; a second series branch of three series coupled bulk acoustic millimeter wave resonator 702A, 702B, 702C; a third series branch of three series coupled bulk acoustic millimeter wave resonator 703A, 703B, 703C; a fourth series branch of three series coupled bulk acoustic millimeter wave resonator 704A, 704B, 704C; a fifth series branch of three series coupled bulk acoustic millimeter wave resonator 705A, 705B, 705C; and a sixth series branch of three series coupled bulk acoustic millimeter wave resonator 705A, 705B, 705C. The three series coupled bulk acoustic millimeter wave resonators 701A, 701B, 701C of the first series branch may have respective main series resonant frequencies (Fs) of twenty seven and fifty two hundredths GigaHertz (27.52 GHz). The three series coupled bulk acoustic millimeter wave resonators 702A, 702B, 702C of the second series branch may be mass loaded to shift respective main series resonant frequencies (Fs) down by twice of seven tenths of a GigaHertz (twice delta Fs=twice 0.7 GHz=1.4 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 703A, 703B, 703C of the third series branch may be further mass loaded to shift respective main series resonant frequencies (Fs) down by four times seven tenths of a GigaHertz (four times delta Fs=four times 0.7 GHz=2.8 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 704A, 704B, 704C of the fourth series branch may be further mass loaded to shift respective main series resonant frequencies (Fs) down by seven tenths of a GigaHertz (delta Fs=0.7 GHz=2.1 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 705A, 705B, 705C of the fifth series branch may be further mass loaded to shift respective main series resonant frequencies (Fs) down by three times seven tenths of a GigaHertz (three times delta Fs=three times 0.7 GHz=2.1 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 706A, 706B, 706C of the sixth series branch may be further mass loaded to shift respective main series resonant frequencies (Fs) down by five times seven tenths of a GigaHertz (five times delta Fs=five times 0.7 GHz=3.5 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch.

An input signal Sin may be coupled to a common input node of the first, second, third, fourth, fifth and sixth series branches of transversal filter 700. An input inductor 773B (e.g., input integrated inductor 773B, e.g., fifteen hundredths (0.15) NanoHenry inductor) may be coupled between ground and the common input node of the first, second, third, fourth, fifth and sixth series branches of transversal filter 700. A first common output node of the first, second, and third series branches of transversal filter 700 may be coupled to a summing output node to provide an output signal Sout of transversal filter 700. A one hundred and eighty (180) degree phase shifter 777 may be coupled between a second common output node of the first, second, and third series branches of transversal filter 700 and the summing output node to provide the output signal Sout of transversal filter 700. An output inductor 775B (e.g., output integrated inductor 775B, e.g., fifteen hundredths (0.15) NanoHenry inductor) may be coupled between ground and the summing output node to provide the output signal Sout of transversal filter 700.

In the example transversal filter 700, the eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may have respective electrical characteristic impedances of about fifty (50) Ohms. The first, second, third, fourth, fifth and sixth series branches may have respective electrical characteristic impedances of about one hundred and fifty (150) Ohms.

Parallel electrical characteristic impedance of a first parallel grouping of first, second, and third series branches may be about fifty (50) Ohms. Parallel electrical characteristic impedance of a second parallel grouping of fourth, fifth and sixth series branches may be about fifty (50) Ohms. The eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may have respective electromechanical coupling coefficient (Kt2) of about six and a half percent (6.5%). Various other frequency and electrical characteristic impedance arrangements of eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may be possible to achieve specific filter performance goals, as would be appreciated by one with skill in the art upon reading this disclosure. Moreover, fewer than six branches (e.g., four branches, e.g., two branches) or more than 6 branches (e.g., 8 branches, e.g., 10 branches, etc). may be used. In addition, fewer or more than 3 resonators per branch may be used to achieve specific filter performance goals.

Figure 8A:
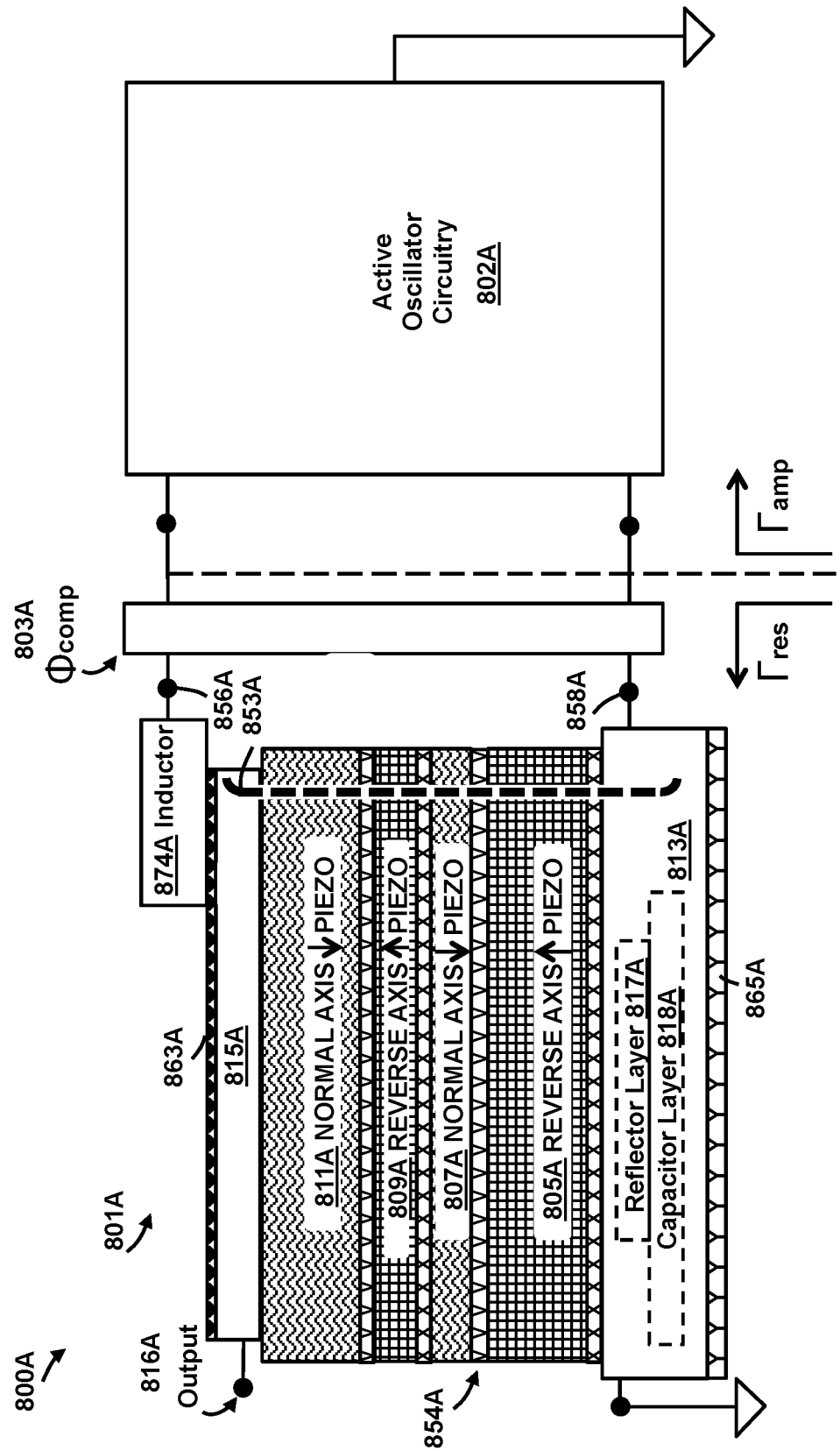
FIG. 8A shows an example oscillator using bulk acoustic wave resonator similar to the bulk acoustic wave resonator structure of FIG. 1A.
Figure 8B:
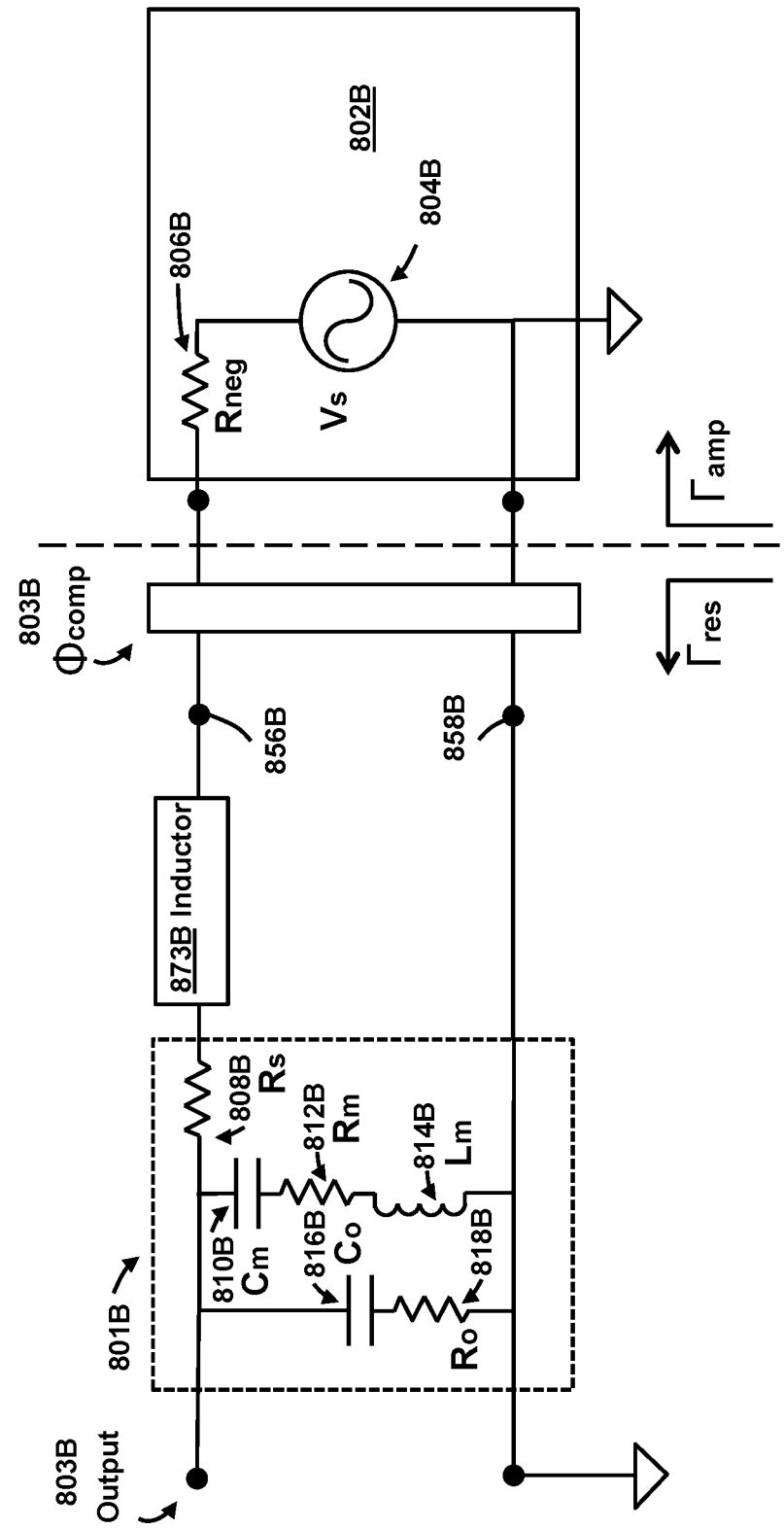
FIG. 8B shows a schematic of an example circuit implementation of the oscillator shown in FIG. 8A.

FIGS. 8A and 8B show an example oscillator 800A, 800B (e.g., millimeter wave oscillator 800A, 800B, e.g., Super High Frequency (SHF) wave oscillator 800A, 800B, e.g., Extremely High Frequency (EHF) wave oscillator 800A, 800B) using the bulk acoustic wave resonator structure of FIG. 1A. For example, FIGS. 8A and 8B shows simplified views of bulk acoustic wave resonator 801A, 801B and electrical coupling nodes 856A, 858A, 856B, 858B that may be electrically coupled with bulk acoustic wave resonator 801A, 801B. As shown in FIGS. 8A and 8B, electrical coupling nodes 856A, 858A, 856B, 858B may facilitate an electrical coupling of bulk acoustic wave resonator 801A, 801B with electrical oscillator circuitry (e.g., active oscillator circuitry 802A, 802B), for example, through phase compensation circuitry 803A, 803B ($\Phi$comp). The example oscillator 800A, 800B may be a negative resistance oscillator, e.g., in accordance with a one-port model as shown in FIGS. 8A and 8B. The electrical oscillator circuitry, e.g., active oscillator circuitry may include one or more suitable active devices (e.g., one or more suitably configured amplifying transistors) to generate a negative resistance commensurate with resistance of the bulk acoustic wave resonator 801A, 801B. In other words, energy lost in bulk acoustic wave resonator 801A, 801B may be replenished by the active oscillator circuitry, thus allowing steady oscillation, e.g., steady SHF or EHF wave oscillation. To ensure oscillation start-up, active gain (e.g., negative resistance) of active oscillator circuitry 802A, 802B may be greater than one. As illustrated on opposing sides of a notional dashed line in FIGS. 8A and 8B, the active oscillator circuitry 802A, 802B may have a complex reflection coefficient of the active oscillator circuitry ($\Gamma$amp), and the bulk acoustic wave resonator 801A, 801B together with the phase compensation circuitry 803A, 803B ($\Phi$comp) may have a complex reflection coefficient ($\Gamma$res). To provide for the steady oscillation, e.g., steady SHF or EHF wave oscillation, a magnitude may be greater than one for $\Gamma$amp $\Gamma$res|, e.g., magnitude of a product of the complex reflection coefficient of the active oscillator circuitry ($\Gamma$amp) and the complex reflection coefficient ($\Gamma$res) of the resonator to bulk acoustic wave resonator 801A, 801B together with the phase compensation circuitry 803A, 803B ($\Phi$comp) may be greater than one. Further, to provide for the steady oscillation, e.g., steady SHF or EHF wave oscillation, phase angle may be an integer multiple of three-hundred-sixty degrees for Z $\Gamma$amp $\Gamma$res, e.g., a phase angle of the product of the complex reflection coefficient of the active oscillator circuitry ($\Gamma$amp) and the complex reflection coefficient ($\Gamma$res) of the resonator to bulk acoustic wave resonator 801A, 801B together with the phase compensation circuitry 803A, 803B ($\Phi$comp) may be an integer multiple of three-hundred-sixty degrees. The foregoing may be facilitated by phase selection, e.g., electrical length selection, of the phase compensation circuitry 803A, 803B ($\Phi$comp).

In the simplified view of FIG. 8A, bulk acoustic wave resonator 801A may be a bulk acoustic millimeter wave resonator 801A having a main resonant frequency in a millimeter wave band. The bulk acoustic wave resonator 801A (e.g., bulk acoustic SHF or EHF wave resonator) includes first reverse axis piezoelectric layer 805A, first normal axis piezoelectric layer 807A, and another reverse axis piezoelectric layer 809A, and another normal axis piezoelectric layer 811A arranged in a four piezoelectric layer alternating axis stack arrangement sandwiched between multi-layer metal top acoustic SHF or EHF wave reflector electrode 815A and multi-layer metal bottom acoustic SHF or EHF wave reflector electrode 813A. General structures and applicable teaching of this disclosure for the multi-layer metal top acoustic SHF or EHF reflector electrode 815A and the multi-layer metal bottom acoustic SHF or EHF reflector electrode have already been discussed in detail previously herein with respect of FIGS. 1A and 4A through 4G, which for brevity are incorporated by reference rather than repeated fully here. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic SHF or EHF wave resonator 801A shown in FIG. 8A includes multi-layer metal top acoustic SHF or EHF wave reflector electrode 815A and multi-layer metal bottom acoustic SHF or EHF wave reflector electrode 815B. Additional metal electrode layers may include layer thicknesses corresponding to a quarter wavelength (e.g., one quarter of an acoustic wavelength) at a SHF or EHF wave main resonant frequency of the respective bulk acoustic SHF or EHF wave resonator 801A.

The multi-layer metal top acoustic SHF or EHF wave reflector electrode 815A may include top metal electrode layers electrically and acoustically coupled with the four piezoelectric layer alternating axis stack arrangement (e.g., with the first reverse axis piezoelectric layer 805A, e.g, with first normal axis piezoelectric layer 807A, e.g., with another reverse axis piezoelectric layer 809A, e.g., with another normal axis piezoelectric layer 811A) to excite the piezoelectrically excitable resonance mode at the resonant frequency. For example, the multi-layer metal top acoustic SHF or EHF wave reflector electrode 815A may include the respective first pair of top metal electrode layers, and the foregoing may have a respective quarter wavelength resonant frequency in the Super High Frequency (SHF) band or the Extremely High Frequency (EHF) band that includes the respective resonant frequency of the respective BAW resonator. Similarly, the multi-layer metal bottom acoustic SHF or EHF wave reflector electrode 813A may include a first pair of bottom metal electrode layers electrically and acoustically coupled with the four piezoelectric layer alternating axis stack arrangement (e.g., with the first normal axis piezoelectric layer 805A, e.g, with first reverse axis piezoelectric layer 807A, e.g., with another normal axis piezoelectric layer 809A, e.g., with another reverse axis piezoelectric layer 811A) to excite the piezoelectrically excitable resonance mode at the resonant frequency. For example, the multi-layer metal bottom acoustic SHF or EHF wave reflector electrode 813A may include the respective first pair of bottom metal electrode layers, and the foregoing may have a respective quarter wavelength resonant frequency in the Super High Frequency (SHF) band or the Extremely High Frequency (EHF) band that includes the respective resonant frequency of the respective BAW resonator.

An output 816A of the oscillator 800A may be coupled to the bulk acoustic wave resonator 801A (e.g., coupled to multi-layer metal top acoustic SHF or EHF wave reflector electrode 815A). It should be understood that polarizing layers as discussed previously herein with respect to FIG. 1A are explicitly shown in the simplified view the example resonator 801A shown in FIG. 8A. Such polarizing layers may be included and respectively interposed below piezoelectric layers. For example, a first polarizing layer may be arranged below first reverse axis piezoelectric layer 805A. For example, a second polarizing layer may be arranged between first reverse axis piezoelectric layer 805A and first normal axis piezoelectric layer 807A. For example, a third polarizing layer may be arranged between first normal axis piezoelectric layer 807A and another reverse axis piezoelectric layer 809A. For example, a fourth polarizing layer may be arranged between the another reverse axis piezoelectric layer 809A and another normal axis piezoelectric layer 811A. Respective thicknesses of piezoelectric layers 805A though 811A may be varied in accordance with teachings as already discussed in detail previously herein. This may facilitate limiting (e.g. may facilitate reducing) electromechanical coupling. Alternatively or additionally, piezoelectric layers 805A though 811A may be doped e.g., to facilitate limiting (e.g. to facilitate reducing) electromechanical coupling, as already discussed in detail previously herein. Alternatively or additionally, piezoelectric materials of piezoelectric layers 805A though 811A may be selected to facilitate limiting (e.g. to facilitate reducing) electromechanical coupling, as already discussed in detail previously herein. Alternatively or additionally, capacitive layer(s) (e.g., non-piezoelectric capacitive layers) may be employed to facilitate limiting (e.g. to facilitate reducing) electromechanical coupling, as already discussed in detail previously herein. For clarity and brevity, these discussions are referenced and incorporated rather than repeated.

A notional heavy dashed line is used in depicting an etched edge region 853A associated with example resonator 801A. The example resonator 801A may also include a laterally opposing etched edge region 854A arranged opposite from the etched edge region 853A. The etched edge region 853A (and the laterally opposing etch edge region 854A) may similarly extend through various members of the example resonator 801A of FIG. 8A, in a similar fashion as discussed previously herein. As shown in FIG. 8A, a first mesa structure corresponding to the stack of four piezoelectric material layers 805A, 807A, 809A, 811A may extend laterally between (e.g., may be formed between) etched edge region 853A and laterally opposing etched edge region 854A. A second mesa structure corresponding to multi-layer metal bottom acoustic SHF or EHF wave reflector electrode 813A may extend laterally between (e.g., may be formed between) etched edge region 853A and laterally opposing etched edge region 854A. Third mesa structure corresponding to multi-layer metal top acoustic SHF or EHF wave reflector electrode 815A may extend laterally between (e.g., may be formed between) etched edge region 853A and laterally opposing etched edge region 854A. Although not explicitly shown in the FIG. 8A simplified view of metal electrode layers, e.g., multi-layer metal top acoustic SHF or EHF wave reflector electrode 815A, a plurality of lateral features (e.g., plurality of step features) may be sandwiched between metal electrode layers (e.g., between pairs of top metal electrode layers. The plurality of lateral features may, but need not, limit parasitic lateral acoustic modes of the example bulk acoustic wave resonator of FIG. 8A.

For example, in the multi-layer top acoustic reflector electrode 815A, the first member having the relatively lower acoustic impedance of the first pair may be arranged nearest, e.g. may abut, first piezoelectric layer (e.g. top piezoelectric layer 811A of the resonator 801A, e.g., the piezoelectric stack of the resonator 801A). For example, in the multi-layer top acoustic reflector electrode 815A, the first member having the relatively lower acoustic impedance of the first pair may be arranged substantially nearest, e.g. may substantially abut, the first piezoelectric layer (top piezoelectric layer 811A of the resonator 801A, e.g., the piezoelectric stack of the resonator 801A). This may facilitate suppressing parasitic lateral modes. In the multi-layer metal top acoustic reflector electrode 815A, the first member having the relatively lower acoustic impedance may be arranged sufficiently proximate to the first layer of piezoelectric material (e.g. may be arranged sufficiently proximate to top piezoelectric layer 811A of the resonator 801A, e.g., may be arranged sufficiently proximate to the piezoelectric stack of the resonator 801A), so that the first member having the relatively lower acoustic impedance may contribute more to the multi-layer metal top acoustic reflector electrode 815A being acoustically from the resonant frequency of the resonator 801A than is contributed by any other top metal electrode layer of the multi-layer metal top acoustic reflector electrode 815A. In the multi-layer metal top acoustic reflector electrode 815A, the first member having the relatively lower acoustic impedance may be arranged sufficiently proximate to the first layer of piezoelectric material (e.g. may be arranged sufficiently proximate to the top piezoelectric layer 811A of the resonator 801A, e.g., may be arranged sufficiently proximate to the piezoelectric 5 stack of the resonator 801A), so that the first member having the relatively lower acoustic impedance may contribute more, e.g., may contribute more to facilitate suppressing parasitic lateral resonances in operation of the resonator 801A than is contributed by any other top metal electrode layer of the multi-layer metal top acoustic reflector electrode 815A. The multi-layer metal top acoustic reflector electrode 815A may comprise a top current spreading layer 863A. Top current spreading layer 863A may be electrically coupled with an integrated inductor 874A.

For example, the multi-layer metal bottom acoustic reflector electrode 813A may comprise a bottom current spreading layer 865A. Multi-layer metal bottom acoustic reflector electrode 813A may comprise a bottom capacitor layer 818A (e.g., bottom integrated capacitive layer 818A, e.g., bottom non-piezoelectric integrated capacitive layer 818A) interposed between bottom reflector layer 817A and bottom current spreading layer 865A.

FIG. 8B shows a schematic of an example circuit implementation of the oscillator shown in FIG. 8A. Active oscillator circuitry 802B may include active elements, symbolically illustrated in FIG. 8B by alternating voltage source 804B (Vs) coupled through negative resistance 806B

(Rneg), e.g., active gain element 806B, to example bulk acoustic wave resonator 801B (e.g., bulk acoustic SHF or EHF wave resonator) via phase compensation circuitry 803B (Φcomp) and integrated inductor 873B. The representation of example bulk acoustic wave resonator 801B (e.g., bulk acoustic SHF or EHF wave resonator) may include passive elements, symbolically illustrated in FIG. 8B by electrode ohmic loss parasitic series resistance 808B (Rs), motional capacitance 810B (Cm), acoustic loss motional resistance 812B (Rm), motional inductance 814B (Lm), static or plate capacitance 816B (Co), and acoustic loss parasitic 818B (Ro). An output 816B of the oscillator 800B may be coupled to the bulk acoustic wave resonator 801B (e.g., coupled to a multi-layer metal top acoustic SHF or EHF wave reflector electrode of bulk acoustic wave resonator 801B).

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 and 6A and 7, and the example oscillators shown in FIGS. 8A and 8B.

A widely used standard to designate frequency bands in the microwave range by letters is established by the United States Institute of Electrical and Electronic Engineers (IEEE). In accordance with standards published by the IEEE, as defined herein, and as shown in FIGS. 9A and 9B are application bands as follows: S Band (2 GHz-4 GHz), C Band (4 GHz-8 GHz), X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). FIG. 9A shows a first frequency spectrum portion 9000A in a range from three Gigahertz (3 GHz) to eight Gigahertz (8 GHz), including application bands of S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 GHz-6.875 GHz), and a UNII-8 band 9047 (6.875 GHz-7125 GHz). An LTE band 9048 overlaps the same frequency range (5.490 GHz-5.735 GHz) as the UNII-3 band 9042. A sub-band 9049A shares the same frequency range as the UNII-4 band 9043 (e.g., cellular vehicle-to-everything (c-V2X) 9049A in a thirty MegaHertz (30 MHz) band extending from 5.895 GHz to 5.925 GHz). An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). FIG. 9B shows a MVDDS (Multi-channel Video Distribution and Data Service) band 9051B (12.2 GHz-12.7 GHz). FIG. 9B shows an EESS (Earth Exploration Satellite Service) band 9051A (23.6 GHz-24 GHz) adjacent to the 3GPP 5G n258 band 9051 (24.25 GHz-27.5 GHz). As will be discussed in greater detail subsequently herein, an example EESS notch filter of the present disclosure may facilitate protecting the EESS (Earth Exploration Satellite Service) band 9051A (23.6 GHz-24 GHz) from energy leakage from the adjacent 3GPP 5G n258 band 9051 (24.25 GHz-27.5 GHz). For example, this may facilitate satisfying (e.g., facilitate compliance with) a specification of a standards setting organization, e.g., International Telecommunications Union (ITU) specifications, e.g., ITU-R SM.329 Category A/B levels of −20 db W/200 MHz, e.g., 3rd Generation Partnership Project (3GPP) 5G specifications, e.g., 3GPP 5G, unwanted (out-of-band & spurious) emission levels, worst case of −20 db W/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement of −42 db W/200 MHz for 200 MHz for Base Stations (BS) and −38 db W/200 MHz for User Equipment (UE), e.g., European Commission Decision (EU) 2019/784 of 14 May 2019 on harmonization of the 24.25-27.5 GHz frequency band for terrestrial systems capable of providing wireless broadband electronic communications services in the Union, published May 16, 2019, which is hereby incorporated by reference in its entirety, e.g., a European Organization for the Exploitation of Meteorological Satellites (EUMETSAT) decision, requirement, recommendation or study, e.g., a ESA/EU-METSAT/EUMETNET study result of −54.2 db W/200 MHz for Base Stations (BS) and 50.4 db W/200 MHz for User Equipment (UE), e.g., the United Nations agency of the World Meteorological Organization (WMO) decision, requirement, recommendation or study, e.g., the WMO decision of −55 db W/200 MHz for Base Stations (BS) and −51 db W/200 MHz for User Equipment (UE). These specifications and/or decisions and/or requirements may be directed to suppression of energy leakage from an adjacent band, e.g., energy leakage from an adjacent 3GPP 5G band, e.g., suppression of transmit energy leakage from the adjacent 3GPP 5G n258 band 9051 (24.250 GHz-27.500 GHz), e.g. limiting of spurious out of n258 band emissions. A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 GHz), European Union and Japan WiGig Band for IEEE 802.11ad and IEEE 802.11ay 9072 (57 GHz-66 GHz), South Korea WiGig Band for IEEE 802.11ad and IEEE 802.11ay 9073 (57 GHz-64

GHz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, e.g., filters, e.g., oscillators) of this disclosure may be implemented in the respective application frequency bands just discussed. For example, the layer thicknesses of the acoustic reflector electrodes and piezoelectric layers in alternating axis arrangement for the example acoustic wave devices (e.g., the example 24 GHz bulk acoustic wave resonators) of this disclosure may be scaled up and down as needed to be implemented in the respective application frequency bands just discussed. This is likewise applicable to the example filters (e.g., bulk acoustic wave resonator based filters) and example oscillators (e.g., bulk acoustic wave resonator based oscillators) of this disclosure to be implemented in the respective application frequency bands just discussed. The following examples pertain to further embodiments for acoustic wave devices, including but not limited to, e.g., bulk acoustic wave resonators, e.g., bulk acoustic wave resonator based filters, e.g., bulk acoustic wave resonator based oscillators, and from which numerous permutations and configurations will be apparent.

A first example is an acoustic wave device (e.g., a bulk acoustic wave resonator) comprising a substrate, a first layer of piezoelectric material having a first piezoelectric axis orientation, and a multi-layer top acoustic reflector including a first pair of top acoustic layers coupled with the first layer of piezoelectric material to reflect a piezoelectrically excitable resonance mode at a resonant frequency of the acoustic wave device, in which: a second member of the first pair of top acoustic layers has an acoustic impedance; a first member of the first pair of top acoustic layers has an acoustic impedance that is relatively lower than the acoustic impedance of the second member; and the first member having the relatively lower acoustic impedance is arranged nearer to the first layer of piezoelectric material than the second member.

A second example is an acoustic wave device as described in the first example, in which the resonant frequency of the acoustic wave device is in a 3rd Generation Partnership Project (3GPP) band.

A third example is an acoustic wave device as described in the first example in which the resonant frequency of the acoustic wave device is in a 3rd Generation Partnership Project (3GPP) band.

A fourth example is an acoustic wave device as the first example, in which the resonant frequency of the acoustic wave device is in a 3GPP n77 band 9010 as shown in FIG. 9A.

A fifth example is an acoustic wave device as described in the first example, in which the resonant frequency of the acoustic wave device is in a 3GPP n79 band 9020 as shown in FIG. 9A.

A sixth example is an acoustic wave device as described in the first example, in which the resonant frequency of the acoustic wave device is in a 3GPP n258 band 9051 as shown in FIG. 9B.

A seventh example is an acoustic wave device as described in the first example, in which the resonant frequency of the acoustic wave device is in a 3GPP n261 band 9052 as shown in FIG. 9B.

An eighth example is an acoustic wave device as described in the first example, in which the resonant frequency of the acoustic wave device is in a 3GPP n260 band as shown in FIG. 9B.

An ninth example is an acoustic wave device as described in the first example, in which the resonant frequency of the acoustic wave device is in an Institute of Electrical and Electronic Engineers (IEEE) C band as shown in FIG. 9A.

A tenth example is an acoustic wave device as described in the first example, in which the resonant frequency of the acoustic wave device is in an Institute of Electrical and Electronic Engineers (IEEE) X band as shown in FIG. 9B.

An eleventh example is an acoustic wave device as described in the first example, in which the resonant frequency of the acoustic wave device is in an Institute of Electrical and Electronic Engineers (IEEE) Ku band as shown in FIG. 9B.

A twelfth example is an acoustic wave device as described in the first example, in which the resonant frequency of the acoustic wave device is in an Institute of Electrical and Electronic Engineers (IEEE) X band as shown in FIG. 9B.

A thirteenth example is an acoustic wave device as described in the first example, in which the resonant frequency of the acoustic wave device is in an Institute of Electrical and Electronic Engineers (IEEE) K band as shown in FIG. 9B.

A fourteenth example is an acoustic wave device as described in the first example, in which the resonant frequency of the acoustic wave device is in an Institute of Electrical and Electronic Engineers (IEEE) Ka band as shown in FIG. 9B.

A fifteenth example is an acoustic wave device as described in the first example, in which the resonant frequency of the acoustic wave device is in an Institute of Electrical and Electronic Engineers (IEEE) V band as shown in FIG. 9B.

A sixteenth example is an acoustic wave device as described in the first example, in which the resonant frequency of the acoustic wave device is in an Institute of Electrical and Electronic Engineers (IEEE) W band as shown in FIG. 9B.

A seventeenth example is an acoustic wave device as described in the first example, in which the resonant frequency of the acoustic wave device is in UNII-1 band 9031, as shown in FIG. 9A.

An eighteenth example is an acoustic wave device as described in the first example, in which the resonant frequency of the acoustic wave device is in UNII-2A band 9032, as shown in FIG. 9A.

A nineteenth example is an acoustic wave device as described in the first example, in which the resonant frequency of the acoustic wave device is in UNII-2C band 9041, as shown in FIG. 9A.

A twentieth example is an acoustic wave device as described in the first example, in which the resonant frequency of the acoustic wave device is in UNII-3 band 9042, as shown in FIG. 9A.

A twenty first example is an acoustic wave device as described in the first example, in which the resonant frequency of the acoustic wave device is in UNII-4 band 9043, as shown in FIG. 9A.

A twenty second example is an acoustic wave device as described in the first example, in which the resonant frequency of the acoustic wave device is in UNII-5 band 9044, as shown in FIG. 9A.

A twenty third example is an acoustic wave device as described in the first example, in which the resonant frequency of the acoustic wave device is in UNII-6 band 9045, as shown in FIG. 9A.

A twenty fourth example is an acoustic wave device as described in the first example, in which the resonant frequency of the acoustic wave device is in UNII-7 band 9046, as shown in FIG. 9A.

A twenty fifth example is an acoustic wave device as described in the first example, in which the resonant frequency of the acoustic wave device is in UNII-8 band 9047, as shown in FIG. 9A.

A twenty sixth example is an acoustic wave device as described in the first example in which standing wave acoustic energy is to be coupled into the multi-layer top acoustic reflector in operation of the acoustic wave device, and the first member having the relatively lower acoustic impedance is arranged sufficiently proximate to the first layer of piezoelectric material, so that standing wave acoustic energy to be in the first member is greater than respective standing wave acoustic energy to be in other respective layers of the multi-layer top acoustic reflector in operation of the acoustic wave device.

A twenty seventh example is an acoustic wave device as described in the first example in which the first member having the relatively lower acoustic impedance is arranged nearest to the first layer of piezoelectric material, relative to other top acoustic layers of the multi-layer top acoustic reflector.

A twenty eighth example is an acoustic wave device as described in the first example in which the first member having the relatively lower acoustic impedance abuts the first layer of piezoelectric material.

A twenty ninth example is an acoustic wave device as described in the first example in which the first member having the relatively lower acoustic impedance substantially abuts the first layer of piezoelectric material.

A thirtieth example is an acoustic wave device as described in the first example in which the first member having the relatively lower acoustic impedance is arranged sufficiently proximate to the first layer of piezoelectric material, so that the first member having the relatively lower acoustic impedance contributes more to facilitate suppressing parasitic lateral resonances in operation of the acoustic wave device than is contributed by any other top acoustic layer of the multi-layer top acoustic reflector.

A thirty first example is an acoustic wave device as described in the first example in which the first pair of top acoustic layers has a frequency of a quarter wavelength resonant frequency in a Super High Frequency (SHF) band or an Extremely High Frequency (EHF) band.

A thirty second example is an acoustic wave device as described in the first example, in which the resonant frequency of the acoustic wave device is the MVDDS (Multichannel Video Distribution and Data Service) band 9051B, as shown in FIG. 9B.

A thirty third example is an acoustic wave device as described in the first example, in which the resonant frequency of the acoustic wave device is the EESS (Earth Exploration Satellite Service) band 9051A, as shown in FIG. 9B.

A thirty fourth example is an electrical oscillator in which an acoustic wave device as described in any one of the first through thirty third examples forms a portion of the electrical oscillator.

A thirty fifth example is electrical filter in which an acoustic wave device as described in any one of the first through thirty third examples forms a portion of the electrical filter.

A thirty sixth example is an antenna device in which an acoustic wave device as described in any one of the first through thirty third examples forms a portion of the antenna device.

A thirty seventh example is an antenna device as in the thirty sixth example in which the antenna device comprises: a plurality of antenna elements supported over the substrate, an integrated circuit supported on one side of the substrate, a first millimeter wave acoustic filter coupled with the integrated circuit, in which the first millimeter wave acoustic filter comprises the acoustic wave device, and an antenna feed coupled with the plurality of antenna elements.

A thirty eighth example is a millimeter acoustic wave integrated circuit in which an acoustic wave device as described in any one of the first through thirty third examples forms a portion of the millimeter acoustic wave integrated circuit.

A thirty ninth example is a millimeter acoustic wave integrated circuit as in the thirty eighth example in which: the substrate comprises and integrated circuit substrate, the acoustic wave device is a first bulk millimeter acoustic wave resonator arranged over the integrated circuit substrate.

A fortieth example is a millimeter acoustic wave integrated circuit as in the thirty ninth example in which the millimeter acoustic wave integrated circuit comprises an integrated millimeter wave inductor electrically coupled with the bulk millimeter acoustic wave resonator.

A forty first example is a millimeter acoustic wave integrated circuit as in the fortieth example in which the millimeter acoustic wave integrated circuit comprises a first integrated millimeter wave capacitor electrically coupled with the integrated millimeter wave inductor and the first bulk millimeter acoustic wave resonator.

A forty second example is a millimeter acoustic wave integrated circuit as in the thirty ninth example, in which the first bulk millimeter acoustic wave resonator comprises: a first piezoelectric layer, a first acoustic reflector electrode comprising a first pair of metal acoustic reflector electrode layers electrically and acoustically coupled with the first piezoelectric layer, a first integrated millimeter wave capacitor comprising a first capacitive layer interposed between the first pair of metal acoustic reflector electrode layers.

FIGS. 9C and 9D and 9E and 9F and 9G and 9H are diagrams illustrating respective simulated band pass characteristics of insertion loss versus frequency for example filters, with results as expected from simulation. For example, FIGS. 9C and 9D show first and second diagrams 9100, 9200 illustrating a first, second, third, fourth and fifth simulated band pass characteristics 9101C, 9201D, 9101E, 9201F, 9101G of insertion loss versus frequency for corresponding example millimeter wave band pass filters comprising bulk acoustic millimeter wave resonators similar to what is shown in FIG. 1A, and configured similar to the ladder filter shown in FIG. 6A. As mentioned previously, the United States Federal Communications Commission (FCC) millimeter wave spectrum license Auction-102 defined geographically diverse one hundred MegaHertz (100 MHz) channels for millimeter wave bands near twenty-five GigaHertz (25 GHz) (e.g., in 3GPP 5G n258 band (24.25 GHz-27.5 GHz)). One hundred MegaHertz (100 MHz) width of −3 decibel pass bands correspond to approximately four tenths of a percent (~0.4%) of twenty-five GigaHertz (25 GHz), which in turn corresponds to a desired electromechanical coupling coefficient of approximately one percent (~1%) for bulk acoustic millimeter wave resonators. These bulk acoustic millimeter wave resonators of this disclosure may be employed in the example filters.

For example, millimeter wave filter having the simulated band pass characteristics 9101C, 9201D, 9101E, 9201F, 9101G may be 3GPP 5G n258 band filters (e.g., filters having pass bands within the FIG. 9B 3GPP 5G n258 band 9051 (24.25 GHz-27.5 GHz), e.g., millimeter wave filters having bandpass characteristics, e.g., pass bands, that are configured for 3GPP 5G n258 applications). Example millimeter wave filters having the simulated band pass characteristic 9101C, 9201D, 9101E, 9201F, 9101G may have fractional bandwidths of approximately four tenths of a percent (~0.4%) of about twenty-five GigaHertz (25 GHz), and may include resonators having electromechanical coupling coefficient (Kt2) of approximately one percent (~1%).

For example, the simulated band pass characteristic 9101C (e.g., first pass band 9101C) of FIG. 9C shows a first band edge feature 9103C having an insertion loss of −3.2188 decibels (dB) at an initial 24.766 GHz extremity of the first pass band 9101C. For example, the simulated band pass characteristic 9101C of FIG. 9C shows an opposing band edge feature 9105C of the first pass band 9101C, having an insertion loss of −3.1252 decibels (dB) at an opposing 24.833 GHz extremity of the first pass band 9101C. This may be within about one hundred MegaHertz (100 MHz) of bandwidth (e.g., within about 67 MHz bandwidth) for the −3 decibel first pass band width extending between the first band edge feature 9103C (having the insertion loss of −3.2188 decibels (dB) at the initial 24.766 GHz extremity of the first pass band 9101C) and the opposing band edge feature 9105C (having the insertion loss of −3.1252 decibels (dB) at the opposing 24.833 GHz extremity of the first pass band 9101C). First pass band 9101C may have an insertion loss of −2.035 decibels (dB) at a 24.8 GHz frequency at a center 9111C of the first pass band 9101C.

For example, the simulated band pass characteristic 9101C of FIG. 9C shows a first pass band roll off feature 9107C having an insertion loss of −29.973 decibels (dB) at an initial 24.735 GHz roll off extremity 9107C of the first pass band 9101C. At the initial 24.735 GHz roll off extremity 9107C of the first pass band 9101C, the pass band roll off feature 9107C may provide more than about minus twenty-six dB of roll off (e.g., −26.7542 dB of roll off) at about 31 MHz from the first band edge feature 9103C, at the initial 24.735 GHz roll off extremity 9107C of the first pass band 9101C.

For example, the simulated band pass characteristic 9101C of FIG. 9C shows an opposing pass band roll off feature 9109C having an insertion loss of −30.24 decibels (dB) at an opposing 24.866 GHz roll off extremity 9109C of the first pass band 9101C. At the opposing 24.866 GHz roll off extremity 9109C of the first pass band 9101C, the opposing pass band roll off feature 9109C may provide more than about minus twenty-six dB of roll off (e.g., −27.1148 dB of roll off) at about 33 MHz from the opposing band edge feature 9105C, at the opposing 24.866 GHz roll off extremity 9109C of the first pass band 9101C.

For example, the simulated band pass characteristic 9201D (e.g., second pass band 9201D) of FIG. 9D shows a first band edge feature 9203D having an insertion loss of −3.0721 decibels (dB) at an initial 24.868 GHz extremity of the second pass band 9201D. For example, the simulated band pass characteristic 9201D of FIG. 9D shows an opposing band edge feature 9205D of the second pass band 9201D, having an insertion loss of −3.0943 decibels (dB) at an opposing 24.932 GHz extremity of the second pass band 9201D. This may be within about one hundred MegaHertz (100 MHz) of bandwidth (e.g., within about 64 MHz bandwidth) for the −3 decibel second pass band width extending between the first band edge feature 9203D (having the insertion loss of −3.0721 decibels (dB) at the initial 24.868 GHz extremity of the second pass band 9201D) and the opposing band edge feature 9205D (having an insertion loss of −3.0943 decibels (dB) at an opposing 24.932 GHz extremity of the second pass band 9201D). Second pass band 9201D may have an insertion loss of −2.044 decibels (dB) at a 24.9 GHz frequency at a center 9211D of the second pass band 9201D.

For example, the simulated band pass characteristic 9201D of FIG. 9D shows a second pass band roll off feature 9207D having an insertion loss of −30.117 decibels (dB) at an initial 24.835 GHz roll off extremity 9207D of the second pass band 9201D. At the initial 24.835 GHz roll off extremity 9207D of the second pass band 9201D, the pass band roll off feature 9207D may provide more than about minus twenty-six dB of roll off (e.g., −27.0449 dB of roll off) at about 33 MHz from the first band edge feature 9203D, at the initial 24.835 GHz roll off extremity 9207D of the second pass band 9201D.

For example, the simulated band pass characteristic 9201D of FIG. 9D shows an opposing pass band roll off feature 9209D having an insertion loss of −31.243 decibels (dB) at an opposing 24.967 GHz roll off extremity 9209D of the second pass band 9201D. At the opposing 24.967 GHz roll off extremity 9209D of the second pass band 9201D, the opposing pass band roll off feature 9209D may provide more than about minus twenty-six dB of roll off (e.g., −28.1487 dB of roll off) at about 35 MHz from the opposing band edge feature 9205D, at the opposing 24.967 GHz roll off extremity 9209D of the second pass band 9201D.

For example, the simulated band pass characteristic 9101E (e.g., third pass band 9101E) of FIG. 9C shows a first band edge feature 9103E having an insertion loss of −3.0219 decibels (dB) at an initial 24.969 GHz extremity of the third pass band 9101E. For example, the simulated band pass characteristic 9101E of FIG. 9C shows an opposing band edge feature 9105E of the third pass band 9101E, having an insertion loss of −3.015 decibels (dB) at an opposing 25.031 GHz extremity of the third pass band 9101E. This may be within about one hundred MegaHertz (100 MHz) of bandwidth (e.g., within about 62 MHz bandwidth) for the −3 decibel third pass band width extending between the first band edge feature 9103E (having the insertion loss of −3.0219 decibels (dB) at an initial 24.969 GHz extremity of the third pass band 9101E) and the opposing band edge feature 9105E (having the insertion loss of −3.015 decibels (dB) at the opposing 25.031 GHz extremity of the third pass band 9101E). Third pass band 9101E may have an insertion loss of −2.054 decibels (dB) at a 25 GHz frequency at a center 9111E of the third pass band 9101E.

For example, the simulated band pass characteristic 9101E of FIG. 9C shows a third pass band roll off feature 9107E having an insertion loss of −30.261 decibels (dB) at an initial 24.935 GHz roll off extremity 9107E of the third pass band 9101E. At the initial 24.935 GHz roll off extremity 9107E of the third pass band 9101E, the pass band roll off feature 9107E may provide more than about minus twenty-six dB of roll off (e.g., −27.2391 dB of roll off) at about 34 MHz from the first band edge feature 9103E, at the initial 24.935 GHz roll off extremity 9107E of the third pass band 9101E.

For example, the simulated band pass characteristic 9101E of FIG. 9C shows an opposing pass band roll off feature 9109E having an insertion loss of −30.053 decibels (dB) at an opposing 25.067 GHz roll off extremity 9109E of the third pass band 9101E. At the opposing 25.067 GHz roll off extremity 9109E of the third pass band 9101E, the opposing pass band roll off feature 9109E may provide more than about minus twenty-six dB of roll off (e.g., −27.038 dB of roll off) at about 36 MHz from the opposing band edge feature 9105E, at the opposing 25.067 GHz roll off extremity 9109E of the third pass band 9101E.

For example, the simulated band pass characteristic 9201F (e.g., fourth pass band 9201F) of FIG. 9D shows a first band edge feature 9203F having an insertion loss of −2.9213 decibels (dB) at an initial 25.071 GHz extremity of the fourth pass band 9201F. For example, the simulated band pass characteristic 9201F of FIG. 9D shows an opposing band edge feature 9205F of the fourth pass band 9201F, having an insertion loss of −3.0943 decibels (dB) at an opposing 25.132 GHz extremity of the fourth pass band 9201F. This may be within about one hundred MegaHertz (100 MHz) of bandwidth (e.g., within about 61 MHz bandwidth) for the −3 decibel fourth pass band width extending between the first band edge feature 9203F (having the insertion loss of −2.9213 decibels (dB) at an initial 25.071 GHz extremity of the fourth pass band 9201F) and the opposing band edge feature 9205F (having the insertion loss of −3.0943 decibels (dB) at the opposing 25.132 GHz extremity of the fourth pass band 9201F). Fourth pass band 9201F may have an insertion loss of −2.065 decibels (dB) at a 25.1 GHz frequency at a center 9211F of the fourth pass band 9201F.

For example, the simulated band pass characteristic 9201F of FIG. 9D shows a fourth pass band roll off feature 9207F having an insertion loss of −30.404 decibels (dB) at an initial 25.035 GHz roll off extremity 9207F of the fourth pass band 9201F. At the initial 25.035 GHz roll off extremity 9207F of the fourth pass band 9201F, the pass band roll off feature 9207F may provide more than about minus twenty-six dB of roll off (e.g., −27.4827 dB of roll off) at about 36 MHz from the first band edge feature 9203F, at the initial 25.035 GHz roll off extremity 9207F of the fourth pass band 9201F.

For example, the simulated band pass characteristic 9201F of FIG. 9D shows an opposing pass band roll off feature 9209F having an insertion loss of −31.043 decibels (dB) at an opposing 25.168 GHz roll off extremity 9209F of the fourth pass band 9201F. At the opposing 25.168 GHz roll off extremity 9209F of the fourth pass band 9201F, the opposing pass band roll off feature 9209F may provide more than about minus twenty-six dB of roll off (e.g., −27.9487 dB of roll off) at about thirty six MHz from the opposing band edge feature 9205F, at the opposing 25.168 GHz roll off extremity 9209F of the fourth pass band 9201F.

For example, the simulated band pass characteristic 9101G (e.g., fifth pass band 9101G) of FIG. 9C shows a first band edge feature 9103G having an insertion loss of −3.0859 decibels (dB) at an initial 25.168 GHz extremity of the fifth pass band 9101G. For example, the simulated band pass characteristic 9101G of FIG. 9C shows an opposing band edge feature 9105G of the fifth pass band 9101G, having an insertion loss of −3.0447 decibels (dB) at an opposing 25.232 GHz extremity of the fifth pass band 9101G. This may be within about one hundred MegaHertz (100 MHz) of bandwidth (e.g., within about 64 MHz bandwidth) for the −3 decibel fifth pass band width extending between the first band edge feature 9103G (having the insertion loss of −3.0859 decibels (dB) at the initial 25.168 GHz extremity of the fifth pass band 9101G) and the opposing band edge feature 9105G (having the insertion loss of −3.0447 decibels (dB) at the opposing 25.232 GHz extremity of the fifth pass band 9101G). Fifth pass band 9101G may have an insertion loss of −2.078 decibels (dB) at a 25.2 GHz frequency at a center 9111G of the fifth pass band 9101G.

For example, the simulated band pass characteristic 9101G of FIG. 9C shows a fifth pass band roll off feature 9107G having an insertion loss of −30.546 decibels (dB) at an initial 25.135 GHz roll off extremity 9107G of the fifth pass band 9101G. At the initial 25.135 GHz roll off extremity 9107G of the fifth pass band 9101G, the pass band roll off feature 9107G may provide more than about minus twenty six dB of roll off (e.g., −27.4601 dB of roll off) at about 33 MHz from the first band edge feature 9103G, at the initial 25.135 GHz roll off extremity 9107G of the fifth pass band 9101G.

For example, the simulated band pass characteristic 9101G of FIG. 9C shows an opposing pass band roll off feature 9109G having an insertion loss of −29.869 decibels (dB) at an opposing 25.168 GHz roll off extremity 9109G of the fifth pass band 9101G. At the opposing 25.268 GHz roll off extremity 9109G of the fifth pass band 9101G, the opposing pass band roll off feature 9109G may provide more than about minus twenty-six dB of roll off (e.g., −26.8243 dB of roll off) at about thirty six MHz from the opposing band edge feature 9105G, at the opposing 25.268 GHz roll off extremity 9109G of the fifth pass band 9101G.

For example, FIG. 9E shows a third diagram 9300 illustrating a first and second simulated band pass characteristics 9301H, 9301I of insertion loss versus frequency for corresponding example millimeter wave band pass filters comprising bulk acoustic millimeter wave resonators similar to what is shown in FIG. 1A, and configured similar to the ladder filter shown in FIG. 6A.

The United States Federal Communications Commission (FCC) millimeter wave spectrum license Auction-102 defined geographically diverse three hundred MegaHertz (300 MHz) channels group CDE for millimeter wave bands near twenty-five GigaHertz (25 GHz) (e.g., in 3GPP 5G n258 band (24.25 GHz-27.5 GHz)). Three hundred MegaHertz (300 MHz) width of −3 decibel pass bands correspond to approximately one and two tenths of a percent (~1.2%) of twenty-five GigaHertz (25 GHz), which in turn corresponds to a desired electromechanical coupling coefficient (Kt2) of approximately two and two tenths percent (~2.2%) for bulk acoustic millimeter wave resonators. These bulk acoustic millimeter wave resonators of this disclosure may be employed in the example filter.

For example, an example millimeter wave filter having the simulated band pass characteristics 9301H may be a 3GPP 5G n258 band filter (e.g., filter having pass band within the FIG. 9B 3GPP 5G n258 band 9051 (24.25 GHz-27.5 GHz), e.g., millimeter wave filter having band pass characteristic, e.g., pass band, that is configured for 3GPP 5G n258 applications). Example millimeter wave filters having the simulated band pass characteristic 9301H may have fractional bandwidth of approximately one and two tenths of a percent (~1.2%) of about twenty-five GigaHertz (25 GHz), and may include resonators having electromechanical coupling coefficient (Kt2) of approximately two and two tenths percent (~2.2%).

For example, the simulated band pass characteristic 9301H depicted in solid line (e.g., first pass band 9301H) of FIG. 9E shows a first band edge feature 9303H having an insertion loss of −3.0735 decibels (dB) at an initial 24.755 GHz extremity of the first pass band 9301H. For example, the simulated band pass characteristic 9301H of FIG. 9E shows an opposing band edge feature 9305H of the first pass band 9301H, having an insertion loss of −2.9813 decibels (dB) at an opposing 25.022 GHz extremity of the first pass band 9301H. This may be within about three hundred MegaHertz (300 MHz) of bandwidth (e.g., within about 267 MHz bandwidth) for the −3 decibel first pass band width extending between the first band edge feature 9303H (having the insertion loss of −3.0735 decibels (dB) at the initial 24.755 GHz extremity of the first pass band 9301H) and the opposing band edge feature 9305H (having the insertion loss of −2.9813 decibels (dB) at the opposing 25.022 GHz extremity of the first pass band 9301H). First pass band 9301H may have an insertion loss of −1.274 decibels (dB) at a 24.9 GHz frequency at a center 9311H of the first pass band 9301H.

For example, the simulated band pass characteristic 9301H of FIG. 9E shows a first pass band roll off feature 9307H having an insertion loss of −29.924 decibels (dB) at an initial 24.688 GHz roll off extremity 9307H of the first pass band 9301H. At the initial 24.688 GHz roll off extremity 9307H of the first pass band 9301H, the pass band roll off feature 9307H may provide more than about minus twenty six dB of roll off (e.g., −26.8505 dB of roll off) at about 67 MHz from the first band edge feature 9303H, at the initial 24.688 GHz roll off extremity 9307H of the first pass band 9301H.

For example, the simulated band pass characteristic 9301H of FIG. 9E shows an opposing pass band roll off feature 9309H having an insertion loss of −30.151 decibels (dB) at an opposing 25.09 GHz roll off extremity 9309H of the first pass band 9301H. At the opposing 25.09 GHz roll off extremity 9309H of the first pass band 9301H, the opposing pass band roll off feature 9309H may provide more than about minus twenty-six dB of roll off (e.g., −27.0977 dB of roll off) at about 68 MHz from the opposing band edge feature 9305H, at the opposing 25.09 GHz roll off extremity 9309H of the first pass band 9301H.

The United States Federal Communications Commission (FCC) millimeter wave spectrum license Auction-102 defined geographically diverse two hundred MegaHertz (200 MHz) channels group FG for millimeter wave bands near twenty-five GigaHertz (25 GHz) (e.g., in 3GPP 5G n258 band (24.25 GHz-27.5 GHz)). Two hundred MegaHertz (200 MHz) width of −3 decibel pass bands correspond to approximately eight tenths of percent (—0.8%) of twenty-five GigaHertz (25 GHz), which in turn corresponds to a desired electromechanical coupling coefficient (Kt2) of approximately one and four tenths percent (~1.4%) for bulk acoustic millimeter wave resonators. These bulk acoustic millimeter wave resonators of this disclosure may be employed in the example filter.

For example, an example millimeter wave filter having the simulated band pass characteristics 9301I may be a 3GPP 5G n258 band filter (e.g., filter having pass band within the FIG. 9B 3GPP 5G n258 band 9051 (24.25 GHz-27.5 GHz), e.g., millimeter wave filter having bandpass characteristic, e.g., pass band, that is configured for 3GPP 5G n258 applications). The example millimeter wave filter having the simulated band pass characteristic 9301I may have fractional bandwidth of approximately eight tenths of percent (—0.8%) of about twenty-five GigaHertz (25 GHz), and may include resonators having electromechanical coupling coefficient (Kt2) of approximately one and four tenths percent (~1.4%).

For example, the simulated band pass characteristic 9301I depicted in dashed line (e.g., second pass band 9301I) of FIG. 9E shows a first band edge feature 9303I having an insertion loss of −3.1349 decibels (dB) at an initial 25.062 GHz extremity of the second pass band 9301I. For example, the simulated band pass characteristic 9301I of FIG. 9E shows an opposing band edge feature 9305I of the second pass band 9301I, having an insertion loss of −2.9309 decibels (dB) at an opposing 25.235 GHz extremity of the second pass band 9301I. This may be within about two hundred MegaHertz (200 MHz) of bandwidth (e.g., within about 173 MHz bandwidth) for the −3 decibel second pass band width extending between the first band edge feature 9303I (having the insertion loss of −3.1349 decibels (dB) at the initial 25.062 GHz extremity of the second pass band 9301I) and the opposing band edge feature 9305I (having the insertion loss of −2.9309 decibels (dB) at the opposing 25.235 GHz extremity of the second pass band 9301I). Second pass band 9301I may have an insertion loss of −3.1349 decibels (dB) at a 25.062 GHz frequency at a center 9311I of the second pass band 9301I.

For example, the simulated band pass characteristic 9301I of FIG. 9E shows a second pass band roll off feature 9307I having an insertion loss of −30.079 decibels (dB) at an initial 25.019 GHz roll off extremity 9307I of the second pass band 9301I. At the initial 25.019 GHz roll off extremity 9307I of the second pass band 9301I, the pass band roll off feature 9307I may provide more than about minus twenty six dB of roll off (e.g., −26.9441 dB of roll off) at about 43 MHz from the first band edge feature 9303I, at the initial 25.019 GHz roll off extremity 9307I of the second pass band 9301I.

For example, the simulated band pass characteristic 9301I of FIG. 9E shows an opposing pass band roll off feature 9309I having an insertion loss of −30.095 decibels (dB) at an opposing 25.28 GHz roll off extremity 9309I of the second pass band 9301I. At the opposing 25.28 GHz roll off extremity 9309I of the second pass band 9301I, the opposing pass band roll off feature 9309I may provide more than about minus twenty-six dB of roll off (e.g., −27.1641 dB of roll off) at about 45 MHz from the opposing band edge feature 9305I, at the opposing 25.28 GHz roll off extremity 9309I of the second pass band 9301I.

The United States Federal Communications Commission (FCC) millimeter wave spectrum license Auction-102 defined geographically diverse five hundred MegaHertz (500 MHz) channels group CDEFG for millimeter wave bands near twenty-five GigaHertz (25 GHz) (e.g., in 3GPP 5G n258 band (24.25 GHz-27.5 GHz)). Five hundred MegaHertz (500 MHz) width of −3 decibel pass bands correspond to approximately two percent (~2%) of twenty-five GigaHertz (25 GHz), which in turn corresponds to a desired electromechanical coupling coefficient (Kt2) of approximately three and a half percent (~3.5%) for bulk acoustic millimeter wave resonators. These bulk acoustic millimeter wave resonators of this disclosure may be employed in the following example filter.

For example, an example millimeter wave filter having the simulated band pass characteristics 9401J as shown in FIG. 9F may be a 3GPP 5G n258 band filter (e.g., filter having pass band within the FIG. 9B 3GPP 5G n258 band 9051 (24.25 GHz-27.5 GHz), e.g., millimeter wave filter having band pass characteristic, e.g., pass band, that is configured for 3GPP 5G n258 applications). The example millimeter wave filter having the simulated band pass characteristic 9401J may have fractional bandwidth of approximately two percent (~2%) of about twenty-five GigaHertz (25 GHz), and may include resonators having electromechanical coupling coefficient (Kt2) of approximately three and a half percent (~3.5%).

For example, the simulated band pass characteristic 9401J depicted in solid line (e.g., pass band 9401J) of FIG. 9F shows a first band edge feature 9403J having an insertion loss of −2.9756 decibels (dB) at an initial 24.76 GHz extremity of the pass band 9401J. For example, the simulated band pass characteristic 9401J of FIG. 9F shows an opposing band edge feature 9405J of the pass band 9401J, having an insertion loss of −3.0564 decibels (dB) at an opposing 25.243 GHz extremity of the pass band 9401J. This may be within about five hundred MegaHertz (500 MHz) of bandwidth (e.g., within about 483 MHz bandwidth) for the −3 decibel pass band width extending between the first band edge feature 9403J (having the insertion loss of −2.9756 decibels (dB) at the initial 24.76 GHz extremity of the pass band 9401J) and the opposing band edge feature 9405J (having the insertion loss of −3.0564 decibels (dB) at the opposing 25.243 GHz extremity of the pass band 9401J). Pass band 9401J may have an insertion loss of −1.011 decibels (dB) at a 25 GHz frequency at a center 9411I of the pass band 9401J.

For example, the simulated band pass characteristic 9401J of FIG. 9F shows a pass band roll off feature 9407J having an insertion loss of 30.314 decibels (dB) at an initial 24.694 GHz roll off extremity 9407J of the pass band 9401J. At the initial 24.694 GHz roll off extremity 9407J of the pass band 9401J, the pass band roll off feature 9407J may provide more than about minus twenty six dB of roll off (e.g., −27.3384 dB of roll off) at about 66 MHz from the first band edge feature 9403J, at the initial 24.694 GHz roll off extremity 9407J of the pass band 9401J.

For example, the simulated band pass characteristic 9401J of FIG. 9F shows an opposing pass band roll off feature 9409J having an insertion loss of −30.25 decibels (dB) at an opposing 25.311 GHz roll off extremity 9409J of the pass band 9401J. At the opposing 25.311 GHz roll off extremity 9409J of the pass band 9401J, the opposing pass band roll off feature 9409J may provide more than about minus twenty-six dB of roll off (e.g., −27.1936 dB of roll off) at about 68 MHz from the opposing band edge feature 9405J, at the opposing 25.28 GHz roll off extremity 9409J of the pass band 9401J.

The United States Federal Communications Commission (FCC) decision dated Nov. 18, 2000 allocated thirty MegaHertz (30 MHz) extending from 5.895 GHz to 5.925 GHz in a band near 6 GHz to cellular vehicle-to-everything (c-V2X) (e.g., cellular vehicle-to-everything (c-V2X) in a thirty MegaHertz (30 MHz) band extending from 5.895 GHz to 5.925 GHz). Thirty MegaHertz (30 MHz) width of −3 decibel pass bands correspond to approximately half a percent (—0.5%) of six GigaHertz (6 GHz), which in turn corresponds to a desired electromechanical coupling coefficient (Kt2) of approximately one and two tenths percent (~1.2%) for bulk acoustic wave resonators. These bulk acoustic wave resonators of this disclosure may be employed in the following example filter.

An example wave filter having the simulated band pass characteristics 9501K as shown in diagram 9500 of FIG. 9G may be a cellular vehicle-to-everything (c-V2X) filter (e.g., filter having pass band within the FIG. 9A cellular vehicle-to-everything (c-V2X) 9049A in the thirty MegaHertz (30 MHz) band extending from 5.895 GHz to 5.925 GHz), e.g., wave filter having band pass characteristic, e.g., pass band, that is configured for cellular vehicle-to-everything (c-V2X) applications). The example cellular vehicle-to-everything (c-V2X) filter having the simulated band pass characteristic 9501K may have fractional bandwidth of approximately half a percent (—0.5%) of about six GigaHertz (6 GHz), and may include resonators having electromechanical coupling coefficient (Kt2) of approximately one and two tenths percent (~1.2%).

For example, the simulated band pass characteristic 9501K depicted in solid line (e.g., pass band 9501K) of FIG. 9G shows a first band edge feature 9503K having an insertion loss of −3.0486 decibels (dB) at an initial 5.895 GHz extremity of the pass band 9501K. For example, the simulated band pass characteristic 9501K of FIG. 9G shows an opposing band edge feature 9505K of the pass band 9501K, having an insertion loss of −2.9717 decibels (dB) at an opposing 5.925 GHz extremity of the pass band 9501K. This may be within about thirty MegaHertz (30 MHz) of bandwidth (e.g., within about 5.892 MHz bandwidth) for the −3 decibel pass band width extending between the first band edge feature 9503K (having the insertion loss of −3.0486 decibels (dB) at the initial 5.895 GHz extremity of the pass band 9501K) and the opposing band edge feature 9505K (having the insertion loss of −2.9717 decibels (dB) at the opposing 5.925 GHz extremity of the pass band 9501K). Pass band 9501K may have an insertion loss of −1.396 decibels (dB) at about 6 GHz (e.g. 5.91 GHz) frequency at a center 9511K of the pass band 9501K.

For example, the simulated band pass characteristic 9501K of FIG. 9G shows a pass band roll off feature 9507K having an insertion loss of 34.92 decibels (dB) at an initial 5.886 GHz roll off extremity 9507K of the pass band 9501K. At the initial 5.886 GHz roll off extremity 9507K of the pass band 9501K, the pass band roll off feature 9507K may provide more than about minus thirty dB of roll off (e.g., −31.8712 dB of roll off) at about 9 MHz from the first band edge feature 9503K, at the initial 5.886 GHz roll off extremity 9507K of the pass band 9501K.

For example, the simulated band pass characteristic 9501K of FIG. 9G shows an opposing pass band roll off feature 9509K having an insertion loss of −35.07 decibels (dB) at an opposing 5.935 GHz roll off extremity 9509K of the pass band 9501K. At the opposing 5.935 GHz roll off extremity 9509K of the pass band 9501K, the opposing pass band roll off feature 9509K may provide more than about minus thirty dB of roll off (e.g., −32.0983 dB of roll off) at about 10 MHz from the opposing band edge feature 9505K, at the opposing 5.935 GHz roll off extremity 9509K of the pass band 9501K.

The example transversal bulk acoustic millimeter wave filter 700 discussed previously herein with respect to FIG. 7 may have the simulated band pass characteristics 9601L as shown in FIG. 9H. This may be a 3GPP 5G n258 band filter (e.g., filter having pass band within the FIG. 9B 3GPP 5G n258 band 9051 (24.25 GHz-27.5 GHz), e.g., transversal bulk acoustic millimeter wave filter having band pass characteristic, e.g., pass band, that is configured for 3GPP 5G n258 applications).

For example, the simulated band pass characteristic 9601L depicted in solid line (e.g., pass band 9601L) of FIG. 9H shows a first band edge feature 9603L having an insertion loss of −2.8939 decibels (dB) at an initial 24.25 GHz extremity of the pass band 9601L. For example, the simulated band pass characteristic 9601L of FIG. 9H shows an opposing band edge feature 9605L of the pass band 9601L, having an insertion loss of −2.963 decibels (dB) at an opposing 27.5 GHz extremity of the pass band 9601L. This may be within about three and a quarter GigaHertz (3.25 Ghz) of bandwidth for the −3 decibel pass band width extending between the first band edge feature 9603L (having the insertion loss of −2.8939 decibels (dB) at the initial 24.25 GHz extremity of the pass band 9601L) and the opposing band edge feature 9605L (having the insertion loss of −2.963 decibels (dB) at an opposing 27.5 GHz extremity of the pass band 9601L). Pass band 9601L may have an insertion loss of −1.22 decibels (dB) at a 25.7 GHz frequency at a center 9611L of the pass band 9601L.

For example, the simulated band pass characteristic 9601L of FIG. 9H shows a pass band roll off feature 9607L having an insertion loss of −30.046 decibels (dB) at an initial 20.27 GHz roll off extremity 9607L of the pass band 9601L. At the initial 20.27 GHz roll off extremity 9607L of the pass band 9601L, the pass band roll off feature 9607L may provide more than about minus twenty six dB of roll off (e.g., −27.1521 dB of roll off) at about 3.98 GHz from the first band edge feature 9603L, at the initial 20.27 GHz roll off extremity 9607L of the pass band 9601L.

For example, the simulated band pass characteristic 9601L of FIG. 9H shows an opposing pass band roll off feature 9609L having an insertion loss of −29.95 decibels (dB) at an opposing 36.56 GHz roll off extremity 9609L of the pass band 9601L. At the opposing 36.56 GHz roll off extremity 9609L of the pass band 9601L, the opposing pass band roll off feature 9609L may provide more than about minus twenty-six dB of roll off (e.g., −26.987 dB of roll off) at about 9.08 GHz from the opposing band edge feature 9605L, at the opposing 36.56 GHz roll off extremity 9609L of the pass band 9601L.

Figure 10:
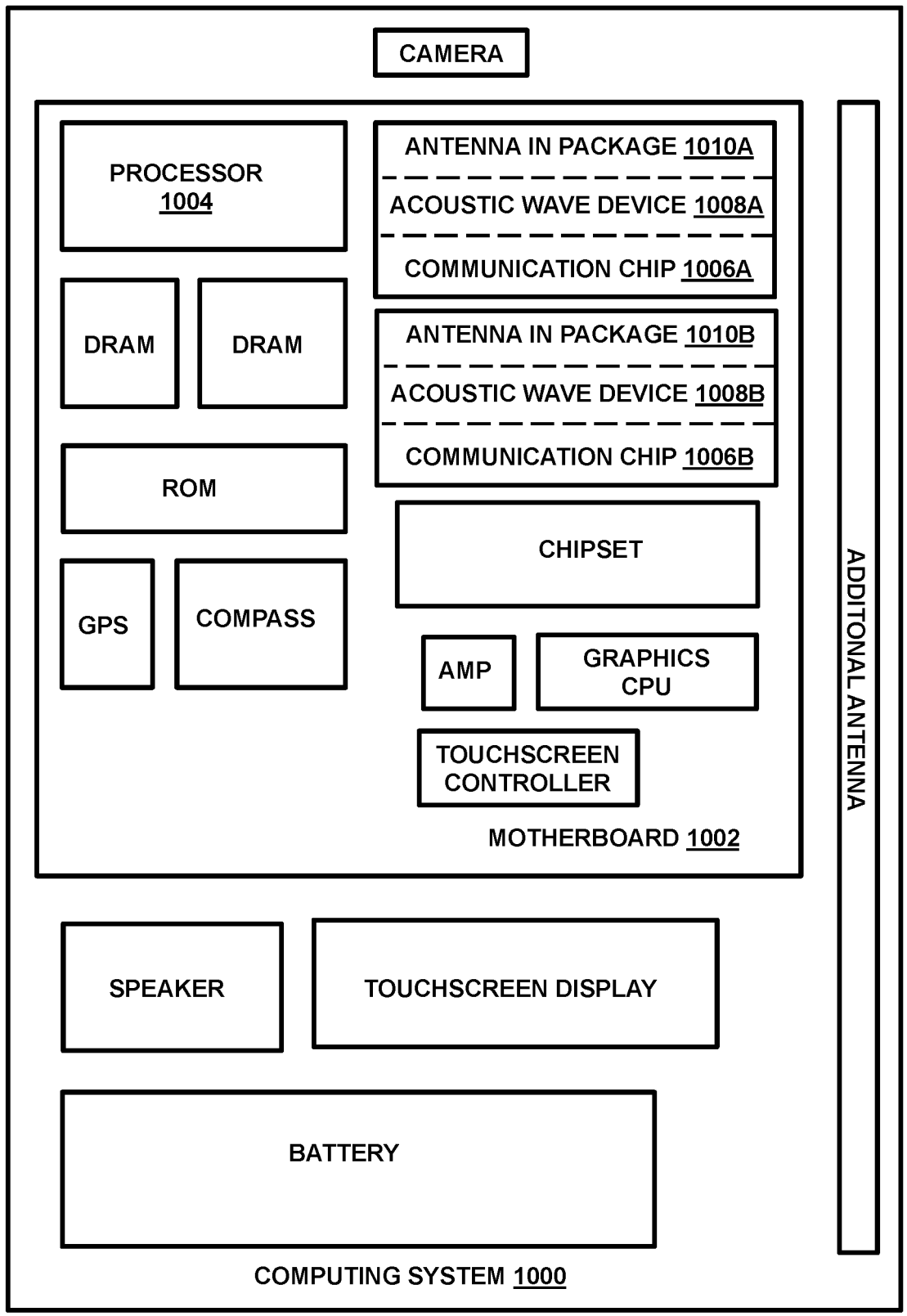
FIG. 10 illustrates a computing system implemented with integrated circuit structures or devices formed using the techniques disclosed herein, in accordance with an embodiment of the present disclosure.

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, additional antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chips 1006A, 1006B may be part of or otherwise integrated into the processor 1004).

The communication chips 1006A, 1006B enable wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chips 1006A, 1006B may include one or more acoustic wave devices 1008A, 1008B (e.g., resonators, filters and/or oscillators 1008A, 1008B) as variously described herein (e.g., acoustic wave devices including a stack of alternating axis piezoelectric material). Acoustic wave devices 1008A, 1008B may be included in various ways, e.g., one or more resonators, e.g., one or more filters, e.g., one or more oscillators. For example, acoustic wave devices 1008A, 1008B may be included in one or more filters with communications chips 1006A, 1006B, in combination with respective antenna in package(s) 1010A, 1010B.

Further, such acoustic wave devices 1008A, 1008B, e.g., resonators, e.g., filters, e.g., oscillators may be configured to be Super High Frequency (SHF) acoustic wave devices 1008A, 1008B or Extremely High Frequency (EHF) acoustic wave devices 1008A, 1008B, e.g., resonators, filters, and/or oscillators (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) acoustic wave devices or Extremely High Frequency (EHF) resonators, filters, and/or oscillators may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any communication chips 1006A, 1006B is integrated into processor 1004, rather than having separate communication chips). Further note that processor 1004 may be a chip set having such wireless capability. In short, any number of processor 1004 and/or communication chips 1006A, 1006B may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, a streaming media device, an entertainment control unit, a digital camera, a portable music player, a digital video recorder, or any other electronic device that processes data or employs one or more integrated circuit structures or devices formed using the disclosed techniques, as variously described herein.

FIG. 11A shows a top view an antenna device 9500 of the present disclosure. The antenna device 9500 may be an antenna in package 9500. The antenna device may comprise an integrated circuit 9515N (e.g., a radio frequency integrated circuit 9515N, e.g., RFIC 9515N). The integrated circuit 9515N may comprise a communication chip 9515N. The integrated circuit 9515N may be operable for 5G wireless communications, for example, in a millimeter wave frequency band, e.g. band including 24 GigaHertz. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Integrated circuit 9515N may be coupled with antenna elements 9112N, 9114N, 9116N, 9118N (e.g., patch antennas 9112N, 9114N, 9116N, 9118N) to facilitate wireless communication. Integrated circuit 9515N may be coupled with bulk acoustic wave resonator based filters 9112J, 9114J, 9116J, 9118J of this disclosure (e.g. bulk acoustic millimeter wave resonator based millimeter wave filters 9112J, 9114J, 9116J, 9118J of this disclosure). The millimeter wave filters 9112J, 9114J, 9116J, 9118J may be band pass millimeter wave filters 9112J, 9114J, 9116J, 9118J to pass a millimeter wave frequency. In some examples, millimeter wave filters 9112J, 9114J, 9116J, 9118J may be two pairs of similar filters, e.g., to address two orthogonal polarizations of patch antennas 9112N, 9114N, 9116N, 9118N.

Patch antennas 9112N, 9114N, 9116N, 9118N may be arranged in a patch antenna array, e.g., having lateral array dimensions (e.g., pitch in a first lateral dimension of, for example, about nine millimeters, e.g., pitch in a second lateral dimension, substantially orthogonal to the first lateral dimension of, for example, about nine millimeters).

The antenna device 9500 may be an antenna in package 9500 may be relatively small in size. This may facilitate: e.g., a relatively small array pitch of patch antennas 9112N, 9114N, 9116N, 9118N (e.g., nine millimeters), e.g., a relatively small respective area of patch antennas 9112N, 9114N, 9116N, 9118N (e.g., six millimeters by six millimeters). The foregoing may be related to frequency, e.g., the millimeter wave frequency band, e.g. band including 24 GigaHertz employed for wireless communication. For example, the array pitch may be approximately one electrical wavelength of the millimeter wave frequency.

For example, as shown in FIG. 11A: a first millimeter wave acoustic filter 9112J may be arranged below the array pitch, e.g., between lateral extremities of the array pitch; a second millimeter wave acoustic filter 9114J may be arranged below the array pitch, e.g., between lateral extremities of the array pitch; a third millimeter wave acoustic filter 9116J may be arranged below the array pitch, e.g., between lateral extremities of the array pitch; and a fourth millimeter wave acoustic filter 9118J may be arranged below the array pitch, e.g., between lateral extremities of the array pitch.

First and second millimeter wave acoustic filters 9112J, 9114J may be arranged below the array pitch between a first pair of the patch antennas 9112N, 9114N. Third and fourth millimeter wave acoustic filters 9116J, 9118J may be arranged below the array pitch between a second pair of the patch antennas 9116N, 9118N. First, second, third and fourth millimeter wave acoustic filters 9112J, 9114J, 9116J, 9118J may be arranged below the array pitch between the quartet of the patch antennas 9112N, 9114N, 9116N, 9118N.

The first millimeter wave acoustic filter 9112J may have an area of about one square millimeter or less, e.g., may have a lateral dimension that is less than the array pitch, e.g., less than nine millimeters. Similarly, the second millimeter wave acoustic filter 9114J may have an area of about one square millimeter or less, e.g., may have a lateral dimension that is less than the array pitch, e.g., less than nine millimeters. The third millimeter wave acoustic filter 9116J may have an area of about one square millimeter or less, e.g., may have a lateral dimension that is less than the array pitch, e.g., less than nine millimeters. The fourth millimeter wave acoustic filter 9118J may have an area of about one square millimeter or less, e.g., may have a lateral dimension that is less than the array pitch, e.g., less than nine millimeters.

The millimeter wave frequency may comprise approximately 24 GigaHertz. The millimeter wave frequency may comprise approximately 28 GigaHertz. The millimeter wave frequency comprises at least one of approximately 39 GigaHertz, approximately 42 GigaHertz, approximately 60 GigaHertz, approximately 77 GigaHertz, and approximately 100 GigaHertz.

Respective pass bands of millimeter wave acoustic filters 9112J, 9114J, 9116J, 9118J may be directed to differing frequency pass bands. For example the first millimeter wave acoustic filter 9112J may have a first pass band comprising at least a lower portion of a 3GPP n258 band. For example, the second millimeter wave acoustic filter 9114J may have a second pass band comprising at least an upper portion of a 3GPP n258 band. For example, the third millimeter wave acoustic filter 9116J may have a third pass band comprising at least a lower portion of a 3GPP n261 band. For example, the fourth millimeter wave acoustic filter 9116J may have a pass band comprising at least an upper portion of a 3GPP n261 band.

FIG. 11B shows a cross sectional view 9600 of the antenna device 9500 shown in FIG. 11A comprising millimeter wave acoustic filters 9116J, 9118J coupled (e.g., flip-chip coupled) with integrated circuit 9515N. (In other examples, millimeter wave acoustic filters 9116J, 9118J may alternatively or additionally be millimeter wave acoustic resonators, e.g., of this disclosure, coupled (e.g., electrically coupled, e.g., flip-chip coupled) with oscillator circuitry of integrated circuit 9515N, e.g., to provide one or more millimeter wave oscillators, as discussed in detail elsewhere herein). Integrated circuit 9515N may be coupled with antenna elements 9116N, 9118N (e.g., patch antenna elements 9116N, 9118N) via antenna feeds (e.g., metallic antenna feeds 9110K, 9112K). A first antenna feed 9110K may extend through package substrate 914Z, e.g., printed circuit board 914Z. An antenna substrate 915Z, e.g., printed circuit board 915Z, may comprise an antenna ground plane 9115Z. Antenna elements 9116N, 9118N (e.g., patch antennas 9116N, 9118N may be arranged over substrate 915Z. Antenna elements 9116N, 9118N may be encapsulated with a suitable encapsulation 9117Z.

FIG. 11C shows a schematic of a millimeter wave transceiver 9700 employing millimeter wave filters, and a millimeter wave oscillator respectively employing millimeter wave resonators of this disclosure. The circuitry (e.g., any portions thereof) shown in the FIG. 11C schematic of the millimeter wave transceiver 9700 employing millimeter wave filters, and the millimeter wave oscillator respectively employing millimeter wave resonators may be included in the integrated circuit 9515N shown in FIGS. 11A and 11B, or coupled with the integrated circuit 9515N shown in FIGS. 11A and 11B in the antenna in package 9500 shown in FIG. 11A. The integrated circuit 9515N shown in FIGS. 11A and 11B may be plurality of integrated circuits 9515N.

As shown in FIG. 11C, a millimeter wave acoustic resonator 9701 may be employed in a low phase noise millimeter wave oscillator 9702, for example as discussed in detail previously herein. The low phase noise millimeter wave oscillator 9702 comprising the millimeter wave acoustic resonator 9701 may be employed as a high frequency reference 9702 (e.g., millimeter wave frequency reference 9702) for a low phase noise millimeter wave frequency synthesizer 9704. The low phase noise millimeter wave frequency synthesizer 9704 may comprise a frequency multiplication circuit coupled with the low phase noise millimeter wave oscillator 9702 comprising the millimeter wave acoustic resonator 9701. The low phase noise millimeter wave frequency synthesizer 9704 may comprise a frequency division circuit coupled with the low phase noise millimeter wave oscillator 9702 comprising the millimeter wave acoustic resonator 9701. The low phase noise millimeter wave frequency synthesizer 9704 may comprise direct digital synthesis circuitry coupled with the low phase noise millimeter wave oscillator 9702 comprising the millimeter wave acoustic resonator 9701. The low phase noise millimeter wave frequency synthesizer 9704 may comprise direct digital to time converter coupled with the low phase noise millimeter wave oscillator 9702 comprising the millimeter wave acoustic resonator 9701. The low phase noise millimeter wave frequency synthesizer 9704 may comprise frequency mixing circuitry coupled with the low phase noise millimeter wave oscillator 9702 comprising the millimeter wave acoustic resonator 9701. The low phase noise millimeter wave frequency synthesizer 9704 may comprise phase-locked loop circuitry (e.g., a plurality of phase-locked loops) coupled with the low phase noise millimeter wave oscillator 9702 comprising the millimeter wave acoustic resonator 9701.

The foregoing may further be coupled with a low frequency oscillator 9703, e.g., comprising a crystal oscillator, e.g., comprising a quartz crystal oscillator, e.g., as a low frequency reference. For example, the frequency oscillator 9703 may provide the low frequency reference having a relatively low frequency, e.g., about 100 MHz or lower (e.g, or below 10 MHz, e.g., or below 1 MHz, e.g., or below 100 KHz). The low frequency reference 9703 may have an enhanced long term stability, e.g., an enhanced temperature stability relative to the high frequency reference 9702 (e.g., relative to the low phase noise millimeter wave oscillator 9702 comprising the millimeter wave acoustic resonator 9701). The low phase noise millimeter wave frequency synthesizer 9704 may comprise frequency comparison circuitry coupled with the low frequency reference 9703 and with the high frequency reference 9702 to compare an output of the low frequency reference 9703 and an output of the high frequency reference 9702 to generate a frequency comparison signal. The low phase noise millimeter wave frequency synthesizer 9704 may comprise frequency error detection circuitry coupled with the frequency comparison circuitry to receive the frequency comparison signal and coupled with the low frequency reference 9703 and with the high frequency reference 9702 to generate a frequency error signal based at least in part on the frequency comparison signal. The low phase noise millimeter wave frequency synthesizer 9704 may comprise frequency correction circuitry coupled with frequency error detection circuitry to receive the frequency error signal and coupled with the low frequency reference 9703 and with the high frequency reference 9702 to correct frequency errors (e.g. long term stability errors, e.g., temperature dependent frequency drift errors) which would otherwise be present in an output of the low phase noise millimeter wave frequency synthesizer 9704.

Alternatively or additionally, relative to the high frequency reference 9702, the low frequency reference 9703 may have a relatively smaller close-in phase noise contribution to the output of the low phase noise millimeter wave frequency synthesizer 9704, e.g., close-in phase noise within a 100 KiloHertz bandwidth of the output carrier, e.g., close-in phase noise within a 1 MegaHertz bandwidth of the output carrier, e.g., close-in phase noise within 10 MegaHertz bandwidth of the output carrier. Relative the low frequency reference 9703, the high frequency reference 9702, may have a relatively smaller farther-out phase noise contribution to the output of the low phase noise millimeter wave frequency synthesizer 9704, e.g., phase noise within a 100 MegaHertz bandwidth of the output carrier, e.g., phase noise within a 1 GigaHertz bandwidth of the output carrier, e.g., close-in phase noise within a 10 GigaHertz bandwidth of the output carrier. Accordingly, by employing the frequency comparison circuitry, the frequency error detection circuitry, and the frequency correction circuitry, the output of the low phase noise millimeter wave frequency synthesizer 9704 may provide the relatively smaller close-in phase noise contribution derived from the low frequency reference 9703, and may also provide the relatively smaller farther-out phase noise contribution derived from the high frequency reference 9702 (e.g., derived from the low phase noise millimeter wave oscillator 9702 comprising the millimeter wave acoustic resonator 9701). For example, the low phase noise millimeter wave frequency synthesizer 9704 may employ phase lock circuitry to phase lock a signal derived from the high frequency reference 9702 with a signal derived from low frequency reference 9703.

The low phase noise millimeter wave frequency synthesizer 9704 may be coupled with a frequency down converting mixer 9705 to provide the millimeter wave frequency output of the low phase noise millimeter wave frequency synthesizer 9704 to the frequency down converting mixer 9705. The frequency down converting mixer 9705 may be coupled with an analog to digital converter 9706 to provide a down converted signal to be digitized by the analog to digital converter 9706. A receiver band pass millimeter wave acoustic filter 9708 of this disclosure may be coupled between a pair of receiver amplifiers 9707, 9709 to generate a filtered amplified millimeter wave signal. This may be coupled with the frequency down converting mixer 9705 to down covert the filtered amplified millimeter wave signal. Another receiver band pass millimeter wave acoustic filter 9710 may be coupled between another receiver amplifier 9711 and a receiver phase shifter 97100 to provide an amplified phase shifted millimeter wave signal. This may be coupled with a first member 9709 if the pair of receivers 9709, 9707 for amplification. Yet another band pass millimeter wave acoustic filter 9713 may be coupled between antenna 9714 and millimeter wave switch 9712. Time Division Duplexing (TDD) may be employed using millimeter wave switch 9712 to switch between the receiver chain (just discussed) and a transmitter chain of millimeter wave transceiver 9700, to be discussed next.

The low phase noise millimeter wave frequency synthesizer 9704 may be coupled with a frequency up converting mixer 9715 to provide the millimeter wave frequency output of the low phase noise millimeter wave frequency synthesizer 9704 to the frequency up converting mixer 9715. The frequency up converting mixer 9715 may be coupled with a digital to analog converter 9716 to provide a signal to be up converted to millimeter wave for transmission. A transmitter band pass millimeter wave acoustic filter 9718 may be coupled between a pair of transmitter amplifiers 9717, 9719. This may be coupled with the frequency up converting mixer 9715 to receive the up converted millimeter wave signal to be transmitted and to generate a filtered and amplified transmit signal. Another transmitter band pass millimeter wave acoustic filter 9720 may be coupled between a transmit phase shifter 97200 and another transmit amplifier 9721. This may be coupled with a first member 9719 of the pair of transmit amplifiers 9719, 9718 to receive the filtered and amplified transmit signal and to generate a filtered, amplified and phase shifted signal. This may be coupled with the yet another band pass millimeter wave acoustic filter 9713 and antenna 9714 via millimeter wave switch 9712 for transmission.

Further Example Embodiments

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A bulk acoustic wave (BAW) resonator comprising:
an acoustic reflector electrode, in which the acoustic reflector electrode includes at least a first pair of metal electrode layers and a second pair of metal electrode layers;
a first piezoelectric layer having a first piezoelectric axis orientation and a first thickness;
a second piezoelectric layer having a second piezoelectric axis orientation;
a third piezoelectric layer having a third piezoelectric axis orientation that opposes the second piezoelectric axis orientation, and having a third thickness acoustically and electrically coupled with the acoustic reflector electrode to facilitate a main resonant frequency of the bulk acoustic wave resonator; and
an integrated capacitive layer electrically coupled with the acoustic reflector electrode to facilitate limiting of an electromechanical coupling of the bulk acoustic wave resonator.

2. The bulk acoustic wave resonator as in claim 1 in which the main resonant frequency is an X band.

3. The bulk acoustic wave resonator as in claim 1 in which the first thickness of the first piezoelectric layer is greater than an integral multiple a half wavelength of the main resonant frequency.

4. The bulk acoustic wave resonator as in claim 3 in which the first thickness of the first piezoelectric layer is greater than the integral multiple of the half wavelength of the main resonant frequency of the bulk acoustic wave resonator by about 10% or more of the integral multiple of the half wavelength of the main resonant frequency of the bulk acoustic wave resonator.

5. The bulk acoustic wave resonator as in claim 3 in which the first thickness of the first piezoelectric layer is greater than the integral multiple of the half wavelength of the main resonant frequency of the bulk acoustic wave resonator by about 50% or more of the integral multiple of the half wavelength of the main resonant frequency of the bulk acoustic wave resonator.

6. The bulk acoustic wave resonator as in claim 3 in which the first thickness of the first piezoelectric layer is greater than the integral multiple of the half wavelength of the main resonant frequency of the bulk acoustic wave resonator by about 90% or more of the integral multiple of the half wavelength of the main resonant frequency of the bulk acoustic wave resonator.

7. The bulk acoustic wave resonator as in claim 1 in which the third thickness of the third piezoelectric layer is less than an integral multiple of a half wavelength of the main resonant frequency.

8. The bulk acoustic wave resonator as in claim 1 in which the first piezoelectric axis orientation of the first piezoelectric layer opposes the second piezoelectric axis orientation of the second piezoelectric layer.

9. The bulk acoustic wave resonator as in claim 1 including at least a fourth piezoelectric layer.

10. The bulk acoustic wave resonator as in claim 1 in which:
the first piezoelectric layer includes at least a first piezoelectric material having a first electromechanical coupling; and
the third thickness of the third piezoelectric layer is sufficiently different than the first thickness of the first piezoelectric layer to facilitate the electromechanical coupling of the bulk acoustic wave resonator approximately 10% or less of a first electromechanical coupling of the first piezoelectric material.

11. The bulk acoustic wave resonator as in claim 1 in which the main resonant frequency is in one of a Ku band, a K band, a Ka band, a V band, and a W band.

12. The bulk acoustic wave resonator as in claim 1 in which members of the first pair of metal electrode layers and the second pair of metal electrode layers have respective acoustic impedances in an alternating arrangement to provide a plurality of reflective acoustic impedance mismatches.

13. The bulk acoustic wave resonator as in claim 1 in which
the third thickness of the third piezoelectric layer is different than the first thickness of the first piezoelectric layer.

14. The bulk acoustic wave resonator as in claim 1 in which:
a first member of the first pair of metal electrode layers is a first metal electrode layer;
the first metal electrode layer has a first electrical conductivity;
the acoustic reflector electrode includes at least a current spreading layer; and the current spreading layer has a second electrical conductivity that is greater than the first electrical conductivity.

15. The bulk acoustic wave resonator as in claim 1 including at least an integrated inductor electrically coupled with the first piezoelectric layer, the second piezoelectric layer, and the third piezoelectric layer via the acoustic reflector electrode.

16. An electrical oscillator comprising:
electrical oscillator circuitry; and
a bulk acoustic wave resonator coupled with the electrical oscillator circuitry to excite electrical oscillation in the bulk acoustic wave resonator, in which the bulk acoustic wave resonator includes at least:
an acoustic reflector electrode, in which the acoustic reflector electrode includes at least a first pair of metal electrode layers and a second pair of metal electrode layers;
a first piezoelectric layer having a first piezoelectric axis orientation and a first thickness;
a second piezoelectric layer having a second piezoelectric axis orientation;
a third piezoelectric layer having a third piezoelectric axis orientation that opposes the second piezoelectric axis orientation, and having a third thickness acoustically and electrically coupled with the acoustic reflector electrode to facilitate a main resonant frequency of the bulk acoustic wave resonator; and
an integrated capacitive layer electrically coupled with the acoustic reflector electrode to facilitate limiting of an electromechanical coupling of the bulk acoustic wave resonator.

17. The electrical oscillator as in claim 16 in which the main resonant frequency is in one of a Ku band, a K band, a Ka band, a V band, and a W band.

18. An electrical filter comprising:
a plurality of bulk acoustic wave resonators over a substrate, in which a first bulk acoustic wave resonator of the plurality of bulk acoustic wave resonators includes at least:
an acoustic reflector electrode, in which the acoustic reflector electrode includes at least a first pair of metal electrode layers and a second pair of metal electrode layers;
a first piezoelectric layer having a first piezoelectric axis orientation and a first thickness;
a second piezoelectric layer having a second piezoelectric axis orientation;
a third piezoelectric layer having a third piezoelectric axis orientation that opposes the second piezoelectric axis orientation, and having a third thickness acoustically and electrically coupled with the acoustic reflector electrode to facilitate a main resonant frequency of the first bulk acoustic wave resonator; and
an integrated capacitive layer electrically coupled with the acoustic reflector electrode to facilitate limiting of an electromechanical coupling of the first bulk acoustic wave resonator.

19. The electrical filter as in claim 18 in which the main resonant frequency is in one of a Ku band, a K band, a Ka band, a V band, and a W band.

20. The electrical filter as in claim 18 comprising:
including at least an integrated inductor electrically coupled with the first piezoelectric layer, the second piezoelectric layer, and the third piezoelectric layer via the acoustic reflector electrode.

* * * * *